(12) United States Patent
Ogasawara

(10) Patent No.: US 10,069,091 B2
(45) Date of Patent: Sep. 4, 2018

(54) ORGANIC ELECTROLUMINESCENT DEVICE

(71) Applicant: UDC IRELAND LIMITED, Dublin (IE)

(72) Inventor: Jun Ogasawara, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 834 days.

(21) Appl. No.: 14/468,748

(22) Filed: Aug. 26, 2014

(65) Prior Publication Data

US 2015/0287939 A1 Oct. 8, 2015

Related U.S. Application Data

(62) Division of application No. 11/269,698, filed on Nov. 9, 2005, now Pat. No. 8,815,409.

(30) Foreign Application Priority Data

Nov. 10, 2004 (JP) ................. 2004-326658

(51) Int. Cl.
*H01L 51/54* (2006.01)
*H01L 51/00* (2006.01)
*C09K 11/06* (2006.01)
*H05B 33/14* (2006.01)
*H01L 51/50* (2006.01)

(52) U.S. Cl.
CPC ......... *H01L 51/0094* (2013.01); *C09K 11/06* (2013.01); *H01L 51/0077* (2013.01); *H01L 51/0084* (2013.01); *H01L 51/0085* (2013.01); *H01L 51/0086* (2013.01); *H01L 51/0087* (2013.01); *H01L 51/0089* (2013.01); *H01L 51/0091* (2013.01); *H05B 33/14* (2013.01); *C09K 2211/1007* (2013.01); *C09K 2211/1014* (2013.01); *C09K 2211/1029* (2013.01); *C09K 2211/1037* (2013.01); *C09K 2211/1044* (2013.01); *C09K 2211/1048* (2013.01); *C09K 2211/1059* (2013.01); *C09K 2211/1092* (2013.01); *C09K 2211/185* (2013.01); *C09K 2211/187* (2013.01); *C09K 2211/188* (2013.01); *H01L 51/005* (2013.01); *H01L 51/007* (2013.01); *H01L 51/0056* (2013.01); *H01L 51/0058* (2013.01); *H01L 51/0067* (2013.01); *H01L 51/0068* (2013.01); *H01L 51/5016* (2013.01); *H01L 51/5036* (2013.01); *Y10S 428/917* (2013.01)

(58) Field of Classification Search
None
See application file for complete search history.

(56) References Cited

U.S. PATENT DOCUMENTS

| | | | |
|---|---|---|---|
| 5,358,788 A * | 10/1994 | Kawamura et al. | ......................... H01L 51/0094 313/504 |
| 6,303,231 B1 | 10/2001 | Sawada et al. | |
| 6,303,238 B1 | 10/2001 | Thompson et al. | |
| 6,310,231 B1 | 10/2001 | Igarashi et al. | |
| 6,653,654 B1 | 11/2003 | Che | |
| 8,815,409 B2 * | 8/2014 | Ogasawara | ............ C09K 11/06 257/E51.044 |
| 2005/0064238 A1 | 3/2005 | Lee et al. | |
| 2005/0123788 A1 | 6/2005 | Huo et al. | |
| 2005/0170206 A1 | 8/2005 | Ma et al. | |
| 2005/0233167 A1 | 10/2005 | Che et al. | |
| 2005/0244672 A1 | 11/2005 | Che et al. | |

FOREIGN PATENT DOCUMENTS

| | | |
|---|---|---|
| JP | 2000186094 | 7/2000 |
| JP | 2004103463 | 4/2004 |
| WO | 2004039914 | 5/2004 |
| WO | 2004108857 | 12/2004 |
| WO | 2006046416 | 5/2006 |

OTHER PUBLICATIONS

Japanese Patent Office Notice of Reasons for Rejection dated Mar. 30, 2010 (pp. 1-3) and English translation (pp. 1-4) for Application No. 2004-326658.

\* cited by examiner

*Primary Examiner* — Marie R. Yamnitzky
(74) *Attorney, Agent, or Firm* — Riverside Law LLP

(57) ABSTRACT

An organic electroluminescent device including at least one organic layer between a pair of electrodes, wherein the at least one organic layer includes a luminescent layer, at least one layer of the at least one organic layer includes at least one metal complex containing a tri- or higher-dentate ligand, and a compound represented by formula (I) is contained in an organic layer containing the metal complex and/or in other organic layer(s). In formula (I), $R^{11}$ to $R^{14}$ each independently represent a hydrogen atom or a substituent group, and at least one of $R^{11}$ to $R^{14}$ represents an aryl or heteroaryl group.

Formula (I)

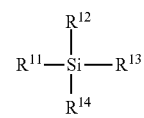

9 Claims, No Drawings

ORGANIC ELECTROLUMINESCENT DEVICE

CROSS-REFERENCE TO RELATED APPLICATIONS

This application is a divisional of U.S. patent application Ser. No. 11/269,698, filed Nov. 9, 2005, now U.S. Pat. No. 8,815,409, which claims priority under 35 U.S.C. § 119 from Japanese Patent Application No. 2004-326658, filed Nov. 10, 2004, the disclosures of which are each incorporated by reference herein in their entirety.

BACKGROUND OF THE INVENTION

Field of the Invention

The present invention relates to an organic electroluminescent device (hereinafter, also referred to as "organic EL device" or "luminescent device") which can emit light through the conversion of electric energy to light.

Description of the Related Art

Recently, research and development on various display devices have been conducted. In particular, organic electroluminescent devices (organic EL devices) have attracted attention because emission can be obtained with high luminance by driving at low voltage.

Further, the application of organic electroluminescent devices to color displays and white light sources have been tried actively. However, it is necessary to improve the characteristics of respective luminescent devices of blue, green, and red in order to obtain high-performance color displays and white light sources.

A red-emission phosphorescent device has been known which uses a platinum porphyrin complex having a cyclic quadridentate ligand as a phosphorescent substance (see, for example, U.S. Pat. No. 6,303,231B1, the disclosure of which is incorporated herein by reference). However, this device has a low maximum emission and there have been needs for the improvement of the device.

Another platinum complex has been reported (for example in U.S. Pat. No. 6,653,654B1, the disclosure of which is incorporated herein by reference) which has a chained bipyridine-based quadridentate ligand or a phenanthroline-based quadridentate ligand. However, this platinum complex is unsatisfactory with respect to the balance between emission characteristics such as color purity and durability. Therefore, there have been needs for improvement thereof.

Further, there have also been needs for the development of organic EL devices which use luminescent substances emitting light of shorter wavelength (i.e., green-emission luminescent substance and blue-emission luminescent substance) and which have improved emission characteristics and durability.

SUMMARY OF THE INVENTION

The present invention has been made in view of the above-described circumstances and provides an organic electroluminescent device having superior emission characteristics and driving durability.

An aspect of the invention provides a n organic electroluminescent device comprising at least one organic layer between a pair of electrodes, wherein the at least one organic layer includes a luminescent layer, at least one layer of the at least one organic layer includes at least one metal complex containing a tri- or higher-dentate ligand, and a compound represented by formula (I) is contained in an organic layer containing the metal complex and/or in other organic layer(s).

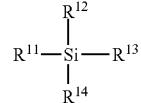

Formula (I)

In formula (I), to $R^{11}$ to $R^{14}$ each independently represent a hydrogen atom or a substituent group, and at least one of $R^{11}$ to $R^{14}$ represents an aryl or heteroaryl group.

DETAILED DESCRIPTION OF THE INVENTION

Hereinafter, the invention will be described in detail.

The organic electroluminescent device according to the invention is an organic electroluminescent device including at least one organic layer between a pair of electrodes. The at least one organic layer includes a luminescent layer. At least one of the organic layer(s) includes at least one metal complex containing a tr- or higher-dentate ligand. A compound represented by the following formula (I) is contained in the organic layer containing the metal complex and/or in the other organic layer.

Hereinafter, components for the organic electroluminescent device according to the invention will be described respectively.

<Compound Represented by Formula (I)>

The luminescent device according to the invention contains a compound represented by the following formula (I) in at least one organic layer.

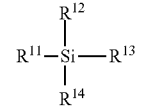

Formula (I)

In formula (I), $R^{11}$ to $R^{14}$ each independently represent a hydrogen atom or a substituent group; and at least one of $R^{11}$ to $R^{14}$ represents an aryl or heteroaryl group.

The $T_1$ level (energy level of lowest triplet excited state) of the compound represented by formula (I) is preferably 45 kcal/mol or more (188.3 kJ/mol or more) and 85 kcal/mol or less (355.6 kJ/mol or less), more preferably, 55 kcal/mol or more (251.0 kJ/mol or more) and 85 kcal/mol or less (355.6 kJ/mol or less), and still more preferably, 60 kcal/mol or more (272.0 kJ/mol or more), and 85 kcal/mol or less (355.6 kJ/mol or less).

The compound represented by formula (I) may be contained in any of the organic layers in the luminescent device according to the invention, but is preferably contained in the luminescent or electron transport layer, and more preferably in the luminescent layer.

The compound represented by formula (I) is preferably contained as a host material in the luminescent layer.

In the invention, the content of the compound represented by formula (I) in an organic layer is preferably 99 to 10% by mass, more preferably 90 to 30% by mass, and still more preferably 70 to 50% by mass.

When the compound represented by formula (I) is contained in a luminescent layer, the concentration of the compound represented by formula (I) in the luminescent layer is preferably 1% to 90% by mass, more preferably 10% to 70% by mass, and still more preferably 15 to 50% by mass, with respect to the total solid matters in the luminescent layer.

Also in the invention, at least one organic layer contains a compound represented by formula (I) and a metal complex having a tri- or higher-dentate ligand described below, but these compounds may be contained in the same layer or in different layers.

The content ratio of the compound represented by formula (I) to the metal complex having a tri- or higher-dentate ligand described below is preferably 50:50 to 99:1, more preferably 80:20 to 99:1, and still more preferably, 90:10 to 95:5, by mass.

The compound represented by Formula (I) will be described in detail.

In formula (I), $R^{11}$ to $R^{14}$ each independently represent a hydrogen atom or a substituent group; and at least one of $R^{11}$ to $R^{14}$ represents an aryl or heteroaryl group.

The substituent groups represented by $R^{11}$ to $R^{14}$ include the substituent groups described in the following substituent group A.

(Substituent group A)

Alkyl groups (preferably having 1 to 30 carbon atoms, more preferably 1 to 20 carbon atoms, and particularly preferably 1 to 10 carbon atoms, such as methyl, ethyl, iso-propyl, tert-butyl, n-octyl, n-decyl, n-hexadecyl, cyclopropyl, cyclopentyl, and cyclohexyl), alkenyl groups (preferably having 2 to 30 carbon atoms, more preferably 2 to 20 carbon atoms, and particularly preferably 2 to 10 carbon atoms, such as vinyl, allyl, 2-butenyl, and 3-pentenyl), alkynyl groups (preferably having 2 to 30 carbon atoms, more preferably 2 to 20 carbon atoms, and particularly preferably 2 to 10 carbon atoms, such as propargyl and 3-pentynyl), aryl groups (preferably having 6 to 30 carbon atoms, more preferably 6 to 20 carbon atoms, and particularly preferably 6 to 12 carbon atoms, such as phenyl, p-methylphenyl, naphthyl, and anthranyl), amino groups (preferably having 0 to 30 carbon atoms, more preferably 0 to 20 carbon atoms, and particularly preferably 0 to 10 carbon atoms, such as amino, methylamino, dimethylamino, diethylamino, dibenzylamino, diphenylamino, and ditolylamino), alkoxy groups (preferably having 1 to 30 carbon atoms, more preferably 1 to 20 carbon atoms, and particularly preferably 1 to 10 carbon atoms, methoxy, ethoxy, butoxy, and 2-ethylhexyloxy), aryloxy groups (preferably having 6 to 30 carbon atoms, more preferably 6 to 20 carbon atoms, and particularly preferably 6 to 12 carbon atoms, such as phenyloxy, 1-naphthyloxy, and 2-naphthyloxy), heteroaryloxy groups (preferably having 1 to 30 carbon atoms, more preferably 1 to 20 carbon atoms, and particularly preferably 1 to 12 carbon atoms, such as pyridyloxy, pyrazyloxy, pyrimidyloxy, and quinolyloxy), acyl groups (preferably having 1 to 30 carbon atoms, more preferably 1 to 20 carbon atoms, and particularly preferably 1 to 12 carbon atoms, such as acetyl, benzoyl, formyl, and pivaloyl), alkoxycarbonyl groups (preferably having 2 to 30 carbon atoms, more preferably 2 to 20 carbon atoms, and particularly preferably 2 to 12 carbon atoms, such as methoxycarbonyl and ethoxycarbonyl), aryloxycarbonyl groups (preferably having 7 to 30 carbon atoms, more preferably 7 to 20 carbon atoms, and particularly preferably 7 to 12 carbon atoms, such as phenyloxycarbonyl), acyloxy groups (preferably having 2 to 30 carbon atoms, more preferably 2 to 20 carbon atoms, and particularly preferably 2 to 10 carbon atoms, such as acetoxy and benzoyloxy), acylamino groups (preferably having 2 to 30 carbon atoms, more preferably 2 to 20 carbon atoms, and particularly preferably 2 to 10 carbon atoms, such as acetylamino and benzoylamino), alkoxycarbonylamino groups (preferably having 2 to 30 carbon atoms, more preferably 2 to 20 carbon atoms, and particularly preferably 2 to 12 carbon atoms, such as methoxycarbonylamino), aryloxycarbonylamino groups (preferably having 7 to 30 carbon atoms, more preferably 7 to 20 carbon atoms, and particularly preferably 7 to 12 carbon atoms, such as phenyloxycarbonylamino), sulfonylamino groups (preferably having 1 to 30 carbon atoms, more preferably 1 to 20 carbon atoms, and particularly preferably 1 to 12 carbon atoms, such as methanesulfonylamino and benzenesulfonylamino), sulfamoyl groups (preferably having 0 to 30 carbon atoms, more preferably 0 to 20 carbon atoms, and particularly preferably 0 to 12 carbon atoms, such as sulfamoyl, methylsulfamoyl, dimethylsulfamoyl, and phenylsulfamoyl), carbamoyl groups (preferably having 1 to 30 carbon atoms, more preferably 1 to 20 carbon atoms, and particularly preferably 1 to 12 carbon atoms, such as carbamoyl, methylcarbamoyl, diethylcarbamoyl, and phenylcarbamoyl), alkylthio groups (preferably having 1 to 30 carbon atoms, more preferably 1 to 20 carbon atoms, and particularly preferably 1 to 12 carbon atoms, such as methylthio and ethylthio), arylthio groups (preferably having 6 to 30 carbon atoms, more preferably 6 to 20 carbon atoms, and particularly preferably 6 to 12 carbon atoms, such as phenylthio), heteroarylthio groups (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, and 2-benzothiazolylthio), sulfonyl groups (preferably having 1 to 30 carbon atoms, more preferably 1 to 20 carbon atoms, and particularly preferably 1 to 12 carbon atoms, such as mesyl and tosyl), sulfinyl groups (preferably having 1 to 30 carbon atoms, more preferably 1 to 20 carbon atoms, and particularly preferably 1 to 12 carbon atoms, such as methanesulfinyl and benzenesulfinyl), ureido groups (preferably having 1 to 30 carbon atoms, more preferably 1 to 20 carbon atoms, and particularly preferably 1 to 12 carbon atoms, such as ureido, methylureido, and phenylureido), phosphoric amide groups (preferably having 1 to 30 carbon atoms, more preferably 1 to 20 carbon atoms, and particularly preferably 1 to 12 carbon atoms, such as diethylphosphoric amide, and phenylphosphoric amide), a hydroxy group, a mercapto group, halogen atoms (e.g., fluorine, chlorine, bromine, and iodine), a cyano group, a sulfo group, a carboxyl group, a nitro group, a hydroxamic acid group, sulfino groups, hydrazino groups, imino groups, heterocyclic groups (preferably having 1 to 30 carbon atoms, and more preferably 1 to 12 carbon atoms and further having one or more heteroatoms (e.g., nitrogen, oxygen, and sulfur), such as imidazolyl, pyridyl, quinolyl, furyl, thienyl, piperidyl, morpholino, benzoxazolyl, benzimidazolyl, benzothiazolyl, carbazolyl, and azepinyl), silyl groups (preferably having 3 to 40 carbon atoms, more preferably 3 to 30 carbon atoms, and particularly preferably 3 to 24 carbon atoms, such as trimethylsilyl and triphenylsilyl), and the like. These substituents may be themselves substituted, and may combine with each other to form a ring.

Each of $R^{11}$ to $R^{14}$ is preferably an alkyl, aryl, heteroaryl, siloxy, or vinyl group, more preferably a methyl, phenyl, naphthyl, anthryl, biphenyl, pyridyl, imidazolyl, benzimidazolyl, imidazopyridyl, siloxy, or vinyl group, and still more preferably a phenyl, benzimidazolyl, imidazopyridyl, siloxy, or vinyl group.

However, at least one of $R^{11}$ to $R^{14}$ represents an aryl or heteroaryl group.

The compound represented by formula (I) is preferably a compound represented by the following formula (I-A) or (I-B).

The compound represented by formula (I-A) will be described first in detail.

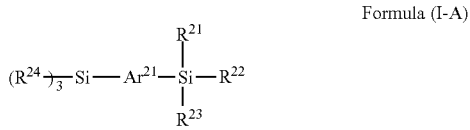

Formula (I-A)

In formula (I-A), $R^{21}$ to $R^{24}$ each independently represent a hydrogen atom or a substituent group. $Ar^{21}$ represents an arylene or heteroarylene group.

Examples of the substituent groups represented by $R^{21}$ to $R^{24}$ in formula (I-A), include those in the group of substituents A.

Each of $R^{21}$ to $R^{24}$ is preferably an alkyl, aryl, heteroaryl, siloxy, or vinyl group, more preferably a methyl, phenyl, naphthyl, anthryl, biphenyl, pyridyl, imidazolyl, benzimidazolyl, imidazopyridyl, siloxy, or vinyl group, and more preferably a phenyl, benzimidazolyl, imidazopyridyl, siloxy, or vinyl group.

The arylene group represented by $Ar^{21}$ is a monocyclic, or bi- or higher-cyclic fused-ring arylene group. The arylene group represented by $Ar^{21}$ is preferably an arylene group having 6 to 30 carbon atoms, more preferably an arylene group having 6 to 20 carbon atoms, particularly preferably an arylene group having 6 to 12 carbon atoms, and examples thereof include groups such as phenylene, biphenylene, terphenylene, naphthylene, anthrylene, phenathrylene, pyrenylene, perylenylene, fluorenylene, clecenylene, triphenylenylene, benzanthrylene, benzophenanthrenylene, diphenylanthrylene.

The heteroarylene group represented by $Ar^{21}$ is a monocyclic, or bi- or higher-cyclic fused-ring heteroarylene group. The heteroarylene group represented by $Ar^{21}$ is preferably a heteroarylene group having 1 to 20 carbon atoms, more preferably a heteroarylene group having 2 to 12 carbon atoms, and still more preferably a heteroarylene group having 2 to 10 carbon atoms. Specific examples of the heteroarylene groups represented by $Ar^{21}$ include groups such as pyridylene, quinolylene, isoquinolylene, acridinylene, phenanthridinylene, pyrazinylene, quinoxalinylene, pyrimidinylene, triazylene, imidazolylene, pyrazolylene, oxadiazolylene, triazolylene, furylene, thienylene, pyrrolylene, indolylene, carbazolylene.

$Ar^{21}$ may be a group in which any of the arylene groups and any of the heteroarylene groups are bound to each other.

$Ar^{21}$ is preferably a phenylene, biphenylene, terphenylene, naphthylene, anthrylene, pyridylene, pyrimidylene, triazylene, oxadiazolylene, triazolylene, thienylene, pyrrolylene, indolylene, or carbazolylene group, more preferably a phenylene, biphenylene, terphenylene, naphthylene, pyridylene, triazylene, oxadiazolylene, thienylene, or carbazolylene group, still more preferably a phenylene, biphenylene, or pyridylene group, and particularly preferably a para-phenylene group.

The arylene or heteroarylene group represented by $Ar^{21}$ further have one or more substituents.

The compound represented by formula (I-B) will be described below.

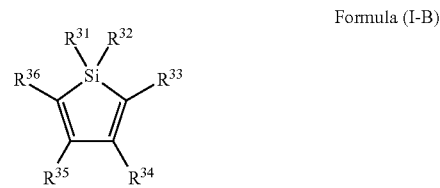

Formula (I-B)

In formula (I-B), $R^{31}$ to $R^{36}$ each independently represent a hydrogen atom or a substituent group, wherein at least one of $R^{31}$ or $R^{32}$ is an aryl or heteroaryl group. Examples and preferable ranges of the substituent groups represented by $R^{31}$ to $R^{36}$ in formula (I-B) are the same as those of the substituent groups represented by $R^{21}$ to $R^{24}$ in formula (I-A).

Hereinafter, specific examples of the compounds represented by formulae (I), (I-A), and (I-B) are listed (exemplary compounds (1-1) to (1-19), (2-1), (2-3), (2-4), (2-6) to (2-8), (2-10), and (2-11)), but the compounds represented by formulae (I), (I-A), and (I-B) are not limited thereto. Formulae (2-2), (2-5), (2-9), (2-12), (2-13), (2-14) and (2-15) are not included in the scope of formula (I).

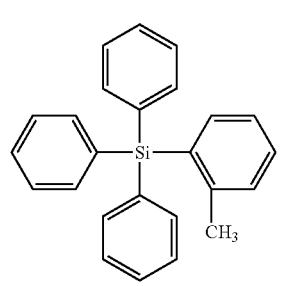

(1-1)

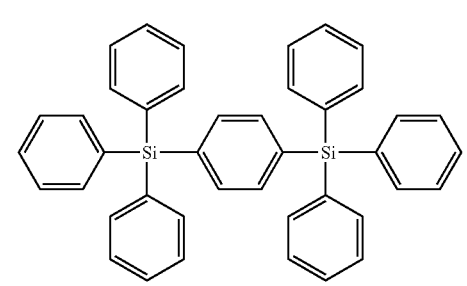

(1-2)

(1-3)
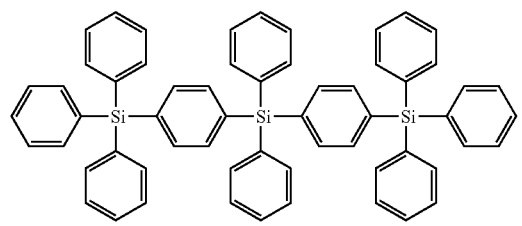
(1-4)
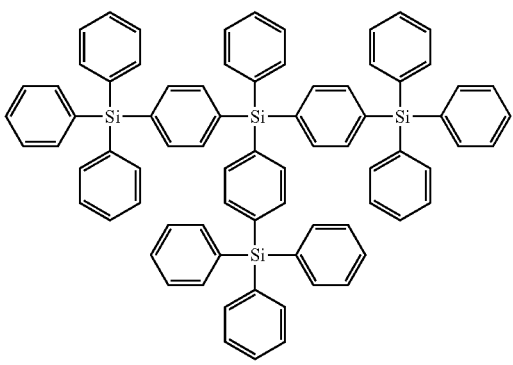
(1-5)
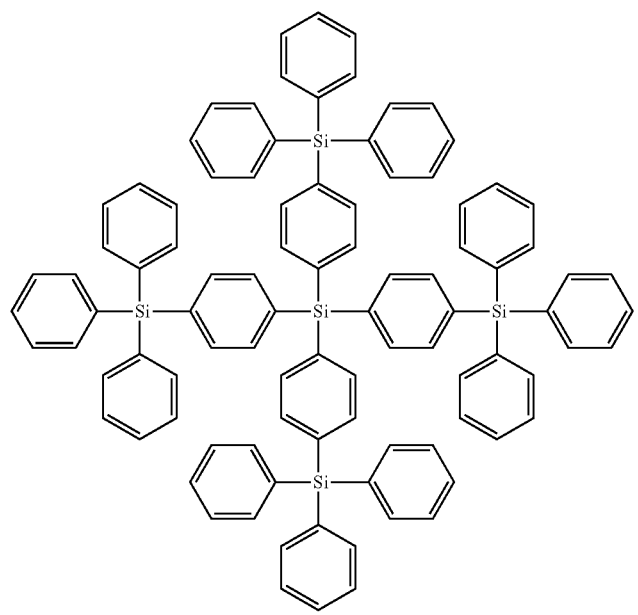
(1-6)
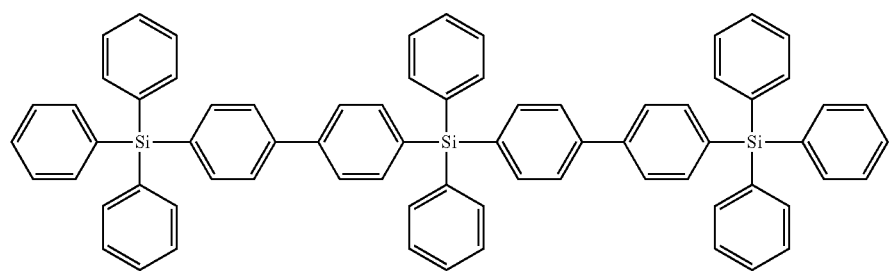
(1-7)
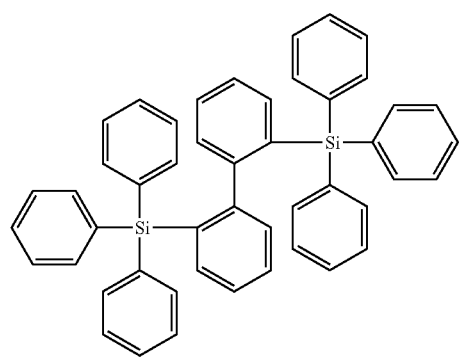

-continued
(1-8)
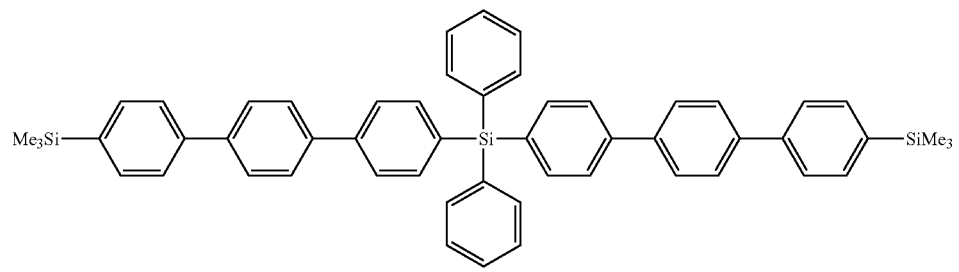
(1-9)
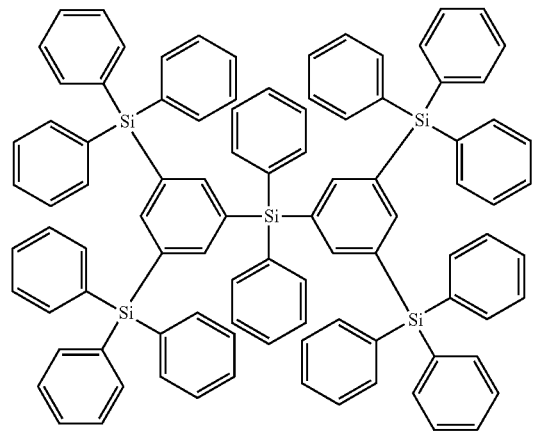
(1-10)
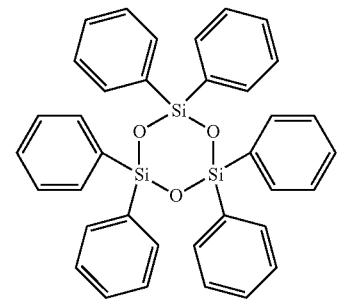
(1-11)
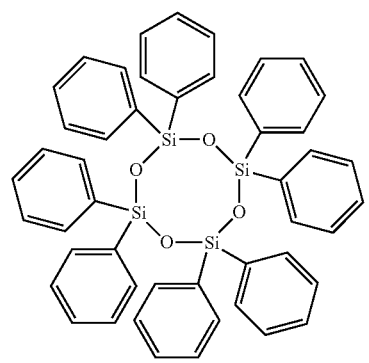
(1-12)
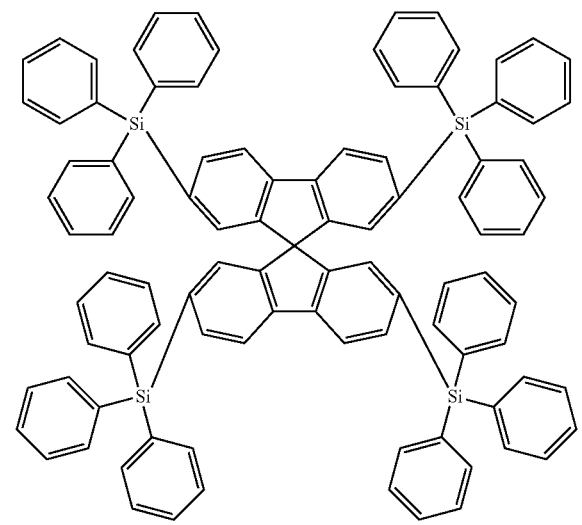
(1-13)
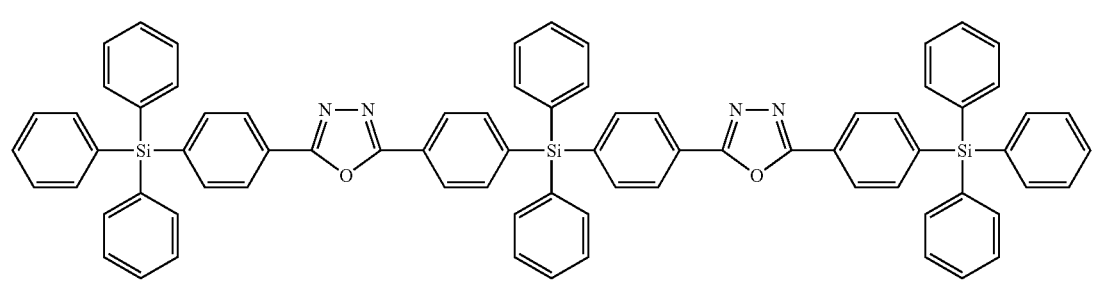

-continued
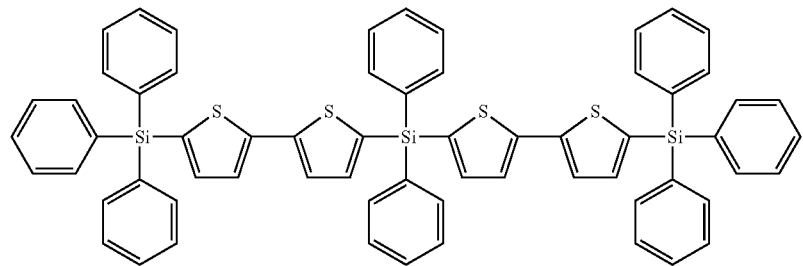
(1-14)
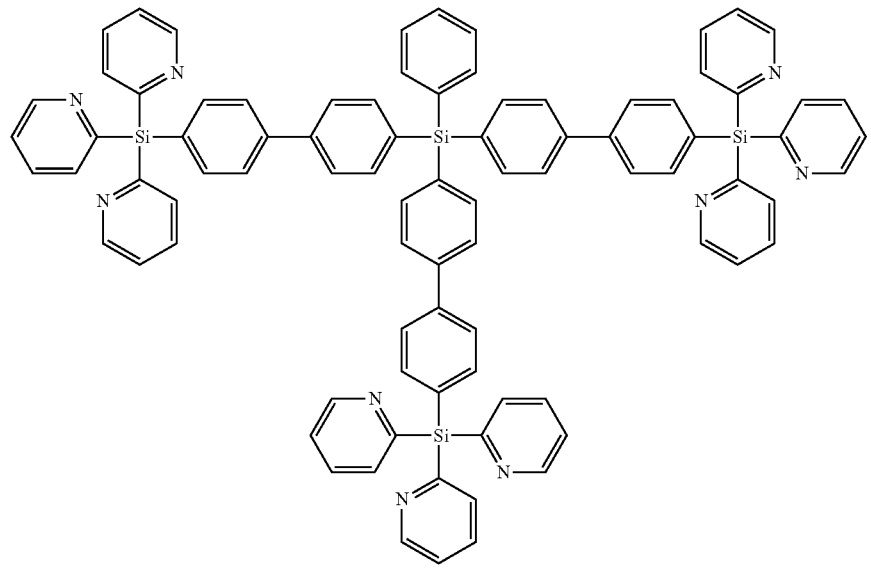
(1-15)
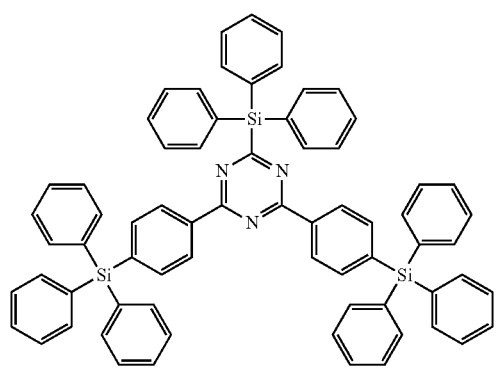
(1-16)
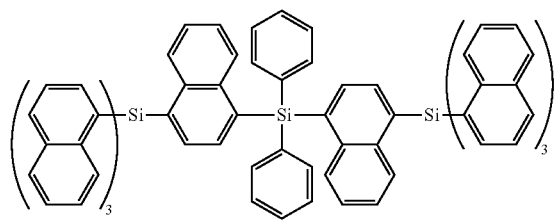
(1-17)
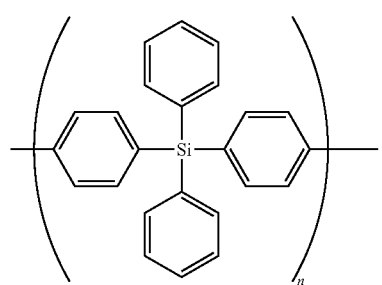
(1-18)
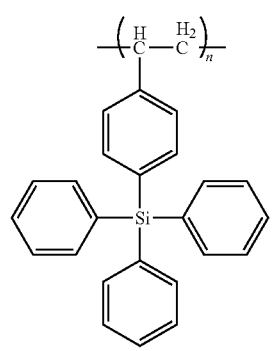
(1-19)

-continued
(2-1)
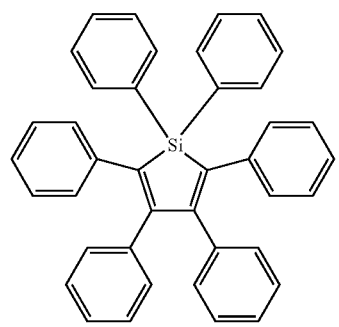
(2-2)
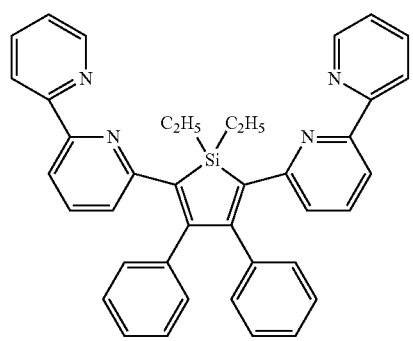
(2-3)
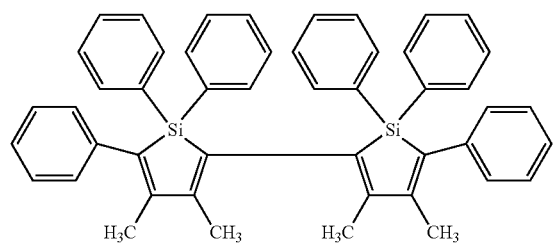
(2-4)
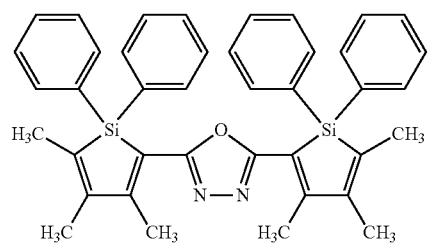
(2-5)
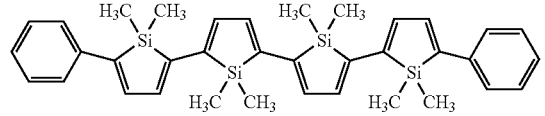
(2-6)
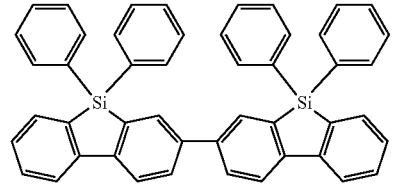
(2-7)
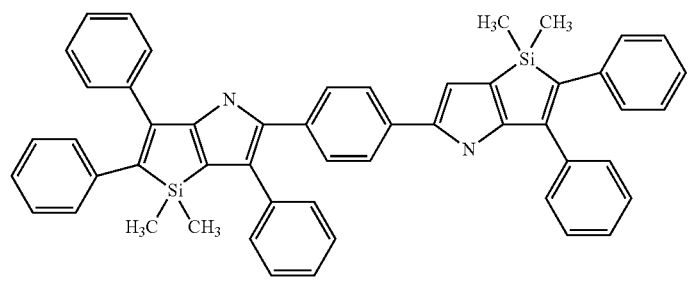
(2-8)
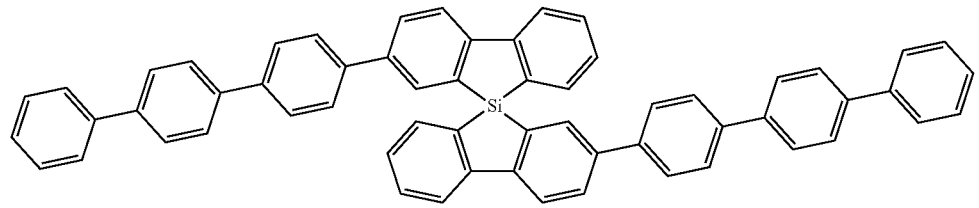
(2-9)
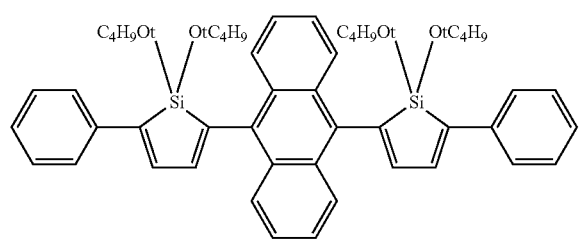
(2-10)
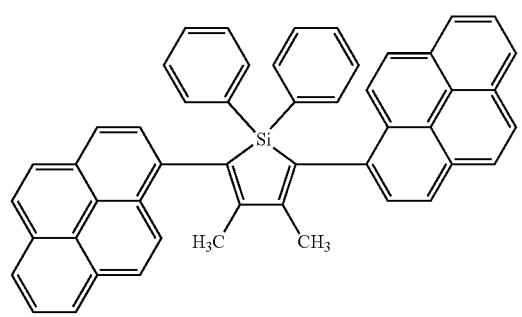

-continued

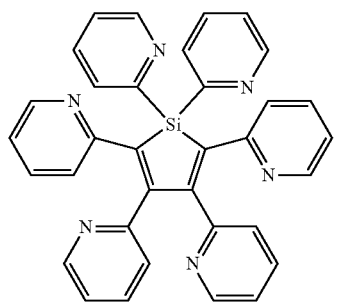
(2-11)

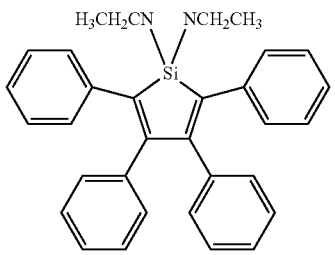
(2-12)

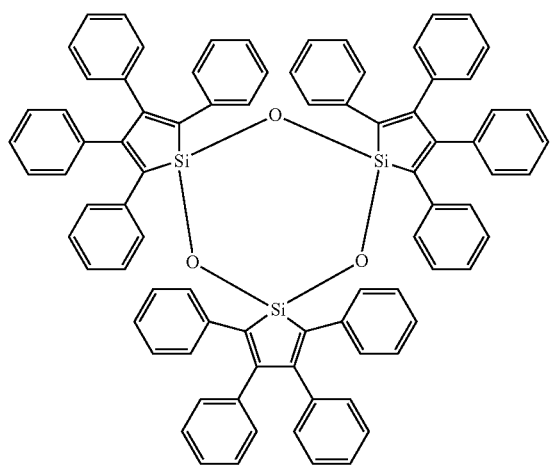
(2-13)

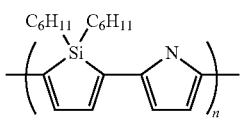
(2-14)

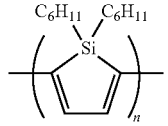
(2-15)

<Metal Complex Having a Tridentate or Higher Dentate Ligand>

Hereinafter, the metal complex having a tridentate or higher dentate ligand according to the invention will be described.

At least one organic layer in the organic electroluminescent device according to the invention includes at least one metal complex having a tridentate or higher dentate ligand (hereinafter occasionally referred to simply as "metal complex").

The metal complex according to the invention is preferably a metal complex having a tridentate to hexadentate ligand, more preferably a metal complex having a tridentate or quadridentate ligand, and particularly preferably a metal complex having a quadridentate ligand.

The ligand contained in the metal complex according to the invention is preferably a chained or cyclic, and preferably has at least one nitrogen-containing heterocyclic ring (e.g., a pyridine ring, a quinoline ring, or a pyrrole ring) that coordinates to the central metal (e.g., $M^{11}$ in the compound represented by formula (II) described below) via the nitrogen. The nitrogen-containing heterocyclic ring is more preferably a nitrogen-containing six-membered heterocyclic ring.

The term "chained" used herein for the ligand contained in the metal complex described above refers to a structure of the ligand not encircling the central metal completely (e.g., terpyridyl ligand). The term "cyclic" used for the ligand contained in the metal complex refers to a closed structure of the ligand encircling the central metal (e.g., phthalocyanine or crown ether ligand).

The atom in the metal complex coordinating to the metal ion is not particularly limited, but preferably an oxygen, nitrogen, carbon, or sulfur atom, more preferably an oxygen, nitrogen, or carbon atom, and still more preferably a nitrogen or carbon atom.

The metal ion in the metal complex is not particularly limited, and preferable examples thereof include iridium, platinum, rhenium, tungsten, rhodium, ruthenium, osmium, rare-earth metal (e.g., europium, gadolinium, terbium), palladium, copper, cobalt, magnesium, zinc, nickel, lead, and aluminum ions. The metal ion in the metal complex is more preferably a platinum, iridium, rhenium, palladium, rhodium, ruthenium, or copper ion.

In a preferable embodiment, the luminescent layer includes the metal complex.

The content of the metal complex in each organic layer containing the metal complex is preferably 50 to 0.5% by mass, more preferably 20 to 1% by mass, and still more preferably 10 to 2% by mass.

When the ligand of the metal complex according to the invention is chained, the metal complex is preferably a compound represented by formula (II) or (III) described in detail below.

The compound represented by formula (II) will be described first.

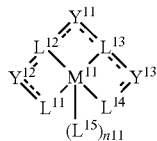

Formula (II)

In formula (II), $M^{11}$ represents a metal ion, and $L^{11}$ to $L^{15}$ each represent a moiety coordinating to $M^{11}$. There is no additional atomic group between $L^{11}$ and $L^{14}$ that forms a cyclic ligand. $L^{15}$ does not bind to both $L^{11}$ and $L^{14}$ to form a cyclic ligand. $Y^{11}$ to $Y^{13}$ each independently represent a connecting group, or a single or double bond. When $Y^{11}$ is a connecting group, the bond between $L^{12}$ and $Y^{11}$ and the bond between $Y^{11}$ and $L^{13}$ are each a single or double bond. When $Y^{12}$ is a connecting group, the bond between $L^{11}$ and $Y^{12}$ and the bond between $Y^{12}$ and $L^{12}$ are each a single or double bond. When $Y^{13}$ is a connecting group, the bond between $L^{13}$ and $Y^{13}$ and the bond between $Y^{13}$ and $L^{14}$ are each a single or double bond. $n^{11}$ represents an integer of 0 to 4.

The compound represented by formula (II) will be described in detail below.

In formula (II), $M^{11}$ represents a metal ion. The metal ion is not particularly limited, but preferably a divalent or trivalent metal ion. The divalent or trivalent metal ion is preferably a platinum, iridium, rhenium, palladium, rhodium, ruthenium, copper, europium, gadolinium, or terbium ion, more preferably a platinum, iridium, or europium ion, still more preferably a platinum or iridium ion, and particularly preferably a platinum ion.

In formula (II), $L^{11}$, $L^{12}$, $L^{13}$, and $L^{14}$ each independently represent a moiety coordinating to $M^{11}$. The atom coordinating to $M^{11}$ contained in $L^{11}$, $L^{12}$, $L^{13}$, or $L^{14}$ is preferably a nitrogen, oxygen, sulfur, or carbon atom, and more preferably a nitrogen, oxygen, or carbon atom.

The bonds between $M^{11}$ and $L^{11}$, between $M^{11}$ and $L^{12}$, between $M^{11}$ and $L^{13}$, between $M^{11}$ and $L^{14}$ each may be independently selected from a covalent bond, an ionic bond, and a coordination bond. In this specification, the terms "ligand" and "coordinate" are used also when the bond between the central metal and the ligand is a bond (an ionic bond or a covalent bond) other than a coordination bond, as well as when the bond between the central metal and the ligand is a coordination bond, for convenience of the explanation.

The entire ligand comprising $L^{11}$, $Y^{12}$, $L^{12}$, $Y^{11}$, $L^{13}$, $Y^{13}$, and $L^{14}$ is preferably an anionic ligand. The term "anionic ligand" used herein refers to a ligand having at least one anion bonded to the metal. The number of anions in the anionic ligand is preferably 1 to 3, more preferably 1 or 2, and still more preferably 2.

When the moiety represented by any of $L^{11}$, $L^{12}$, $L^{13}$, and $L^{14}$ coordinates to $M^{11}$ via a carbon atom, the moiety is not particularly limited, and examples thereof include imino ligands, aromatic carbon ring ligands (e.g., a benzene ligand, a naphthalene ligand, an anthracene ligand, and a phenanthrene ligand), and heterocyclic ligands [e.g., a thiophene ligand, a pyridine ligand, a pyrazine ligand, a pyrimidine ligand, a thiazole ligand, an oxazole ligand, a pyrrole ligand, an imidazole ligand, and a pyrazole ligand, ring-condensation products thereof (e.g., a quinoline ligand and a benzothiazole ligand), and tautomers thereof].

When the moiety represented by any of $L^{11}$, $L^{12}$, $L^{13}$, and $L^{14}$ coordinates to $M^{11}$ via a nitrogen atom, the moiety is not particularly limited, and examples thereof include nitrogen-containing heterocyclic ligands such as a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, and a thiadiazole ligand, and ring-condensation products thereof (e.g., a quinoline ligand, a benzoxazole ligand, and a benzimidazole ligand), and tautomers thereof [in the invention, the following ligands (pyrrole tautomers) are also included in tautomers, in addition to normal isomers: the five-membered heterocyclic ligand of compound (24), the terminal five-membered heterocyclic ligand of compound (64), and the five-membered heterocyclic ring ligand of compound (145), the compounds (24), (64), (145) being shown below as typical examples of the compound represented by formula (II)]; amino ligands such as alkylamino ligands (preferably having 2 to 30 carbon atoms, more preferably 2 to 20 carbon atoms, and particularly preferably 2 to 10 carbon atoms, such as methylamino), arylamino ligands (e.g., and phenylamino), acylamino ligands (preferably having 2 to 30 carbon atoms, more preferably 2 to 20 carbon atoms, and particularly preferably 2 to 10 carbon atoms, such as acetylamino and benzoylamino), alkoxycarbonylamino ligands (preferably having 2 to 30 carbon atoms, more preferably 2 to 20 carbon atoms, and particularly preferably 2 to 12 carbon atoms, such as methoxycarbonylamino), aryloxycarbonylamino ligands (preferably having 7 to 30 carbon atoms, more preferably 7 to 20 carbon atoms, and particularly preferably 7 to 12 carbon atoms, such as phenyloxycarbonylamino), sulfonylamino ligands (preferably having 1 to 30 carbon atoms, more preferably 1 to 20 carbon atoms, and particularly preferably 1 to 12 carbon atoms, such as methanesulfonylamino and benzenesulfonylamino), and imino ligands. These ligands may be substituted.

When the moiety represented by any of $L^{11}$, $L^{12}$, $L^{13}$, and $L^{14}$ coordinates to $M^{11}$ via an oxygen atom, the moiety is not particularly limited, and examples thereof include alkoxy ligands (preferably having 1 to 30 carbon atoms, more preferably 1 to 20 carbon atoms, and particularly preferably 1 to 10 carbon atoms, such as methoxy, ethoxy, butoxy, and 2-ethylhexyloxy), aryloxy ligands (preferably having 6 to 30 carbon atoms, more preferably 6 to 20 carbon atoms, and particularly preferably 6 to 12 carbon atoms, such as phenyloxy, 1-naphthyloxy, and 2-naphthyloxy), heterocyclic oxy ligands (preferably having 1 to 30 carbon atoms, more preferably 1 to 20 carbon atoms, and particularly preferably 1 to 12 carbon atoms, such as pyridyloxy, pyrazyloxy, pyrimidyloxy, and quinolyloxy), acyloxy ligands (preferably having 2 to 30 carbon atoms, more preferably 2 to 20 carbon atoms, and particularly preferably 2 to 10 carbon atoms, such as acetoxy and benzoyloxy), silyloxy ligands (preferably having 3 to 40 carbon atoms, more preferably 3 to 30 carbon atoms, and particularly preferably 3 to 24 carbon atoms, such as trimethylsilyloxy and triphenylsilyloxy), carbonyl ligands (e.g., ketone ligands, ester ligands, and amido ligands), and ether ligands (e.g., dialkylether ligands, diarylether ligands, and furyl ligands).

When the moiety represented by any of $L^{11}$, $L^{12}$, $L^{13}$, and $L^{14}$ coordinates to $M^{11}$ via a sulfur atom, the moiety is not particularly limited, and examples thereof include alkylthio ligands (preferably having 1 to 30 carbon atoms, more preferably 1 to 20 carbon atoms, and particularly preferably 1 to 12 carbon atoms, such as methylthio and ethylthio), arylthio ligands (preferably having 6 to 30 carbon atoms, more preferably 6 to 20 carbon atoms, and particularly preferably 6 to 12 carbon atoms, such as phenylthio), heterocyclic thio ligands (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, and 2-benzothiazolylthio), thiocarbonyl ligands (e.g., thioketone ligands and thioester ligands), and thioether ligands (e.g., dialkylthioether ligands, diarylthioether ligands, and thiofuryl ligands). These substituted ligands may themselves be substituted.

In a preferable embodiment, $L^{11}$ and $L^{14}$ each independently represent a moiety selected from an aromatic carbon ring ligand, an alkyloxy ligand, an aryloxy ligand, an ether ligand, an alkylthio ligand, an arylthio ligand, an alkylamino ligand, an arylamino ligand, an acylamino ligand, or a nitrogen-containing heterocyclic ligand [e.g., a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, or a condensed ring ligand containing one or more of the above ligands (e.g., a quinoline ligand, a benzoxazole ligand, or a benzimidazole ligand), or a tautomer of any of the above ligands]; more preferably, an aromatic carbon ring ligand, an aryloxy ligand, an arylthio ligand, an arylamino ligand, a pyridine ligand, a pyrazine ligand, an imidazole ligand, a condensed ring ligand containing one or more of the above ligands (e.g., a quinoline ligand, a quinoxaline ligand, or a benzimidazole ligand), or a tautomer of any of the above ligands; still more preferably, an aromatic carbon ring ligand or an aryloxy ligand, an arylthio ligand, or an arylamino ligand; and particularly preferably, an aromatic carbon ring ligand or an aryloxy ligand.

In a preferable embodiment, $L^{12}$ and $L^{13}$ each independently represent a moiety forming a coordination bond with $M^{11}$. The moiety forming a coordination bond with $M^{11}$ is preferably a pyridine, pyrazine, pyrimidine, triazine, thiazole, oxazole, pyrrole or triazole ring, a condensed ring containing one or more of the above rings (e.g., a quinoline ring, a benzoxazole ring, a benzimidazole ring, an indolenine ring), or a tautomer of any of the above rings; more preferably a pyridine, pyrazine, pyrimidine, or pyrrole ring, a condensed ring containing one or more of the above rings (e.g., a quinoline ring, a benzopyrrole ring), or a tautomer of any of the above rings; still more preferably a pyridine, pyrazine or pyrimidine ring, or a condensed ring containing one or more of the above rings (e.g., quinoline ring); particularly preferably a pyridine ring or a condensed ring containing a pyridine ring (e.g., a quinoline ring).

In formula (II), $L^{15}$ represents a ligand coordinating to $M^{11}$. $L^{15}$ is preferably a monodentate to quadridentate ligand and more preferably a monodentate to quadridentate anionic ligand. The monodentate to quadridentate anionic ligand is not particularly limited, but is preferably a halogen ligand, a 1,3-diketone ligand (e.g., an acetylacetone ligand), a monoanionic bidentate ligand containing a pyridine ligand [e.g., a picolinic acid ligand or a 2-(2-hydroxyphenyl)-pyridine ligand], or a quadridentate ligand $L^{11}$, $Y^{12}$, $L^{12}$, $Y^{11}$, $L^{13}$, $Y^{13}$, and $L^{14}$ can form; more preferably, a 1,3-diketone ligand (e.g., an acetylacetone ligand), a monoanionic bidentate ligand containing a pyridine ligand [e.g., a picolinic acid ligand or a 2-(2-hydroxyphenyl)-pyridine ligand], or a quadridentate ligand $L^{11}$, $Y^{12}$, $L^{12}$, $Y^{11}$, $L^{13}$, $Y^{13}$, and $L^{14}$ can form; still more preferably, a 1,3-diketone ligand (e.g., an acetylacetone ligand) or a monoanionic bidentate ligand containing a pyridine ligand [e.g., a picolinic acid ligand or a 2-(2-hydroxyphenyl)-pyridine ligand]; and particularly preferably, a 1,3-diketone ligand (e.g., an acetylacetone ligand). The number of coordination sites and the number of ligands do not exceed the valency of the metal. $L^{15}$ does not bind to both $L^{11}$ and $L^{14}$ to form a cyclic ligand.

In formula (II), $Y^{11}$, $Y^{12}$ and $Y^{13}$ each independently represent a connecting group or a single or double bond. The connecting group is not particularly limited, and examples thereof include a carbonyl connecting group, a thiocarbonyl connecting group, an alkylene group, an alkenylene group, an arylene group, a heteroarylene group, an oxygen atom connecting group, a nitrogen atom connecting group, and a silicon atom connecting group, and connecting groups comprising combinations of connecting groups selected from the above. When $Y^{11}$ is a connecting group, the bond between $L^{12}$ and $Y^{11}$ and the bond between $Y^{11}$ and $L^{13}$ are each independently a single or double bond. When $Y^{12}$ is a connecting group, the bond between $L^{11}$ and $Y^{12}$ and the bond between $Y^{12}$ and $L^{12}$ are each independently a single or double bond. When $Y^{13}$ is a connecting group, the bond between $L^{13}$ and $Y^{13}$ and the bond between $Y^{13}$ and $L^{14}$ are each independently a single or double bond.

Preferably, $Y^{11}$, $Y^{12}$, and $Y^{13}$ each independently represent a single bond, a double bond, a carbonyl connecting group, an alkylene connecting group, or an alkenylene group. $Y^{11}$ is more preferably a single bond or an alkylene group, and still more preferably an alkylene group. Each of $Y^{12}$ and $Y^{13}$ is more preferably a single bond or an alkenylene group and still more preferably a single bond.

The ring formed by $Y^{12}$, $L^{11}$, $L^{12}$, and $M^{11}$, the ring formed by $Y^{11}$, $L^{12}$, $L^{13}$, and $M^{11}$, and the ring formed by $Y^{13}$, $L^{13}$, $L^{14}$, and $M^{11}$ are each preferably a four- to ten-membered ring, more preferably a five- to seven-membered ring, and still more preferably a five- to six-membered ring.

In formula (II), $n^{11}$ represents an integer of 0 to 4. When $M^{11}$ is a tetravalent metal, $n^{11}$ is 0, but when $M^{11}$ is a hexavalent metal, $n^{11}$ is preferably 1 or 2 and more preferably 1. When $M^{11}$ is a hexavalent metal and $n^{11}$ is 1, $L^{15}$ represents a bidentate ligand. When $M^{11}$ is a hexavalent metal and $n^{11}$ is 2, $L^{15}$ represents a monodentate ligand. When $M^{11}$ is an octavalent metal, $n^{11}$ is preferably 1 to 4, more preferably, 1 or 2, and still more preferably 1. When $M^{11}$ is an octavalent metal and $n^{11}$ is 1, $L^{15}$ represents a quadridentate ligand. When $M^{11}$ is an octavalent metal and $n^{11}$ is 2, $L^{15}$ represents a bidentate ligand. When $n^{11}$ is 2 or larger, there are plural $L^{15}$'s, and the $L^{15}$'s may be the same as or different from each other.

The compound represented by formula (III) will be described below.

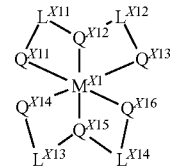

Formula (III)

In formula (III), $M^{X1}$ represents a metal ion. $Q^{X11}$ to $Q^{X16}$ each represent an atom coordinating to $M^{X1}$ or an atomic group containing an atom coordinating to $M^{X1}$. $L^{X11}$ to $L^{X14}$ each represent a single or double bond or a connecting group.

In formula (III), the atomic group comprising $Q^{X11}$-$L^{X11}$-$Q^{X12}$-$L^{X12}$-$Q^{X13}$ and the atomic group comprising $Q^{X14}$-$L^{X13}$-$Q^{X15}$-$L^{X14}$-$Q^{X16}$ each form a tridentate ligand.

In addition, the bond between $M^{X1}$ and each of $Q^{X11}$ to $Q^{X16}$ may be a coordination bond or a covalent bond.

The compound represented by formula (III) will be described in detail below.

In formula (III), $M^{X1}$ represents a metal ion. The metal ion is not particularly limited, but is preferably a monovalent to trivalent metal ion, more preferably a divalent or trivalent metal ion, and still more preferably a trivalent metal ion. Specifically, platinum, iridium, rhenium, palladium, rhodium, ruthenium, copper, europium, gadolinium, and terbium ions are preferable; iridium and europium ions are more preferable; and an iridium ion is still more preferable.

$Q^{X11}$ to $Q^{X16}$ each represent an atom coordinating to $M^{X1}$ or an atomic group containing an atom coordinating to $M^{X1}$.

When any of $Q^{X11}$ to $Q^{X16}$ is an atom coordinating to $M^{X1}$, the atom may be, for example, a carbon, nitrogen, oxygen, silicon, phosphorus, or sulfur atom, preferably a nitrogen, oxygen, sulfur, or phosphorus atom; and more preferably a nitrogen or oxygen atom.

When any of $Q^{X11}$ to $Q^{X16}$ is an atomic group containing a carbon atom coordinating to $M^{X1}$, examples of the atomic group coordinating to $M^{X1}$ via a carbon atom include imino groups, aromatic hydrocarbon ring groups (such as benzene and naphthalene), heterocyclic groups (such as thiophene, pyridine, pyrazine, pyrimidine, pyridazine, triazine, thiazole, oxazole, pyrrole, imidazole, pyrazole, and triazole), condensed rings containing one or more of the above rings, and tautomers thereof.

When any of $Q^{X11}$ to $Q^{X16}$ is an atomic group containing a nitrogen atom coordinating to $M^{X1}$, examples of the atomic group coordinating to $M^{X1}$ via a nitrogen atom include nitrogen-containing heterocyclic groups (such as pyridine, pyrazine, pyrimidine, pyridazine, triazine, thiazole, oxazole, pyrrole, imidazole, pyrazole, and triazole), amino groups [alkylamino groups (preferably having 2 to 30 carbon atoms, more preferably 2 to 20 carbon atoms, and particularly preferably 2 to 10 carbon atoms, such as methylamino) and arylamino groups (e.g., phenylamino)], acylamino groups (preferably having 2 to 30 carbon atoms, more preferably 2 to 20 carbon atoms, and particularly preferably 2 to 10 carbon atoms, such as acetylamino and benzoylamino), alkoxycarbonylamino groups (preferably having 2 to 30 carbon atoms, more preferably 2 to 20 carbon atoms, and particularly preferably 2 to 12 carbon atoms, such as methoxycarbonylamino), aryloxycarbonylamino groups (preferably having 7 to 30 carbon atoms, more preferably 7 to 20 carbon atoms, and particularly preferably 7 to 12 carbon atoms, such as phenyloxycarbonylamino), sulfonylamino groups (preferably having 1 to 30 carbon atoms, more preferably 1 to 20 carbon atoms, and particularly preferably 1 to 12 carbon atoms, such as methanesulfonylamino and benzenesulfonylamino), and imino groups. These groups may be substituted.

When any of $Q^{X11}$ to $Q^{X16}$ is an atomic group containing an oxygen atom coordinating to $M^{X1}$, examples of the atomic groups coordinating to $M^{X1}$ via an oxygen atom include alkoxy groups (preferably having 1 to 30 carbon atoms, more preferably 1 to 20 carbon atoms, and particularly preferably 1 to 10 carbon atoms, such as methoxy, ethoxy, butoxy, and 2-ethylhexyloxy), aryloxy groups (preferably having 6 to 30 carbon atoms, more preferably 6 to 20 carbon atoms, and particularly preferably 6 to 12 carbon atoms, such as phenyloxy, 1-naphthyloxy, and 2-naphthyloxy), heterocyclic oxy groups (preferably having 1 to 30 carbon atoms, more preferably 1 to 20 carbon atoms, and particularly preferably 1 to 12 carbon atoms, such as pyridyloxy, pyrazyloxy, pyrimidyloxy, and quinolyloxy), acyloxy groups (preferably having 2 to 30 carbon atoms, more preferably 2 to 20 carbon atoms, and particularly preferably 2 to 10 carbon atoms, such as acetoxy and benzoyloxy), silyloxy groups (preferably having 3 to 40 carbon atoms, more preferably 3 to 30 carbon atoms, and particularly preferably 3 to 24 carbon atoms, such as trimethylsilyloxy and triphenylsilyloxy), carbonyl groups (e.g., ketone groups, ester groups, and amido groups), and ether groups (e.g., dialkylether groups, diarylether groups, and furyl groups).

When any of $Q^{X11}$ to $Q^{X16}$ is an atomic group containing a silicon atom coordinating to $M^{X1}$, examples of the atomic group coordinating to $M^{X1}$ via a silicon atom include alkylsilyl groups (preferably having 3 to 30 carbon atoms, such as a trimethylsilyl group), and arylsilyl groups (preferably, having 18 to 30 carbon atoms, such as a triphenylsilyl group). These groups may be substituted.

When any of $Q^{X11}$ to $Q^{X16}$ is an atomic group containing a sulfur atom coordinating to $M^{X1}$, examples of the atomic group coordinating to $M^{X1}$ via a sulfur atom include alkylthio groups (preferably having 1 to 30 carbon atoms, more preferably 1 to 20 carbon atoms, and particularly preferably 1 to 12 carbon atoms, such as methylthio and ethylthio), arylthio groups (preferably having 6 to 30 carbon atoms, more preferably 6 to 20 carbon atoms, and particularly preferably 6 to 12 carbon atoms, such as phenylthio), heterocyclic thio groups (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, and 2-benzothiazolylthio), thiocarbonyl groups (e.g., a thioketone group and a thioester group), and thioether groups (e.g., a dialkylthioether group, a diarylthioether group, and a thiofuryl group).

When any of $Q^{X11}$ to $Q^{X16}$ is an atomic group containing a phosphorus atom coordinating to $M^{X1}$, examples of the atomic group coordinating to $M^{X1}$ via a phosphorus atom include dialkylphosphino groups, diarylphosphino groups, trialkyl phosphines, triaryl phosphines, and phosphinine groups. These groups may be substituted.

The atomic groups represented by $Q^{X11}$ to $Q^{X16}$ are each preferably an aromatic hydrocarbon ring group containing a carbon atom coordinating to $M^{X1}$, an aromatic heterocyclic group containing a carbon atom coordinating to $M^{X1}$, a nitrogen-containing aromatic heterocyclic group containing a nitrogen atom coordinating to $M^{X1}$, an alkyloxy group, an aryloxy group, an alkylthio group, an arylthio group, or an dialkylphosphino group, and more preferably an aromatic hydrocarbon ring group containing a carbon atom coordinating to $M^{X1}$, an aromatic heterocyclic group containing a carbon atom coordinating to $M^{X1}$, or a nitrogen-containing aromatic heterocyclic group containing a nitrogen atom coordinating to $M^{X1}$.

The bond between $M^{X1}$ and each of $Q^{X11}$ to $Q^{X16}$ may be a coordination bond or a covalent bond.

In formula (III), $L^{X11}$ to $L^{X14}$ each represent a single or double bond or a connecting group. The connecting group is not particularly limited, but preferably a connecting group containing one or more atoms selected from carbon, nitrogen, oxygen, sulfur, and silicon. Examples of the connecting group are shown below.

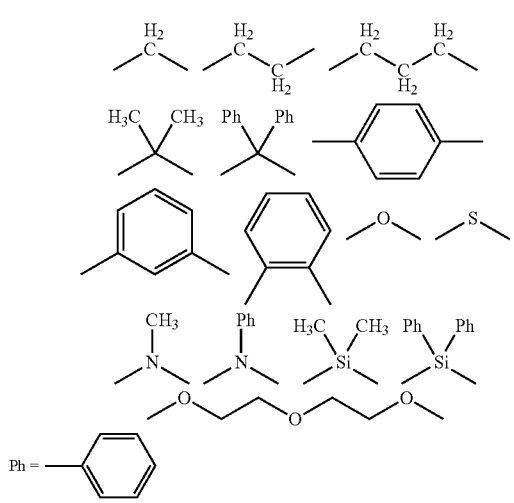

These connecting groups may be substituted, and the substituent may be selected from the examples of the substituents represented by $R^{21}$ to $R^{24}$ in the following formula (2), and the preferable range thereof is also the same as in formula (2). $L^{X11}$ to $L^{X14}$ are each preferably a single bond, a dimethylmethylene group, or a dimethylsilylene group.

Preferable examples of the compound represented by formula (II) are compounds represented by formulae (1), (2), (3), and (4) described below.

The compound represented by formula (1) is described first.

Formula (I)

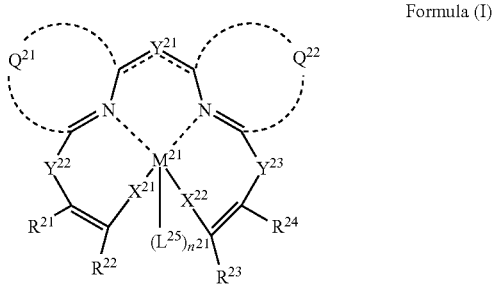

In formula (1), $M^{21}$ represents a metal ion; and $Y^{21}$ represents a connecting group or a single or double bond. $Y^{22}$ and $Y^{23}$ each represent a single bond or a connecting group. $Q^{21}$ and $Q^{22}$ each represent an atomic group forming a nitrogen-containing heterocyclic ring, and the bond between $Y^{21}$ and the ring containing $Q^{21}$ and the bond between $Y^{21}$ and the ring containing $Q^{22}$ are each a single or double bond. $X^{21}$ and $X^{22}$ each independently represent an oxygen atom, a sulfur atom, or a substituted or unsubstituted nitrogen atom. $R^{21}$, $R^{22}$, $R^{23}$, and $R^{24}$ each independently represent a hydrogen atom or a substituent. $R^{21}$ and $R^{22}$ may bind to each other to form a ring, and $R^{23}$ and $R^{24}$ may bind to each other to form a ring. $L^{25}$ represents a ligand coordinating to $M^{21}$, and $n^{21}$ represents an integer of 0 to 4.

The compound represented by formula (1) will be described in detail.

In formula (1), the definition of $M^{21}$ is the same as the definition of $M^{11}$ in formula (II), and their preferable ranges are also the same.

$Q^{21}$ and $Q^{22}$ each independently represent an atomic group forming a nitrogen-containing heterocyclic ring (ring containing a nitrogen atom coordinating to $M^{21}$). The nitrogen-containing heterocyclic rings formed by $Q^{21}$ and $Q^{22}$ are not particularly limited, and may be selected, for example from pyridine, pyrazine, pyrimidine, triazine, thiazole, oxazole, pyrrole, and triazole rings, condensed rings containing one or more of the above rings (e.g., quinoline, benzoxazole, benzimidazole, and indolenine rings), and tautomers thereof.

The nitrogen-containing heterocyclic rings formed by $Q^{21}$ and $Q^{22}$ are preferably selected from pyridine, pyrazine, pyrimidine, pyridazine, triazine, pyrazole, imidazole, oxazole, pyrrole, and benzazole rings, condensed rings containing one or more of the above rings (e.g., quinoline, benzoxazole, and benzimidazole rings) and tautomers thereof; more preferably from pyridine, pyrazine, pyrimidine, imidazole, and pyrrole rings, condensed rings containing one or more of the above rings (e.g., a quinoline ring), and tautomers thereof; still more preferably from a pyridine ring and condensed rings containing a pyridine ring (e.g., quinoline ring); particularly preferably from a pyridine ring.

$X^{21}$ and $X^{22}$ each independently represent an oxygen atom, a sulfur atom, or a substituted or unsubstituted nitrogen atom. $X^{21}$ and $X^{22}$ are each preferably an oxygen atom, a sulfur atom, or a substituted nitrogen atom, more preferably an oxygen or sulfur atom, and particularly preferably an oxygen atom.

The definition of $Y^{21}$ is the same as that of $Y^{11}$ in formula (II), and their preferable ranges are also the same.

$Y^{22}$ and $Y^{23}$ each independently represent a single bond or a connecting group, preferably a single bond. The connecting group is not particularly limited, and examples thereof include a carbonyl connecting group, a thiocarbonyl connecting group, an alkylene group, an alkenylene group, an arylene group, a heteroarylene group, an oxygen atom connecting group, a nitrogen atom connecting group, and connecting groups comprising combinations of connecting groups selected from the above.

The connecting group represented by $Y^{22}$ or $Y^{23}$ is preferably a carbonyl, alkylene, or $Y^{22}$ alkenylene connecting group, more preferably a carbonyl or alkenylene connecting group, and still more preferably a carbonyl connecting group.

$R^{21}$, $R^{22}$, $R^{23}$, and $R^{24}$ each independently represent a hydrogen atom or a substituent. The substituent is not particularly limited, and examples thereof include alkyl groups (preferably having 1 to 30 carbon atoms, more preferably 1 to 20 carbon atoms, and particularly preferably 1 to 10 carbon atoms, such as methyl, ethyl, iso-propyl, tert-butyl, n-octyl, n-decyl, n-hexadecyl, cyclopropyl, cyclopentyl, and cyclohexyl), alkenyl groups (preferably having 2 to 30 carbon atoms, more preferably 2 to 20 carbon atoms, and particularly preferably 2 to 10 carbon atoms, such as vinyl, allyl, 2-butenyl, and 3-pentenyl), alkynyl groups (preferably having 2 to 30 carbon atoms, more preferably 2 to 20 carbon atoms, and particularly preferably 2 to 10 carbon atoms, such as propargyl and 3-pentynyl), aryl groups (preferably having 6 to 30 carbon atoms, more preferably 6 to 20 carbon atoms, and particularly preferably 6 to 12 carbon atoms, such as phenyl, p-methylphenyl, naphthyl, and anthranyl), amino groups (preferably having 0 to 30 carbon atoms, more preferably 0 to 20 carbon atoms, and particularly preferably 0 to 10 carbon atoms, such as amino, methylamino, dimethylamino, diethylamino, dibenzylamino, diphenylamino, and ditolylamino), alkoxy groups (preferably having 1 to 30 carbon atoms, more preferably 1 to 20 carbon atoms, and particularly preferably 1 to 10 carbon atoms, such as methoxy, ethoxy, butoxy, and 2-ethylhexyloxy), aryloxy groups (preferably having 6 to 30 carbon atoms, more preferably 6 to 20 carbon atoms, and particularly preferably 6 to 12 carbon atoms, such as phenyloxy, 1-naphthyloxy, and 2-naphthyloxy), heterocyclic oxy groups (preferably having 1 to 30 carbon atoms, more preferably 1 to 20 carbon atoms, and particularly preferably 1 to 12 carbon atoms, such as pyridyloxy, pyrazyloxy, pyrimidyloxy, and quinolyloxy), acyl groups (preferably having 1 to 30 carbon atoms, more preferably 1 to 20 carbon atoms, and particularly preferably 1 to 12 carbon atoms, such as acetyl, benzoyl, formyl, and pivaloyl), alkoxycarbonyl groups (preferably having 2 to 30 carbon atoms, more preferably 2 to 20 carbon atoms, and particularly preferably 2 to 12 carbon atoms, such as methoxycarbonyl and ethoxycarbonyl), aryloxycarbonyl groups (preferably having 7 to 30 carbon atoms, more preferably 7 to 20 carbon atoms, and particularly preferably 7 to 12 carbon atoms, such as phenyloxycarbonyl), acyloxy groups (preferably having 2 to 30 carbon atoms, more preferably 2 to 20 carbon atoms, and particularly preferably 2 to 10 carbon atoms, such as acetoxy and benzoyloxy), acylamino groups (preferably having 2 to 30 carbon atoms, more preferably 2 to 20 carbon atoms, and particularly preferably 2 to 10 carbon atoms, such as acetylamino and benzoylamino), alkoxycarbonylamino groups (preferably having 2 to 30 carbon atoms, more preferably 2 to 20 carbon atoms, and particularly preferably 2 to 12 carbon atoms, such as methoxycarbonylamino), aryloxycarbonylamino groups (preferably having 7 to 30 carbon atoms, more preferably 7 to 20 carbon atoms, and particularly preferably 7 to 12 carbon atoms, such as phenyloxycarbonylamino), sulfonylamino groups (preferably having 1 to 30 carbon atoms, more preferably 1 to 20 carbon atoms, and particularly preferably 1 to 12 carbon atoms, such as methanesulfonylamino and benzenesulfonylamino), sulfamoyl groups (preferably having 0 to 30 carbon atoms, more preferably 0 to 20 carbon atoms, and particularly preferably 0 to 12 carbon atoms, such as sulfamoyl, methylsulfamoyl, dimethylsulfamoyl, and phenylsulfamoyl), carbamoyl groups (preferably having 1 to 30 carbon atoms, more preferably 1 to 20 carbon atoms, and particularly preferably 1 to 12 carbon atoms, such as carbamoyl, methylcarbamoyl, diethylcarbamoyl, and phenylcarbamoyl), alkylthio groups (preferably having 1 to 30 carbon atoms, more preferably 1 to 20 carbon atoms, and particularly preferably 1 to 12 carbon atoms, such as methylthio and ethylthio), arylthio groups (preferably having 6 to 30 carbon atoms, more preferably 6 to 20 carbon atoms, and particularly preferably 6 to 12 carbon atoms, such as phenylthio), heterocyclic thio groups (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, and 2-benzothiazolylthio), sulfonyl groups (preferably having 1 to 30 carbon atoms, more preferably 1 to 20 carbon atoms, and particularly preferably 1 to 12 carbon atoms, such as mesyl and tosyl), sulfinyl groups (preferably having 1 to 30 carbon atoms, more preferably 1 to 20 carbon atoms, and particularly preferably 1 to 12 carbon atoms, such as methanesulfinyl and benzenesulfinyl), ureido groups (preferably having 1 to 30 carbon atoms, more preferably 1 to 20 carbon atoms, and particularly preferably 1 to 12 carbon atoms, such as ureido, methylureido, and phenylureido), phosphoric amide groups (preferably having 1 to 30 carbon atoms, more preferably 1 to 20 carbon atoms, and particularly preferably 1 to 12 carbon atoms, such as diethylphosphoric amide and phenylphosphoric amide), a hydroxy group, a mercapto group, halogen atoms (e.g., fluorine, chlorine, bromine, and iodine), a cyano group, a sulfo group, a carboxyl group, a nitro group, a hydroxamic acid group, sulfino groups, hydrazino groups, imino groups, heterocyclic groups (preferably having 1 to 30 carbon atoms and more preferably 1 to 12 carbon atoms; the heteroatom(s) may be selected from nitrogen, oxygen, and sulfur atoms), such as imidazolyl, pyridyl, quinolyl, furyl, thienyl, piperidyl, morpholino, benzoxazolyl, benzimidazolyl, benzothiazolyl, carbazolyl, and azepinyl, silyl groups (preferably having 3 to 40 carbon atoms, more preferably 3 to 30 carbon atoms, and particularly preferably 3 to 24 carbon atoms, such as trimethylsilyl and triphenylsilyl), and silyloxy groups (preferably having 3 to 40 carbon atoms, more preferably 3 to 30 carbon atoms, and particularly preferably 3 to 24 carbon atoms, such as trimethylsilyloxy and triphenylsilyloxy). These substituents may be substituted.

In a preferable embodiment, $R^{21}$, $R^{22}$, $R^{23}$, and $R^{24}$ are each independently selected from alkyl groups or aryl groups. In another preferable embodiment, $R^{21}$ and $R^{22}$ are groups that bind to each other to form a ring structure (e.g., a benzo-condensed ring or a pyridine-condensed ring), and/or $R^{23}$ and $R^{24}$ are groups that bind to each other to form a ring structure or ring structures (e.g., a benzo-condensed ring or a pyridine-condensed ring). In a more preferable embodiment, $R^{21}$ and $R^{22}$ are groups that bind to each other to form a ring structure (e.g., a benzo-condensed ring or a pyridine-condensed ring), and/or $R^{23}$ and $R^{24}$ are groups that bind to each other to form a ring structure or ring structures (e.g., a benzo-condensed ring or a pyridine-condensed ring).

The definition of $L^{25}$ is the same as that of $L^{15}$ in formula (II), and their preferable ranges are also the same.

The definition of $n^{21}$ is the same as that of $n^{11}$ in formula (II), and their preferable ranges are also the same.

In formula (1), examples of preferable embodiments are described below:

(1) the rings formed by $Q^{21}$ and $Q^{22}$ are pyridine rings, $Y^{21}$ is a connecting group;

(2) the rings formed by $Q^{21}$ and $Q^{22}$ are pyridine rings, $Y^{21}$ is a single or double bond, and $X^{21}$ and $X^{22}$ are selected from sulfur atoms, substituted nitrogen atoms, and unsubstituted nitrogen atom;

(3) the rings formed by $Q^{21}$ and $Q^{22}$ are each a five-membered nitrogen-containing heterocyclic ring, or a nitrogen-containing six-membered ring containing two or more nitrogen atoms.

Preferable examples of compounds represented by formula (1) are compounds represented by the following formula (1-A).

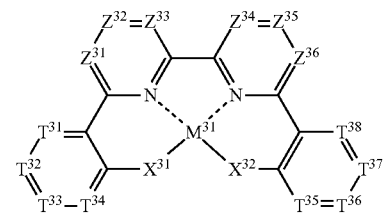

Formula (1-A)

The compound represented by formula (1-A) will be described below.

In formula (1-A), the definition of $M^{31}$ is the same as that of $M^{11}$ in formula (II), and their preferable ranges are also the same.

$Z^{31}$, $Z^{32}$, $Z^{33}$, $Z^{34}$, $Z^{35}$, and $Z^{36}$ each independently represent a substituted or unsubstituted carbon or nitrogen atom, and preferably a substituted or unsubstituted carbon atom. The substituent on the carbon may be selected from the substituents described as examples of $R^{21}$ in formula (1). $Z^{31}$ and $Z^{32}$ may be bonded to each other via a connecting group to form a condensed ring (e.g., a benzo-condensed ring or a pyridine-condensed ring). $Z^{32}$ and $Z^{33}$ may be bonded to each other via a connecting group to form a condensed ring (e.g., a benzo-condensed ring or a pyridine-condensed ring). $Z^{33}$ and $Z^{34}$ may be bonded to each other via a connecting group to form a condensed ring (e.g., a benzo-condensed ring or a pyridine-condensed ring). $Z^{34}$ and $Z^{35}$ may be bonded to each other via a connecting group to form a condensed ring (e.g., a benzo-condensed ring or a pyridine-condensed ring). $Z^{35}$ and $Z^{36}$ may be bonded to each other via a connecting group to form a condensed ring (e.g., a benzo-condensed ring or a pyridine-condensed ring). $Z^{31}$ and $T^{31}$ may be bonded to each other via a connecting group to form a condensed ring (e.g., a benzo-condensed ring or a pyridine-condensed ring). $Z^{36}$ and $T^{38}$ may be bonded to each other via a connecting group to form a condensed ring (e.g., a benzo-condensed ring or a pyridine-condensed ring).

The substituent on the carbon is preferably an alkyl group, an alkoxy group, an alkylamino group, an aryl group, a group capable of forming a condensed ring (e.g., a benzo-condensed ring or a pyridine-condensed ring), or a halogen atom, more preferably an alkylamino group, an aryl group, or a group capable of forming a condensed ring (e.g., a benzo-condensed ring or a pyridine-condensed ring), still more preferably an aryl group or a group capable of forming a condensed ring (e.g., a benzo-condensed ring or a pyridine-condensed ring), and particularly preferably a group capable of forming a condensed ring (e.g., a benzo-condensed ring or a pyridine-condensed ring).

$T^{31}$, $T^{32}$, $T^{33}$, $T^{34}$, $T^{35}$, $T^{36}$, $T^{37}$, and $T^{38}$ each independently represent a substituted or unsubstituted carbon or nitrogen atom, and more preferably a substituted or unsubstituted carbon atom. Examples of the substituents on the carbon include the groups described as examples of $R^{21}$ in formula (1); $T^{31}$ and $T^{32}$ may be bonded to each other via a connecting group to form a condensed ring (e.g., a benzo-condensed ring). $T^{32}$ and $T^{33}$ may be bonded to each other via a connecting group to form a condensed ring (e.g., a benzo-condensed ring). $T^{33}$ and $T^{34}$ may be bonded to each other via a connecting group to form a condensed ring (e.g., a benzo-condensed ring). $T^{35}$ and $T^{36}$ may be bonded to each other via a connecting group to form a condensed ring (e.g., a benzo-condensed ring). $T^{36}$ and $T^{37}$ may be bonded to each other via a connecting group to form a condensed ring (e.g., a benzo-condensed ring). $T^{37}$ and $T^{33}$ may be bonded to each other via a connecting group to form a condensed ring (e.g., a benzo-condensed ring).

The substituent on the carbon is preferably an alkyl group, an alkoxy group, an alkylamino group, an aryl group, a group capable of forming a condensed ring (e.g., a benzo-condensed ring or a pyridine-condensed ring), or a halogen atom; more preferably an aryl group, a group capable of forming a condensed ring (e.g., a benzo-condensed ring or pyridine-condensed ring), or a halogen atom; still more preferably an aryl group or a halogen atom, and particularly preferably an aryl group.

The definitions and preferable ranges of $X^{31}$ and $X^{32}$ are the same as the definitions and preferable ranges of $X^{21}$ and $X^{22}$ in formula (1), respectively.

The compound represented by formula (2) will be described below.

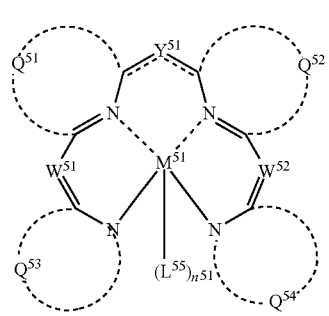

Formula (2)

In formula (2), the definition of $M^{51}$ is the same as that of $M^{11}$ in formula (II), and their preferable ranges are also the same.

The definitions of $Q^{51}$ and $Q^{52}$ are the same as the definitions of $Q^{21}$ and $Q^{22}$ in formula (1), and their preferable ranges are also the same.

$Q^{53}$ and $Q^{54}$ each independently represent a group forming a nitrogen-containing heterocyclic ring (ring containing a nitrogen coordinating to $M^{51}$). The nitrogen-containing heterocyclic rings formed by $Q^{53}$ and $Q^{54}$ are not particularly limited, and are preferably selected from tautomers of pyrrole derivatives, tautomers of imidazole derivatives (e.g., the five-membered heterocyclic ligand contained in the compound (29) shown below as a specific example of the compound represented by formula (II)), tautomers of thiazole derivatives (e.g., the five-membered heterocyclic ligand contained in the compound (30) shown below as a specific example of the compound represented by formula (H)), and tautomers of oxazole derivatives (e.g., the five-membered heterocyclic ligand contained in the compound (31) shown below as a specific example of the compound represented by formula (II)), more preferably selected from tautomers of pyrrole, imidazole, and thiazole derivatives; still more preferably selected from tautomers of pyrrole and imidazole derivatives; and particularly preferably selected from tautomers of pyrrole derivatives.

The definition of $Y^{51}$ is the same as that of $Y^{11}$ in formula (II), and their preferable range are also the same. The definition of $L^{55}$ is the same as that of $L^{15}$ in formula (II), and their preferable ranges are also the same. The definition of $n^{51}$ is the same as that of $n^{11}$ in formula (II), and their preferable ranges are also the same.

$W^{51}$ and $W^{52}$ each independently represent a substituted or unsubstituted carbon or nitrogen atom, more preferably an unsubstituted carbon or nitrogen atom, and still more preferably an unsubstituted carbon atom.

The compound represented by formula (3) will be described below.

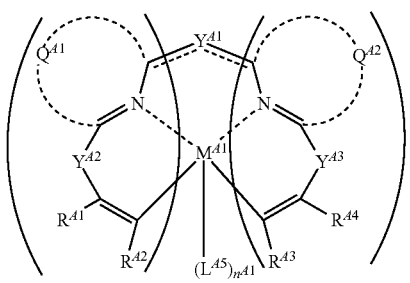

Formula (3)

In formula (3), the definitions and preferable ranges of $M^{41}$, $Q^{41}$, $Q^{42}$, $Y^{41}$, $Y^{42}$, $Y^{43}$, $R^{41}$, $R^{42}$, $R^{43}$, $R^{44}$, $L^{45}$, and $n^{41}$ are the same as the definitions and preferable ranges of $M^{21}$, $Q^{21}$, $Q^{22}$, $Y^{21}$, $Y^{22}$, $Y^{23}$, $R^{21}$, $R^{22}$, $R^{23}$, $R^{24}$, $L^{25}$, and $n^{21}$ in formula (1) respectively.

Preferable examples of compounds represented by formula (3) are compounds represented by the following formulae (3-A) and (3-B).

The compound represented by formula (3-A) will be described first.

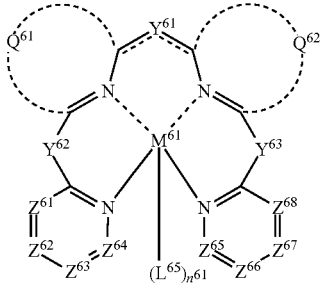

Forumla (3-A)

In formula (3-A), the definitions of $M^{61}$ is the same as that of $M^{11}$ in formula (II), and their preferable ranges are also the same.

$Q^{61}$ and $Q^{62}$ each independently represent a ring forming group. The rings formed by $Q^{61}$ and $Q^{62}$ are not particularly limited, and examples thereof include benzene, pyridine, pyridazine, pyrimidine, thiophene, isothiazole, furan, and isoxazole rings, and condensed rings thereof.

Each of the rings formed by $Q^{61}$ and $Q^{62}$ is preferably a benzene ring, a pyridine ring, a thiophene ring, a thiazole ring, or a condensed ring containing one or more of the above rings; more preferably a benzene ring, a pyridine ring, or a condensed ring containing one or more of the above rings; and still more preferably a benzene or a condensed ring containing a benzene ring.

The definition of $Y^{61}$ is the same as that of $Y^{11}$ in formula (II), and their preferable ranges are also the same.

$Y^{62}$ and $Y^{63}$ each independently represent a connecting group or a single bond. The connecting group is not particularly limited, and examples thereof include a carbonyl connecting group, a thiocarbonyl connecting group, alkylene groups, alkenylene groups, arylene groups, heteroarylene groups, an oxygen atom connecting groups, a nitrogen atom connecting groups, and connecting groups comprising combinations of connecting groups selected from the above.

$Y^{62}$ and $Y^{63}$ are each independently selected, preferably from a single bond, a carbonyl connecting group, an alkylene connecting group, and an alkenylene group, more preferably from a single bond and an alkenylene group, and still more preferably from a single bond.

The definition of $L^{65}$ is the same as that of $L^{15}$ in formula (H), and their preferable ranges are also the same. The definition of $n^{61}$ is the same as the definition of $n^{11}$ in formula (II), and their preferable ranges are also the same.

$Z^{61}$, $Z^{62}$, $Z^{63}$, $Z^{64}$, $Z^{65}$, $Z^{66}$, and $Z^{68}$ each independently represent a substituted or unsubstituted carbon or nitrogen atom, and preferably a substituted or unsubstituted carbon atom. Examples of the substituent on the carbon include the groups described as examples of $R^{21}$ in formula (1). $Z^{61}$ and $Z^{62}$ may be bonded to each other via a connecting group to form a condensed ring (e.g., a benzo-condensed ring or a pyridine-condensed ring) $Z^{62}$ and $Z^{63}$ may be bonded to each other via a connecting group to form a condensed ring (e.g., a benzo-condensed ring or a pyridine-condensed ring). $Z^{63}$ and $Z^{64}$ may be bonded to each other via a connecting group to form a condensed ring (e.g., a benzo-condensed ring or a pyridine-condensed ring). $Z^{65}$ and $Z^{66}$ may be bonded to each other via a connecting group to form a condensed ring (e.g., a benzo-condensed ring or a pyridine-condensed ring). $Z^{66}$ and $Z^{67}$ may be bonded to each other via a connecting group to form a condensed ring (e.g., a benzo-condensed ring or a pyridine-condensed ring). $Z^{67}$ and $Z^{68}$ may be bonded to each other via a connecting group to form a condensed ring (e.g., a benzo-condensed ring or a pyridine-condensed ring). The ring formed by $Q^{61}$ may be bonded to $Z^{61}$ via a connecting group to form a ring. The ring formed by $Q^{62}$ may be bonded to $Z^{68}$ via a connecting group to form a ring.

The substituent on the carbon is preferably an alkyl group, an alkoxy group, an alkylamino group, an aryl group, a group capable of forming a condensed ring (e.g., benzo-condensed ring or pyridine-condensed ring), or a halogen atom, more preferably an alkylamino group, an aryl group, or a group capable of forming a condensed ring (e.g., benzo-condensed ring or pyridine-condensed ring), still more preferably an aryl group or a group capable of forming a condensed ring (e.g., benzo-condensed ring or pyridine-condensed ring), and particularly preferably a group capable of forming a condensed ring (e.g., benzo-condensed ring or pyridine-condensed ring).

The compound represented by formula (3-B) will be described below.

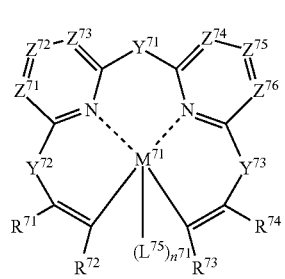

Formula (3-B)

In formula (3-B), the definition of $M^{71}$ is the same as the definition of $M^{11}$ in formula (H), and their preferable ranges are also the same.

The definitions and preferable ranges of $Y^{71}$, $Y^{72}$, and $Y^{73}$ are the same as the definition and preferable range of $Y^{61}$, $Y^{62}$, and $Y^{63}$ in formula (3-A). $Y^{71}$, $Y^{72}$, and $Y^{73}$ may be the same as each other or different from each other.

The definition of $L^{75}$ is the same as that of $L^{15}$ in formula (H), and their preferable ranges are also the same.

The definition of $n^{71}$ is the same as that of $n^{11}$ in formula (II), and their preferable ranges are also the same.

$Z^{71}$, $Z^{72}$, $Z^{73}$, $Z^{74}$, $Z^{75}$, and $Z^{76}$ each independently represent a substituted or unsubstituted carbon or nitrogen atom, and more preferably a substituted or unsubstituted carbon atom. Examples of the substituent on the carbon include the groups described as examples of $R^{21}$ in formula (1). In addition, $Z^{71}$ and $Z^{72}$ may be bonded to each other via a connecting group to form a ring (e.g., a benzene ring or a pyridine ring). $Z^{72}$ and $Z^{73}$ may be bonded to each other via a connecting group to form a ring (e.g., a benzene ring or a pyridine ring). $Z^{73}$ and $Z^{74}$ may be bonded to each other via a connecting group to form a ring (e.g., a benzene ring or a pyridine ring). $Z^{74}$ and $Z^{75}$ may be bonded to each other via a connecting group to form a ring (e.g., a benzene ring or a pyridine ring). $Z^{75}$ and $Z^{76}$ may be bonded to each other via a connecting group to form a ring (e.g., a benzene ring or a pyridine ring). The definitions and preferable ranges of $R^{71}$ to $R^{74}$ are the same as the definitions of $R^{21}$ to $R^{24}$ in formula (1), respectively.

Preferable examples of compounds represented by formula (3-B) include compounds represented by the following formula (3-C).

The compound represented by formula (3-C) will be described below.

Formula (3-C)

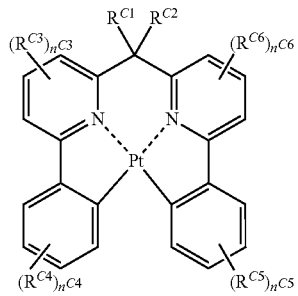

In formula (3-C), $R^{C1}$ and $R^{C2}$ each independently represent a hydrogen atom or a substituent, and the substituents may be selected from the alkyl groups and aryl groups described as examples of $R^{21}$ to $R^{24}$ in formula (1). The definition of $R^{C3}$, $R^{C4}$, $R^{C5}$, and $R^{C6}$ is the same as the definition of $R^{21}$ to $R^{24}$ in formula (1). Each of $n^{C3}$ and $n^{C6}$ represents an integer of 0 to 3; each of $n^{C4}$ and $n^{C5}$ represents an integer of 0 to 4; when there are plural $R^{C3}$'s, $R^{C4}$'s, $R^{C5}$'s, or $R^{C6}$'s, the plural $R^{C3}$'s, $R^{C4}$'s, $R^{C5}$'s, or $R^{C6}$'s may be the same as each other or different from each other, and may be bonded to each other to form a ring. $R^{C3}$, $R^{C4}$, $R^{C5}$, and $R^{C6}$ each preferably represent an alkyl, aryl, or heteroaryl group, or a halogen atom. The compound represented by formula (4) will be described below.

Formula (4)

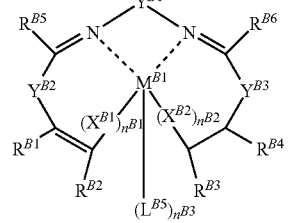

In formula (4), the definitions and preferable ranges of $M^{B1}$, $Y^{B2}$, $Y^{B3}$, $R^{B1}$, $R^{B2}$, $R^{B3}$, $R^{B4}$, $L^{B5}$, $n^{B3}$, $X^{B1}$, and $X^{B2}$ are the same as the definitions of $M^{21}$, $Y^{22}$, $Y^{23}$, $R^{21}$, $R^{22}$, $R^{23}$, $R^{24}$, $L^{25}$, $n^{21}$, $X^{21}$, $X^{22}$ in formula (1), respectively.

$Y^{B1}$ represents a connecting group whose definition is the same as that of $Y^{21}$ in formula (1). $Y^{B1}$ is preferably a vinyl group substituted at 1- or 2-position, a phenylene ring, a pyridine ring, a pyrazine ring, a pyrimidine ring, or a methylene group having 2 to 8 carbons.

$R^{B5}$ and $R^{B6}$ each independently represent a hydrogen atom or a substituent, and the substituent may be selected from the alkyl groups, aryl groups, and heterocyclic groups described as examples of $R^{21}$ to $R^{24}$ in formula (1). However, $Y^{B1}$ is not bonded to $R^{B5}$ or $R^{B6}$. $n^{B1}$ and $n^{B2}$ each independently represent an integer of 0 or 1.

Preferable examples of the compound represented by formula (4) include compounds represented by the following formula (4-A).

The compound represented by formula (4-A) will be described below.

Forumla (4-A)

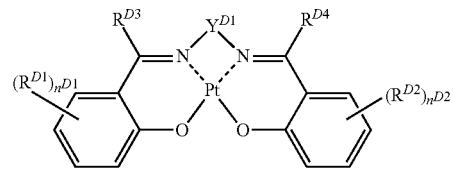

In formula (4-A), $R^{D3}$ and $R^{D4}$ each independently represent a hydrogen atom or a substituent, and $R^{D1}$ and $R^{D2}$ each represent a substituent. The substituents represented by $R^{D1}$, $R^{D2}$, $R^{D3}$, and $R^{D4}$ may be selected from the substituents described as examples of $R^{B5}$ and $R^{B6}$ in formula (4), and have the same preferable range as $R^{B5}$ and $R^{B6}$ in formula (4). $n^{D1}$ and $n^{D2}$ each represent an integer of 0 to 4. When there are plural $R^{D1}$'s, the plural $R^{D1}$'s may be the same as or different from each other or may be bonded to each other to form a ring. When there are plural $R^{D2}$'s, the plural $R^{D2}$'s may be the same as or different from each other or may be bonded to each other to form a ring. $Y^{D1}$ represents a vinyl group substituted at 1- or 2-position, a phenylene ring, a pyridine ring, a pyrazine ring, a pyrimidine ring, or a methylene group having 1 to 8 carbons.

Preferable examples of the metal complex having a tridentate ligand according to the invention include compounds represented by the following formula (5).

The compound represented by formula (5) will be described below.

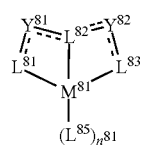

Forumla (5)

In formula (5), the definition of $M^{81}$ is the same as that of $M^{11}$ in formula (H), and their preferable ranges are also the same.

The definitions and preferable ranges of $L^{81}$, $L^{82}$, and $L^{83}$ are the same as the definitions and preferable ranges of $L^{11}$, $L^{12}$, and $L^{14}$ in formula (II), respectively.

The definitions and preferable ranges of $Y^{81}$ and $Y^{82}$ are the same as the definitions and preferable ranges of $Y^{11}$ and $Y^{12}$ in formula (II), respectively.

$L^{85}$ represents a ligand coordinating to $M^{81}$. $L^{85}$ is preferably a monodentate to tridentate ligand and more preferably a monodentate to tridentate anionic ligand. The monodentate to tridentate anionic ligand is not particularly limited, but is preferably a halogen ligand or a tridentate ligand $L^{81}$, $Y^{81}$, $L^{82}$, $Y^{82}$, and $L^{83}$ can form, and more preferably a tridentate ligand $L^{81}$, $Y^{81}$, $L^{82}$, $Y^{82}$, and $L^{83}$ can form. $L^{85}$ is not directly bonded to $L^{81}$ or $L^{83}$. The numbers of coordination sites and ligands do not exceed the valency of the metal.

$n^{81}$ represents an integer of 0 to 5. When $M^{81}$ is a tetravalent metal, $n^{81}$ is 1, and $L^{85}$ represents a monodentate ligand. When $M^{81}$ is a hexavalent metal, $n^{81}$ is preferably 1 to 3, more preferably 1 or 3, and still more preferably 1. When $M^{81}$ is hexavalent and $n^{81}$ is 1, $L^{85}$ represents a tridentate ligand. When $M^{81}$ is hexavalent and $n^{81}$ is 2, $L^{85}$ represents a monodentate ligand and a bidentate ligand. When $M^{81}$ is hexavalent and $n^{81}$ is 3, $L^{85}$ represents a monodentate ligand. When $M^{81}$ is an octavalent metal, $n^{81}$ is preferably 1 to 5, more preferably 1 or 2, and still more preferably 1. When $M^{81}$ is octavalent and $n^{81}$ is 1, $L^{85}$ represents a pentadentate ligand. When $M^{81}$ is octavalent and $n^{81}$ is 2, $L^{85}$ represents a tridentate ligand and a bidentate ligand. When $M^{81}$ is octavalent and $n^{81}$ is 3, $L^{85}$ represents a tridentate ligand and two monodentate ligands, or represents two bidentate ligands and one monodentate ligand. When $M^{81}$ is octavalent and $n^{81}$ is 4, $L^{85}$ represents one bidentate ligand and three monodentate ligands. When $M^{81}$ is octavalent and $n^{81}$ is 5, $L^{85}$ represents five monodentate ligands. When $n^{81}$ is 2 or larger, there are plural $L^{85}$'s, and the plural $L^{85}$'s may be the same as or different from each other.

In a preferable example of the compound represented by formula (5), $L^{81}$, $L^{82}$, or $L^{83}$ each represent an aromatic carbon ring containing a carbon atom coordinating to $M^{81}$, a heterocyclic ring containing a carbon atom coordinating to $M^{81}$, or a nitrogen-containing heterocyclic ring containing a nitrogen atom coordinating to $M^{81}$, wherein at least one of $L^{81}$, $L^{82}$, and $L^{83}$ is a nitrogen-containing heterocyclic ring. Examples of the aromatic carbon ring containing a carbon atom coordinating to $M^{81}$, heterocyclic ring containing a carbon atom coordinating to $M^{81}$, or nitrogen-containing heterocyclic ring containing a nitrogen atom coordinating to $M^{81}$ include the examples of ligands (moieties) each containing a nitrogen or carbon atom coordinating to $M^{11}$ in formula (II) described in the explanation of formula (II). Preferable examples thereof are the same as in the description of ligands (moieties) each containing a nitrogen or carbon atom coordinating to $M^{11}$ in formula (II). $Y^{81}$ and $Y^{82}$ each preferably represent a single bond or a methylene group.

Other preferable examples of compounds represented by formula (5) include compounds represented by the following formulae (5-A) and (5-B).

The compound represented by formula (5-A) will be described first, below.

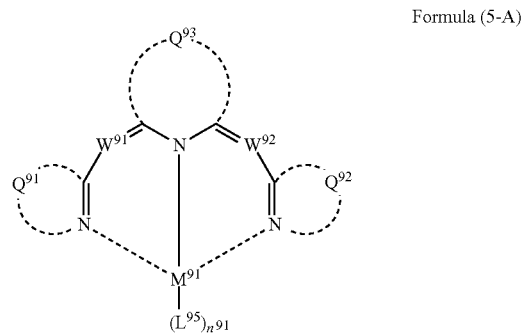

Formula (5-A)

In formula (5-A), the definition of $M^{91}$ is the same as that of $M^{81}$ in formula (5), and their preferable ranges are also the same.

$Q^{91}$ and $Q^{92}$ each represent a group forming a nitrogen-containing heterocyclic ring (ring containing a nitrogen atom coordinating to $M^{91}$). The nitrogen-containing heterocyclic rings formed by $Q^{91}$ and $Q^{92}$ are not particularly limited, and examples thereof include pyridine, pyrazine, pyrimidine, pyridazine, triazine, thiazole, oxazole, pyrrole, pyrazole, imidazole, and triazole rings, condensed rings containing one or more of the above rings (e.g., quinoline, benzoxazole, benzimidazole, and indolenine rings), and tautomers thereof.

Each of the nitrogen-containing heterocyclic rings formed by $Q^{91}$ and $Q^{92}$ is preferably a pyridine, pyrazole, thiazole, imidazole, or pyrrole ring, a condensed ring containing one or more of the above ring (e.g., quinoline, benzothiazole, benzimidazole, or indolenine rings), or a tautomer of any of the above rings; more preferably a pyridine or pyrrole ring, a condensed ring containing one or more of the above rings (e.g., a quinoline ring), or a tautomer of any of the above rings; more preferably a pyridine ring or a condensed ring containing a pyridine ring (e.g., a quinoline ring); and particularly preferably a pyridine ring.

$Q^{93}$ represents a group forming a nitrogen-containing heterocyclic ring (ring containing a nitrogen atom coordinating to $M^{91}$). The nitrogen-containing heterocyclic ring formed by $Q^{93}$ is not particularly limited, but is preferably a pyrrole ring, an imidazole ring, a tautomer of a triazole ring, or a condensed ring containing one or more of the above rings (e.g., benzopyrrole), and more preferably a tautomer of a pyrrole ring or a tautomer of a condensed ring containing a pyrrole ring (e.g., benzopyrrole).

The definitions and preferable ranges of $W^{91}$ and $W^{92}$ are the same as the definitions and preferable ranges of $W^{51}$ and $W^{52}$ in formula (2), respectively.

The definition of $L^{95}$ is the same as that of $L^{85}$ in formula (5), and their preferable ranges are also the same.

The definition of $n^{91}$ is the same as that of $n^{81}$ in formula (5), and their preferable ranges are also the same.

The compound represented by formula (5-B) will be described next.

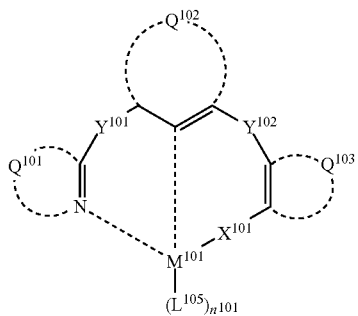

Formula (5-B)

In formula (5-B), the definition of $M^{101}$ is the same as that of $M^{81}$ in formula (5), and their preferable ranges are also the same.

The definition of $Q^{102}$ is the same as that of $Q^{21}$ in formula (1), and their preferable ranges are also the same.

The definition of $Q^{101}$ is the same as that of $Q^{91}$ in formula (5-A), and their preferable ranges are also the same.

$Q^{103}$ represents a group forming an aromatic ring. The aromatic ring formed by $Q^{103}$ is not particularly limited, but is preferably a benzene, furan, thiophene, or pyrrole ring, or a condensed ring containing one or more of the above rings (e.g., a naphthalene ring), more preferably a benzene ring or a condensed ring containing a benzene ring (e.g., naphthalene ring), and particularly preferably a benzene ring.

The definitions and preferable ranges of $Y^{101}$ and $Y^{102}$ are the same as the definition and preferable range of $Y^{22}$ in formula (1). $Y^{101}$ and $Y^{102}$ may be the same as or different from each other.

The definition of $L^{105}$ is the same as that of $L^{85}$ in formula (5), and their preferable ranges are also the same.

The definition of $n^{101}$ is the same as that of $n^{81}$ in formula (5), and their preferable ranges are also the same.

The definition of $X^{101}$ is the same as that of $X^{21}$ in formula (1), and their preferable ranges are also the same.

Other preferable examples of the metal complex having a tridentate ligand according to the invention include compounds represented by formula (III). Among compounds represented by formula (III), compounds represented by the following formula (X2) are more preferable, and compounds represented by the following formula (X3) are still more preferable.

The compound represented by formula (X2) is described first.

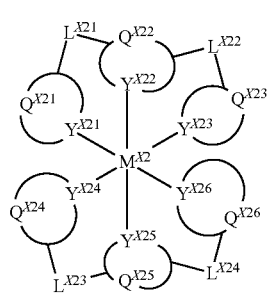

Formula (X2)

In formula (X2), $M^{X2}$ represents a metal ion. $Y^{X21}$ to $Y^{X26}$ each represent an atom coordinating to $M^{X2}$; and $Q^{X21}$ to $Q^{X26}$ each represent an atomic group forming an aromatic ring or an aromatic heterocyclic ring respectively with $Y^{X21}$ to $Y^{X26}$. $L^{X21}$ to $L^{X24}$ each represent a single or double bond or a connecting group. The bond between $M^{X2}$ and each of $Y^{X21}$ to $Y^{X26}$ may be a coordination bond or a covalent bond.

The compound represented by formula (X2) will be described below in detail.

In formula (X2), the definition of $M^{X2}$ is the same as that of $M^{X1}$ in formula (III), and their preferable ranges are also the same. $Y^{X21}$ to $Y^{X26}$ each represent an atom coordinating to $M^{X2}$. The bond between $M^{X2}$ and each of $Y^{X21}$ to $Y^{X26}$ may be a coordination bond or a covalent bond. Each of $Y^{X21}$ to $Y^{X26}$ is a carbon, nitrogen, oxygen, sulfur, phosphorus, or silicon atom, and preferably a carbon or nitrogen atom. $Q^{X21}$ to $Q^{X26}$ represent atomic groups forming rings containing $Y^{X21}$ to $Y^{X26}$, respectively, and the rings are each independently selected from aromatic hydrocarbon rings and aromatic heterocyclic rings. The aromatic hydrocarbon rings and aromatic heterocyclic rings may be selected from benzene, pyridine, pyrazine, pyrimidine, pyridazine, triazine, pyrrole, pyrazole, imidazole, triazole, oxazole, thiazole, oxadiazole, thiadiazole, thiophene, and furan rings; preferably from benzene, pyridine, pyrazine, pyrimidine, pyrazole, imidazole, and triazole rings; more preferably from benzene, pyridine, pyrazine, pyrazole, and triazole rings; and particularly preferably from benzene and pyridine rings. The aromatic rings may have a condensed ring or a substituent.

The definitions and preferable ranges of $L^{X21}$ to $L^{X24}$ are the same as the definitions and preferable ranges of $L^{X11}$ to $L^{X14}$ in formula (III), respectively.

Compounds represented by the following formula (X3) are more preferable examples of the compounds represented by formula (III).

The compound represented by formula (X3) will be described below.

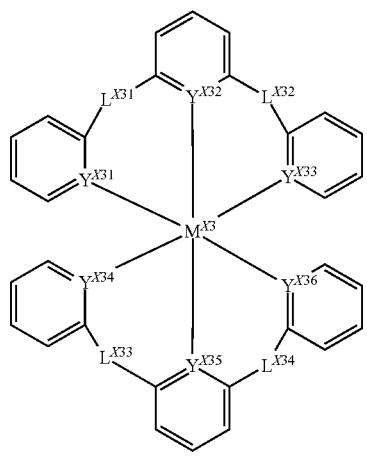

Formula (X3)

In formula (X3), $M^{X3}$ represents a metal ion. $Y^{X31}$ to $Y^{X36}$ each represent a carbon, nitrogen, or phosphorus atom. $L^{X31}$ to $L^{X34}$ each represent a single or double bond or a connecting group. The bond between $M^{X3}$ and each of $Y^{X31}$ to $Y^{X36}$ may be a coordination bond or a covalent bond.

The definition of $M^{X3}$ is the same as that of $M^{X1}$ in formula (III) above, and their preferable ranges are also the same. $Y^{X31}$ to $Y^{X36}$ each represent an atom coordinating to $M^{X3}$. The bond between $M^{X3}$ and each of $Y^{X31}$ to $Y^{X36}$ may be a coordination bond or a covalent bond. $Y^{X31}$ to $Y^{X36}$ each represent a carbon, nitrogen, or phosphorus atom and preferably a carbon or nitrogen atom. The definitions and preferable ranges of $L^{X31}$ to $L^{X34}$ are the same as the definitions and preferable ranges of $L^{X11}$ to $L^{X14}$ in formula (III), respectively.

Specific examples of compounds represented by the formulae (II), (III) and (5) include the compounds (1) to (242) described in Japanese Patent Application No. 2004-162849 (their structures being shown below). The disclosure of Japanese Patent Application No. 2004-162849 is incorporated herein by reference.

Compound (1)

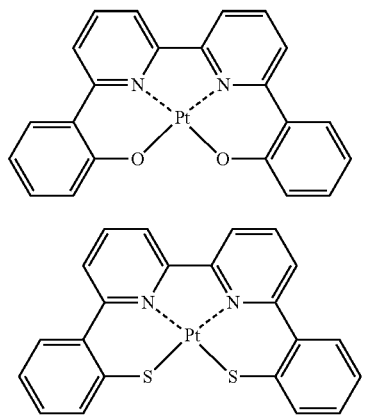

Formula (2)

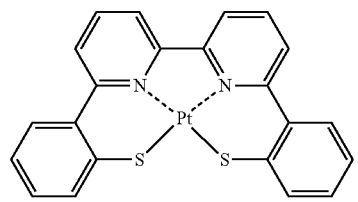

Compound (3)

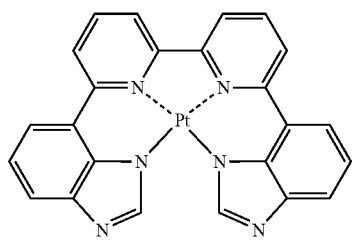

Compound (4)

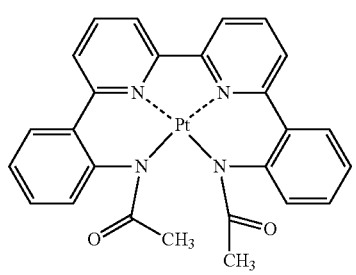

Compound (5)

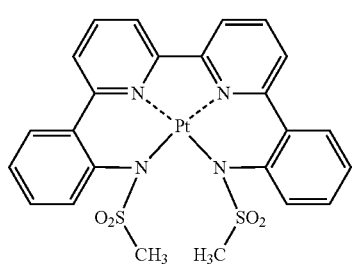

-continued

Compound (6)

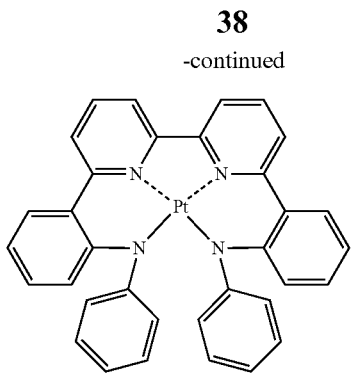

Compound (7)

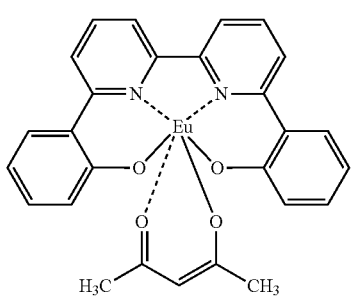

Compound (8)

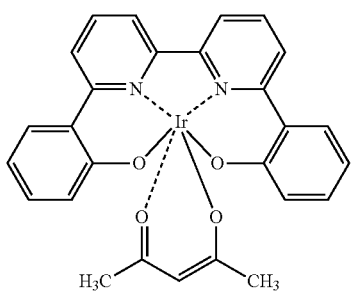

Compound (9)

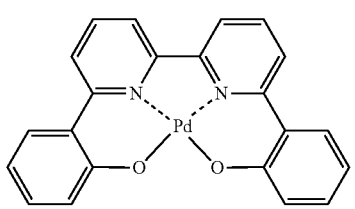

Compound (10)

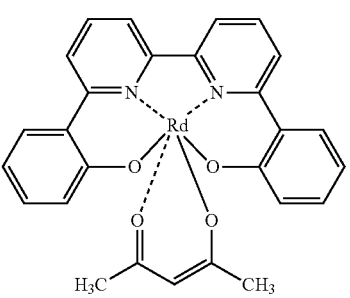

Compound (11)
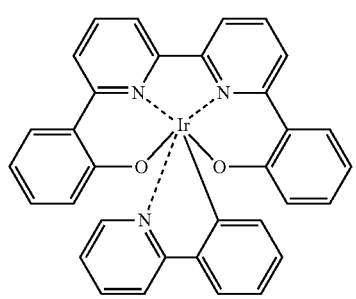
Compound (12)
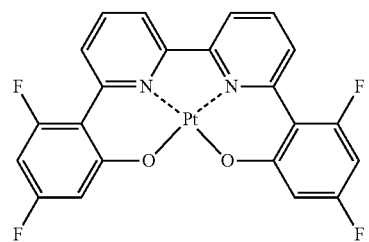
Compound (13)
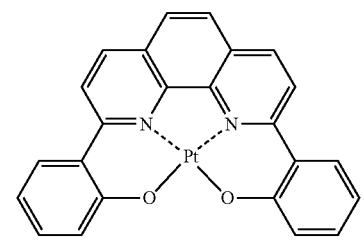
Compound (14)
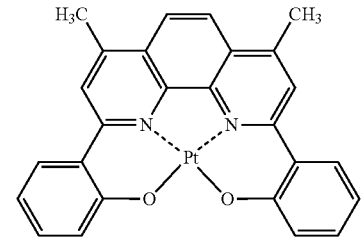
Compound (15)
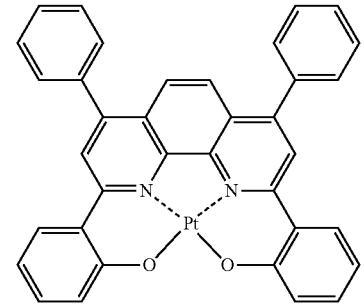
Compound (16)
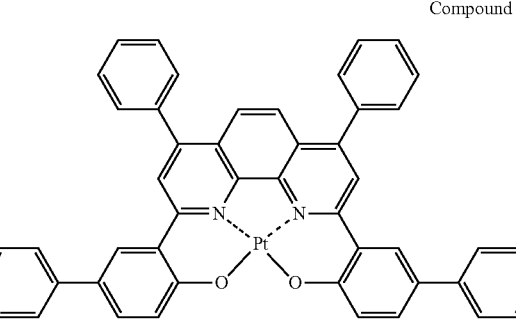
Compound (17)
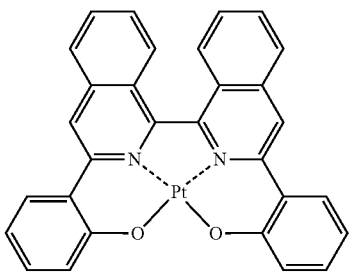
Compound (18)
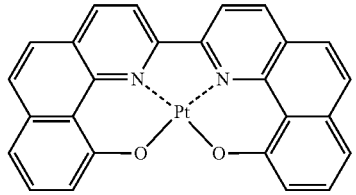
Compound (19)
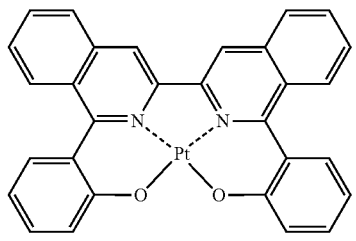
Compound (20)
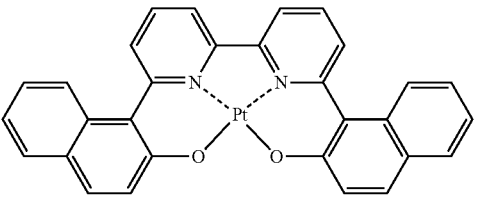
Compound (21)
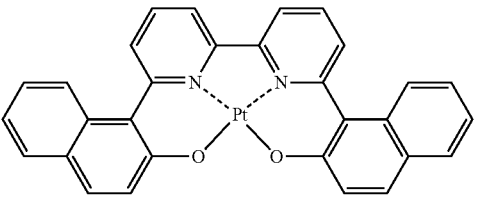
Compound (22)
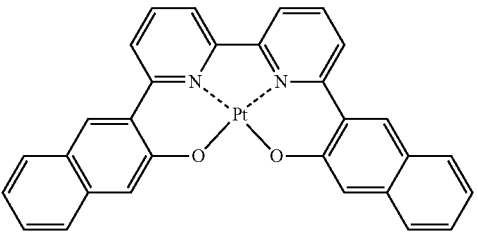

-continued
Compound (23)
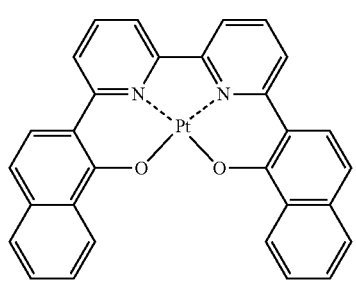
Compound (24)
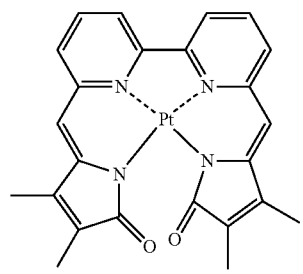
Compound (25)
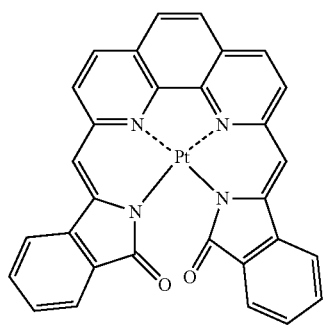
Compound (26)
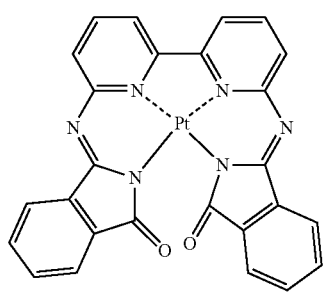
Compound (27)
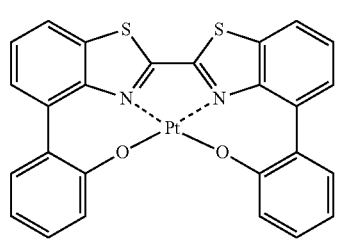
Compound (28)
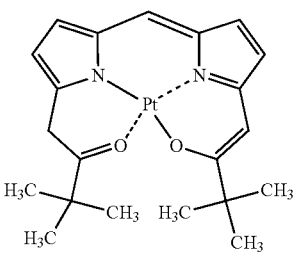
Compound (29)
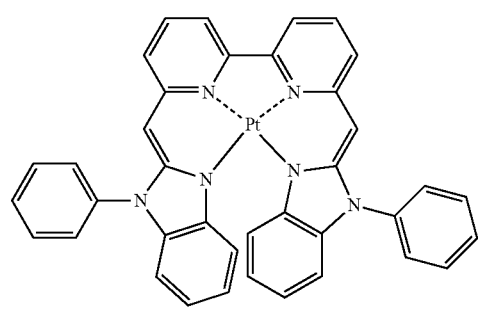
Compound (30)
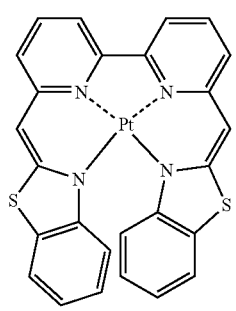
Compound (31)
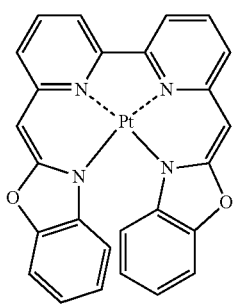
Compound (32)
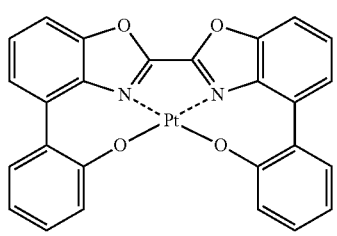

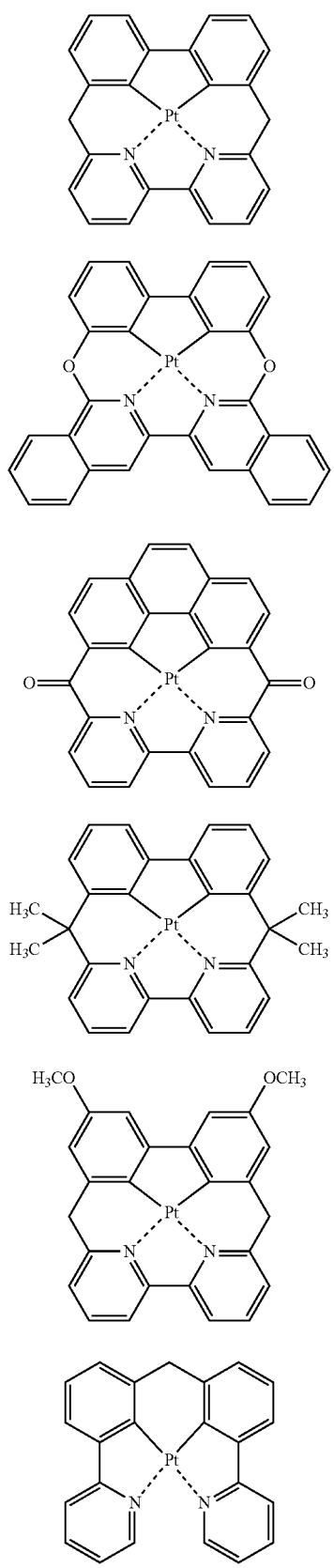
Compound (33)
Compound (34)
Compound (35)
Compound (36)
Compound (37)
Compound (38)
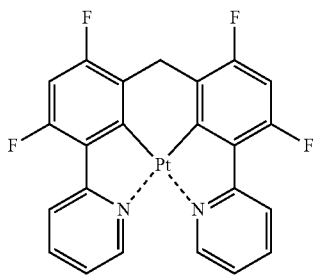
Compound (39)
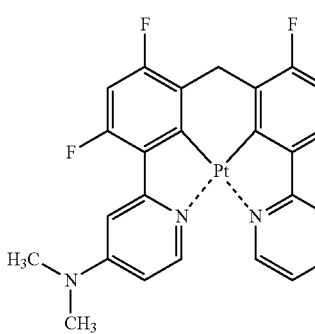
Compound (40)
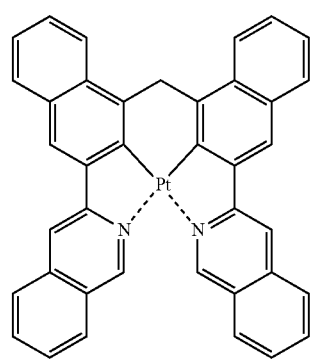
Compound (41)
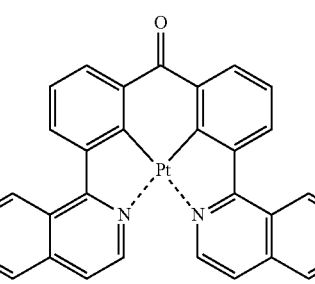
Compound (42)
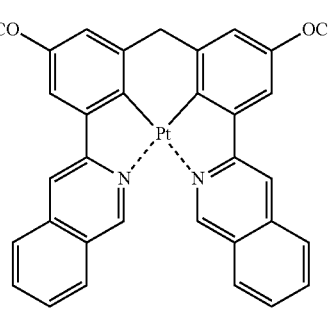
Compound (43)

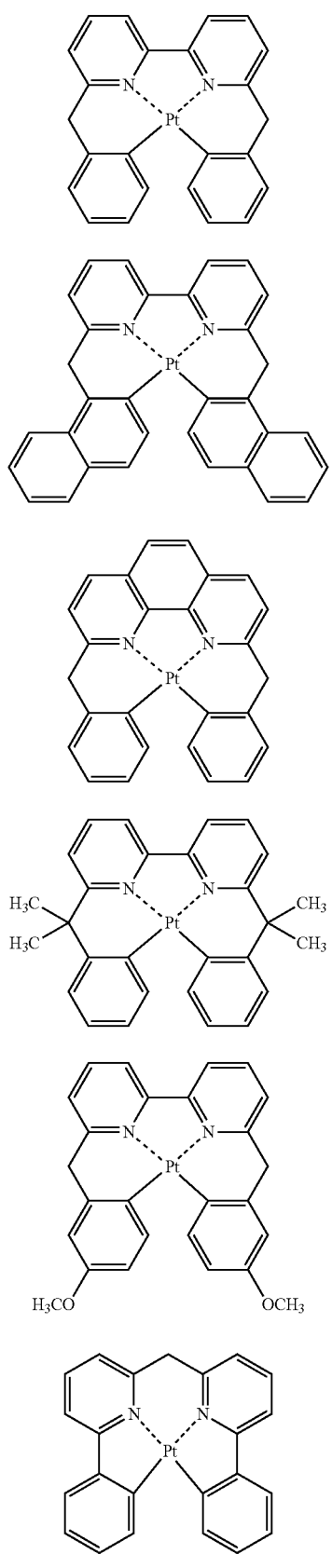

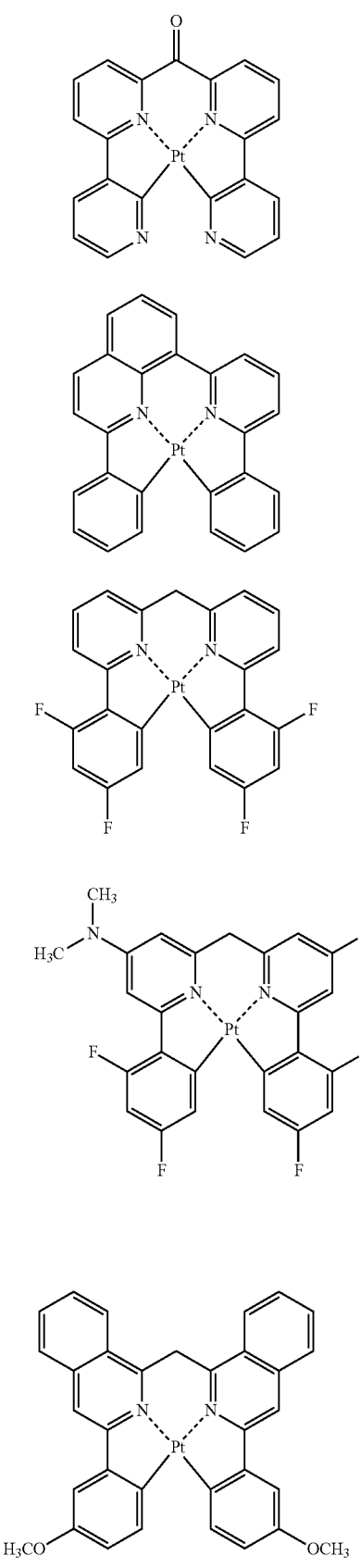
Compound (56)
Compound (57)
Compound (58)
Compound (59)
Compound (60)
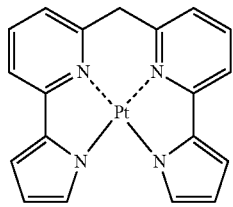
Compound (61)
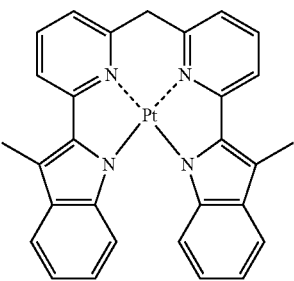
Compound (62)
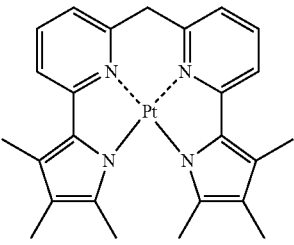
Compound (63)
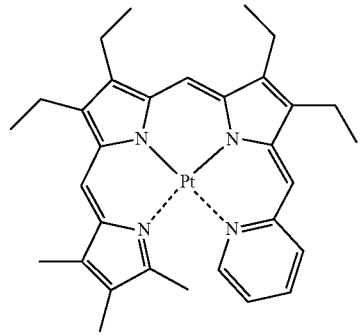
Compound (64)
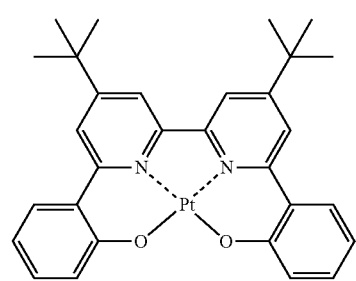
Compound (65)
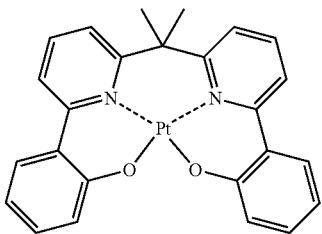
Compound (66)

Compound (67)
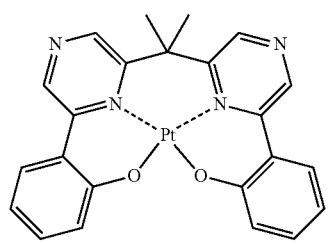
Compound (68)
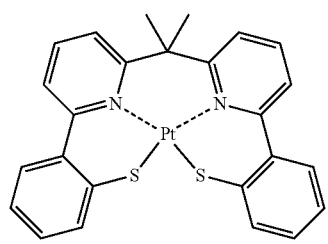
Compound (69)
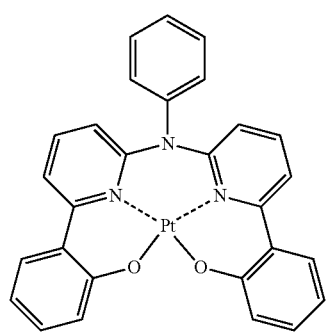
Compound (70)
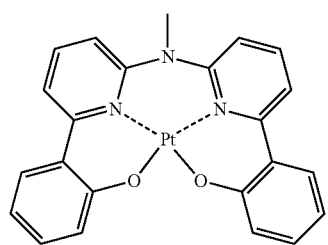
Compound (71)
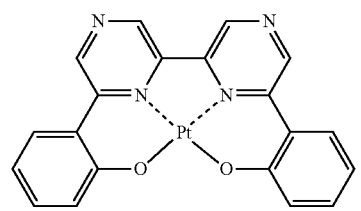
Compound (72)
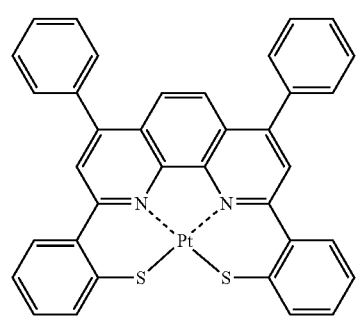
Compound (73)
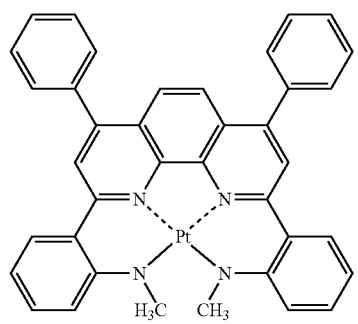
Compound (74)
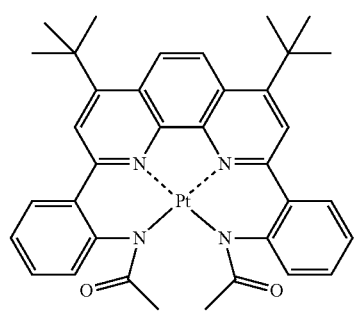
Compound (75)
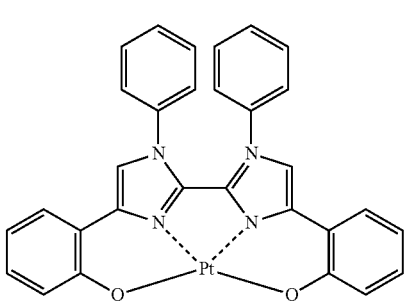
Compound (76)
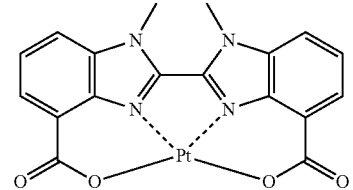
Compound (77)
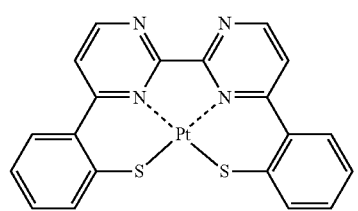

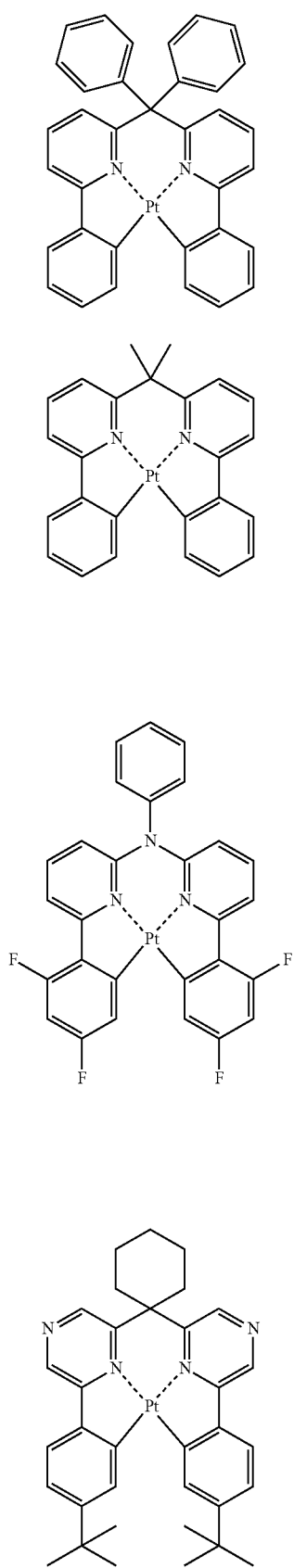

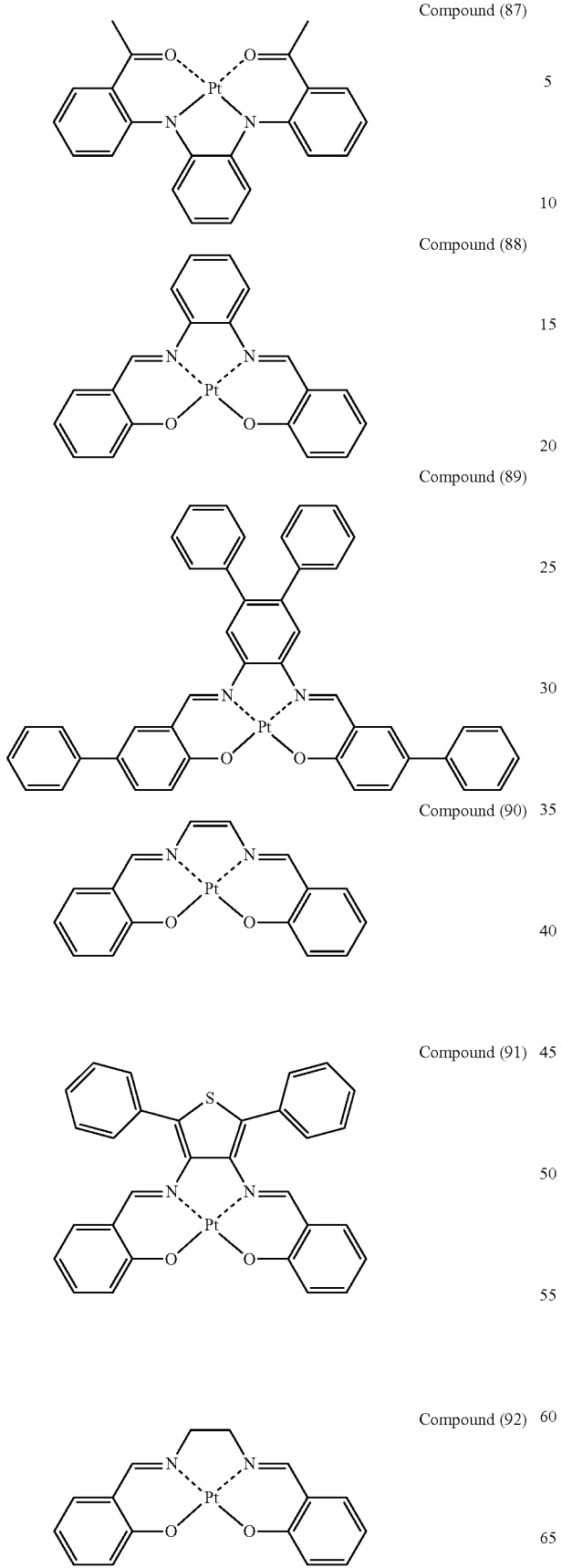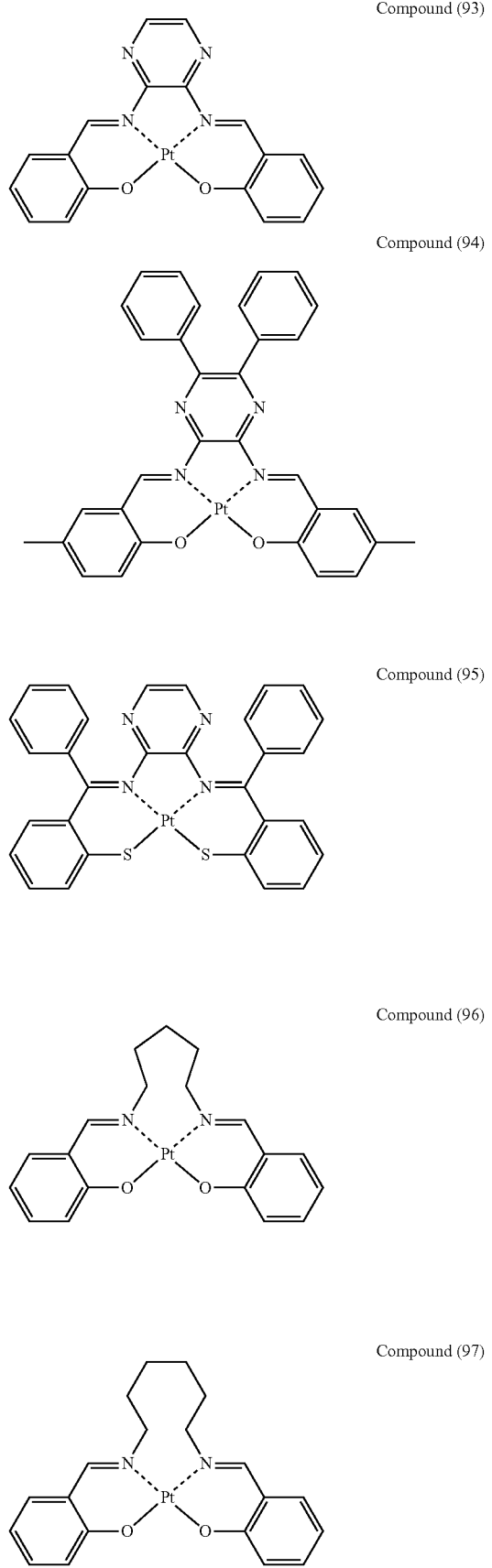

Compound (98)
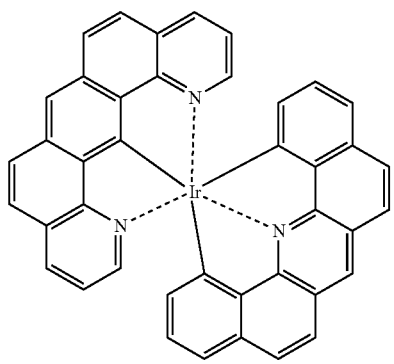
Compound (99)
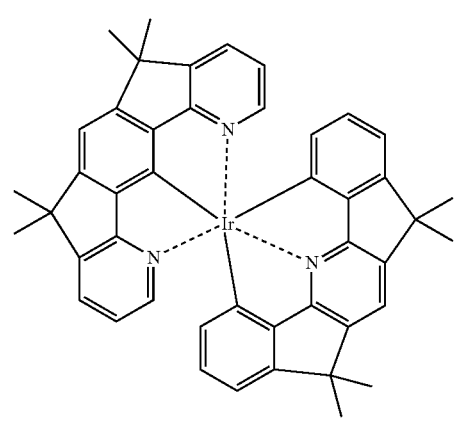
Compound (100)
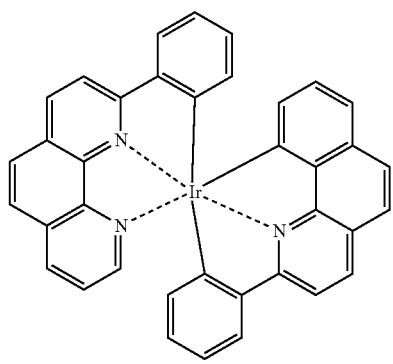
Compound (101)
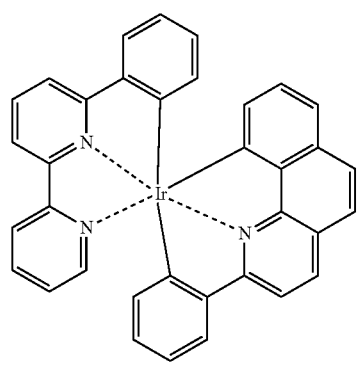
Compound (102)
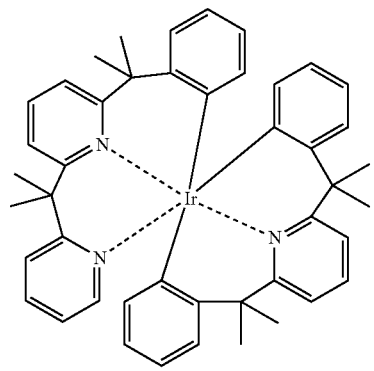
Compound (103)
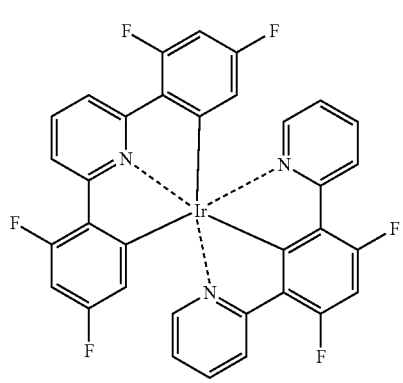
Compound (104)
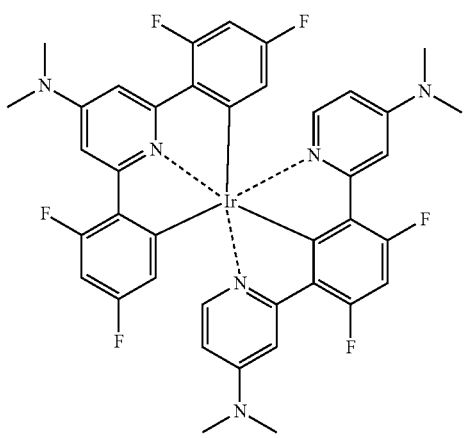
Compound (105)
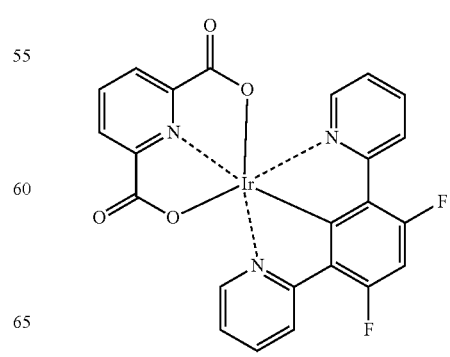

Compound (106)
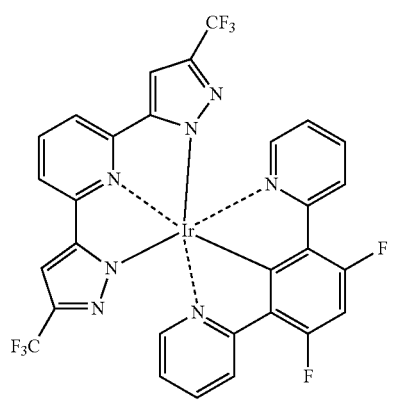
Compound (107)
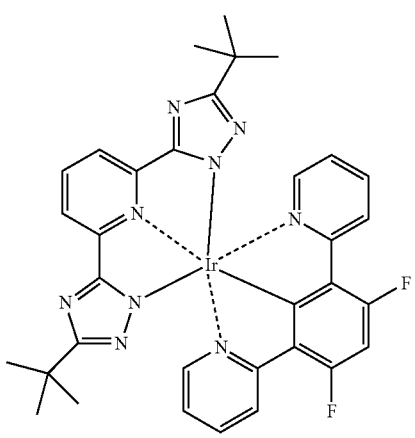
Compound (108)
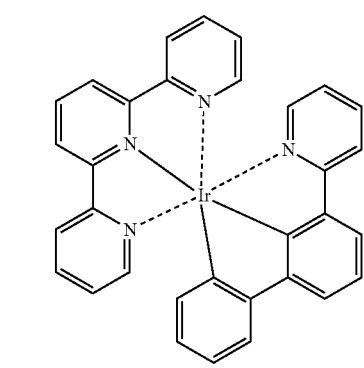
Compound (109)
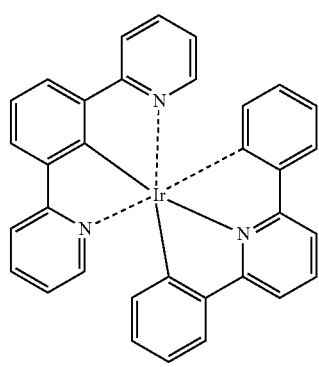
Compound (110)
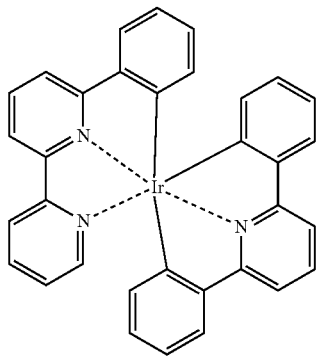
Compound (111)
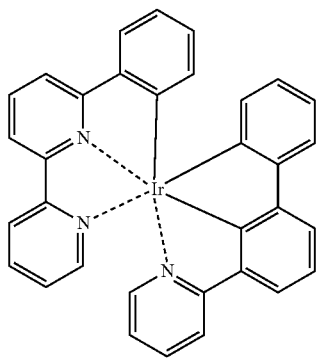
Compound (112)
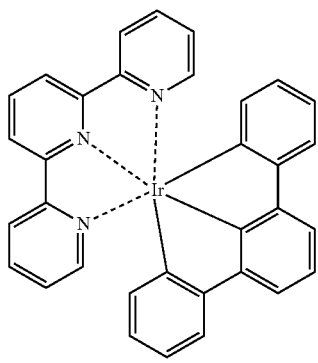
Compound (113)
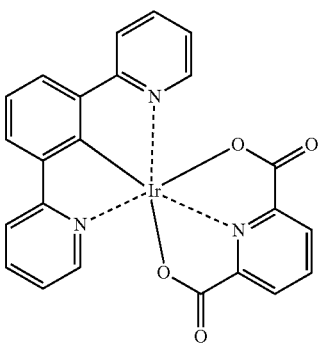

Compound (114)
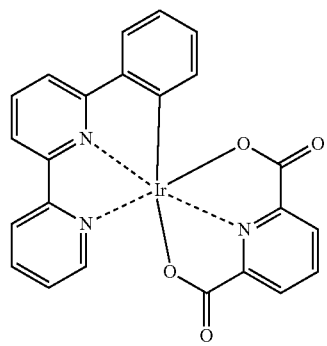
Compound (115)
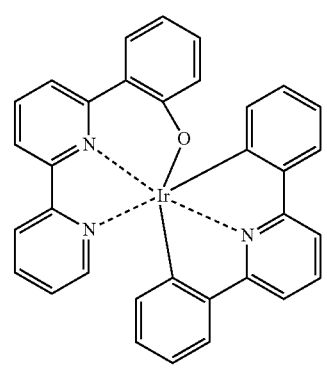
Compound (116)
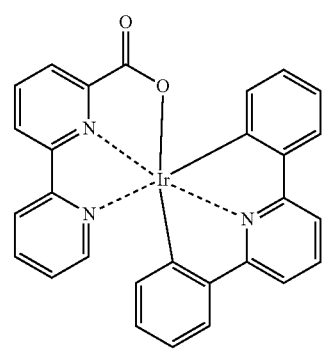
Compound (117)
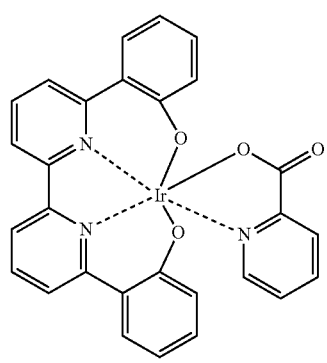
Compound (118)
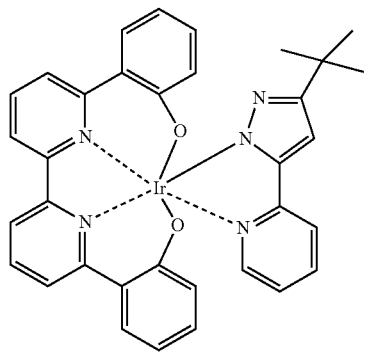
Compound (119)
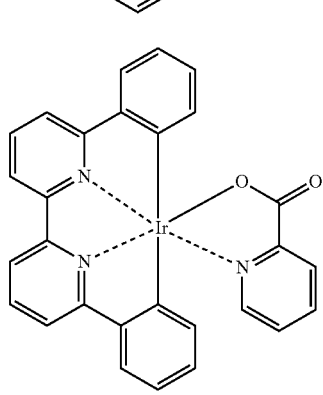
Compound (120)
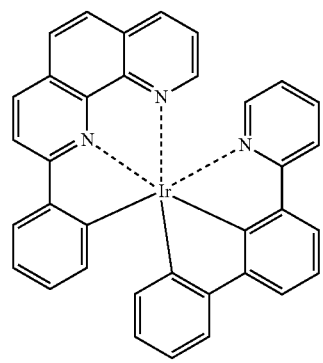
Compound (121)
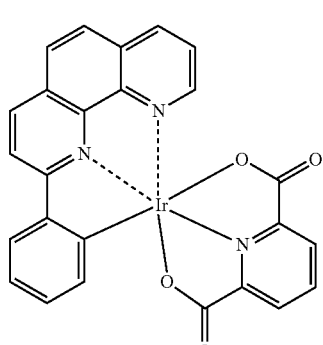

Compound (122)
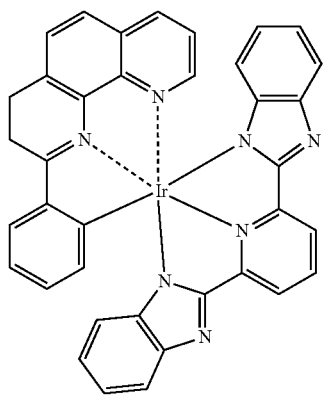
Compound (123)
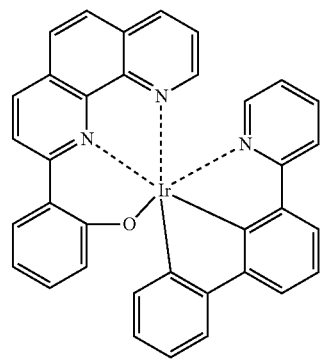
Compound (124)
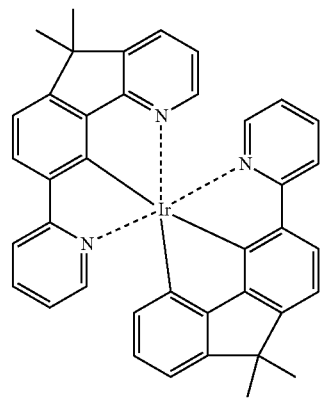
Compound (125)
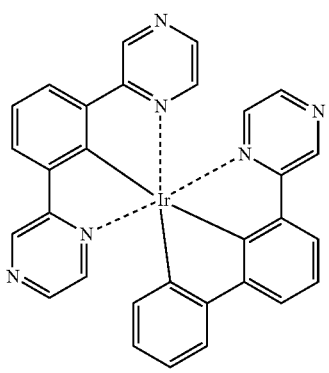
Compound (126)
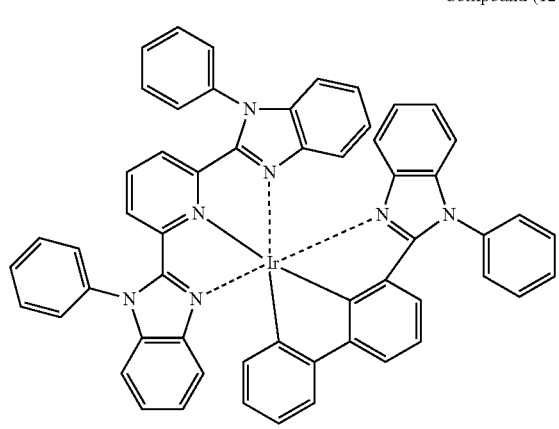
Compound (127)
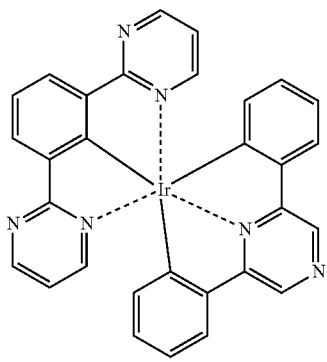
Compound (128)
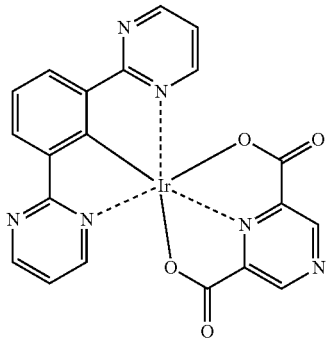
Compound (129)
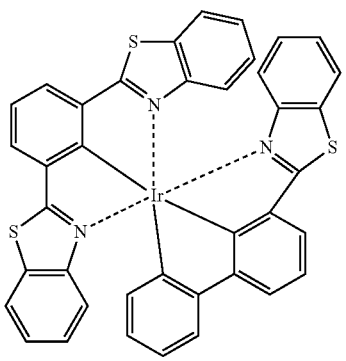

-continued
Compound (130)
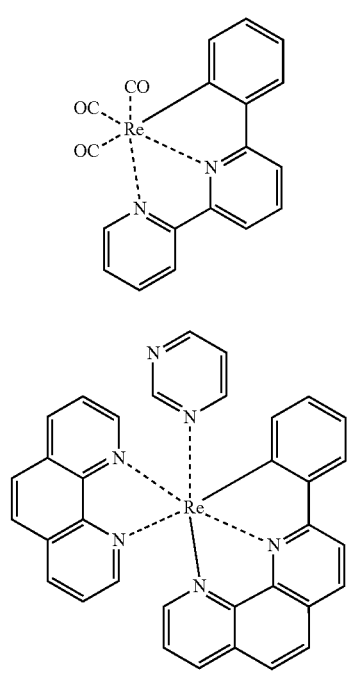
Compound (131)
Compound (132)
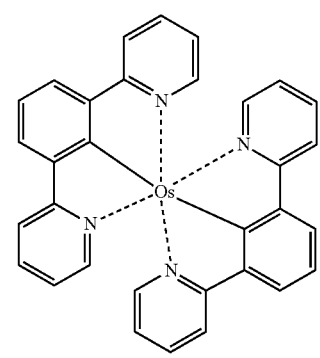
Compound (133)
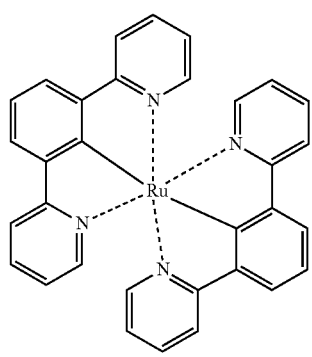
-continued
Compound (134)
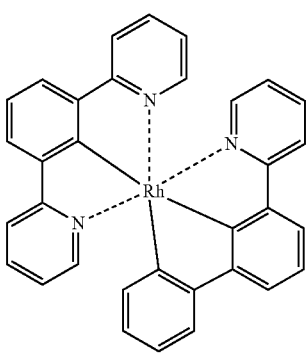
Compound (135)
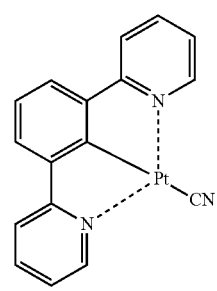
Compound (136)
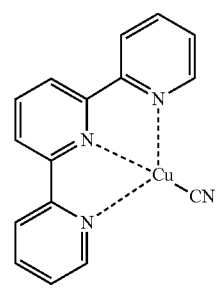
Compound (137)
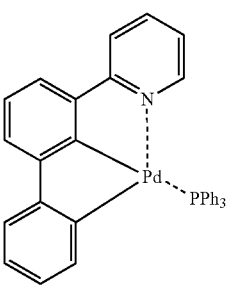
Compound (138)
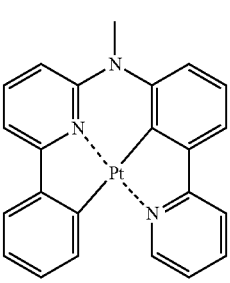

Compound (139)
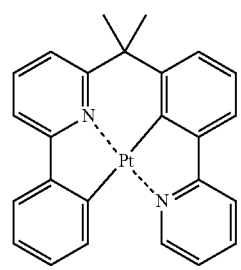
Compound (140)
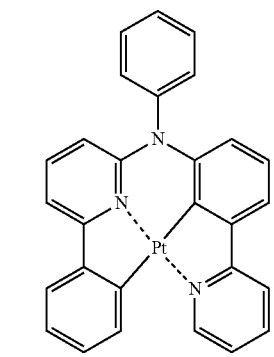
Compound (141)
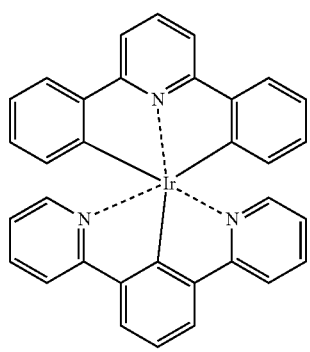
Compound (142)
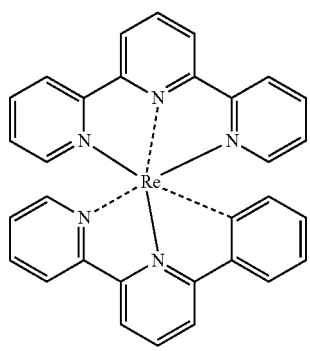
Compound (143)
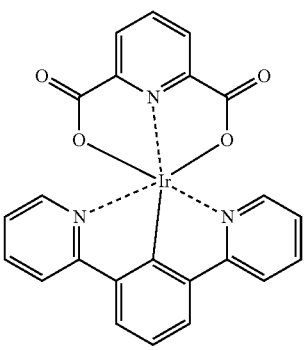
Compound (144)
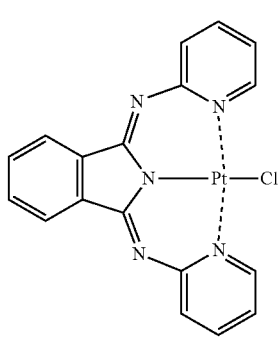
Compound (145)
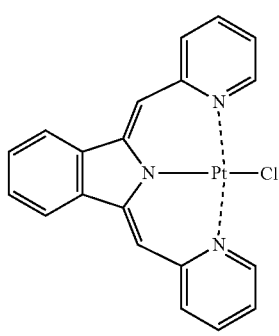
Compound (146)
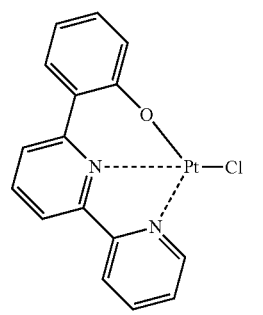
Compound (147)
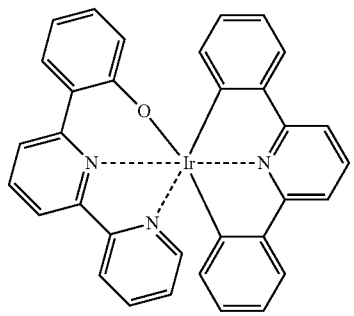

Compound (148)
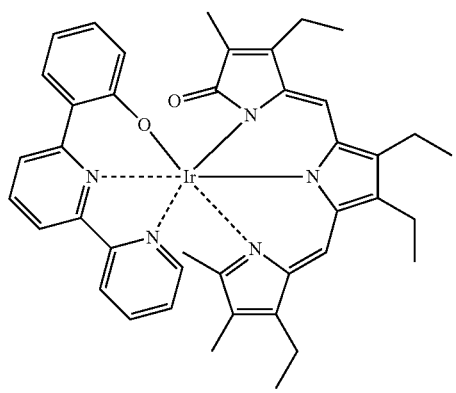
Compound (149)
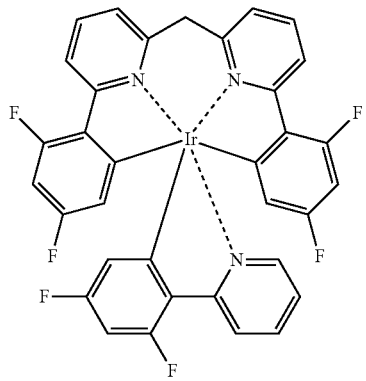
Compound (150)
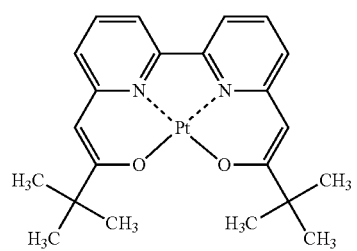
Compound (151)
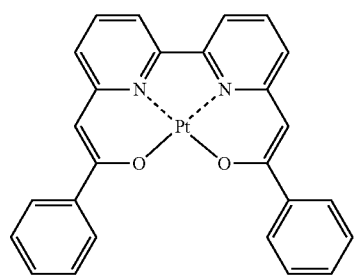
Compound (152)
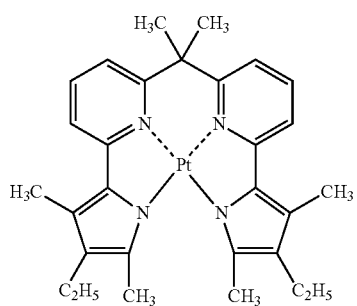
Compound (153)
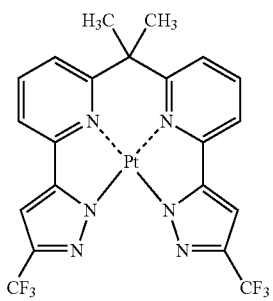
Compound (154)
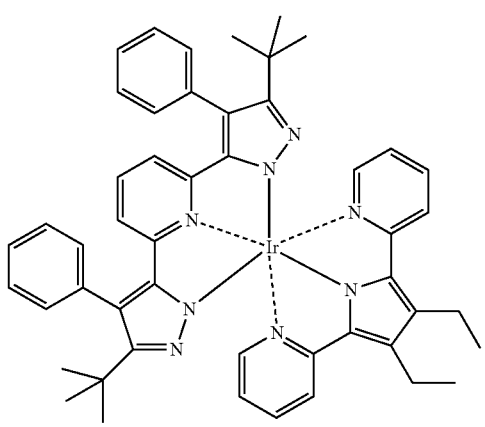
Compound (155)
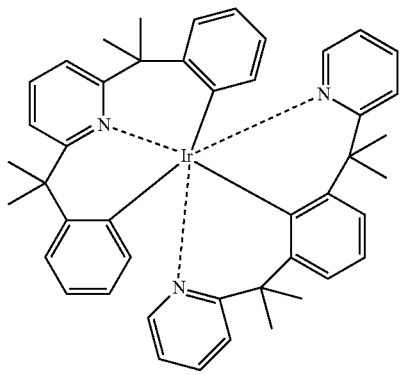
Compound (156)
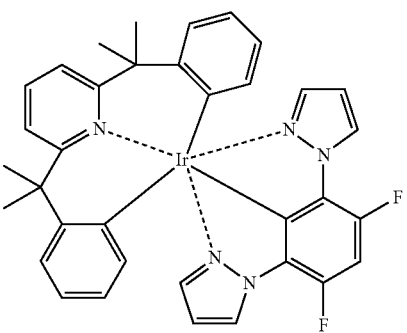

Compound (157)
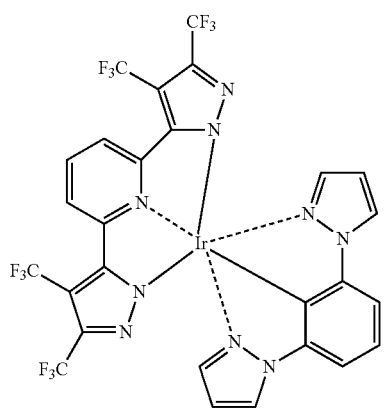
Compound (158)
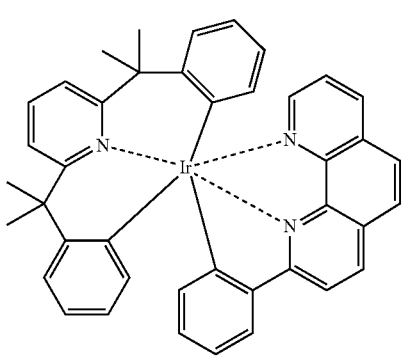
Compound (159)
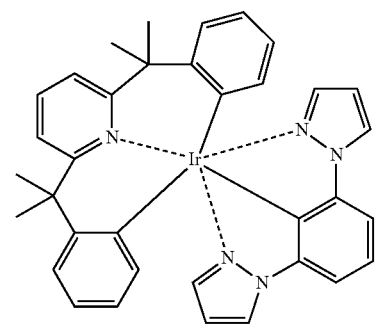
Compound (160)
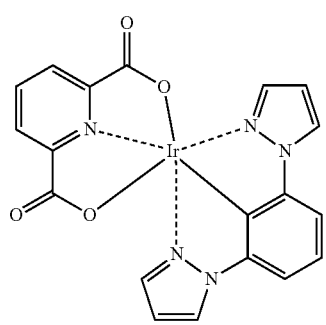
Compound (161)
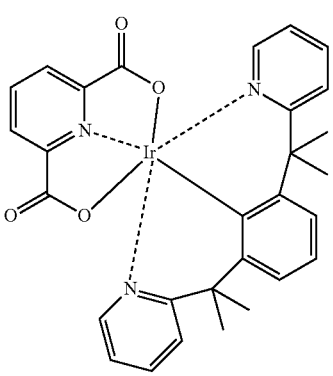
Compound (162)
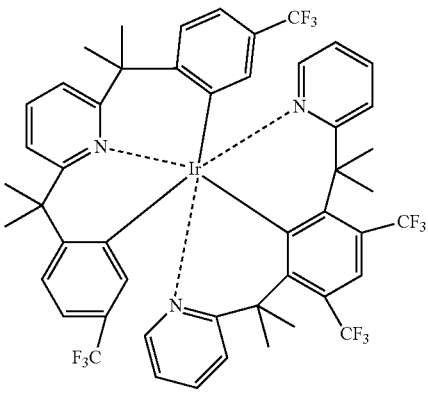
Compound (163)
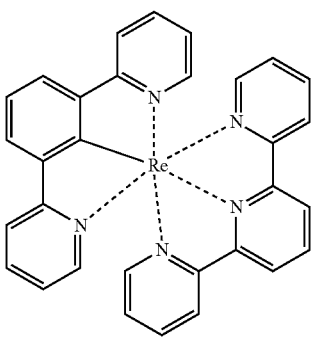
Compound (164)
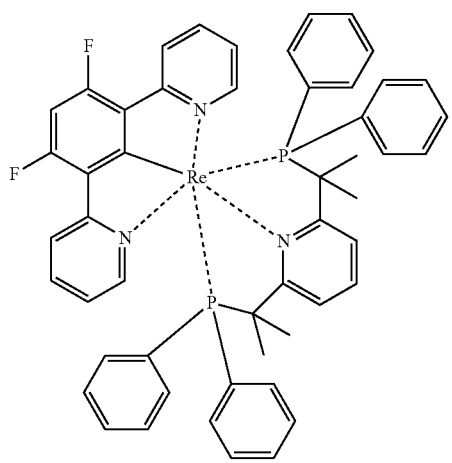

Compound (165)
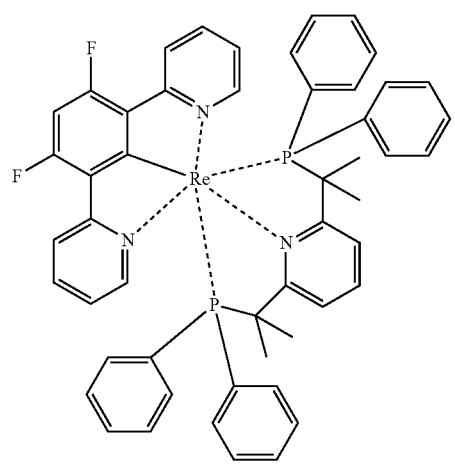
Compound (166)
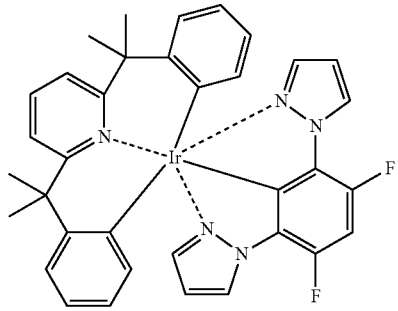
Compound (167)
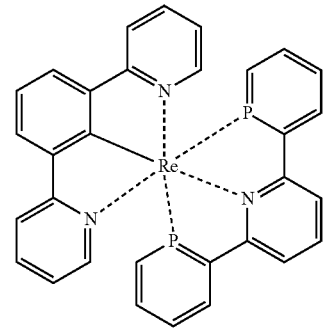
Compound (168)
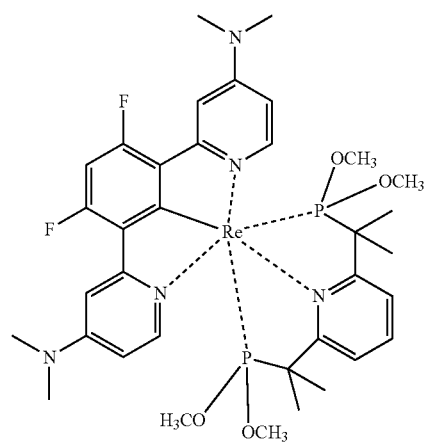
Compound (169)
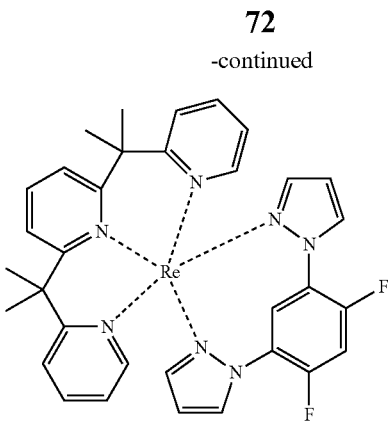
Compound (170)
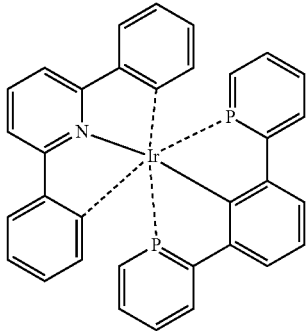
Compound (171)
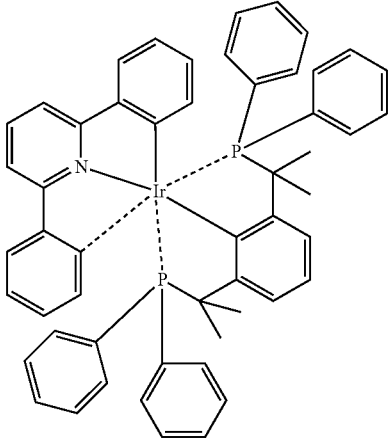
Compound (172)
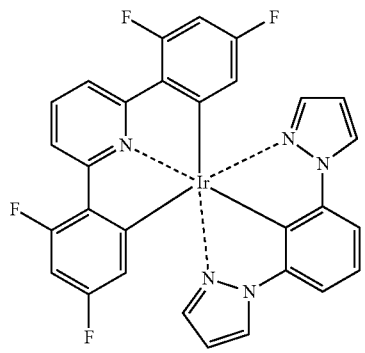

Compound (173)
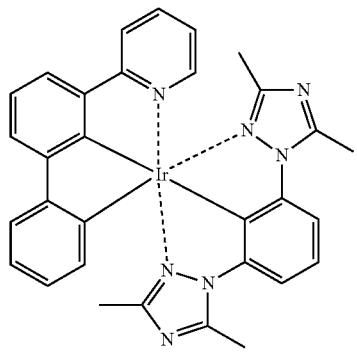
Compound (174)
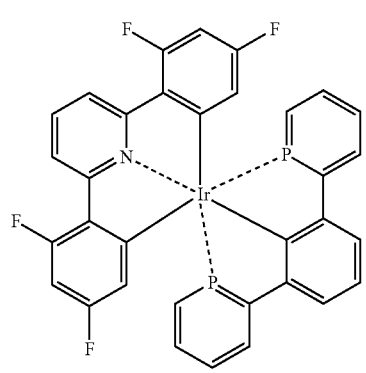
Compound (175)
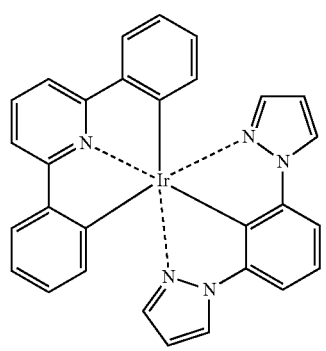
Compound (176)
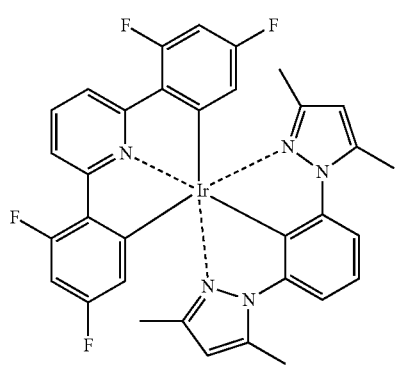
Compound (177)
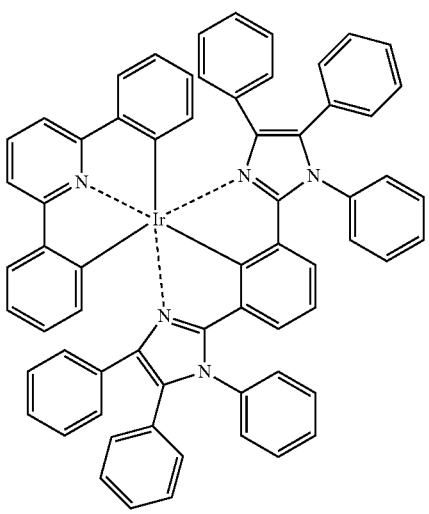
Compound (178)
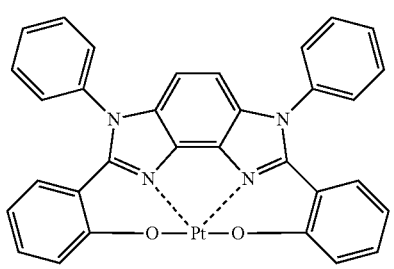
Compound (179)
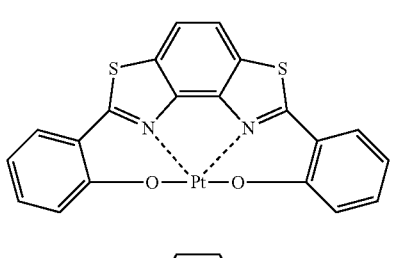
Compound (180)
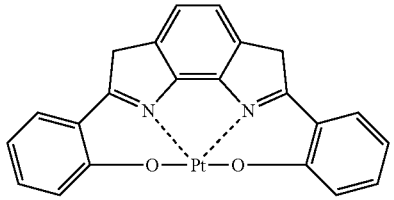
Compound (181)

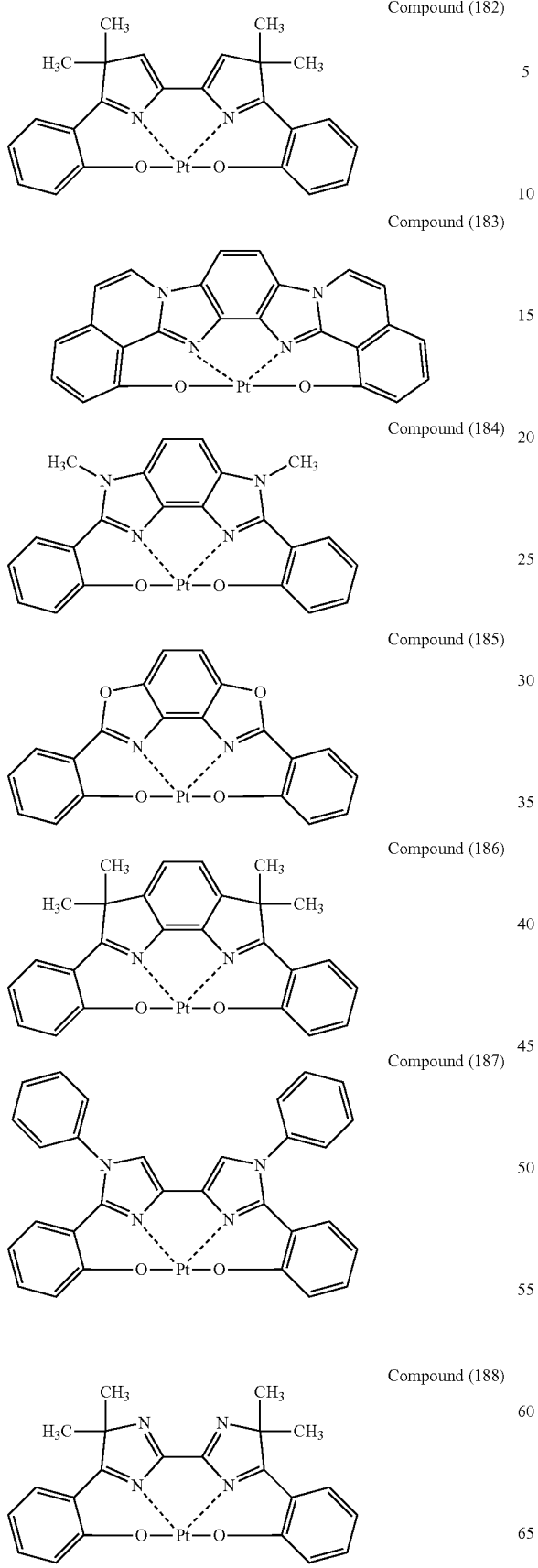
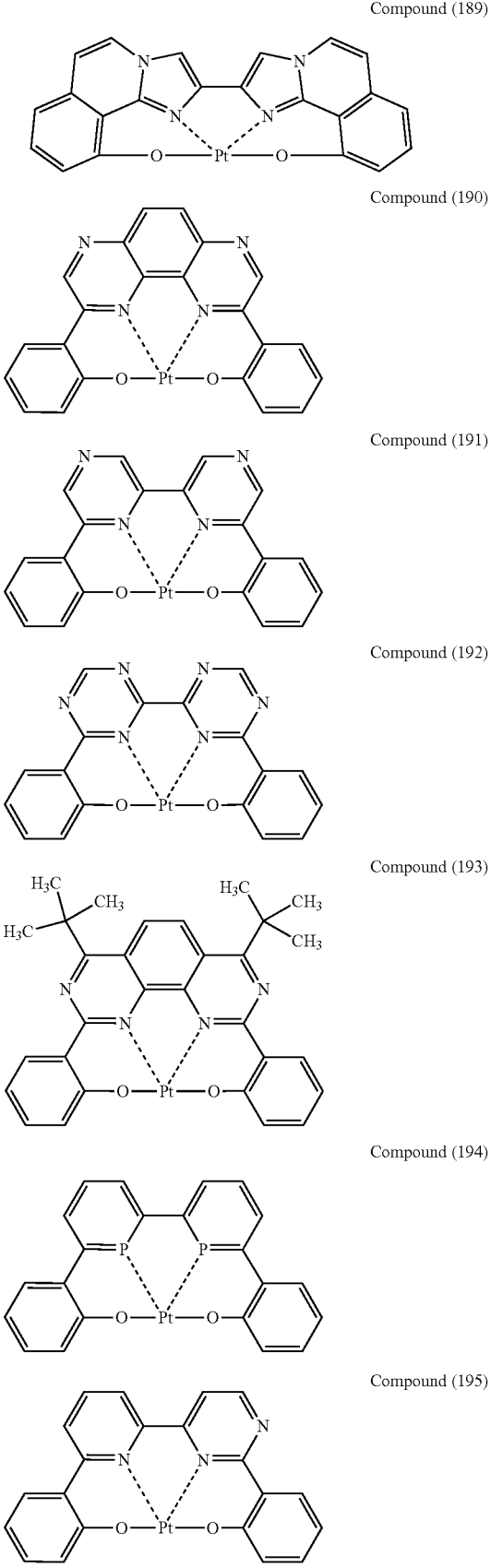

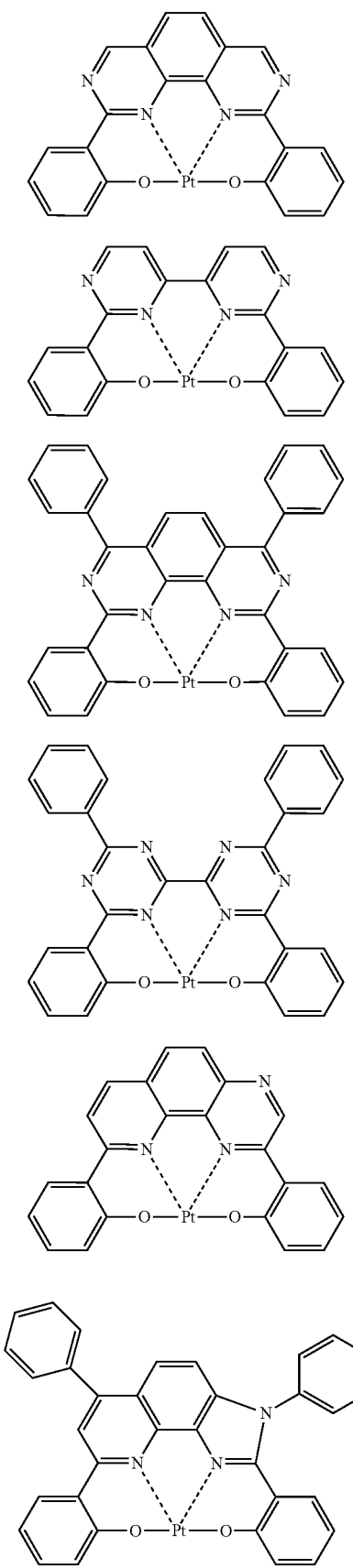
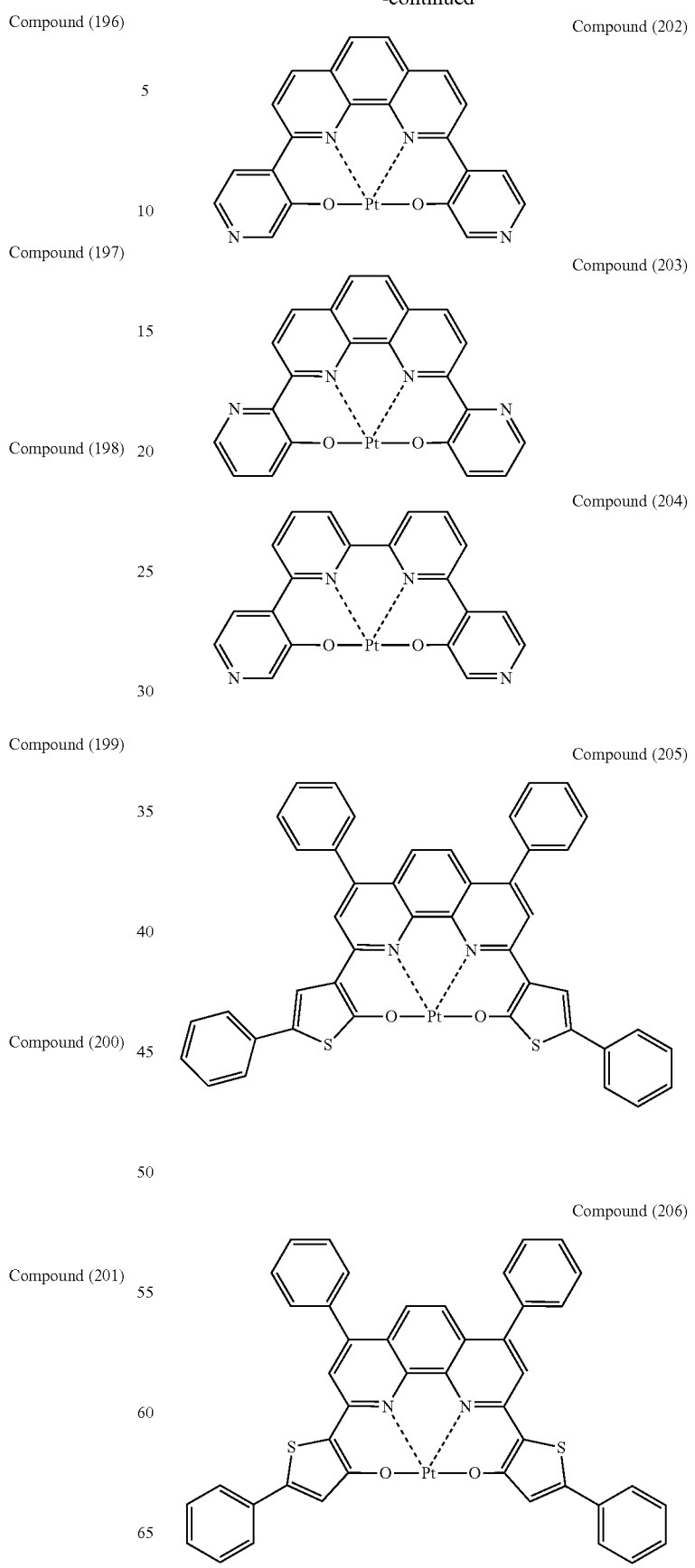

Compound (207)
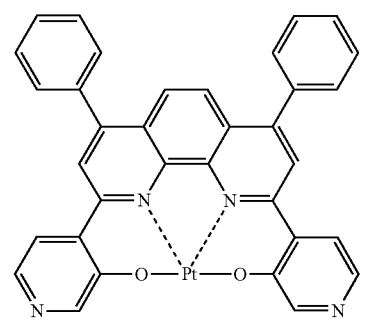
Compound (208)
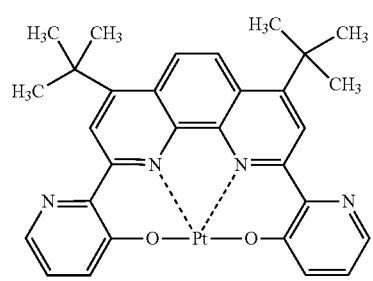
Compound (209)
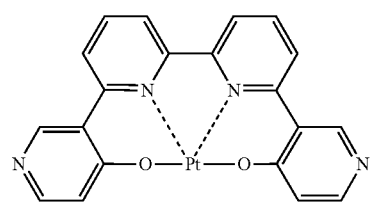
Compound (210)
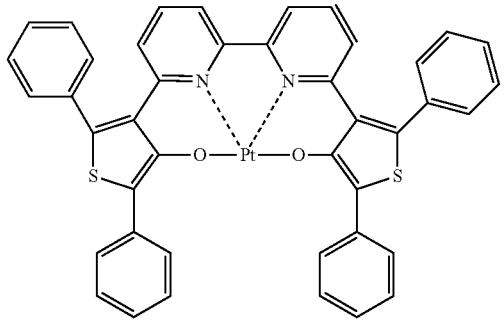
Compound (211)
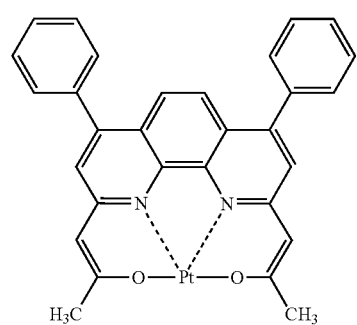
Compound (212)
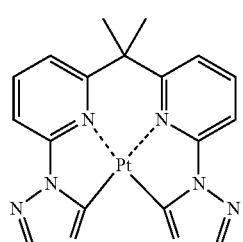
Compound (213)
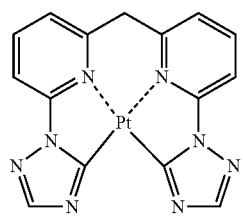
Compound (214)
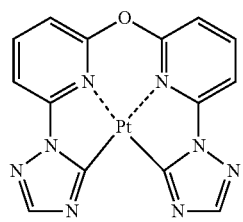
Compound (215)
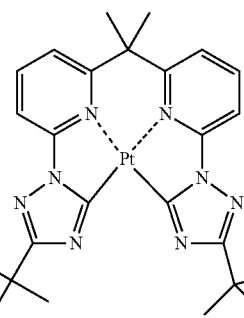
Compound (216)
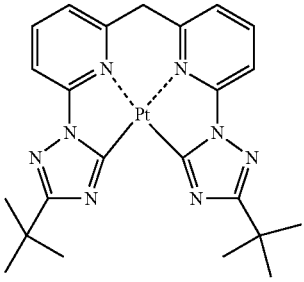
Compound (217)
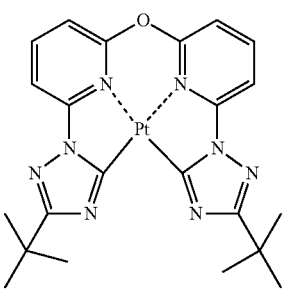

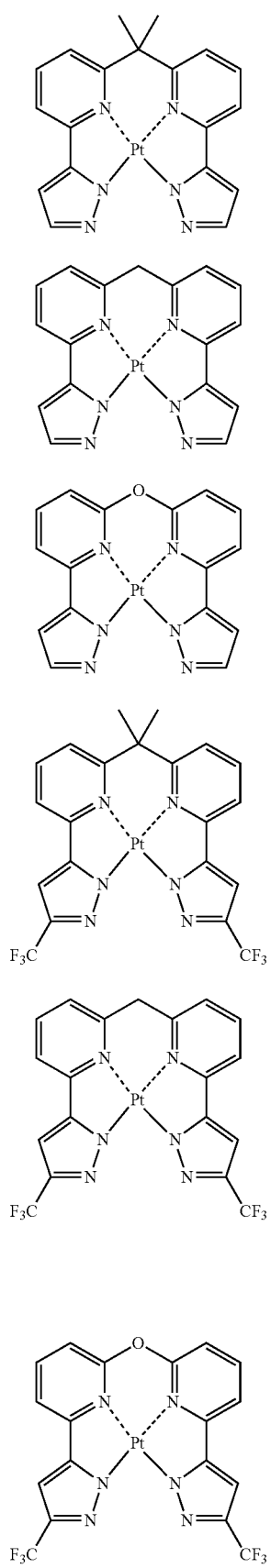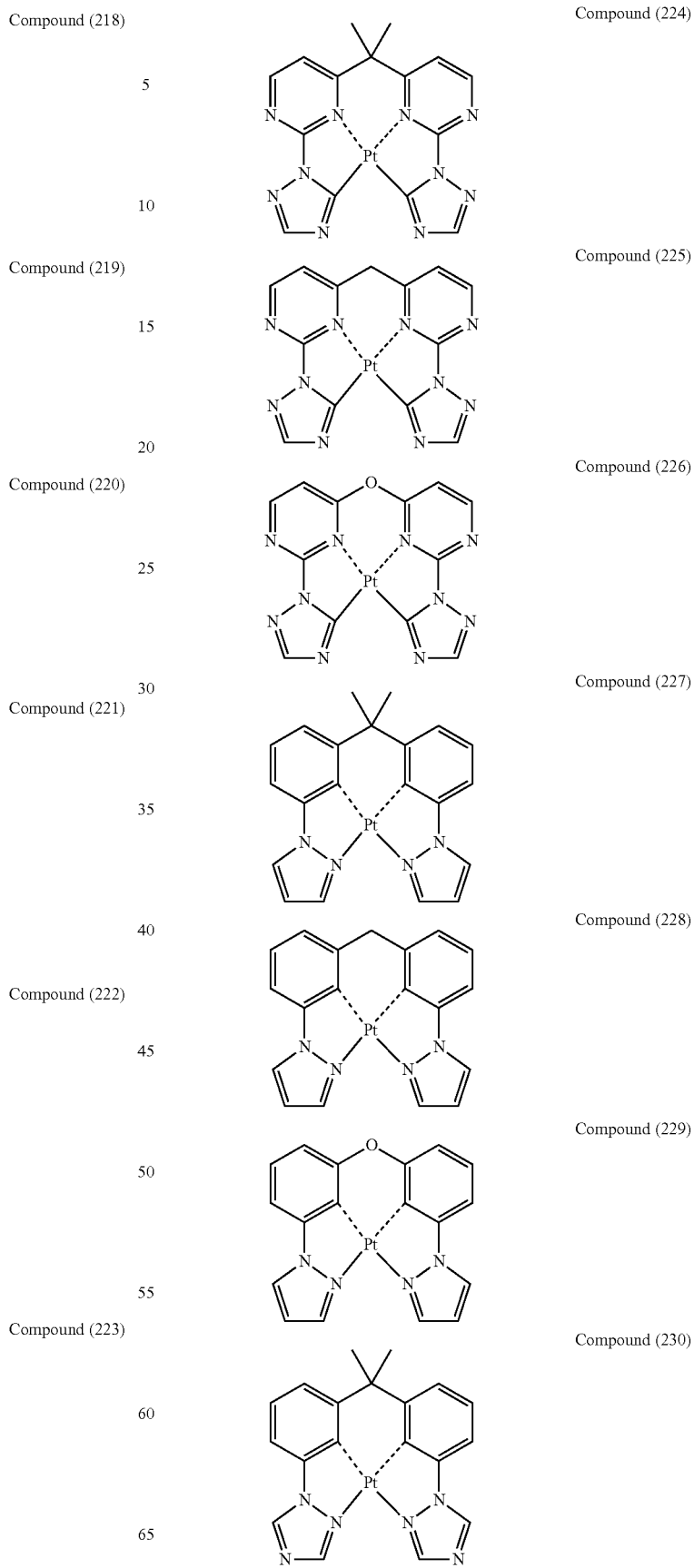

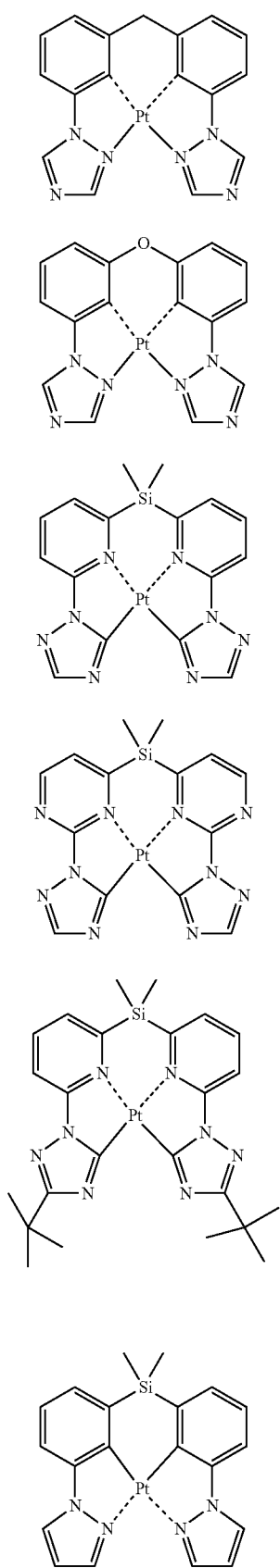
Compound (231)
Compound (232)
Compound (233)
Compound (234)
Compound (235)
Compound (236)
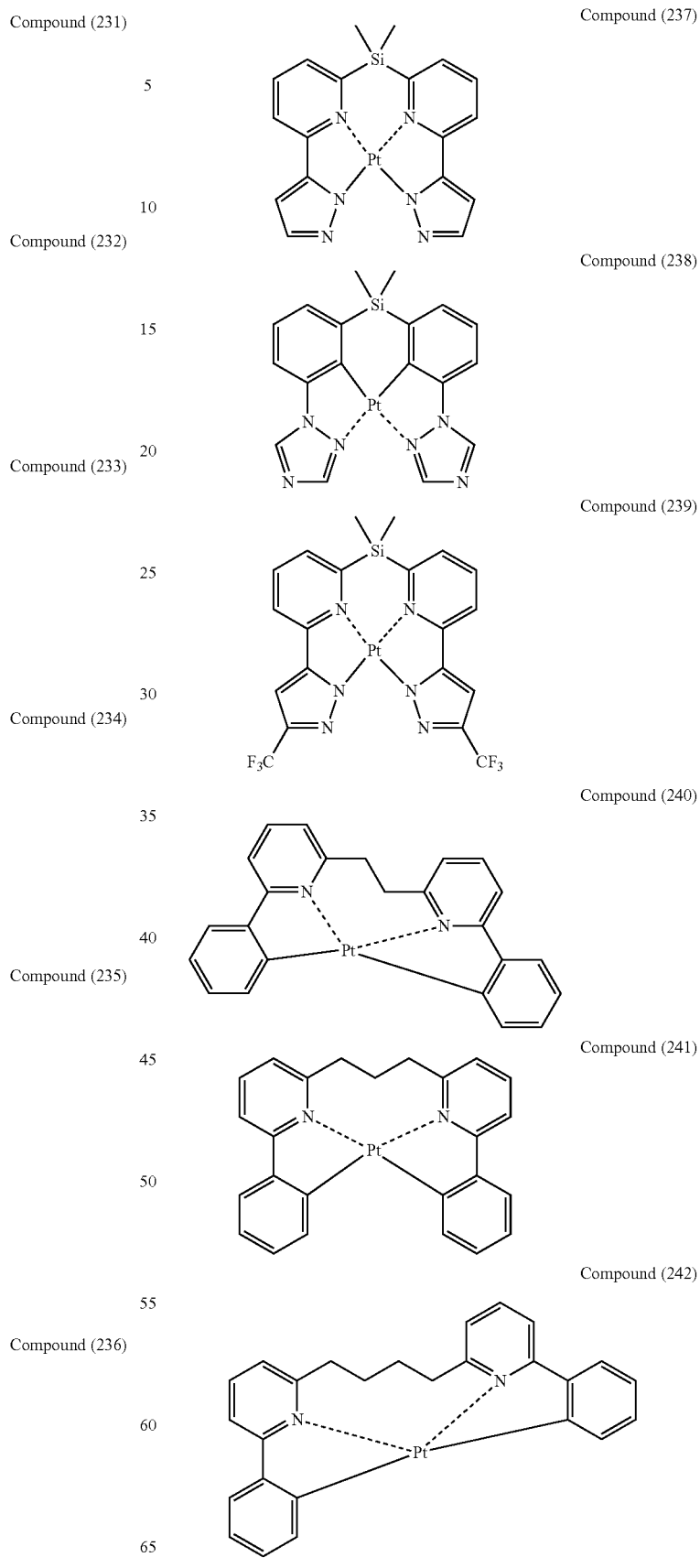
Compound (237)
Compound (238)
Compound (239)
Compound (240)
Compound (241)
Compound (242)

(Method of Preparing the Metal Complex According to the Invention)

The metal complexes according to the invention [compounds represented by formulae (II), (1), (1-A), (2), (3), (3-A), (3-B), (3-C), (4), (4-A), (5), (5-A), and (5-B) and formulae (III), (X2), and (X3)] can be prepared by various methods.

For example, a metal complex within the scope of the invention can be prepared by allowing a ligand or a dissociated form of the ligand to react with a metal compound under heating or at a temperature which is not higher than room temperature, 1) in the presence of a solvent (such as a halogenated solvent, an alcohol solvent, an ether solvent, an ester solvent, a ketone solvent, a nitrile solvent, an amide solvent, a sulfone solvent, a sulfoxide solvent, or water), 2) in the absence of a solvent but in the presence of a base (an inorganic or organic base such as sodium methoxide, potassium t-butoxide, triethylamine, or potassium carbonate), or 3) in the absence of a base. The heating may be conducted efficiently by a normal method or by using a microwave.

The reaction period at the preparation of the metal complex according to the invention may be changed according to the activity of the raw materials and is not particularly limited, but is preferably 1 minute to 5 days, more preferably 5 minutes to 3 days, and still more preferably 10 minutes to 1 day.

The reaction temperature for the preparation of the metal complex according to the invention may be changed according to the reaction activity, and is not particularly limited. The reaction temperature is preferably 0° C. to 300° C., more preferably 5° C. to 250° C., and still more preferably 10° C. to 200° C.

Each of the metal complexes according to the invention, i.e., the compounds represented by formulae (II), (1), (1-A), (2), (3), (3-A), (3-B), (3-C), (4), (4-A), (5), (5-A), and (5-B) and the compound represented by formulae (III), (X2), and (X3), can be prepared by properly selecting a ligand that forms the partial structure of the desirable complex. For example, a compound represented by formula (1-A) can be prepared by adding 6,6'-bis(2-hydroxyphenyl)-2,2'-bipyridyl ligand or a derivative thereof (e.g., 2,9-bis(2-hydroxyphenyl)-1,10-phenanthroline ligand, 2,9-bis(2-hydroxyphenyl)-4,7-diphenyl-1,10-phenanthroline ligand, 6,6'-bis(2-hydroxy-5-tert-butylphenyl)-2,2'-bipyridyl ligand) to a metal compound in an amount of preferably 0.1 to 10 equivalences, more preferably 0.3 to 6 equivalences, and still more preferably 0.5 to 4 equivalences, with respect to the quantity of metal compound. The reaction solvent, reaction time, and reaction temperature at the preparation of the compound represented by formula (1-A) are the same as in the method for preparing the metal complexes according to the invention described above.

The derivatives of 6,6'-bis(2-hydroxyphenyl)-2,2'-bipyridyl ligand can be prepared by any one of known preparative methods.

In an embodiment, a derivative is prepared by allowing a 2,2'-bipyridyl derivative (e.g., 1,10-phenanthroline) to react with an anisole derivative (e.g., 4-fluoroanisole) according to the method described in Journal of Organic Chemistry, 741, 11, (1946), the disclosure of which is incorporated herein by reference. In another embodiment, a derivative is prepared by performing Suzuki coupling reaction using a halogenated 2,2'-bipyridyl derivative (e.g., 2,9-dibromo-1,10-phenanthroline) and a 2-methoxyphenylboronic acid derivative (e.g., 2-methoxy-5-fluorophenylboronic acid) as starting materials and then deprotecting the methyl group (according to the method described in Journal of Organic Chemistry, 741, 11, (1946) or under heating in pyridine hydrochloride salt). In another embodiment, a derivative can be prepared by performing Suzuki coupling reaction using a 2,2'-bipyridylboronic acid derivative [e.g., 6,6'-bis(4,4,5,5-tetramethyl-1,3,2-dioxaboronyl)-2,2'-bipyridyl] and a halogenated anisole derivative (e.g., 2-bromoanisole) as starting materials and then deprotecting the methyl group (according to the method described in Journal of Organic Chemistry, 741, 11, (1946) or under heating in pyridine hydrochloride salt).

When the above-mentioned ligand for the metal complex according to the invention is a cyclic ligand, the metal complex is preferably a compound represented by the following formula (IV).

Hereinafter, the compound represented by the following formula (IV) will be described.

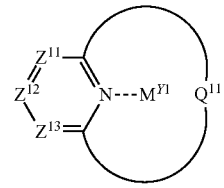

Formula (IV)

In formula (IV), $Q^{11}$ represents an atomic group forming a nitrogen-containing heterocyclic ring; $Z^{11}$, $Z^{12}$, and $Z^{13}$ each represent a substituted or unsubstituted carbon or nitrogen atom; and $M^{Y1}$ represents a metal ion that may have an additional ligand.

In formula (IV), $Q^{11}$ represents an atomic group forming a nitrogen-containing heterocyclic ring together with the two carbon atoms bonded to $Q^{11}$ and the nitrogen atom directly bonded to these carbon atoms. The number of the atoms constituting the nitrogen-containing heterocyclic ring containing $Q^{11}$ is not particularly limited, but is preferably 12 to 20, more preferably 14 to 16, and still more preferably 16.

$Z^{11}$, $Z^{12}$, and $Z^{13}$ each independently represent a substituted or unsubstituted carbon or nitrogen atom. At least one of $Z^{11}$, $Z^{12}$, and $Z^{13}$ is preferably a nitrogen atom.

Examples of the substituent on the carbon atom include alkyl groups (preferably having 1 to 30 carbon atoms, more preferably 1 to 20 carbon atoms, and particularly preferably 1 to 10 carbon atoms, such as methyl, ethyl, iso-propyl, tert-butyl, n-octyl, n-decyl, n-hexadecyl, cyclopropyl, cyclopentyl, and cyclohexyl), alkenyl groups (preferably having 2 to 30 carbon atoms, more preferably 2 to 20 carbon atoms, and particularly preferably 2 to 10 carbon atoms, such as vinyl, allyl, 2-butenyl, and 3-pentenyl), alkynyl groups (preferably having 2 to 30 carbon atoms, more preferably 2 to 20 carbon atoms, and particularly preferably 2 to 10 carbon atoms, such as propargyl and 3-pentynyl), aryl groups (preferably having 6 to 30 carbon atoms, more preferably 6 to 20 carbon atoms, and particularly preferably 6 to 12 carbon atoms, such as phenyl, p-methylphenyl, naphthyl, and anthranyl), amino groups (preferably having 0 to 30 carbon atoms, more preferably 0 to 20 carbon atoms, and particularly preferably 0 to 10 carbon atoms, such as amino, methylamino, dimethylamino, diethylamino, dibenzylamino, diphenylamino, and ditolylamino), alkoxy groups (preferably having 1 to 30 carbon atoms, more preferably 1 to 20 carbon atoms, and particularly preferably 1 to 10 carbon atoms, such as methoxy, ethoxy, butoxy, and 2-ethylhexyloxy), aryloxy groups (preferably having 6 to 30 carbon atoms, more preferably 6 to 20 carbon atoms, and particularly preferably 6 to 12 carbon atoms, such as phenyloxy, 1-naphthyloxy, and 2-naphthyloxy), heterocyclic oxy groups (preferably having 1 to 30 carbon atoms, more preferably 1 to 20 carbon atoms, and particularly preferably 1 to 12 carbon atoms, such as pyridyloxy, pyrazyloxy, pyrimidyloxy, and quinolyloxy), acyl groups (preferably having 1 to 30 carbon atoms, more preferably 1 to 20 carbon atoms, and particularly preferably 1 to 12 carbon atoms, such as acetyl, benzoyl, formyl, and pivaloyl), alkoxycarbonyl groups (preferably having 2 to 30 carbon atoms, more preferably 2 to 20 carbon atoms, and particularly preferably 2 to 12 carbon atoms, such as methoxycarbonyl and ethoxycarbonyl), aryloxycarbonyl groups (preferably having 7 to 30 carbon atoms, more preferably 7 to 20 carbon atoms, and particularly preferably 7 to 12 carbon atoms, such as phenyloxycarbonyl), acyloxy groups (preferably having 2 to 30 carbon atoms, more preferably 2 to 20 carbon atoms, and particularly preferably 2 to 10 carbon atoms, such as acetoxy and benzoyloxy), acylamino groups (preferably having 2 to 30 carbon atoms, more preferably 2 to 20 carbon atoms, and particularly preferably 2 to 10 carbon atoms, such as acetylamino and benzoylamino)

alkoxycarbonylamino groups (preferably having 2 to 30 carbon atoms, more preferably 2 to 20 carbon atoms, and particularly preferably 2 to 12 carbon atoms, such as methoxycarbonylamino), aryloxycarbonylamino groups (preferably having 7 to 30 carbon atoms, more preferably 7 to 20 carbon atoms, and particularly preferably 7 to 12 carbon atoms, such as phenyloxycarbonylamino), sulfonylamino groups (preferably having 1 to 30 carbon atoms, more preferably 1 to 20 carbon atoms, and particularly preferably 1 to 12 carbon atoms, such as methanesulfonylamino and benzene sulfonylamino), sulfamoyl groups (preferably having 0 to 30 carbon atoms, more preferably 0 to 20 carbon atoms, and particularly preferably 0 to 12 carbon atoms, such as sulfamoyl, methylsulfamoyl, dimethylsulfamoyl, and phenylsulfamoyl), carbamoyl groups (preferably having 1 to 30 carbon atoms, more preferably 1 to 20 carbon atoms, and particularly preferably 1 to 12 carbon atoms, such as carbamoyl, methylcarbamoyl, diethylcarbamoyl, and phenylcarbamoyl), alkylthio groups (preferably having 1 to 30 carbon atoms, more preferably 1 to 20 carbon atoms, and particularly preferably 1 to 12 carbon atoms, such as methylthio and ethylthio), arylthio groups (preferably having 6 to 30 carbon atoms, more preferably 6 to 20 carbon atoms, and particularly preferably 6 to 12 carbon atoms, such as phenylthio), heterocyclic thio groups (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, and 2-benzothiazolylthio), sulfonyl groups (preferably having 1 to 30 carbon atoms, more preferably 1 to 20 carbon atoms, and particularly preferably 1 to 12 carbon atoms, such as mesyl and tosyl), sulfinyl groups (preferably having 1 to 30 carbon atoms, more preferably 1 to 20 carbon atoms, and particularly preferably 1 to 12 carbon atoms, such as methanesulfinyl and benzenesulfinyl), ureido groups (preferably having 1 to 30 carbon atoms, more preferably 1 to 20 carbon atoms, and particularly preferably 1 to 12 carbon atoms, such as ureido, methylureido, and phenylureido), phosphoric amide groups (preferably having 1 to 30 carbon atoms, more preferably 1 to 20 carbon atoms, and particularly preferably 1 to 12 carbon atoms, such as diethylphosphoric amide and phenyl-phosphoric amide), a hydroxy group, a mercapto group, halogen atoms (e.g., fluorine, chlorine, bromine, and iodine), a cyano group, a sulfo group, a carboxyl group, a nitro group, a hydroxamic acid group, sulfino groups, hydrazino groups, imino groups, heterocyclic groups (preferably having 1 to 30 carbon atoms, and particularly preferably 1 to 12 carbon atoms; the heteroatom(s) may be selected from nitrogen, oxygen and sulfur atoms; examples of the heterocyclic groups include imidazolyl, pyridyl, quinolyl, furyl, thienyl, piperidyl, morpholino, benzoxazolyl, benzimidazolyl, benzothiazolyl, carbazolyl, and azepinyl), silyl groups (preferably having 3 to 40 carbon atoms, more preferably 3 to 30 carbon atoms, and particularly preferably 3 to 24 carbon atoms, such as trimethylsilyl and triphenylsilyl), silyloxy groups (preferably having 3 to 40 carbon atoms, more preferably 3 to 30 carbon atoms, and particularly preferably 3 to 24 carbon atoms, such as trimethylsilyloxy and triphenylsilyloxy), and the like. These substituents may themselves be substituted.

Among these substituents, the substituent on the carbon atom is preferably an alkyl, aryl, or heterocyclic group or a halogen atom, more preferably an aryl group or a halogen atom, and still more preferably a phenyl group or a fluorine atom.

The substituent on the nitrogen atom may be selected from the substituents described as examples of the substituent on the carbon atom, and have the same preferable range as in the case of the substituent on the carbon atom.

In formula (IV), $M^{Y1}$ represents a metal ion that may have an additional ligand, and preferably a metal ion having no ligand.

The metal ion represented by $M^{Y1}$ is not particularly limited, but is preferably a divalent or trivalent metal ion. The divalent or trivalent metal ion is preferably a cobalt, magnesium, zinc, palladium, nickel, copper, platinum, lead, aluminum, iridium, or europium ion, more preferably a cobalt, magnesium, zinc, palladium, nickel, copper, platinum, or lead ion, still more preferably a copper or platinum ion, and particularly preferably a platinum ion. $M^{Y1}$ may or may not be bound to an atom contained in $Q^{11}$, preferably bound to an atom contained in $Q^{11}$.

The additional ligand that $M^{Y1}$ may have is not particularly limited, but is preferably a monodentate or bidentate ligand, and more preferably a bidentate ligand. The coordinating atom is not particularly limited, but preferably an oxygen, sulfur, nitrogen, carbon, or phosphorus atom, more preferably an oxygen, nitrogen, or carbon atom, and still more preferably an oxygen or nitrogen atom.

Preferable examples of compounds represented by formula (IV) include compounds represented by the following formulae (a) to (j) and the tautomers thereof.

Compounds represented by formula (IV) are more preferably selected from compounds represented by formulae (a) and (b) and tautomers thereof, and still more preferably selected from compounds represented by formula (b).

Compounds represented by formula (c) or (g) are also preferable as the compounds represented by formula (IV).

A compound represented by formula (c) is preferably a compound represented by formula (d), a tautomer of a compound represented by formula (d), a compound represented by formula (e), a tautomer of a compound represented by formula (e), a compound represented by formula (f) or a tautomer of a compound represented by formula (f); more preferably a compound represented by formula (d), a tautomer of a compound represented by formula (d), a compound represented by formula (e), or a tautomer of a compound represented by formula (e); and still more preferably a compound represented by formula (d) or a tautomer of a compound represented by formula (d).

A compound represented by formula (g) is preferably a compound represented by formula (h), a tautomers of a compound represented by formula (h), a compound represented by formula (i), a tautomer of a compound represented by formula (i), a compounds represented by formula (j) or a tautomer of a compounds represented by formula (j); more preferably a compound represented by formula (h), a tautomers of a compound represented by formula (h), a compound represented by formula (i), or a tautomer of a compound represented by formula (i); and still more preferably a compound represented by formula (h) or a tautomer of a compound represented by formula (h).

Hereinafter, the compounds represented by formulae (a) to (j) will be described in detail.

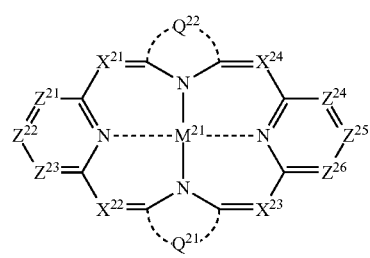

Formula (a)

The compound represented by formula (a) will be described below.

In formula (a), the definitions and preferable ranges of $Z^{21}$, $Z^{22}$, $Z^{23}$, $Z^{24}$, $Z^{25}$, $Z^{26}$, and $M^{21}$ are the same as the definitions and preferable ranges of corresponding $Z^{11}$, $Z^{12}$, $Z^{13}$, $Z^{11}$, $Z^{12}$, $Z^{13}$, and $M^{y1}$ in formula (IV), respectively.

$Q^{21}$ and $Q^{22}$ each represent a group forming a nitrogen-containing heterocyclic ring. Each of the nitrogen-containing heterocyclic rings formed by $Q^{21}$ and $Q^{22}$ is not particularly limited, but is preferably a pyrrole ring, an imidazole ring, a triazole ring, a condensed ring containing one or more of the above rings (e.g., benzopyrrole), or a tautomer of any of the above rings (e.g., in formula (b) below, the nitrogen-containing five-membered ring substituted by $R^{43}$ and $R^{44}$, or by $R^{45}$ and $R^{46}$ is defined as a tautomer of pyrrole), and more preferably a pyrrole ring or a condensed ring containing a pyrrole ring (e.g., benzopyrrole).

$X^{21}$, $X^{22}$, $X^{23}$, and $X^{24}$ each independently represent a substituted or unsubstituted carbon or nitrogen atom, preferably an unsubstituted carbon or nitrogen atom, and more preferably a nitrogen atom.

The compound represented by formula (b) will be described below.

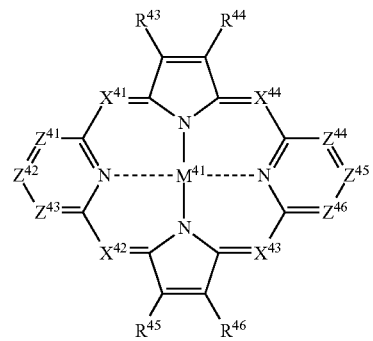

Formula (b)

In formula (b), the definitions and preferable ranges of $Z^{41}$, $Z^{42}$, $Z^{43}$, $Z^{44}$, $Z^{45}$, $Z^{46}$, $X^{41}$, $X^{42}$, $X^{43}$, $X^{44}$, and $M^{41}$ are the same as the definitions and preferable ranges of $Z^{21}$, $Z^{22}$, $Z^{23}$, $Z^{24}$, $Z^{25}$, $Z^{26}$, $X^{21}$, $X^{22}$, $X^{23}$, $X^{24}$, and $M^{21}$ in formula (a), respectively.

In an embodiment, $R^{43}$, $R^{44}$, $R^{45}$, and $R^{46}$ are each selected from a hydrogen atom and the alkyl groups and aryl groups described as examples of the substituent on $Z^{11}$ or $Z^{12}$ in formula (IV); or $R^{43}$ and $R^{44}$ are bonded to each other to form a ring structure (e.g., a benzo-condensed ring or a pyridine-condensed ring) and/or $R^{45}$ and $R^{46}$ are bonded to each other to form a ring structure (e.g., a benzo-condensed ring or a pyridine-condensed ring). In a preferable embodiment, $R^{43}$, $R^{44}$, $R^{45}$, and $R^{46}$ are each an alkyl group or an aryl group; or $R^{43}$ and $R^{44}$ are bonded to each other to form a ring structure (e.g., a benzo-condensed ring or a pyridine-condensed ring) and/or $R^{45}$ and $R^{46}$ are bonded to each other to form a ring structure (e.g., a benzo-condensed ring or a pyridine-condensed ring). In a more preferable embodiment, $R^{43}$ and $R^{44}$ are bonded to each other to form a ring structure (e.g., a benzo-condensed ring or a pyridine-condensed ring) and/or $R^{45}$ and $R^{46}$ are bonded to each other to form a ring structure (e.g., a benzo-condensed ring or a pyridine-condensed ring)

$R^{43}$, $R^{44}$, $R^{45}$, and $R^{46}$ each independently represent a hydrogen atom or a substituent. Examples of the substituent include the groups described as examples of the substituent on the carbon atom represented by $Z^{11}$ or $Z^{12}$ in formula (IV).

The compound represented by formula (c) will be described below.

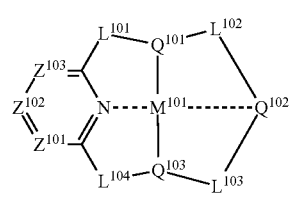

Formula (c)

In formula (c), $Z^{101}$, $Z^{102}$, and $Z^{103}$ each independently represent a substituted or unsubstituted carbon or nitrogen atom. At least one of $Z^{101}$, $Z^{102}$, and $Z^{103}$ is preferably a nitrogen atom.

$L^{101}$, $L^{102}$, $L^{103}$, and $L^{104}$ each independently represent a single bond or a connecting group. The connecting group is not particularly limited, and examples thereof include a carbonyl connecting group, an alkylene group, an alkenylene group, an arylene group, a heteroarylene group, a nitrogen-containing heterocyclic ring connecting group, an oxygen atom connecting group, an amino connecting group, an imino connecting group, a carbonyl connecting group, and connecting groups comprising combinations thereof.

$L^{101}$, $L^{102}$, $L^{103}$, and $L^{104}$ are each preferably a single bond, an alkylene group, an alkenylene group, an amino connecting group, or an imino connecting group, more preferably a single bond, an alkylene connecting group, an alkenylene connecting group, or an imino connecting group, and still more preferably a single bond or an alkylene connecting group.

$Q^{101}$ and $Q^{103}$ each independently represent a group containing a carbon, nitrogen, phosphorus, oxygen, or sulfur atom coordinating to $M^{101}$.

The group containing a coordinating carbon atom is preferably an aryl group containing a coordinating carbon atom, a five-membered ring heteroaryl group containing a coordinating carbon atom, or a six-membered ring heteroaryl group containing a coordinating carbon atom; more preferably, an aryl group containing a coordinating carbon atom, a nitrogen-containing five-membered ring heteroaryl group containing a coordinating carbon atom, or a nitrogen-containing six-membered ring heteroaryl group containing a coordinating carbon atom; and still more preferably, an aryl group containing a coordinating carbon atom.

The group containing a coordinating nitrogen atom is preferably a nitrogen-containing five-membered ring heteroaryl group containing a coordinating nitrogen atom or a nitrogen-containing six-membered ring heteroaryl group containing a coordinating nitrogen atom, and more preferably a nitrogen-containing six-membered ring heteroaryl group containing a coordinating nitrogen atom.

The group containing a coordinating phosphorus atom is preferably an alkyl phosphine group containing a coordinating phosphorus atom, an aryl phosphine group containing a coordinating phosphorus atom, an alkoxyphosphine group containing a coordinating phosphorus atom, an aryloxyphosphine group containing a coordinating phosphorus atom, a heteroaryloxyphosphine group containing a coordinating phosphorus atom, a phosphinine group containing a coordinating phosphorus atom, or a phosphor group containing a coordinating phosphorus atom; more preferably, an alkyl phosphine group containing a coordinating phosphorus atom or an aryl phosphine group containing a coordinating phosphorus atom.

The group containing a coordinating oxygen atom is preferably an oxy group or a carbonyl group containing a coordinating oxygen atom, and more preferably an oxy group.

The group containing a coordinating sulfur atom is preferably a sulfide group, a thiophene group, or a thiazole group, and more preferably a thiophene group.

Each of $Q^{101}$ and $Q^{103}$ is preferably a group containing a carbon, nitrogen, or oxygen atom coordinating to $M^{101}$; more preferably a group containing a carbon or nitrogen atom coordinating to $M^{101}$; and still more preferably a group containing a carbon atom coordinating to $M^{101}$.

$Q^{102}$ represents a group containing a nitrogen, phosphorus, oxygen, or sulfur atom coordinating to $M^{101}$, and preferably a group containing a nitrogen atom coordinating to $M^{101}$.

The definition of $M^{101}$ is the same as that of $M^{11}$ in formula (II), and their preferable ranges are also the same.

The compound represented by formula (d) will be described below.

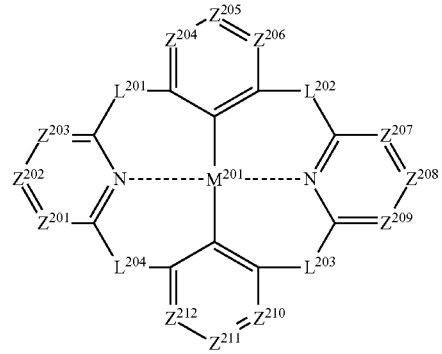

Formula (d)

In formula (d), the definitions and preferable ranges of $Z^{201}$, $Z^{202}$, $Z^{203}$, $Z^{207}$, $Z^{208}$, $Z^{209}$, $L^{201}$, $L^{202}$, $L^{203}$, $L^{204}$, and $M^{201}$ are the same as the definitions and preferable ranges $Z^{101}$, $Z^{102}$, $Z^{103}$, $Z^{101}$, $Z^{102}$, $Z^{103}$, $L^{101}$, $L^{102}$, $L^{103}$, $L^{104}$, and $M^{101}$ in formula (c), respectively. $Z^{204}$, $Z^{205}$, $Z^{206}$, $Z^{210}$, $Z^{211}$, and $Z^{212}$ each represent a substituted or unsubstituted carbon or nitrogen atom, and preferably a substituted or unsubstituted carbon atom.

The compound represented by formula (e) will be described below.

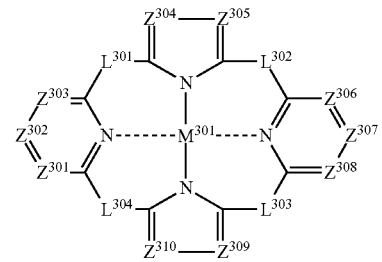

Formula (e)

In formula (e), the definitions and preferable ranges of $Z^{301}$, $Z^{302}$, $Z^{303}$, $Z^{304}$, $Z^{305}$, $Z^{306}$, $Z^{307}$, $Z^{308}$, $Z^{309}$, $Z^{310}$, $L^{301}$, $L^{302}$, $L^{303}$, $L^{304}$, and $M^{301}$ are the same as the definitions and preferable ranges of corresponding $Z^{201}$, $Z^{202}$, $Z^{203}$, $Z^{204}$, $Z^{206}$, $Z^{207}$, $Z^{208}$, $Z^{209}$, $Z^{210}$, $Z^{212}$, $L^{101}$, $L^{102}$, $L^{103}$, $L^{104}$, and $M^{101}$ in formulae (d) and (c), respectively.

The compound represented by formula (f) will be described below.

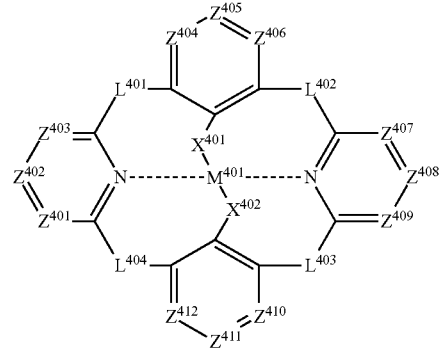

Formula (f)

In formula (f), the definitions and preferable ranges of $Z^{401}$, $Z^{402}$, $Z^{403}$, $Z^{404}$, $Z^{405}$, $Z^{406}$, $Z^{407}$, $Z^{408}$, $Z^{409}$, $Z^{410}$, $Z^{411}$, $Z^{412}$, $L^{401}$, $L^{402}$, $L^{403}$, $L^{404}$, and $M^{401}$ are the same as the definitions and preferable ranges of corresponding $Z^{201}$, $Z^{202}$, $Z^{203}$, $Z^{204}$, $Z^{205}$, $Z^{206}$, $Z^{207}$, $Z^{208}$, $Z^{209}$, $Z^{210}$, $Z^{211}$, $Z^{212}$, $L^{101}$, $L^{102}$, $L^{103}$, $L^{104}$, and $M^{101}$ in formulae (d) and (c), respectively. $X^{401}$ and $X^{402}$ each represent an oxygen atom or a substituted or unsubstituted nitrogen or sulfur atom, preferably an oxygen atom or a substituted nitrogen atom, and more preferably an oxygen atom.

The compound represented by formula (g) will be described below.

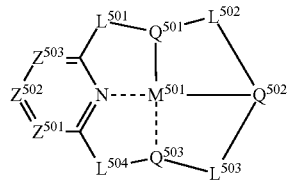

Formula (g)

In formula (g), the definitions and preferable ranges of $Z^{501}$, $Z^{502}$, $Z^{503}$, $L^{501}$, $L^{502}$, $L^{503}$, $L^{504}$, $Q^{501}$, $Q^{502}$, $Q^{503}$, and $M^{501}$ are the same as the definitions and preferable ranges of corresponding $Z^{101}$, $Z^{102}$, $Z^{103}$, $L^{101}$, $L^{102}$, $L^{103}$, $L^{104}$, $Q^{101}$, $Q^{103}$, $Q^{102}$, and $M^{101}$ in formula (c), respectively The compound represented by formula (h) will be described below.

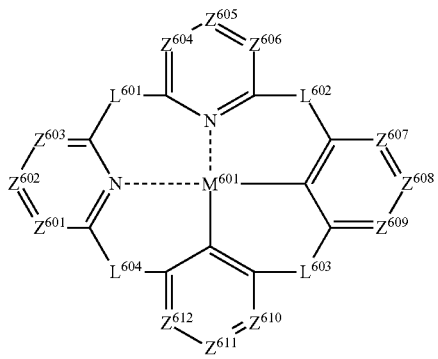

Formula (h)

In formula (h), the definitions and preferable ranges of $Z^{601}$, $Z^{602}$, $Z^{603}$, $Z^{604}$, $Z^{605}$, $Z^{606}$, $Z^{607}$, $Z^{608}$, $Z^{609}$, $Z^{610}$, $Z^{611}$, $Z^{612}$, $L^{601}$, $L^{602}$, $L^{603}$, $L^{604}$, and $M^{601}$ are the same as the definitions and preferable ranges of corresponding $Z^{201}$, $Z^{202}$, $Z^{203}$, $Z^{207}$, $Z^{208}$, $Z^{209}$, $Z^{204}$, $Z^{205}$, $Z^{206}$, $Z^{210}$, $Z^{211}$, $Z^{212}$, $L^{101}$, $L^{102}$, $L^{103}$, $L^{104}$, and $M^{101}$ in formulae (d) and (c), respectively.

The compound represented by formula (i) will be described below.

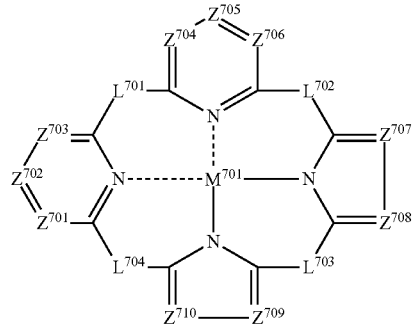

Formula (i)

In formula (i), the definitions and preferable ranges of $Z^{701}$, $Z^{702}$, $Z^{703}$, $Z^{704}$, $Z^{705}$, $Z^{706}$, $Z^{707}$, $Z^{708}$, $Z^{709}$, $Z^{710}$, $L^{701}$, $L^{702}$, $L^{703}$, $L^{704}$, and $M^{701}$ are the same as the definitions and preferable ranges of corresponding $Z^{201}$, $Z^{202}$, $Z^{203}$, $Z^{207}$, $Z^{208}$, $Z^{209}$, $Z^{204}$, $Z^{206}$, $Z^{210}$, $Z^{212}$, $L^{101}$, $L^{102}$, $L^{103}$, $L^{104}$, and $M^{101}$ in formulae (d) and (c), respectively.

The compound represented by formula (j) will be described below.

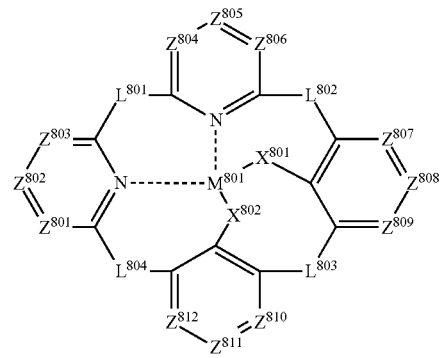

Formula (j)

In formula (j), the definitions and preferable ranges of $Z^{801}$, $Z^{802}$, $Z^{803}$, $Z^{804}$, $Z^{805}$, $Z^{806}$, $Z^{807}$, $Z^{808}$, $Z^{809}$, $Z^{810}$, $Z^{811}$, $Z^{812}$, $L^{801}$, $L^{802}$, $L^{803}$, $L^{804}$, $M^{801}$, $X^{801}$, and $X^{802}$ are the same as the definitions and preferable ranges of corresponding $Z^{201}$, $Z^{202}$, $Z^{203}$, $Z^{207}$, $Z^{208}$, $Z^{209}$, $Z^{204}$, $Z^{205}$, $Z^{206}$, $Z^{210}$, $Z^{211}$, $Z^{212}$, $L^{101}$, $L^{102}$, $L^{103}$, $L^{104}$, $M^{101}$, $X^{401}$, and $X^{402}$ in formulae (d), (c), and (f), respectively.

Specific examples of compounds represented by formula (IV) include compounds (2) to (8), compounds (15) to (20), compound (27) to (32), compounds (36) to (38), compounds (42) to (44), compounds (50) to (52), and compounds (57) to (154) described in Japanese Patent Application No. 2004-88575, the disclosure of which is incorporated herein by reference. The structures of the above compounds are shown below.

Compound (2)
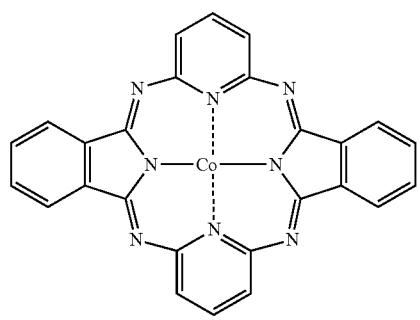
Compound (3)
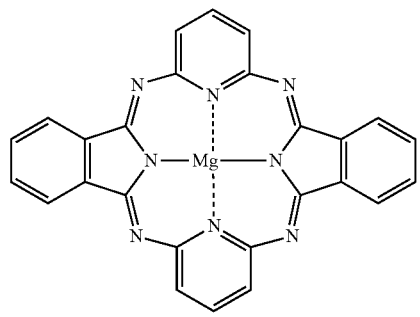
Compound (4)
Compound (5)
Compound (6)
Compound (7)
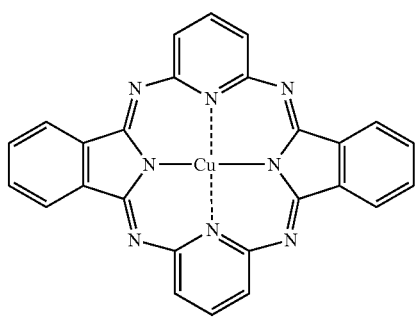
Compound (8)
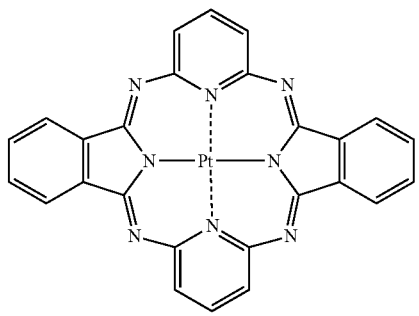
Compound (15)
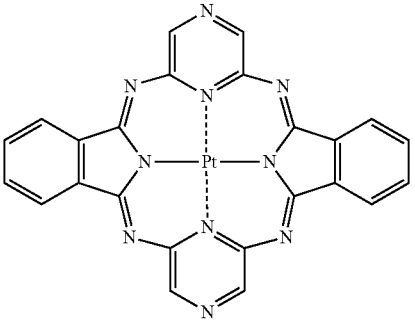
Compound (16)
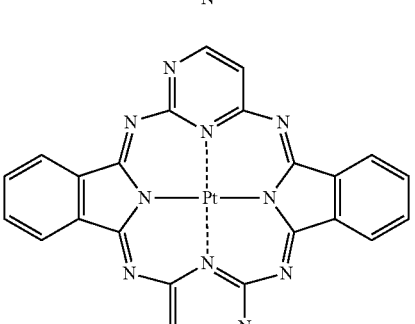
Compound (17)
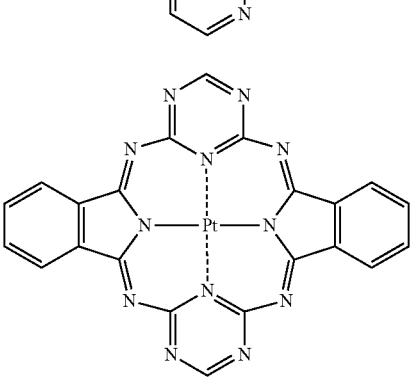

Compound (18)
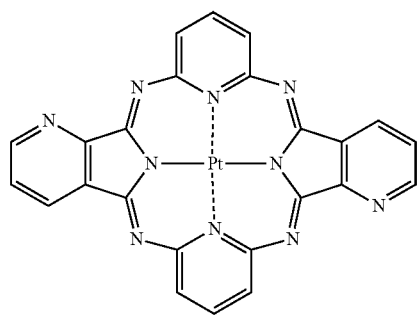
Compound (19)
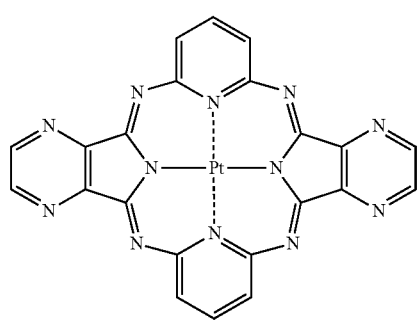
Compound (20)
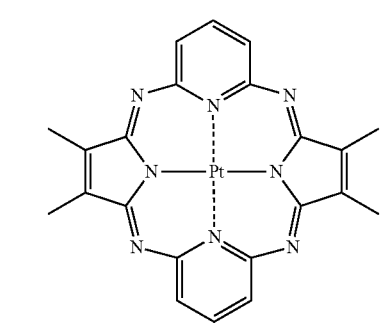
Compound (27)
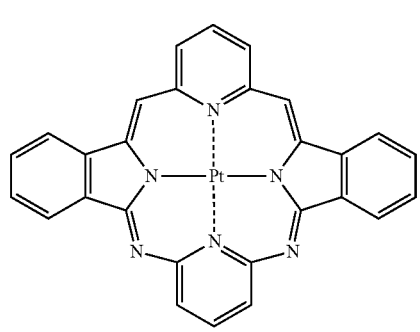
Compound (28)
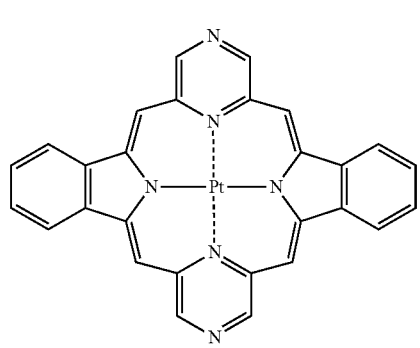
Compound (29)
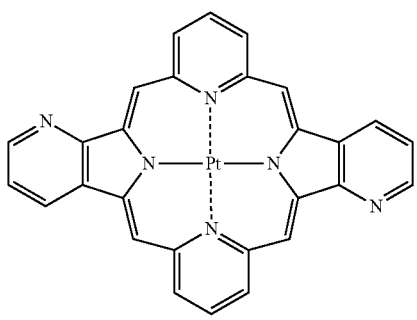
Compound (30)
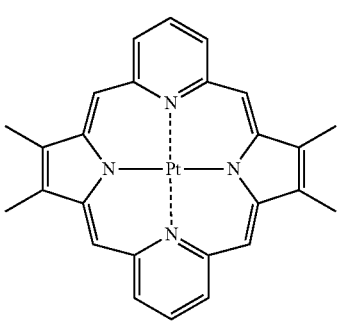
Compound (31)
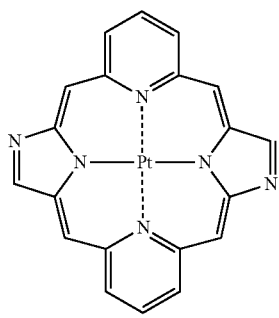
Compound (32)
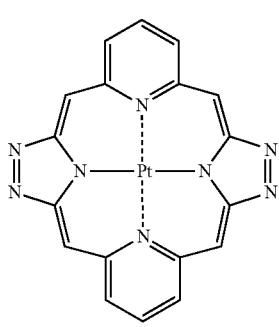

Compound (36)
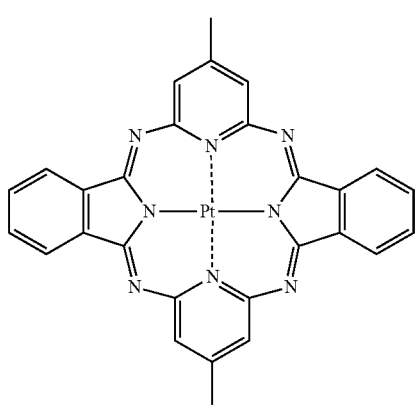
Compound (37)
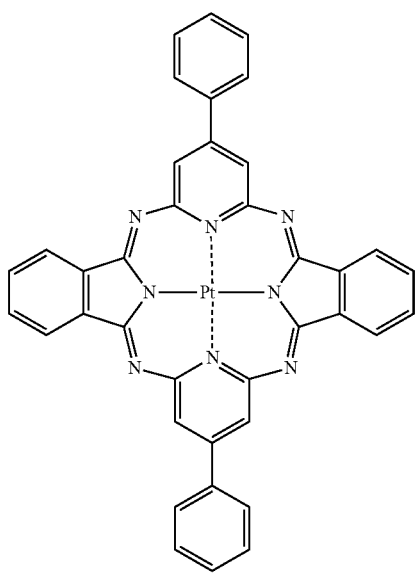
Compound (38)
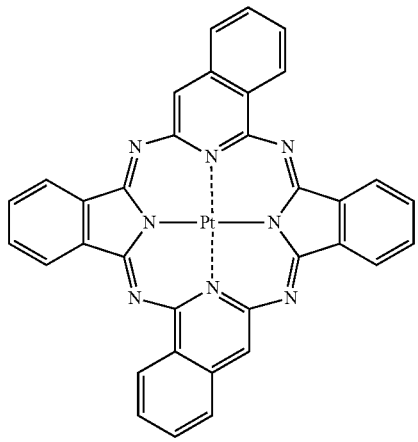
Compound (42)
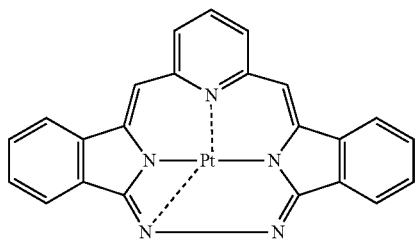
Compound (43)
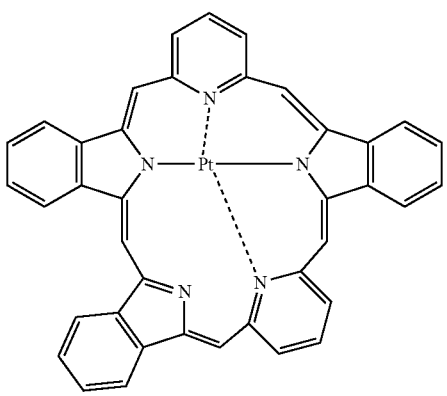
Compound (44)
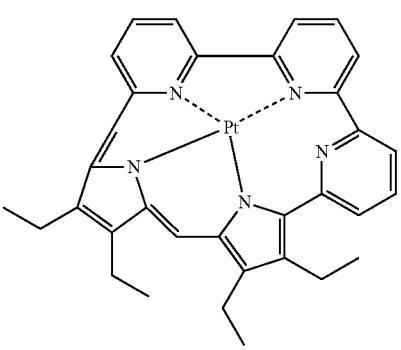
Compound (50)
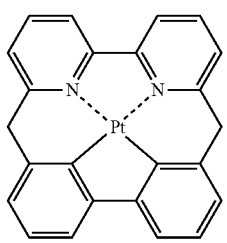
Compound (51)
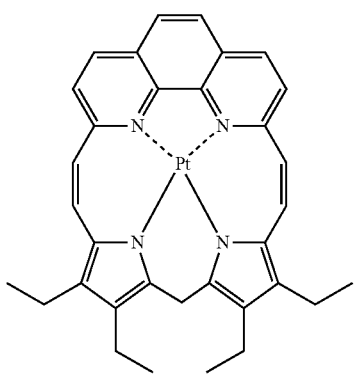

-continued
Compound (52)
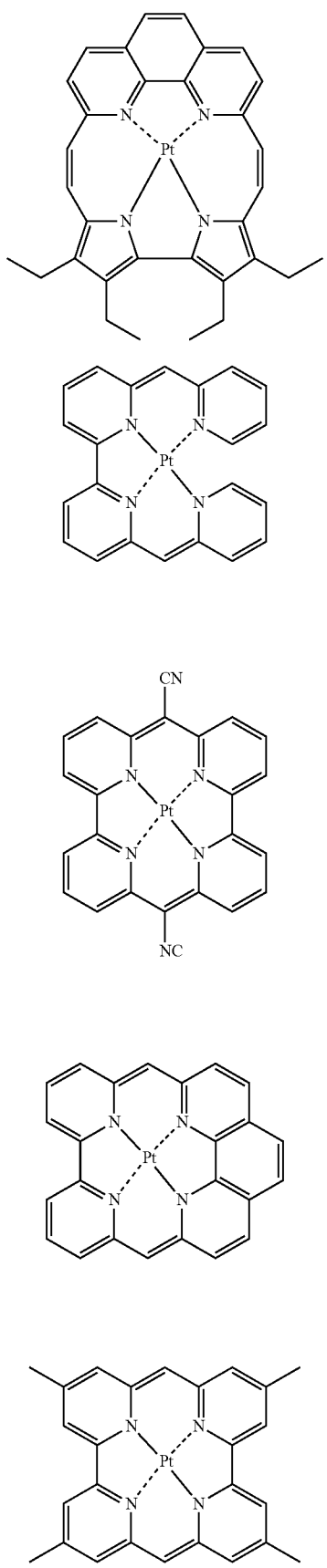
Compound (57)
Compound (58)
Compound (59)
Compound (60)
-continued
Compound (61)
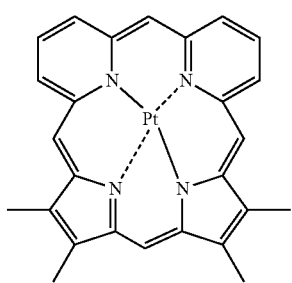
Compound (62)
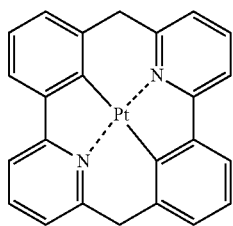
Compound (63)
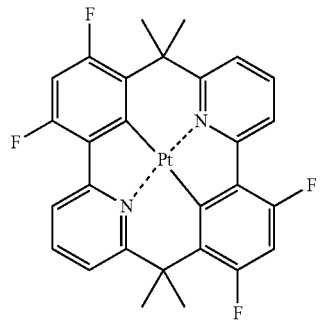
Compound (64)
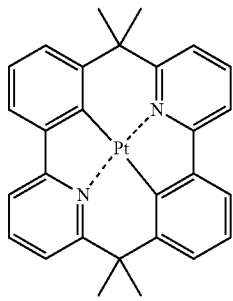
Compound (65)
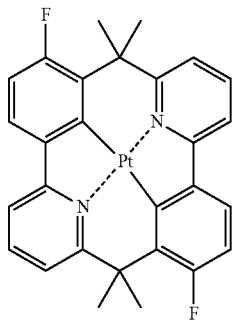

Compound (66)
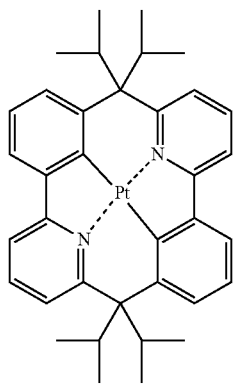
Compound (67)
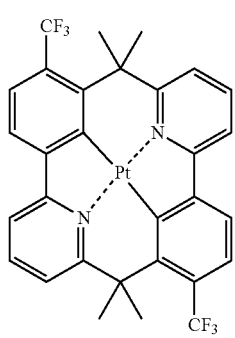
Compound (68)
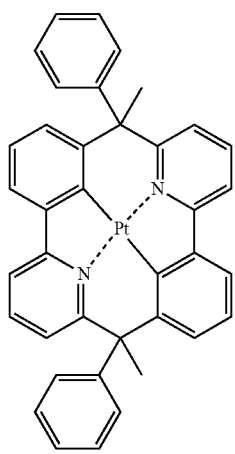
Compound (69)
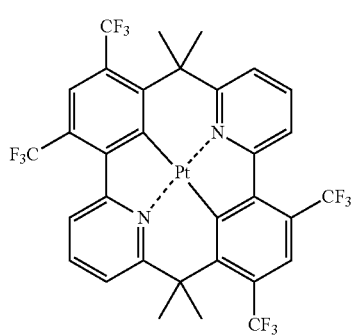
Compound (70)
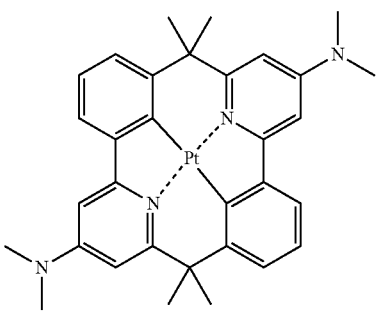
Compound (71)
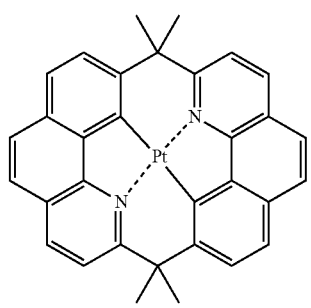
Compound (72)
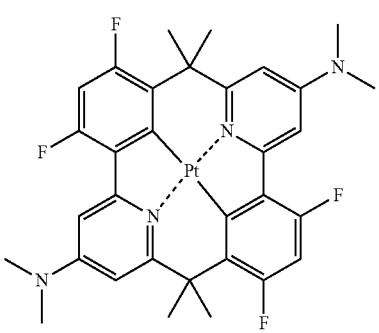
Compound (73)
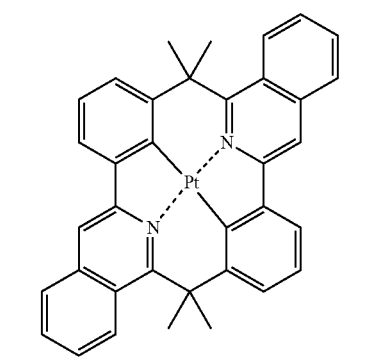
Compound (74)
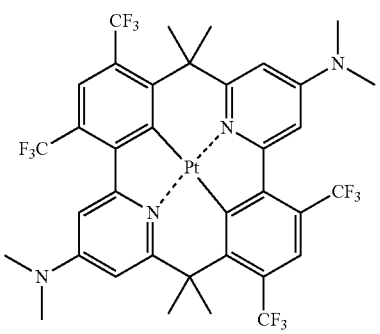

Compound (75)
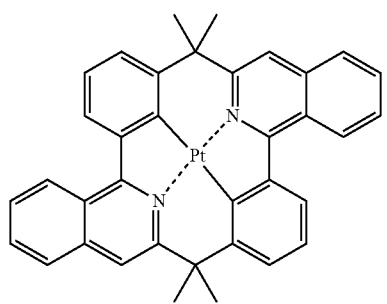
Compound (76)
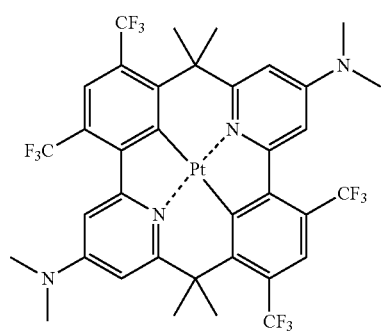
Compound (77)
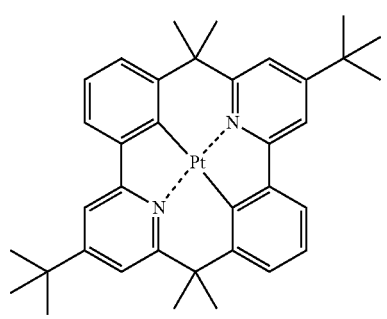
Compound (78)
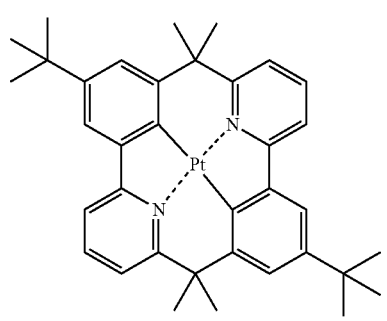
Compound (79)
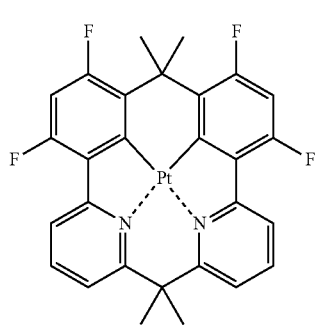
Compound (80)
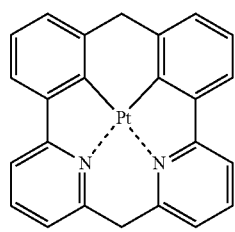
Compound (81)
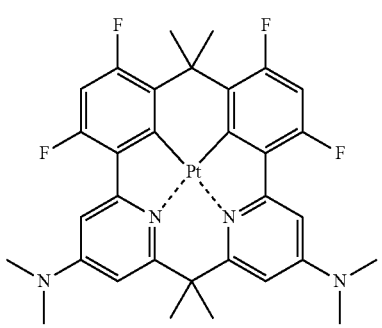
Compound (82)
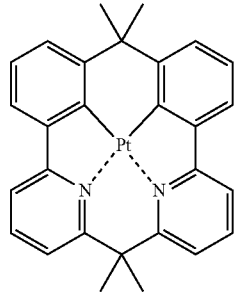
Compound (83)
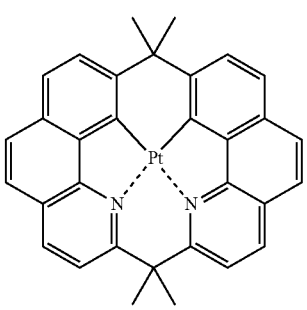
Compound (84)
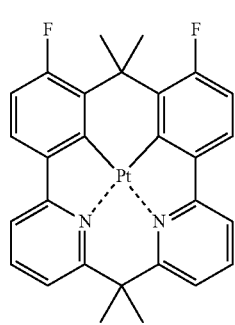

Compound (85)
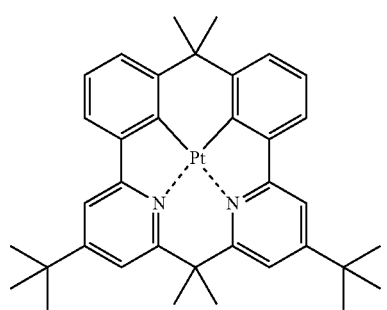
Compound (86)
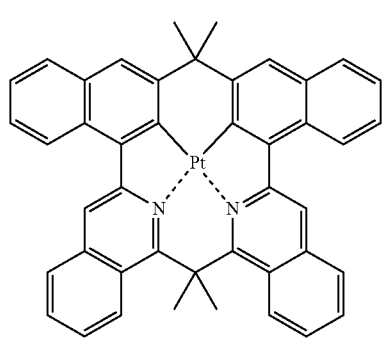
Compound (87)
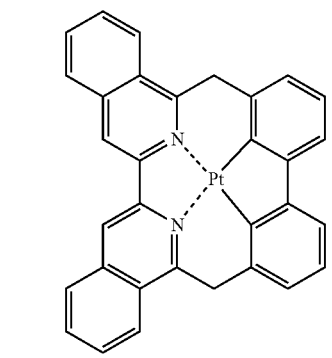
Compound (88)
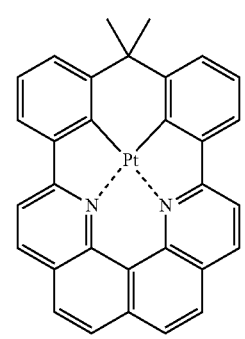
Compound (89)
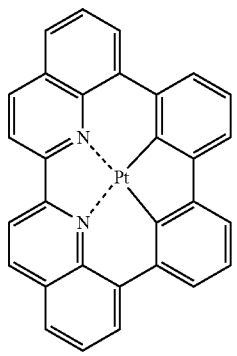
Compound (90)
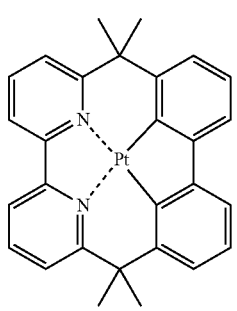
Compound (91)
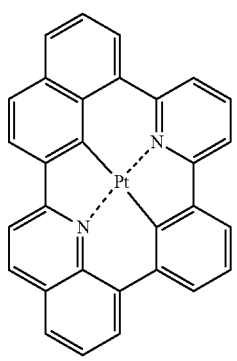
Compound (92)
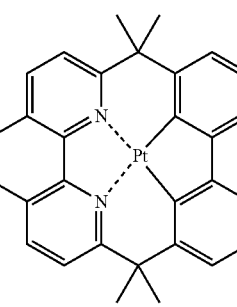
Compound (93)
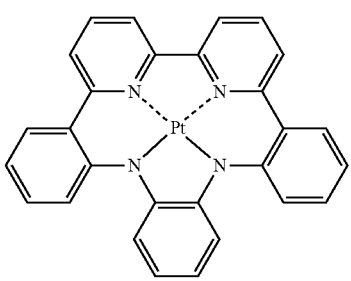

-continued
Compound (94)
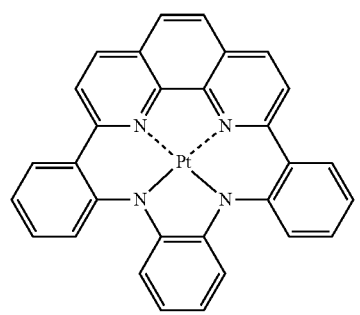
Compound (95)
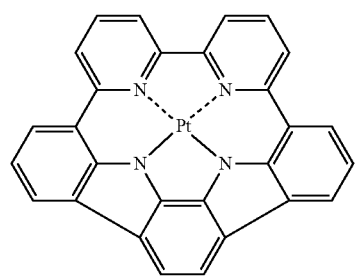
Compound (96)
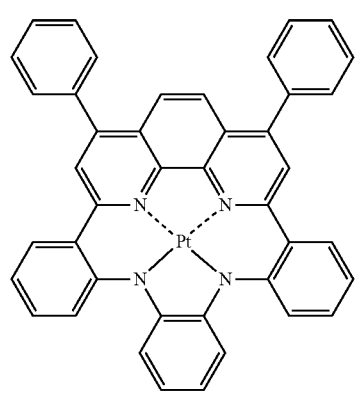
Compound (97)
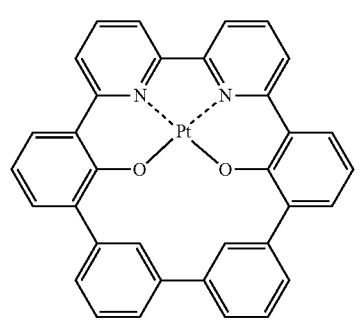
Compound (98)
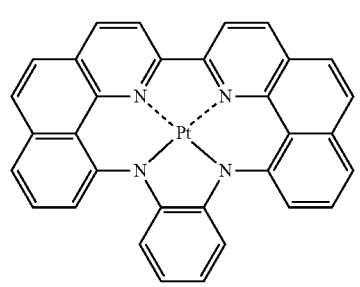
-continued
Compound (99)
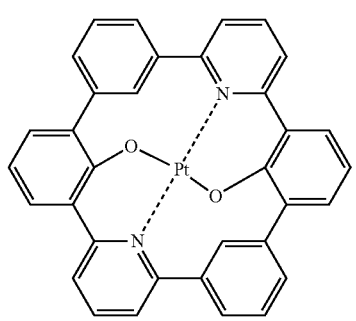
Compound (100)
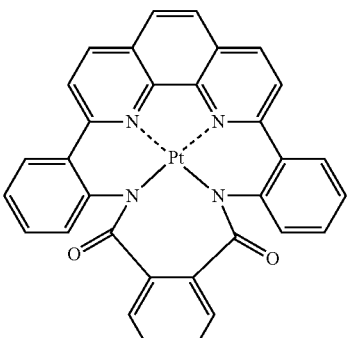
Compound (101)
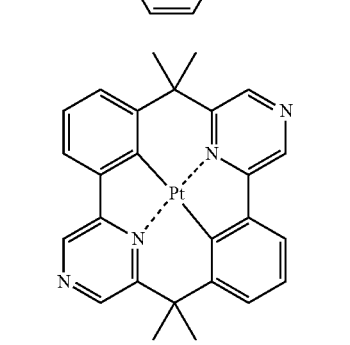
Compound (102)
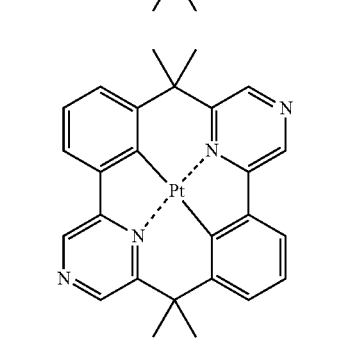
Compound (103)
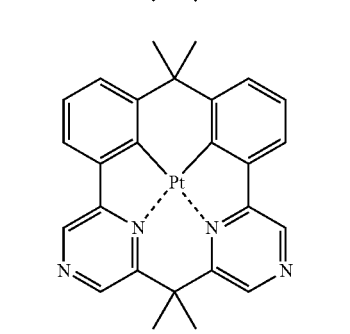

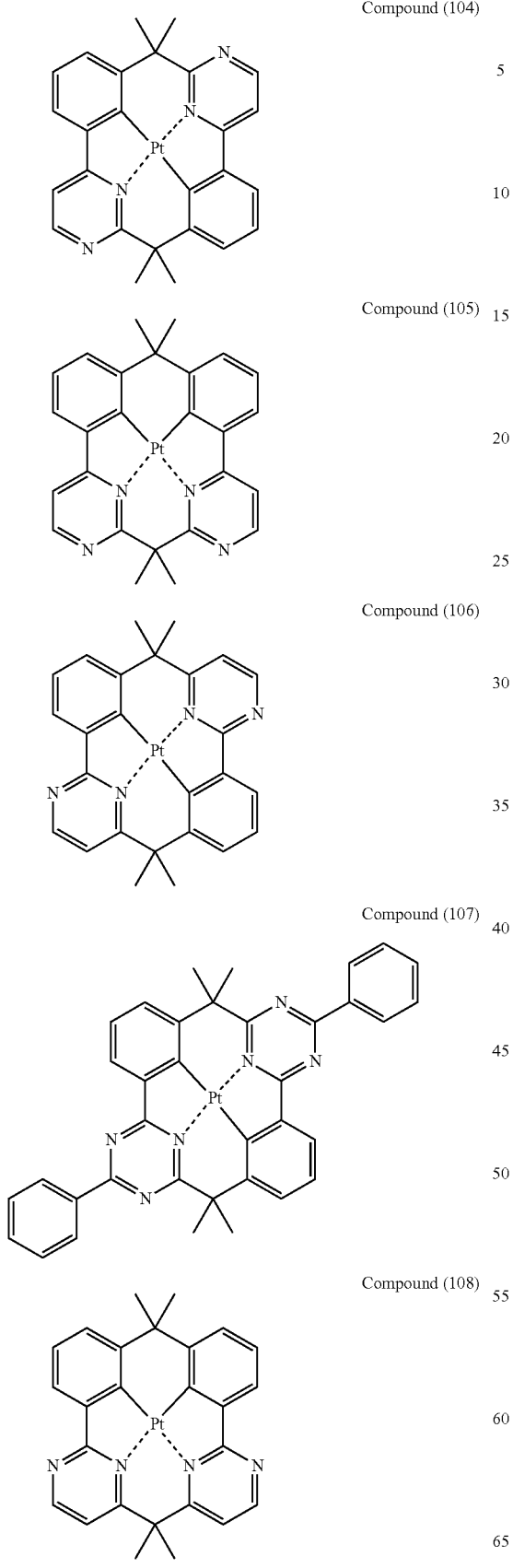
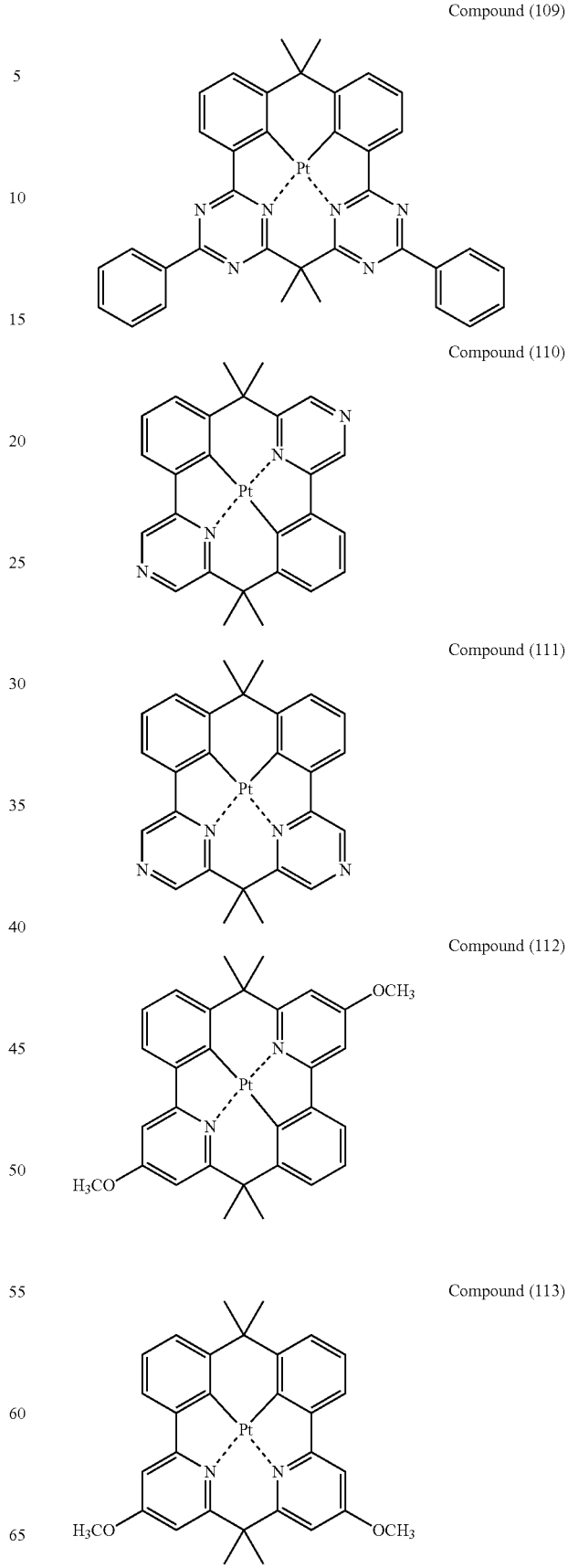

-continued
Compound (114)
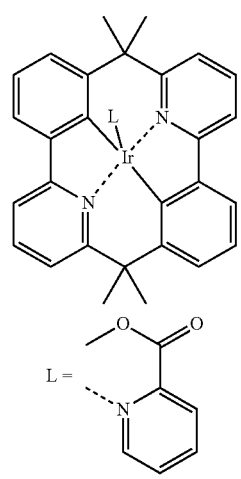
Compound (115)
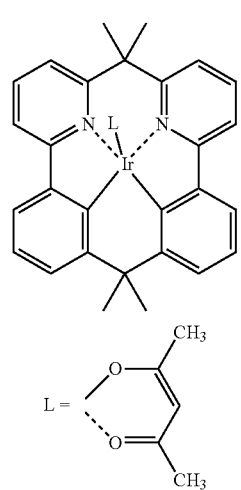
Compound (116)
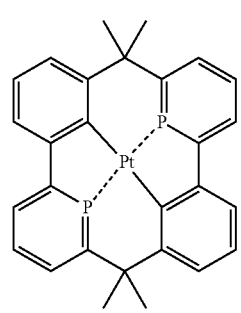
Compound (117)
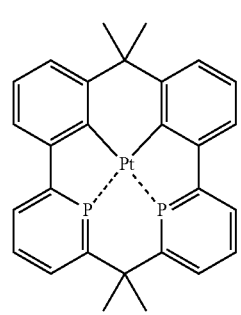
-continued
Compound (118)
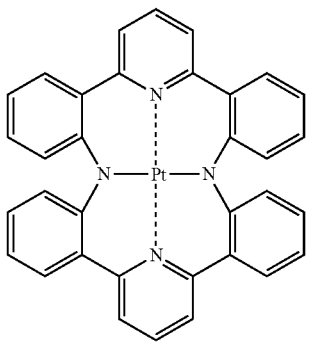
Compound (119)
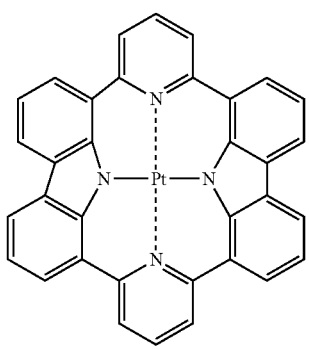
Compound (120)
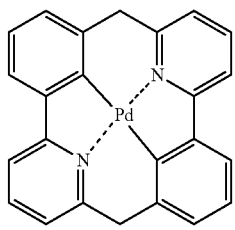
Compound (121)
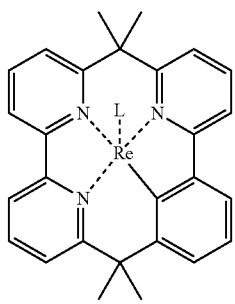

Compound (122)
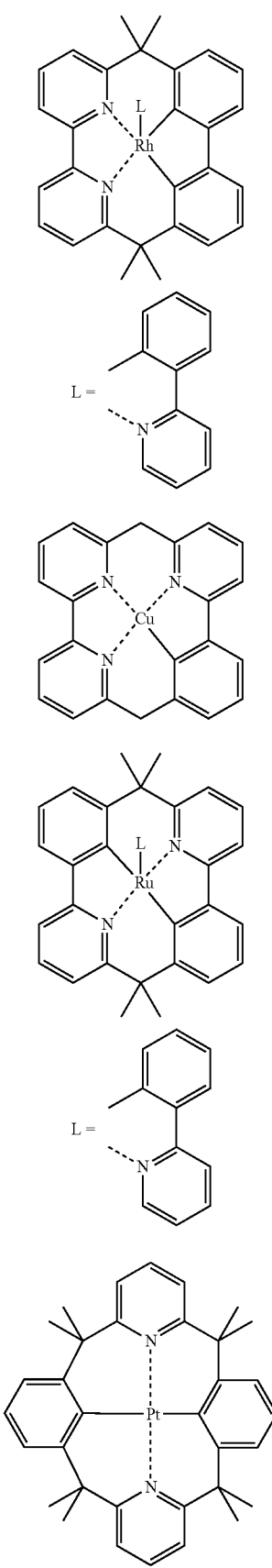
Compound (123)
Compound (124)
Compound (125)
Compound (126)
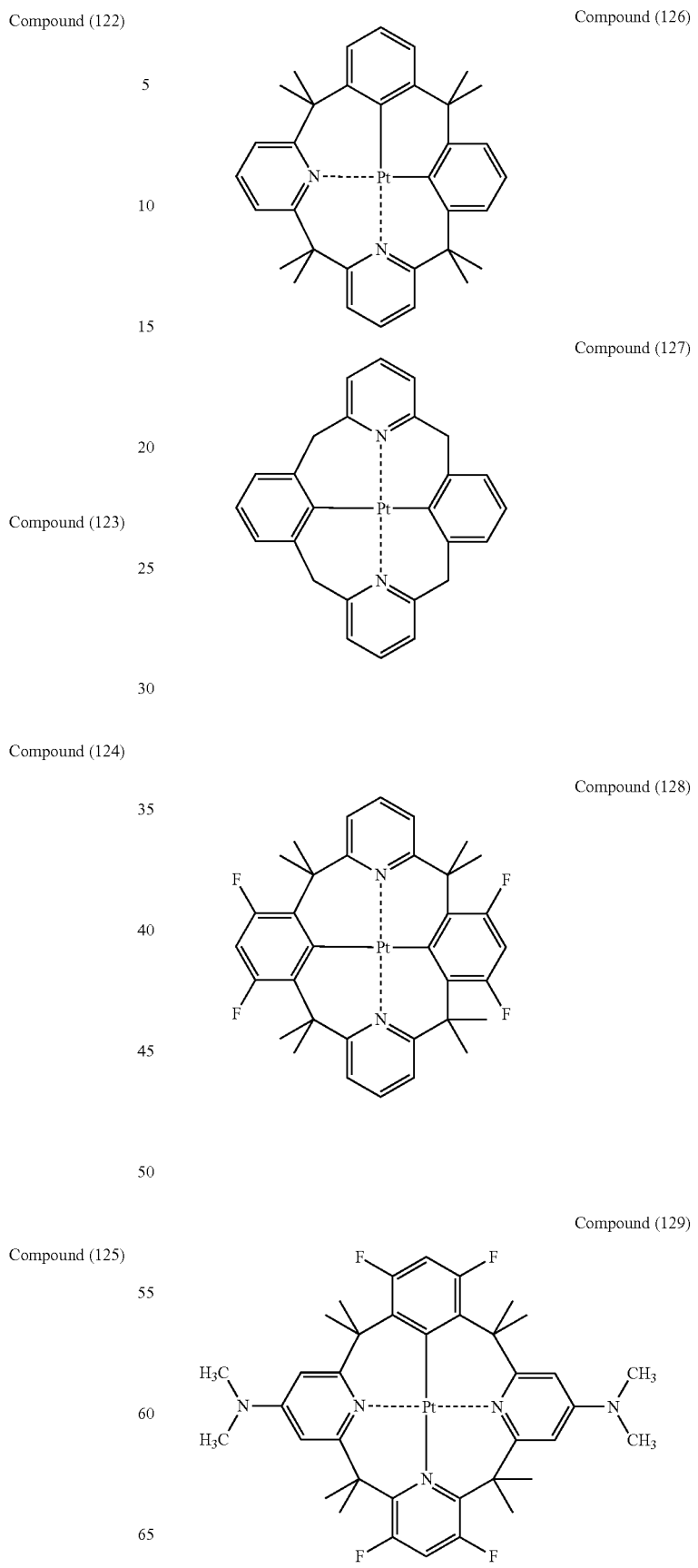
Compound (127)
Compound (128)
Compound (129)

Compound (130)
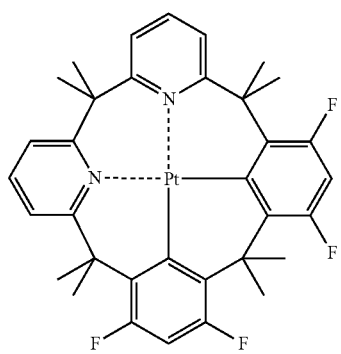
Compound (131)
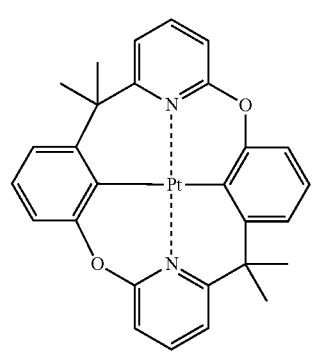
Compound (132)
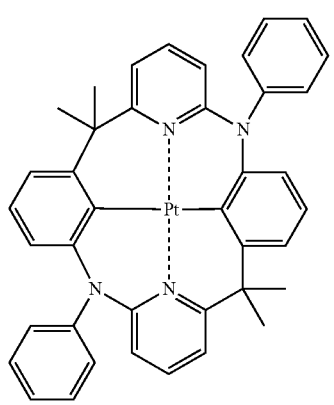
Compound (133)
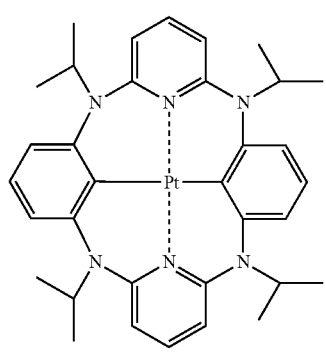
Compound (134)
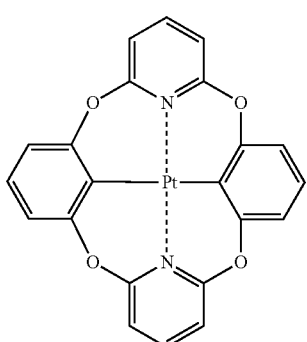
Compound (135)
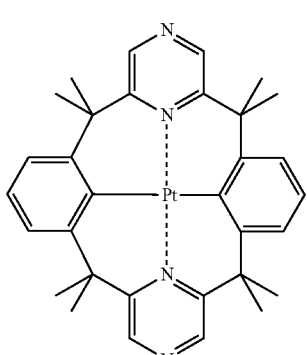
Compound (136)
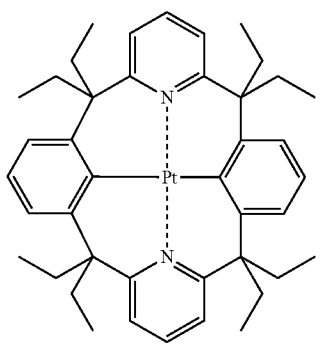
Compound (137)
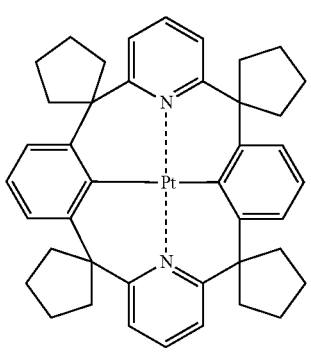

Compound (138)
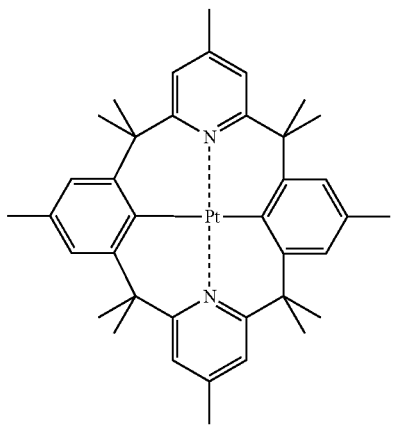
Compound (142)
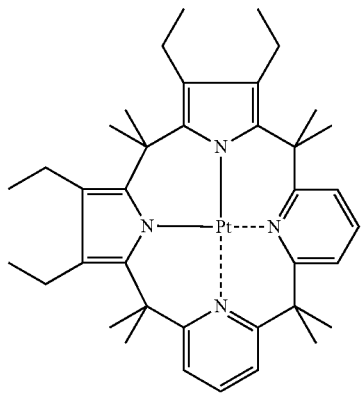
Compound (139)
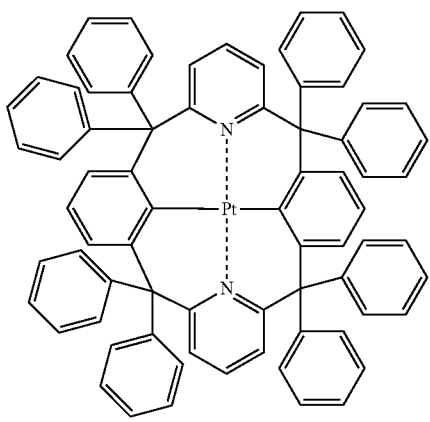
Compound (143)
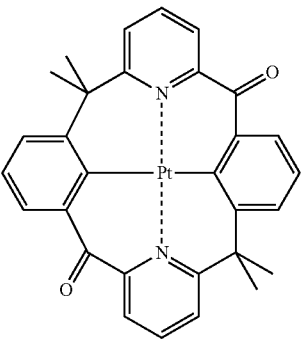
Compound (140)
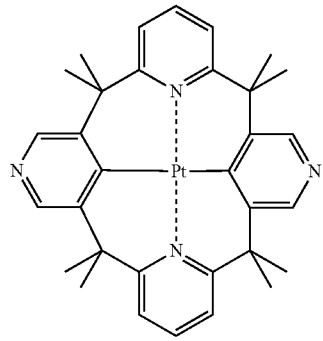
Compound (144)
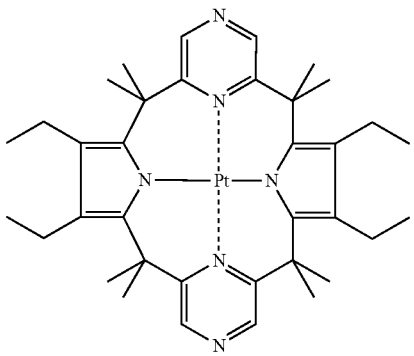
Compound (141)
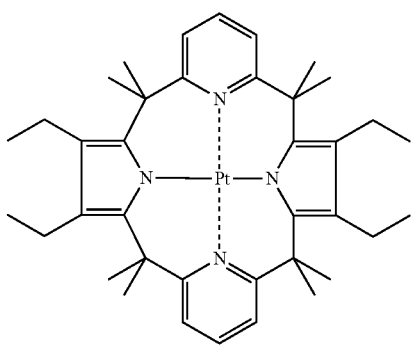
Compound (145)
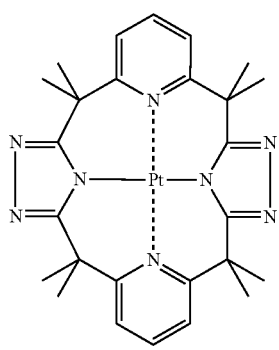

Compound (146)
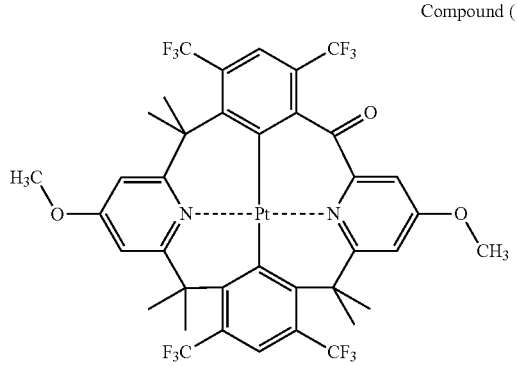
Compound (147)
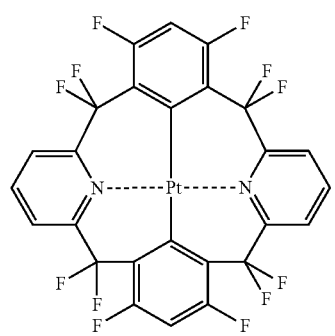
Compound (148)
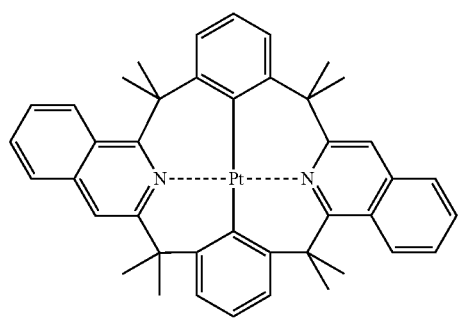
Compound (149)
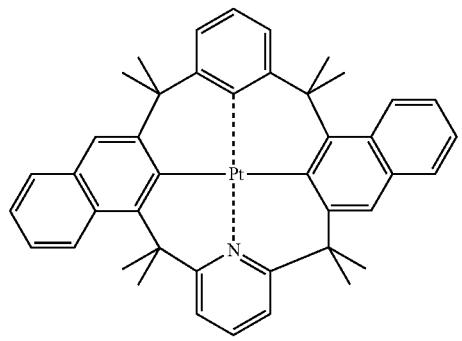
Compound (150)
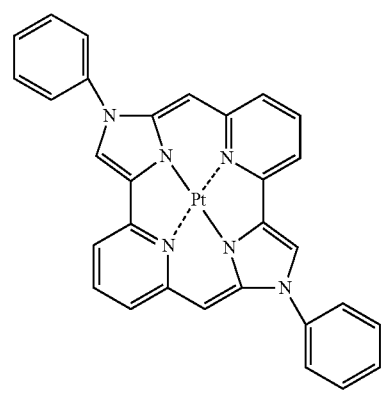
Compound (151)
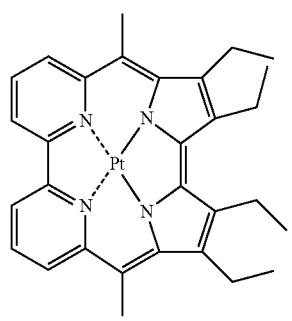
Compound (152)
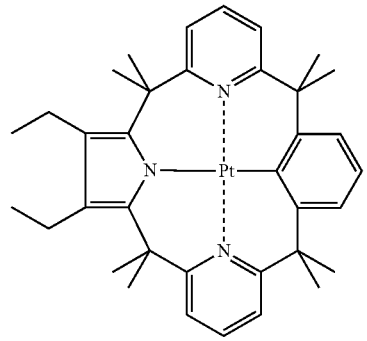
Compound (153)
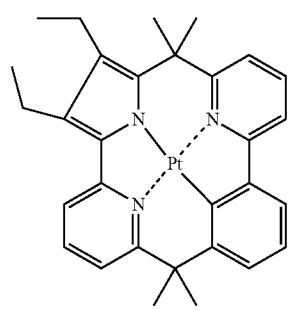

Compound (154)

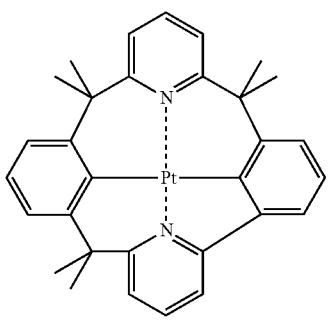

Preferable examples of the metal complex usable in the invention include the compounds represented by formulae (A-1), (B-1), (C-1), (D-1), (E-1), and (F-1) described below.
The formula (A-1) is described below.

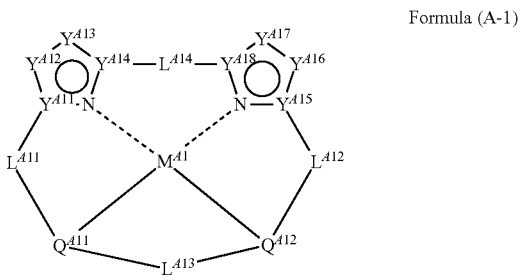

Formula (A-1)

In formula (A-1), $M^{41}$ represents a metal ion. $Y^{A11}$, $Y^{A14}$, $Y^{A15}$ and $Y^{A18}$ each independently represent a carbon atom or a nitrogen atom. $Y^{A12}$, $Y^{A13}$, $Y^{A16}$ and $Y^{A17}$ each independently represent a substituted or unsubstituted carbon atom, a substituted or unsubstituted nitrogen atom, an oxygen atom or a sulfur atom. $L^{A11}$, $L^{A12}$, $L^{A13}$ and $L^{A14}$ each represent a connecting group, and may be the same as each other or different from each other. $Q^{11}$ and $Q^{A12}$ each independently represent a partial structure containing an atom bonded to $M^{41}$. The bond between the atom in the partial structure and $M^{41}$ may be, for example, a covalent bond.

The compound represented by the formula (A-1) will be described in detail.

$M^{41}$ represents a metal ion. The metal ion is not particularly limited, but is preferably a divalent metal ion, more preferably $Pt^{2+}$, $Pd^{2+}$, $Cu^{2+}$, $Ni^{2+}$, $Co^{2+}$, $Zn^{2+}$, $Mg^{2+}$ or $Pb^{2+}$, still more preferably $Pt^{2+}$ or $Cu^{2+}$, and further more preferably $Pt^{2+}$.

$Y^{A11}$, $Y^{A14}$, $Y^{A15}$ and $Y^{A18}$ each independently represent a carbon atom or a nitrogen atom. Each of $Y^{A11}$, $Y^{A14}$, $Y^{A15}$ and $Y^{A18}$ is preferably a carbon atom.

$Y^{A12}$, $Y^{A13}$, $Y^{A16}$ and $Y^{A17}$ each independently represent a substituted or unsubstituted carbon atom, a substituted or unsubstituted nitrogen atom, an oxygen atom or a sulfur atom. Each of $Y^{A12}$, $Y^{A13}$, $Y^{A16}$ and $Y^{A17}$ is preferably a substituted or unsubstituted carbon atom or a substituted or unsubstituted nitrogen atom.

$L^{A11}$, $L^{A12}$, $L^{A13}$ and $L^{A14}$ each independently represent a divalent connecting group. The divalent connecting group represented by $L^{A11}$, $L^{A12}$, $L^{A13}$ or $L^{A14}$ may be, for example, a single bond or a connecting group formed of atoms selected from carbon, nitrogen, silicon, sulfur, oxygen, germanium, phosphorus and the like, more preferably a single bond, a substituted or unsubstituted carbon atom, a substituted or unsubstituted nitrogen atom, a substituted silicon atom, an oxygen atom, a sulfur atom, a divalent aromatic hydrocarbon cyclic group or a divalent aromatic heterocyclic group, still more preferably a single bond, a substituted or unsubstituted carbon atom, a substituted or unsubstituted nitrogen atom, a substituted silicon atom, a divalent aromatic hydrocarbon cyclic group or a divalent aromatic heterocyclic group, and further more preferably a single bond or a substituted or unsubstituted methylene group. Examples of the divalent connecting group represented by $L^{A11}$, $L^{A12}$, $L^{A13}$ or $L^{A14}$ include the following groups:

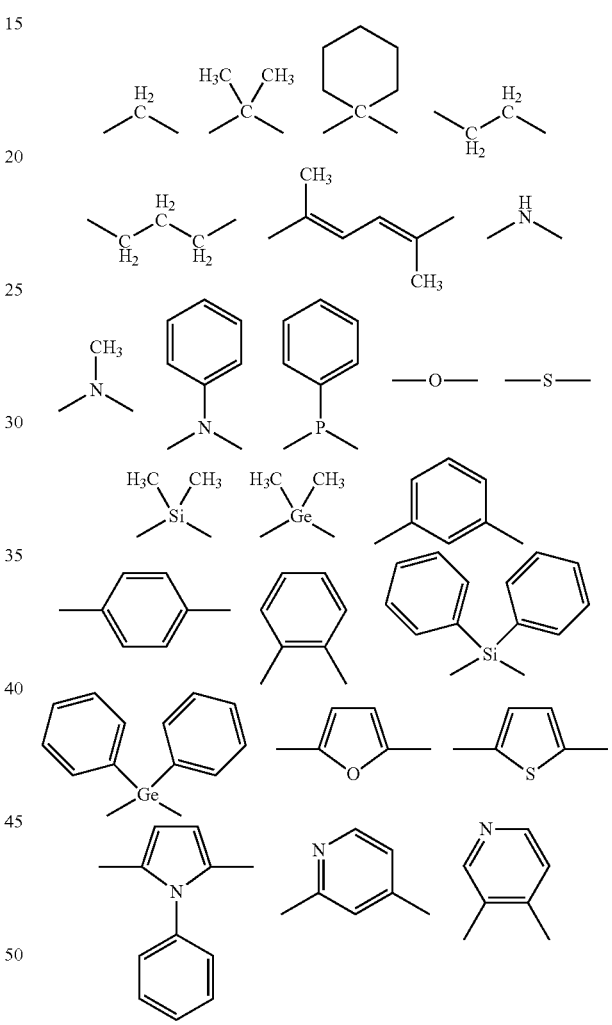

The divalent connecting group represented by $L^{A11}$, $L^{A12}$, $L^{A13}$ or $L^{A14}$ may further have a substituent. The substituent which can be introduced into the divalent connecting group may be, for example, an alkyl group (preferably a C1 to C30, more preferably C1 to C20, particularly preferably C1 to C10 group, for example methyl, ethyl, iso-propyl, tert-butyl, n-octyl, n-decyl, n-hexadecyl, cyclopropyl, cyclopentyl, cyclohexyl, etc.), an alkenyl group (preferably a C2 to C30, more preferably C2 to C20, particularly preferably C2 to C10 group, for example vinyl, allyl, 2-butenyl, 3-pentenyl, etc.), an alkynyl group (preferably a C2 to C30, more preferably C2 to C20, particularly preferably C2 to C10 group, for example propargyl, 3-pentynyl, etc.), an aryl group (preferably a C6 to C30, more preferably C6 to C20, particularly preferably C6 to C12 group, for example phenyl, p-methylphenyl, naphthyl, anthranyl, etc.), an amino group (preferably a C0 to C30, more preferably C0 to C20, particularly preferably C0 to C10 group, for example amino, methylamino, dimethylamino, diethylamino, dibenzylamino, diphenylamino, ditolylamino, etc.), an alkoxy group (preferably a C1 to C30, more preferably C1 to C20, particularly preferably C1 to C10 group, for example methoxy, ethoxy, butoxy, 2-ethylhexyloxy, etc.), an aryloxy group (preferably a C6 to C30, more preferably C6 to C20, particularly preferably C6 to C12 group, for example phenyloxy, 1-naphthyloxy, 2-naphthyloxy, etc.), a heterocyclic oxy group (preferably a C1 to C30, more preferably C1 to C20, particularly preferably C1 to C12 group, for example pyridyloxy, pyrazyloxy, pyrimidyloxy, quinolyloxy, etc.), an acyl group (preferably a C1 to C30, more preferably C1 to C20, particularly preferably C1 to C12 group, for example acetyl, benzoyl, formyl, pivaloyl, etc.), an alkoxycarbonyl group (preferably a C2 to C30, more preferably C2 to C20, particularly preferably C2 to C12 group, for example methoxycarbonyl, ethoxycarbonyl, etc.), an aryloxycarbonyl group (preferably a C7 to C30, more preferably C7 to C20, particularly preferably C7 to C12 group, for example phenyloxycarbonyl, etc.), an acyloxy group (preferably a C2 to C30, more preferably C2 to C20, particularly preferably C2 to C10 group, for example acetoxy, benzoyloxy, etc.), an acylamino group (preferably a C2 to C30, more preferably C2 to C20, particularly preferably C2 to C10 group, for example acetylamino, benzoylamino, etc.), an alkoxycarbonylamino group (preferably a C2 to C30, more preferably C2 to C20, particularly preferably C2 to C12 group, for example methoxycarbonylamino, etc.), an aryloxycarbonylamino group (preferably a C7 to C30, more preferably C7 to C20, particularly preferably C7 to C12 group, for example phenyloxycarbonylamino, etc.), a sulfonylamino group (preferably a C1 to C30, more preferably C1 to C20, particularly preferably C1 to C12 group, for example methanesulfonylamino, benzenesulfonylamino, etc.), a sulfamoyl group (preferably a C0 to C30, more preferably C0 to C20, particularly preferably C0 to C12 group, for example sulfamoyl, methylsulfamoyl, dimethylsulfamoyl, phenylsulfamoyl, etc.), a carbamoyl group (preferably a C1 to C30, more preferably C1 to C20, particularly preferably C1 to C12 group, for example carbamoyl, methylcarbamoyl, diethylcarbamoyl, phenylcarbamoyl, etc.), an alkylthio group (preferably a C1 to C30, more preferably C1 to C20, particularly preferably C1 to C12 group, for example methylthio, ethylthio, etc.), an arylthio group (preferably a C6 to C30, more preferably C6 to C20, particularly preferably C6 to C12 group, for example phenylthio, etc.), a heterocyclic thio group (preferably a C1 to C30, more preferably C1 to C20, particularly preferably C1 to C12 group, for example pyridylthio, 2-benzimidazolylthio, 2-benzoxazolylthio, 2-benzthiazolylthio, etc.), a sulfonyl group (preferably a C1 to C30, more preferably C1 to C20, particularly preferably C1 to C12 group, for example mesyl, tosyl, etc.), a sulfinyl group (preferably a C1 to C30, more preferably C1 to C20, particularly preferably C1 to C12 group, for example methanesulfinyl, benzenesulfinyl, etc.), a ureido group (preferably a C1 to C30, more preferably C1 to C20, particularly preferably C1 to C12 group, for example ureido, methylureido, phenylureido, etc.), a phosphoric amide group (preferably a C1 to C30, more preferably C1 to C20, particularly preferably C1 to C12 group, for example diethylphosphoric amide, phenylphosphoric amide, etc.), a hydroxy group, a mercapto group, a halogen atom (for example a fluorine atom, chlorine atom, bromine atom, iodine atom), a cyano group, a sulfo group, a carboxyl group, a nitro group, a hydroxamic acid group, a sulfino group, a hydrazino group, an imino group, a heterocyclic group (preferably a C1 to C30, more preferably C1 to C12 group containing a heteroatom such as a nitrogen atom, oxygen atom or sulfur atom, specifically imidazolyl, pyridyl, quinolyl, furyl, thienyl, piperidyl, morpholino, benzoxazolyl, benzimidazolyl, benzthiazolyl, carbazolyl group, azepinyl group, etc.), a silyl group (preferably a C3 to C40, more preferably C3 to C30, particularly preferably C3 to C24 group, for example trimethylsilyl, triphenylsilyl, etc.) or a silyloxy group (preferably a C3 to C40, more preferably C3 to C30, particularly preferably C3 to C24 group, for example trimethylsilyloxy, triphenylsilyloxy, etc.).

These substituents may be further substituted. Substituents which can be introduced to these substituents are each preferably selected from an alkyl group, an aryl group, a heterocyclic group, a halogen atom or a silyl group, more preferably an alkyl group, an aryl group, a heterocyclic group or a halogen atom, and still more preferably an alkyl group, an aryl group, an aromatic heterocyclic group or a fluorine atom.

$Q^{411}$ and $Q^{12}$ each independently represent a partial structure containing an atom bonded to $M^{41}$. The bond between the atom in the partial structure and $M^{41}$ may be, for example, a covalent bond. $Q^{411}$ and $Q^{412}$ each independently represent preferably a group having a carbon atom bonded to $M^{41}$, a group having a nitrogen atom bonded to $M^{41}$, a group having a silicon atom bonded to $M^{41}$, a group having a phosphorus atom bonded to $M^{41}$, a group having an oxygen atom bonded to $M^{41}$ or a group having a sulfur atom bonded to $M^{41}$, more preferably a group having a carbon, nitrogen, oxygen or sulfur atom bonded to $M^{41}$, still more preferably a group having a carbon or nitrogen atom bonded to $M^{41}$, and further more preferably a group having a carbon atom bonded to $M^{41}$.

The group bonded via a carbon atom is preferably an aryl group having a carbon atom bonded to $M^{41}$, a 5-membered heteroaryl group having a carbon atom bonded to $M^{41}$ or a 6-membered heteroaryl group having a carbon atom bonded to $M^{41}$, more preferably an aryl group having a carbon atom bonded to $M^{41}$, a nitrogen-containing 5-membered heteroaryl group having a carbon atom bonded to $M^{41}$ or a nitrogen-containing 6-membered heteroaryl group having a carbon atom bonded to $M^{41}$, and still more preferably an aryl group having a carbon atom bonded to $M^{41}$.

The group bonded via a nitrogen atom is preferably a substituted amino group or a nitrogen-containing 5-membered heteroaryl group having a nitrogen atom bonded to $M^{41}$, more preferably a nitrogen-containing 5-membered heteroaryl group having a nitrogen atom bonded to $M^{41}$.

The group having a phosphorus atom bonded to $M^{41}$ is preferably a substituted phosphino group. The group having a silicon atom bonded to $M^{41}$ is preferably a substituted silyl group. The group having an oxygen atom bonded to $M^{41}$ is preferably an oxy group, and the group having a sulfur atom bonded to $M^{41}$ is preferably a sulfide group.

The compound represented by the formula (A-1) is more preferably a compound represented by the following formula (A-2), (A-3) or (A-4).

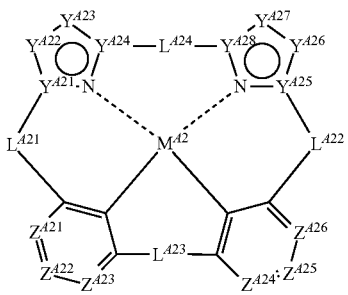

Formula (A-2)

In formula (A-2), $M^{A2}$ represents a metal ion. $Y^{A21}$, $Y^{A24}$, $Y^{A25}$ and $Y^{A28}$ each independently represent a carbon atom or a nitrogen atom. $Y^{A22}$, $Y^{A23}$, $Y^{A26}$ and $Y^{A27}$ each independently represent a substituted or unsubstituted carbon atom, a substituted or unsubstituted nitrogen atom, an oxygen atom or a sulfur atom. $L^{A21}$, $L^{A22}$, $L^{A23}$ and $L^{A24}$ each independently represent a connecting group. $Z^{A21}$, $Z^{A22}$, $Z^{A23}$, $Z^{A24}$, $Z^{A25}$ and $Z^{A26}$ each independently represent a nitrogen atom or a substituted or unsubstituted carbon atom.

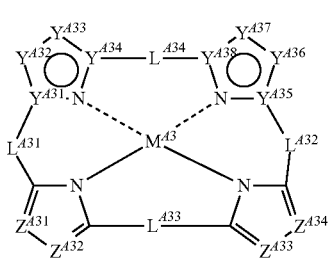

Formula (A-3)

In formula (A-3), $M^{A3}$ represents a metal ion. $Y^{A31}$, $Y^{A34}$, $Y^{A35}$ and $Y^{A38}$ each independently represent a carbon atom or a nitrogen atom. $Y^{A32}$, $Y^{A33}$, $Y^{A36}$ and $Y^{A37}$ each independently represent a substituted or unsubstituted carbon atom, a substituted or unsubstituted nitrogen atom, an oxygen atom or a sulfur atom. $L^{A31}$, $L^{A32}$, $L^{A33}$ and $L^{A34}$ each independently represent a connecting group. $Z^{A31}$, $Z^{A32}$, $Z^{A33}$ and $Z^{A34}$ each independently represent a nitrogen atom or a substituted or unsubstituted carbon atom.

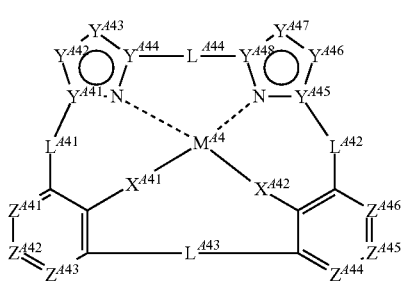

Formula (A-4)

In formula (A-4), $M^{A4}$ represents a metal ion. $Y^{A41}$, $Y^{A44}$, $Y^{A45}$ and $Y^{A48}$ each independently represent a carbon atom or a nitrogen atom. $Y^{A42}$, $Y^{A43}$, $Y^{A46}$ and $Y^{A47}$ each independently represent a substituted or unsubstituted carbon atom, a substituted or unsubstituted nitrogen atom, an oxygen atom or a sulfur atom. $L^{A41}$, $L^{A42}$, $L^{A43}$ and $L^{A44}$ each independently represent a connecting group. $Z^{A41}$, $Z^{A42}$, $Z^{A43}$, $Z^{A44}$, $Z^{A45}$ and $Z^{A46}$ each independently represent a nitrogen atom or a substituted or unsubstituted carbon atom. $X^{A41}$ and $X^{A42}$ each independently represent an oxygen atom, a sulfur atom or a substituted or unsubstituted nitrogen atom.

The compound represented by the formula (A-2) will be described in detail.

$M^{A2}$, $Y^{A21}$, $Y^{A24}$, $Y^{A25}$, $Y^{A28}$, $Y^{A22}$, $Y^{A23}$, $Y^{A26}$, $Y^{A27}$, $L^{A21}$, $L^{A22}$, $L^{A23}$ and $L^{A24}$ have the same definitions as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in formula (A-1) respectively, and their preferable examples are also the same.

$Z^{A21}$, $Z^{A22}$, $Z^{A23}$, $Z^{A24}$, $Z^{A25}$ and $Z^{A26}$ each independently represent a nitrogen atom or a substituted or unsubstituted carbon atom. $Z^{A21}$, $Z^{A22}$, $Z^{A23}$, $Z^{A24}$, $Z^{A25}$ and $Z^{A26}$ each independently represent preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

The compound represented by the formula (A-3) will be described in detail.

$M^{A3}$, $Y^{A31}$, $Y^{A34}$, $Y^{A35}$, $Y^{A38}$, $Y^{A32}$, $Y^{A33}$, $Y^{A36}$, $Y^{A37}$, $L^{A31}$, $L^{A32}$, $L^{A33}$ and $L^{A34}$ have the same definitions as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in formula (A-1) respectively, and their preferable examples are also the same.

$Z^{A31}$, $Z^{A32}$, $Z^{A33}$ and $Z^{A34}$ each independently represent a nitrogen atom or a substituted or unsubstituted carbon atom. Each of $Z^{A31}$, $Z^{A32}$, $Z^{A33}$ and $Z^{A34}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

The compound represented by the formula (A-4) will be described in detail.

$M^{A4}$, $Y^{A41}$, $Y^{A44}$, $Y^{A45}$, $Y^{A48}$, $Y^{A42}$, $Y^{A43}$, $Y^{A46}$, $Y^{A47}$, $L^{A41}$, $L^{A42}$, $L^{A43}$ and $L^{A44}$ have the same definitions as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$ in formula (A-1) respectively, and their preferable examples are also the same.

$Z^{A41}$, $Z^{A42}$, $Z^{A43}$, $Z^{A44}$, $Z^{A45}$ and $Z^{A46}$ each independently represent a nitrogen atom or a substituted or unsubstituted carbon atom. Each of $Z^{A41}$, $Z^{A42}$, $Z^{A43}$, $Z^{A44}$, $Z^{A45}$ and $Z^{A46}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

$X^{A41}$ and $X^{A42}$ each independently represent an oxygen atom, a sulfur atom or a substituted or unsubstituted nitrogen atom. Each of $X^{A41}$ and $X^{A42}$ is preferably an oxygen atom or a sulfur atom, and more preferably an oxygen atom.

Specific examples of the compound represented by the formula (A-1) are shown below. However, the specific examples should not be construed as limiting the invention.

-continued
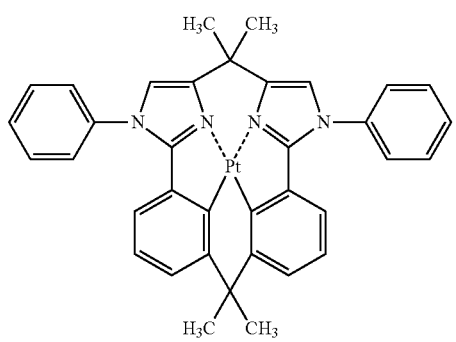
(A1)
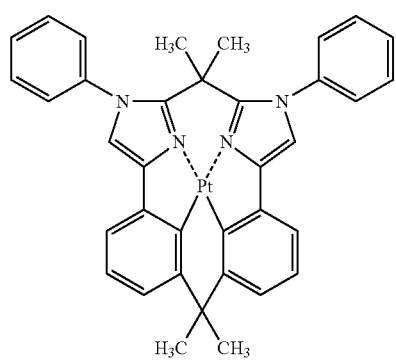
(A2)
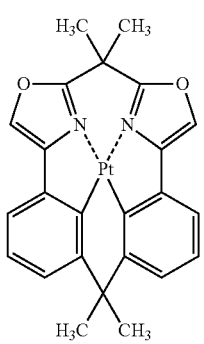
(A3)
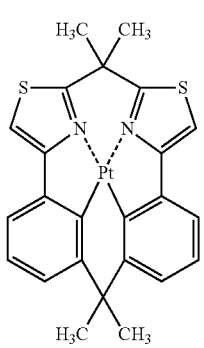
(A4)
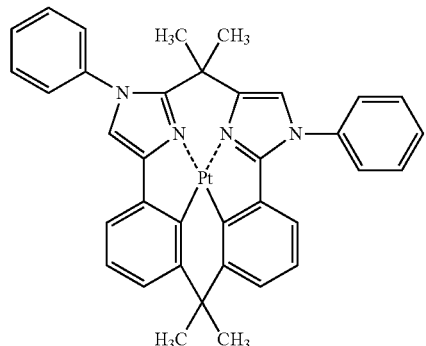
(A5)
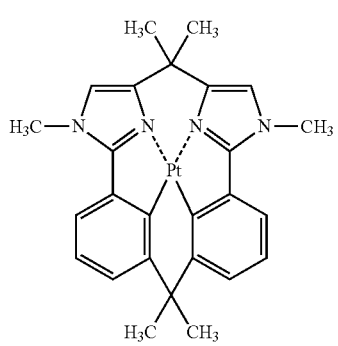
(A6)
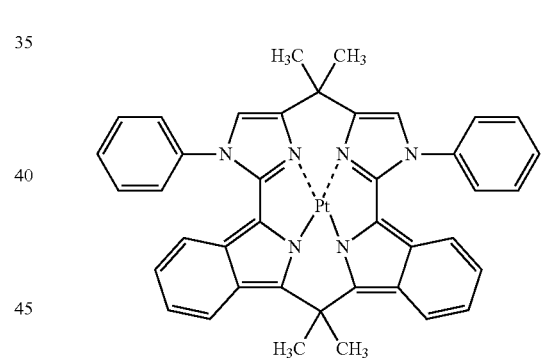
(A7)
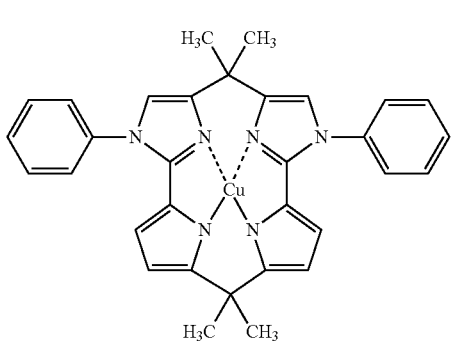
(A8)

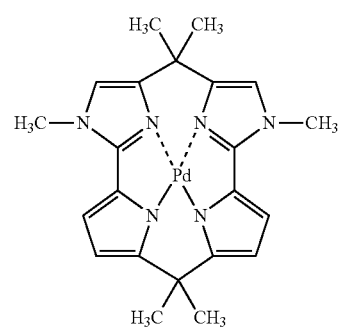
(A9)
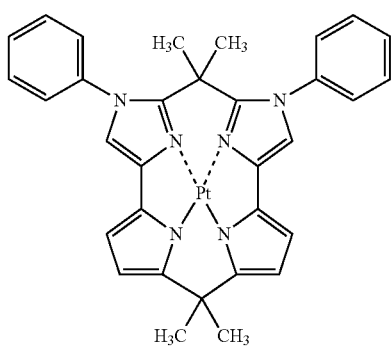
(A10)
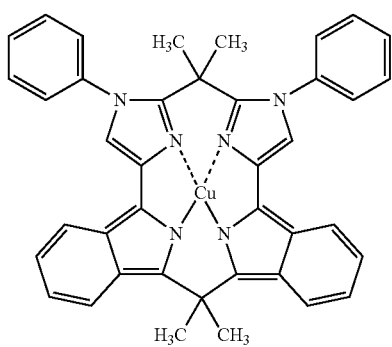
(A11)
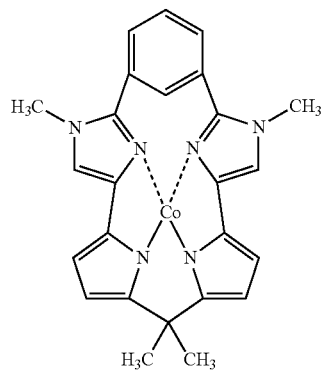
(A12)
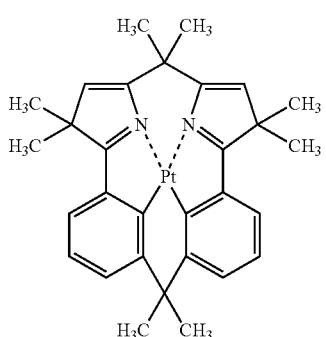
(A13)
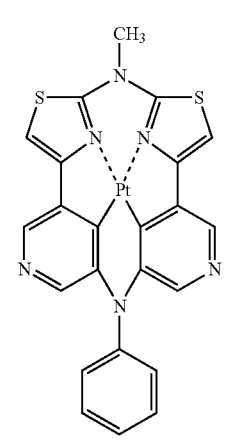
(A14)
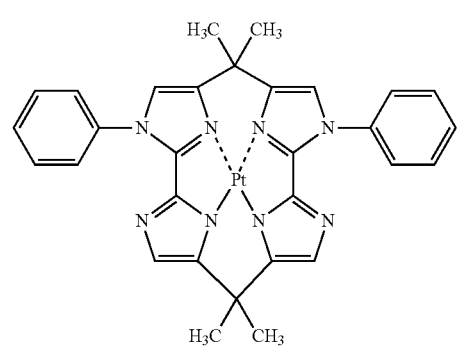
(A15)
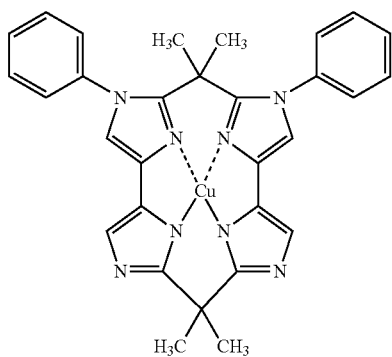
(A16)

(A17)
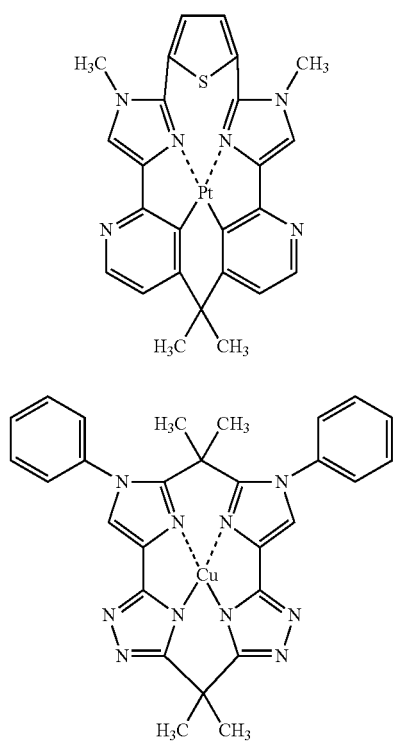
(A18)
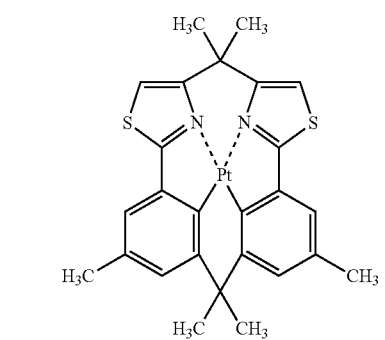
(A19)
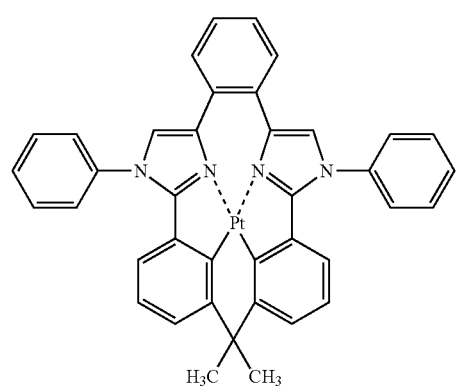
(A20)
(A21)
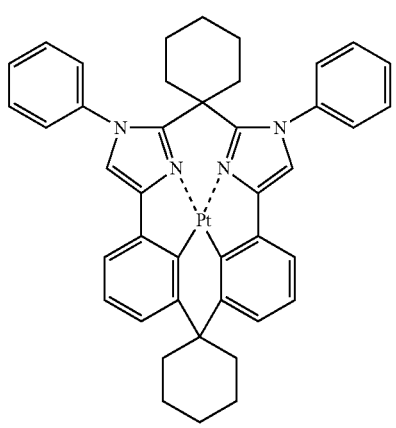
(A22)
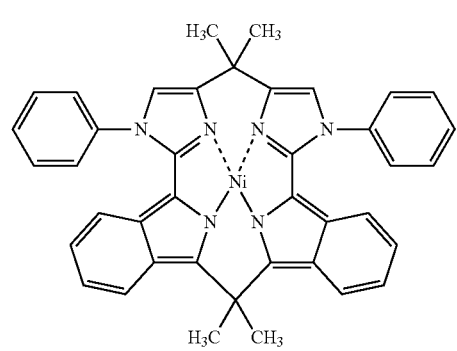
(A23)
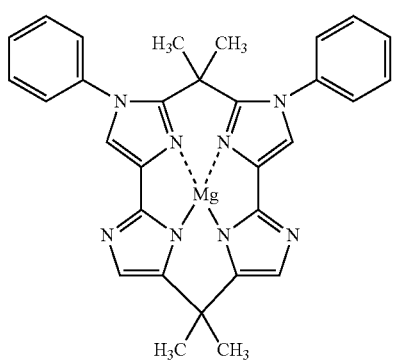
(A24)
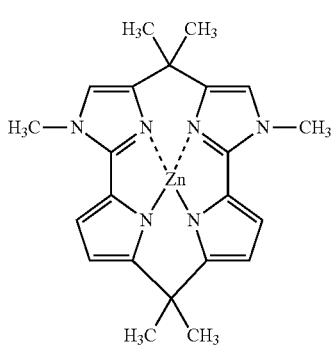

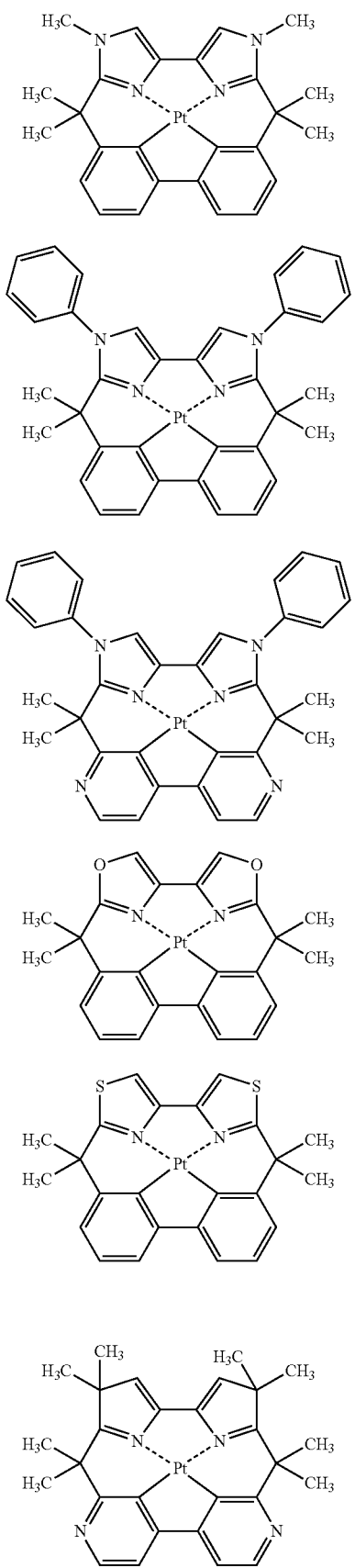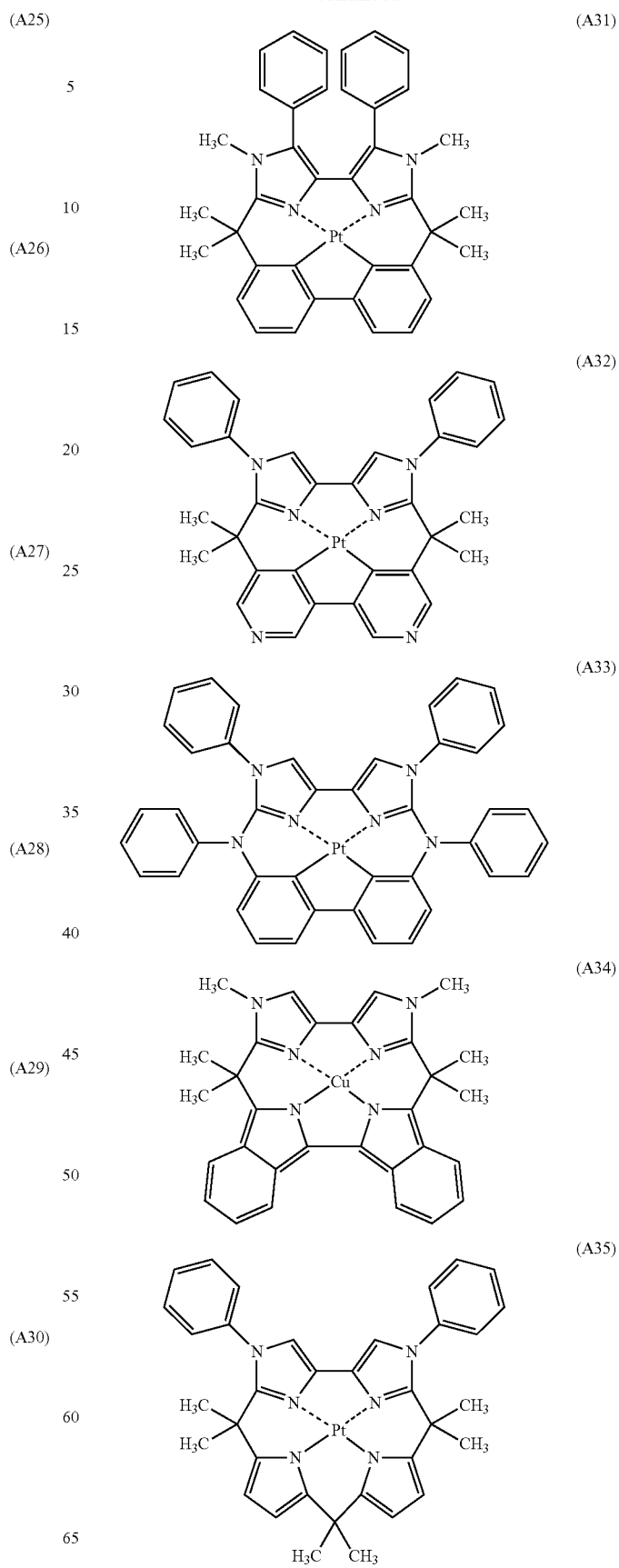

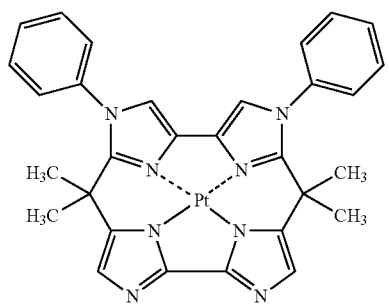 (A36)
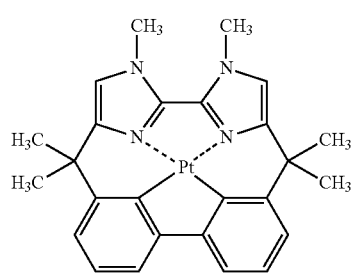 (A37)
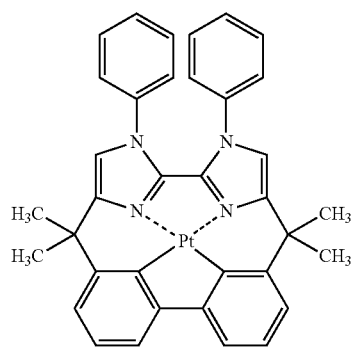 (A38)
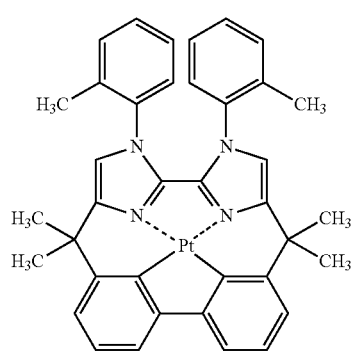 (A39)
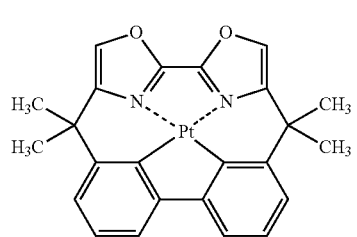 (A40)
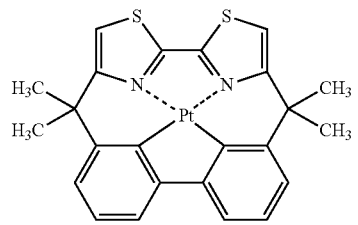 (A41)
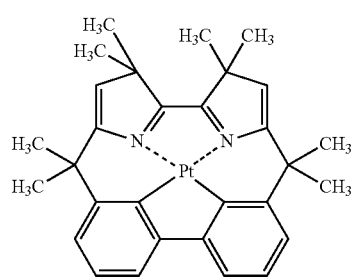 (A42)
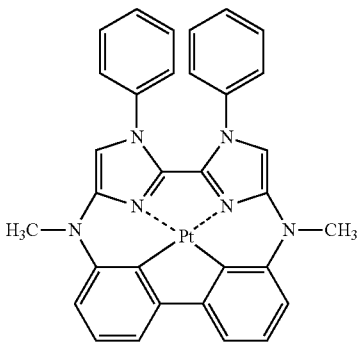 (A43)
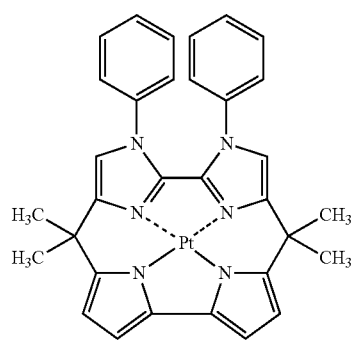 (A44)
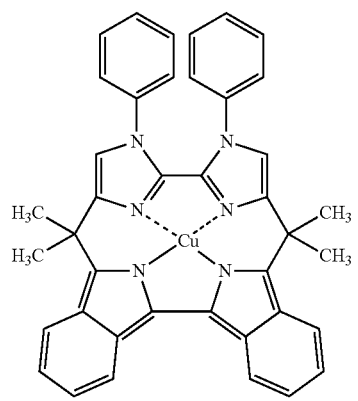 (A45)

(A46) 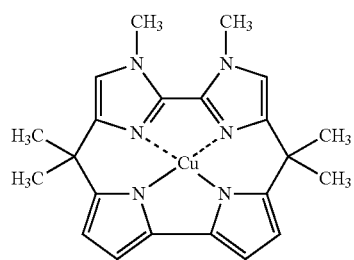
(A47) 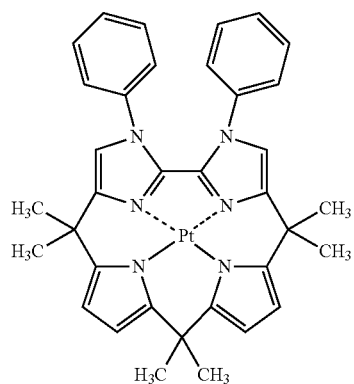
(A48) 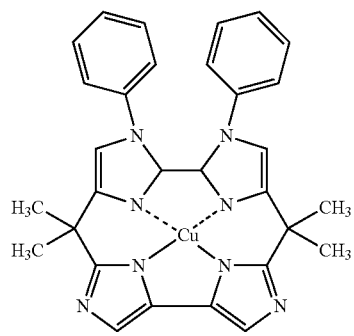
(A49) 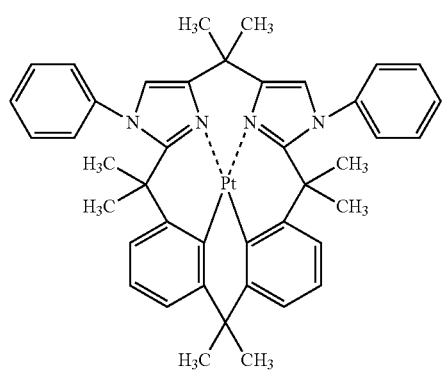
(A50) 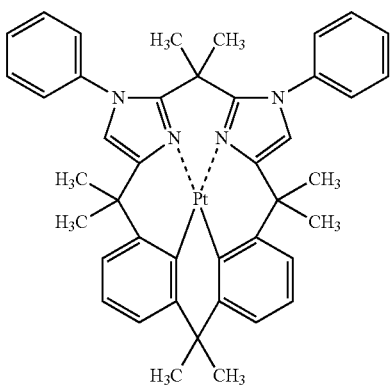
(A51) 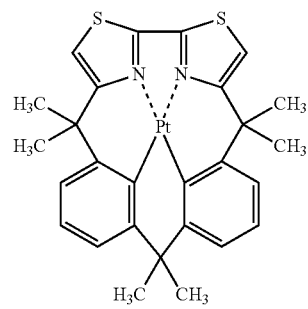
(A52) 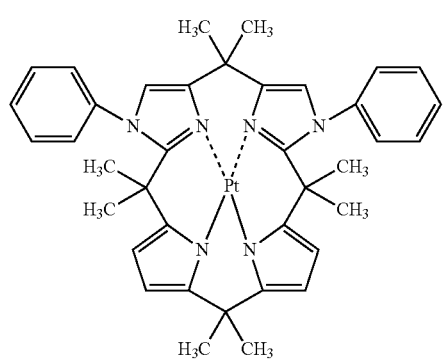
(A53) 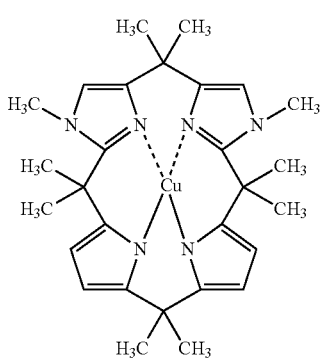

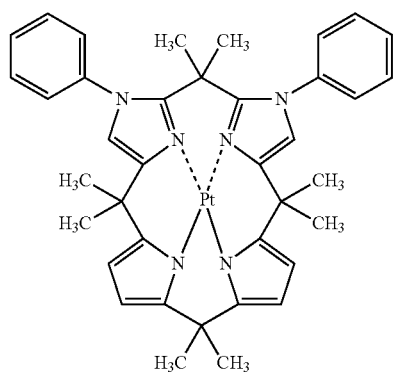 (A54)
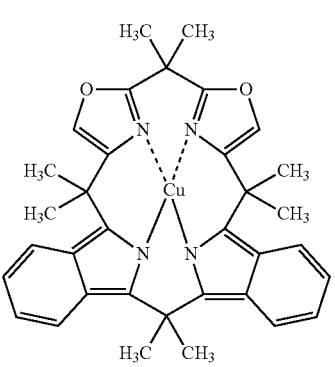 (A55)
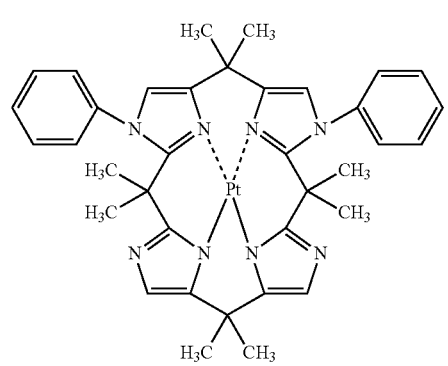 (A56)
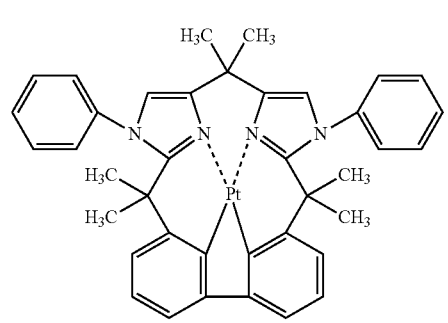 (A57)
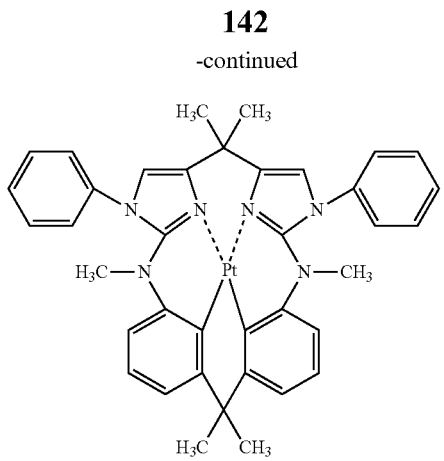 (A58)
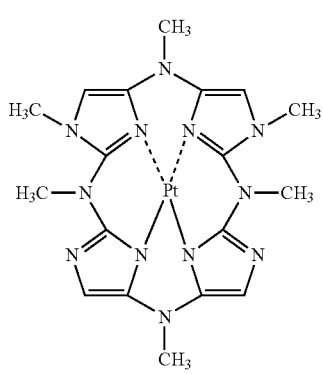 (A59)
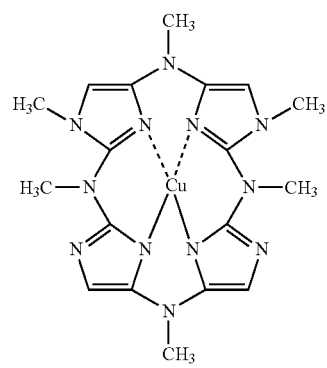 (A60)
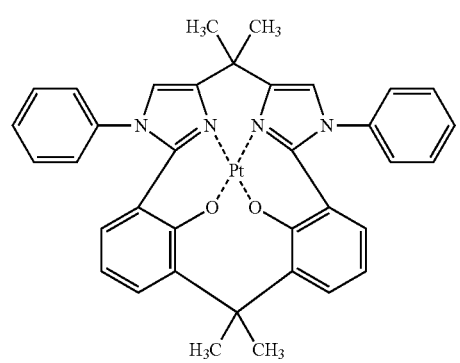 (A61)

-continued
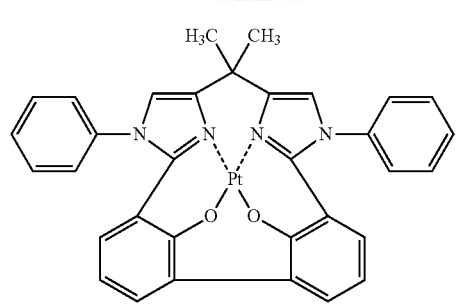
(A62)
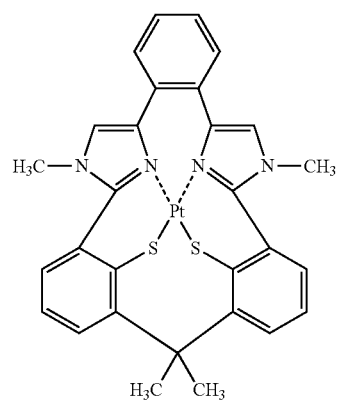
(A63)
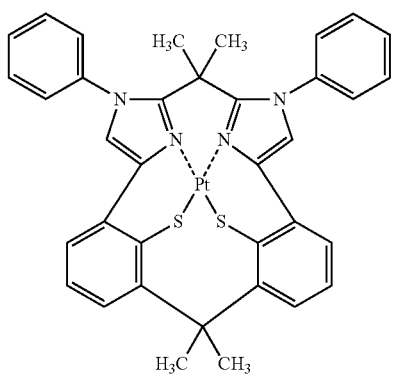
(A64)
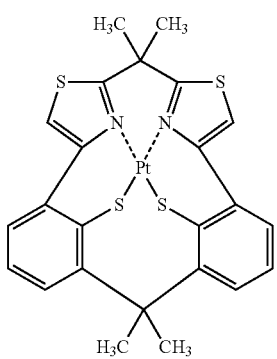
(A65)
-continued
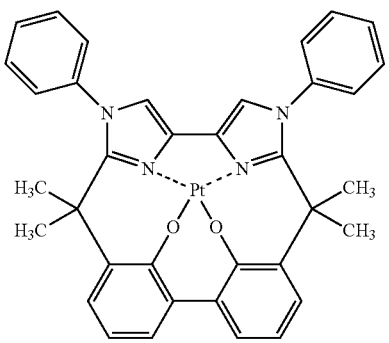
(A66)
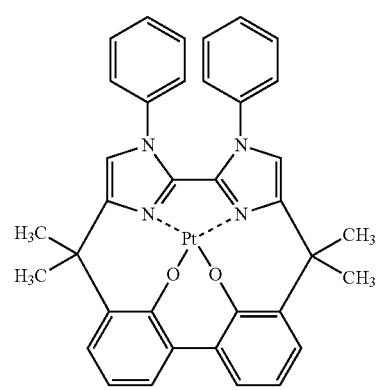
(A67)
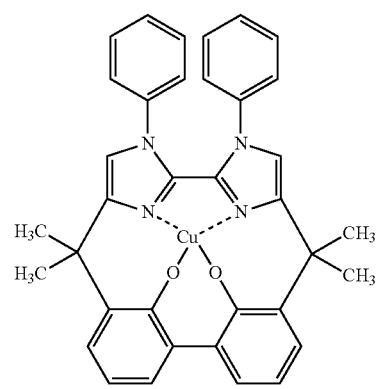
(A68)
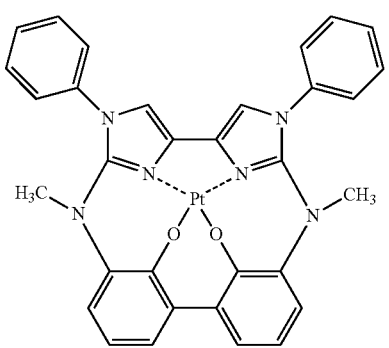
(A69)

(A70) 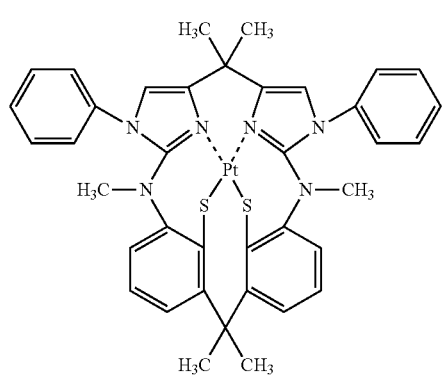
(A71) 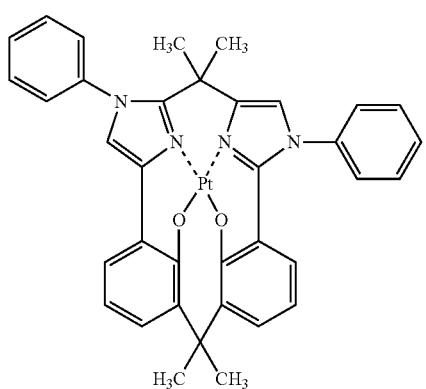
(A72) 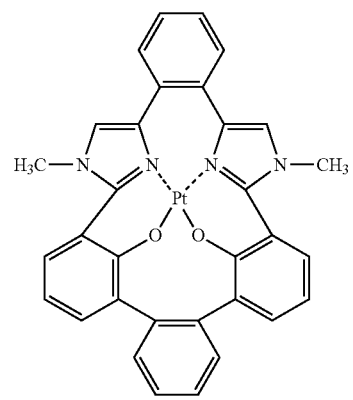
(A73) 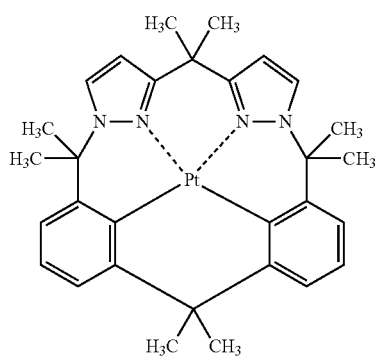
(A74) 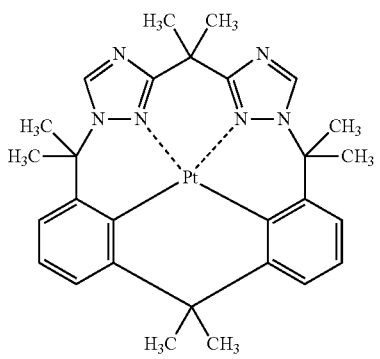
(A75) 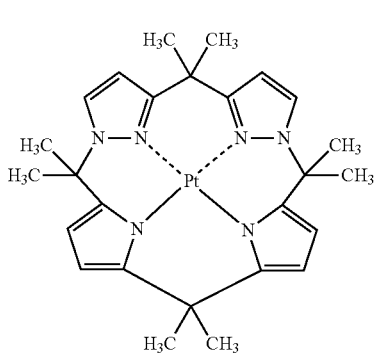
(A76) 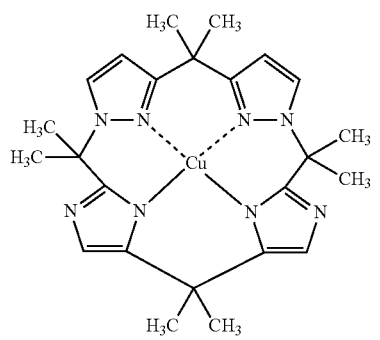
(A77) 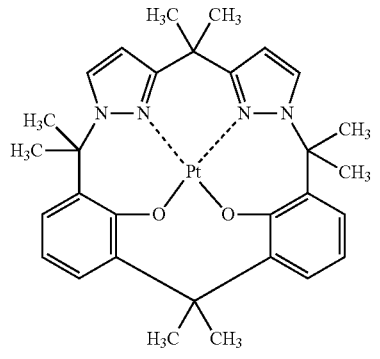

-continued

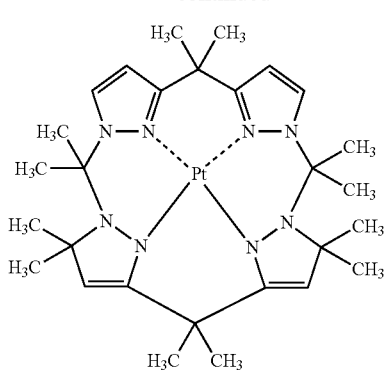
(A78)

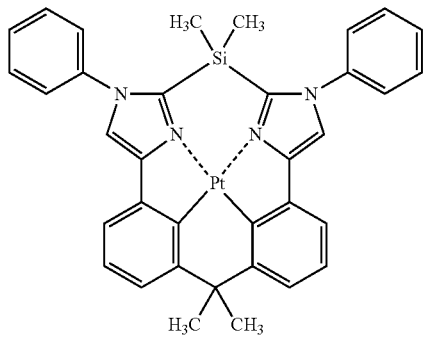
(A79)

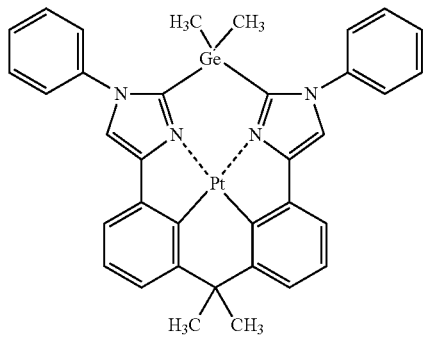
(A80)

Compounds represented by the formula (B-1) shown below are also preferable as metal complexes usable in the invention.

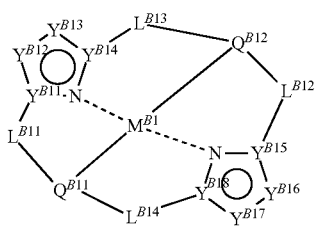
Formula (B-1)

In formula (B-1), $M^{B1}$ represents a metal ion. $Y^{B11}$, $Y^{B14}$, $Y^{B15}$ and $Y^{B18}$ each independently represent a carbon atom or a nitrogen atom. $Y^{B12}$, $Y^{B13}$, $Y^{B16}$ and $Y^{B17}$ each independently represent a substituted or unsubstituted carbon atom, a substituted or unsubstituted nitrogen atom, an oxygen atom or a sulfur atom. $L^{B11}$, $L^{B12}$, $L^{B13}$ and $L^{B14}$ each independently represent a connecting group. $Q^{B11}$ and $Q^{B12}$ each independently represent a partial structure containing an atom bonded to $M^{B1}$. The bond between the atom in the partial structure and $M^{B1}$ may be, for example, a covalent bond.

The compound represented by the formula (B-1) will be described in detail.

In formula (B-1), $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$, $L^{B14}$, $Q^{B11}$ and $Q^{B12}$ have the same definitions as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$, $L^{A14}$, $Q^{A11}$ and $Q^{A12}$ in formula (A-1) respectively, and their preferable examples are also the same.

The compound represented by formula (B-1) is more preferably a compound represented by the following formula (B-2), (B-3) or (B-4).

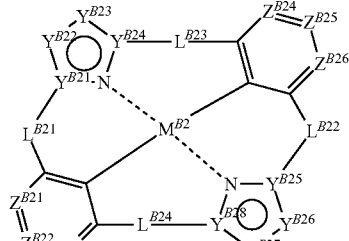
Formula (B-2)

In formula (B-2), $M^{B2}$ represents a metal ion. $Y^{B21}$, $Y^{B24}$, $Y^{B25}$ and $Y^{B28}$ each independently represent a carbon atom or a nitrogen atom. $Y^{B22}$, $Y^{B23}$, $Y^{B26}$ and $Y^{B27}$ each independently represent a substituted or unsubstituted carbon atom, a substituted or unsubstituted nitrogen atom, an oxygen atom or a sulfur atom. $L^{B21}$, $L^{B22}$, $L^{B23}$ and $L^{B24}$ each independently represent a connecting group. $Z^{B21}$, $Z^{B22}$, $Z^{B23}$, $Z^{B24}$, $Z^{B25}$ and $Z^{B26}$ each independently represent a nitrogen atom or a substituted or unsubstituted carbon atom.

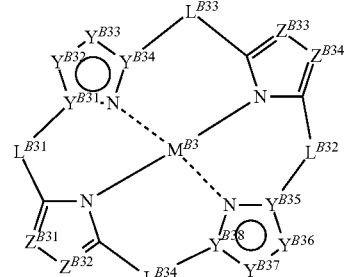
Formula (B-3)

In formula (B-3), $M^{B3}$ represents a metal ion. $Y^{B31}$, $Y^{B34}$, $Y^{B35}$ and $Y^{B38}$ each independently represent a carbon atom or a nitrogen atom. $Y^{B32}$, $Y^{B33}$, $Y^{B36}$ and $Y^{B37}$ each independently represent a substituted or unsubstituted carbon atom, a substituted or unsubstituted nitrogen atom, an oxygen atom or a sulfur atom. $L^{B31}$, $L^{B32}$, $L^{B33}$ and $L^{B34}$ each independently represent a connecting group. $Z^{B31}$, $Z^{B32}$, $Z^{B33}$ and $Z^{B34}$ each independently represent a nitrogen atom or a substituted or unsubstituted carbon atom.

Formula (B-4)

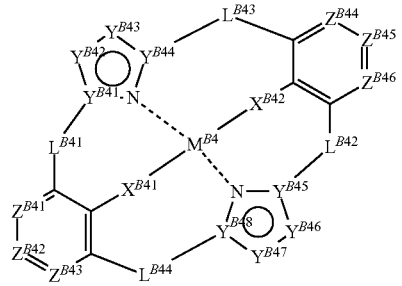

In formula (B-4), $M^{B4}$ represents a metal ion. $Y^{B41}$, $Y^{B44}$, $Y^{B45}$ and $Y^{B48}$ each independently represent a carbon atom or a nitrogen atom. $Y^{B42}$, $Y^{B43}$, $Y^{B46}$ and $Y^{B47}$ each independently represent a substituted or unsubstituted carbon atom, a substituted or unsubstituted nitrogen atom, an oxygen atom or a sulfur atom. $L^{B41}$, $L^{B42}$, $L^{B43}$ and $L^{B44}$ each independently represent a connecting group. $Z^{B41}$, $Z^{B42}$, $Z^{B43}$, $Z^{B44}$, $Z^{B45}$ and $Z^{B46}$ each independently represent a nitrogen atom or a substituted or unsubstituted carbon atom. $X^{B41}$ and $X^{B42}$ each independently represent an oxygen atom, a sulfur atom or a substituted or unsubstituted nitrogen atom.

The compound represented by the formula (B-2) will be described in detail.

In formula (B-2), $M^{B2}$, $Y^{B21}$, $Y^{B24}$, $Y^{B25}$, $Y^{B28}$, $Y^{B22}$, $Y^{B23}$, $Y^{B26}$, $Y^{B27}$, $L^{B21}$, $L^{B22}$, $L^{B23}$ and $L^{B24}$ have the same definitions as corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in formula (B-1) respectively, and their preferable examples are also the same.

$Z^{B21}$, $Z^{B22}$, $Z^{B23}$, $Z^{B24}$, $Z^{B25}$ and $Z^{B26}$ each independently represent a nitrogen atom or a substituted or unsubstituted carbon atom. Each of $Z^{B21}$, $Z^{B22}$, $Z^{B23}$, $Z^{B24}$, $Z^{B25}$ and $Z^{B26}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

The compound represented by the formula (B-3) will be described in detail.

In formula (B-3), $M^{B3}$, $Y^{B31}$, $Y^{B34}$, $Y^{B35}$, $Y^{B38}$, $Y^{B32}$, $Y^{B33}$, $Y^{B36}$, $Y^{B37}$, $L^{B31}$, $L^{B32}$, $L^{B33}$ and $L^{B34}$ have the same definitions as corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in formula (B-1) respectively, and their preferable examples are also the same.

$Z^{B31}$, $Z^{B32}$, $Z^{B33}$ and $Z^{B34}$ each independently represent a nitrogen atom or a substituted or unsubstituted carbon atom. Each of $Z^{B31}$, $Z^{B32}$, $Z^{B33}$ and $Z^{B34}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

The compound represented by the formula (B-4) will be described in detail.

In formula (B-4), $M^{B4}$, $Y^{B41}$, $Y^{B44}$, $Y^{B45}$, $Y^{B48}$, $Y^{B42}$, $Y^{B43}$, $Y^{B46}$, $Y^{B47}$, $L^{B41}$, $L^{B42}$, $L^{B43}$, and $L^{B44}$ have the same definitions as corresponding $M^{B31}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in formula (B-1) respectively, and their preferable examples are also the same.

$Z^{B41}$, $Z^{B42}$, $Z^{B43}$, $Z^{B44}$, $Z^{B45}$ and $Z^{B46}$ each independently represent a nitrogen atom or a substituted or unsubstituted carbon atom. Each of $Z^{B41}$, $Z^{B42}$, $Z^{B43}$, $Z^{B44}$, $Z^{B45}$ and $Z^{B46}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

$X^{B41}$ and $X^{B42}$ each independently represent an oxygen atom, a sulfur atom or a substituted or unsubstituted nitrogen atom. Each of $X^{B41}$ and $X^{B42}$ is preferably an oxygen atom or a sulfur atom, and more preferably an oxygen atom.

Specific examples of the compounds represented by the formula (B-1) are illustrated below, but the invention is not limited thereto.

(B1)

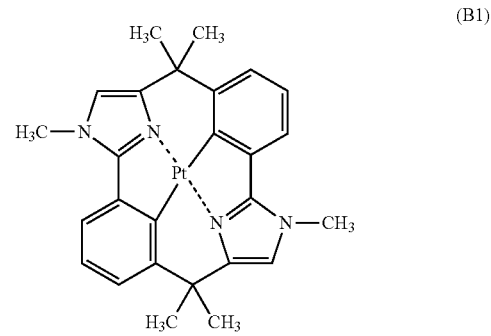

(B2)

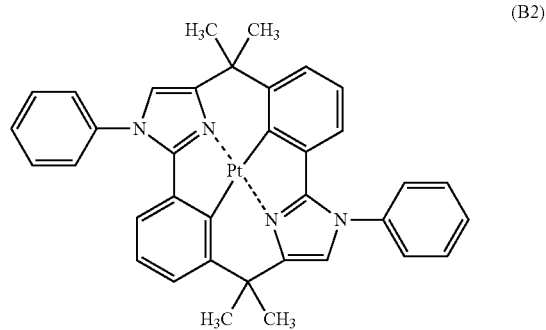

(B3)

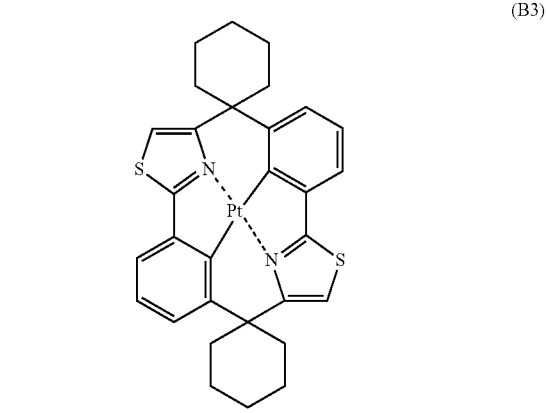

-continued
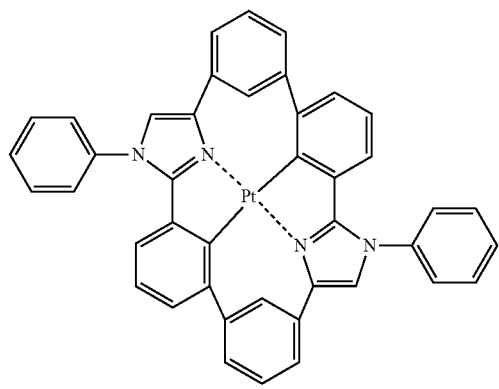
(B4)
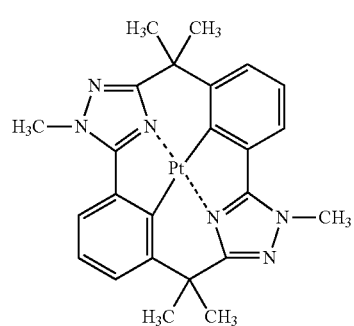
(B5)
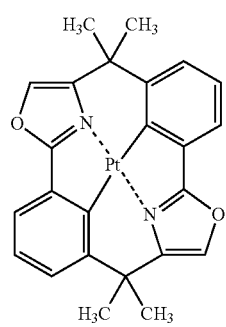
(B6)
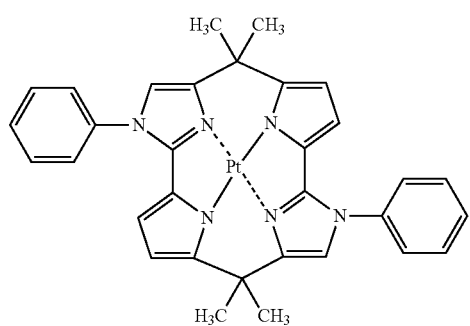
(B7)
-continued
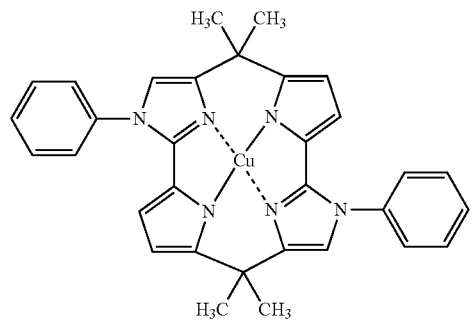
(B8)
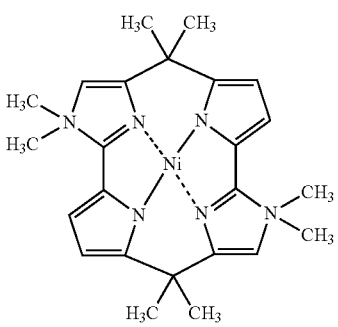
(B9)
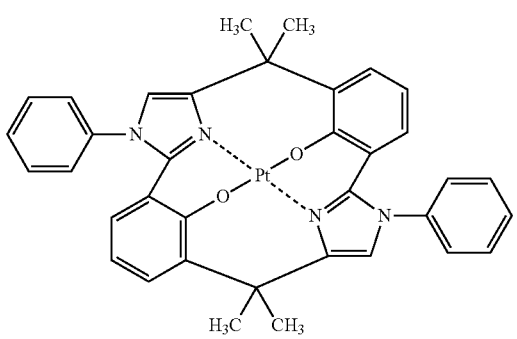
(B10)
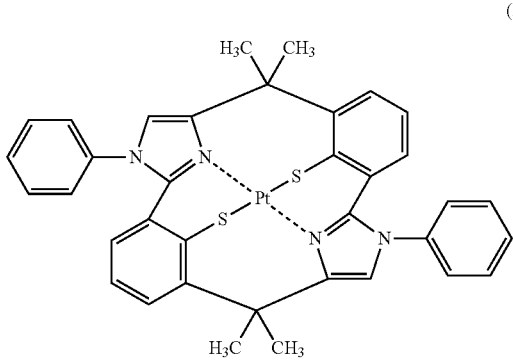
(B11)

(B12) 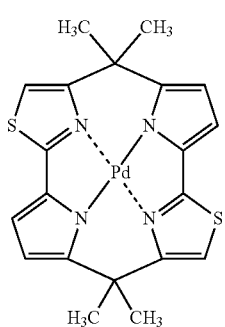
(B13) 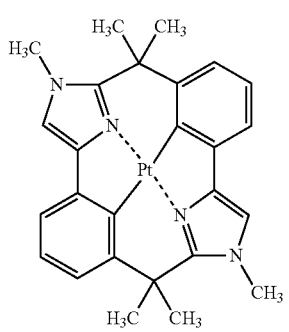
(B14) 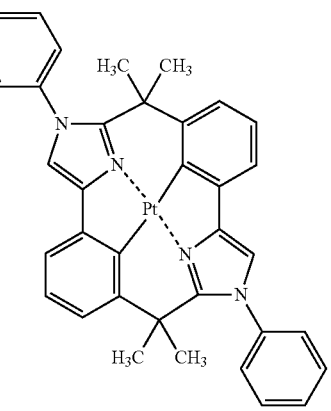
(B15) 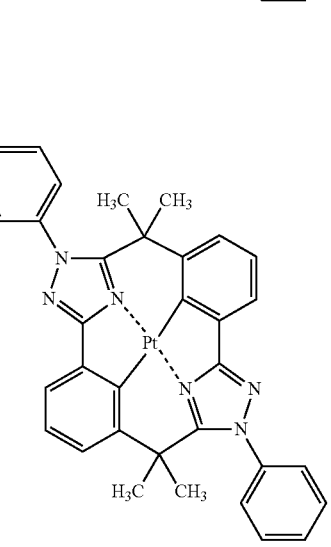
(B16) 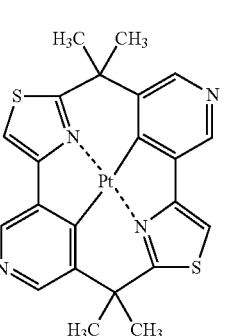
(B17) 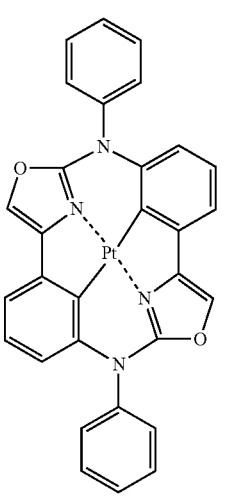
(B18) 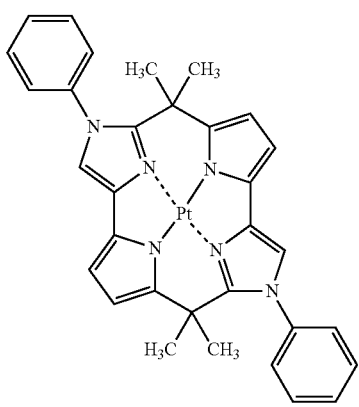
(B19) 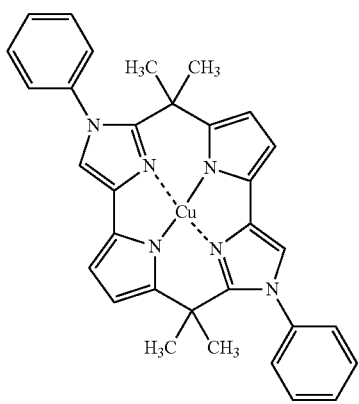

(B20)
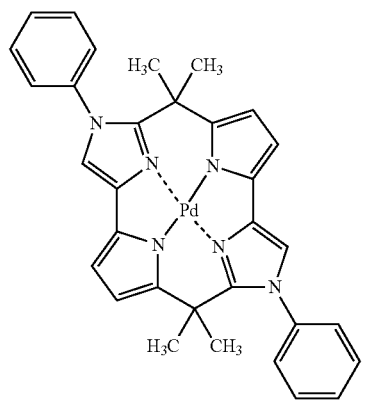
(B21)
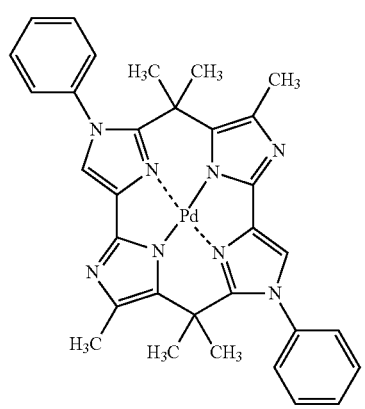
(B22)
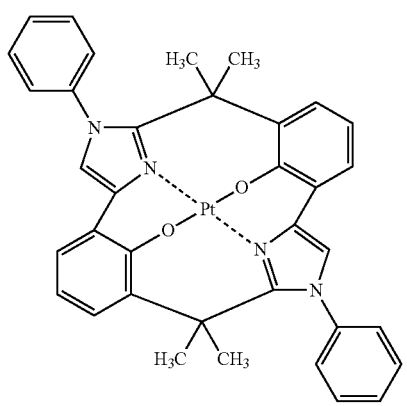
(B23)
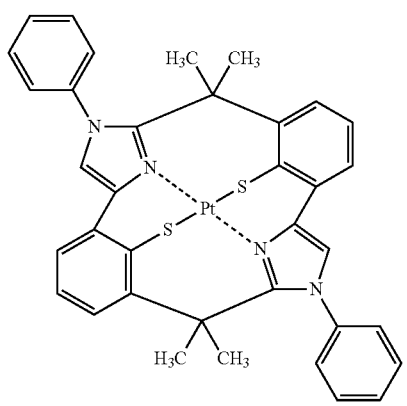
(B24)
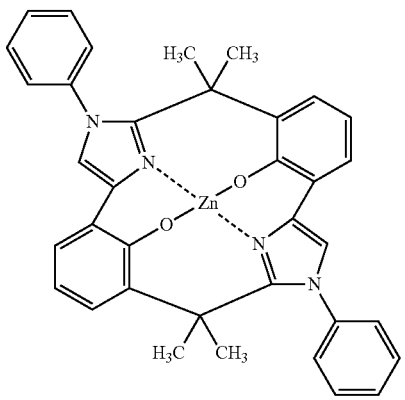
(B25)
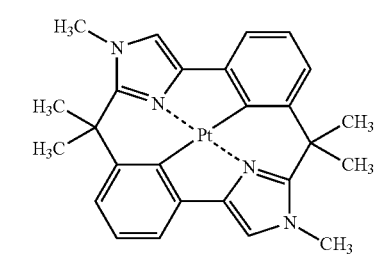
(B26)
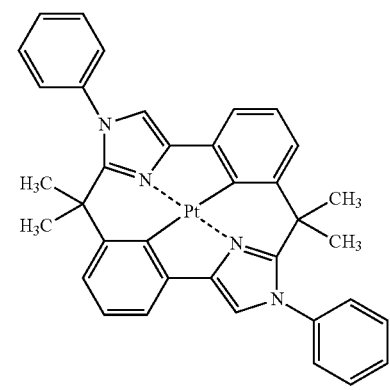
(B27)
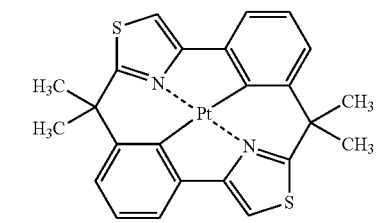
(B28)
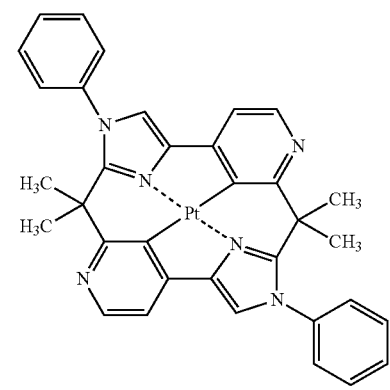

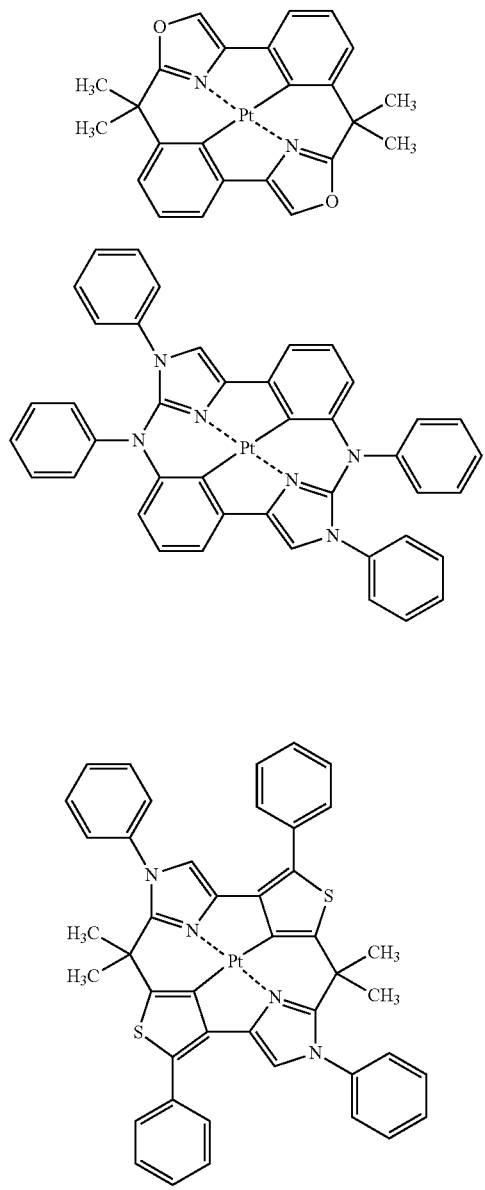
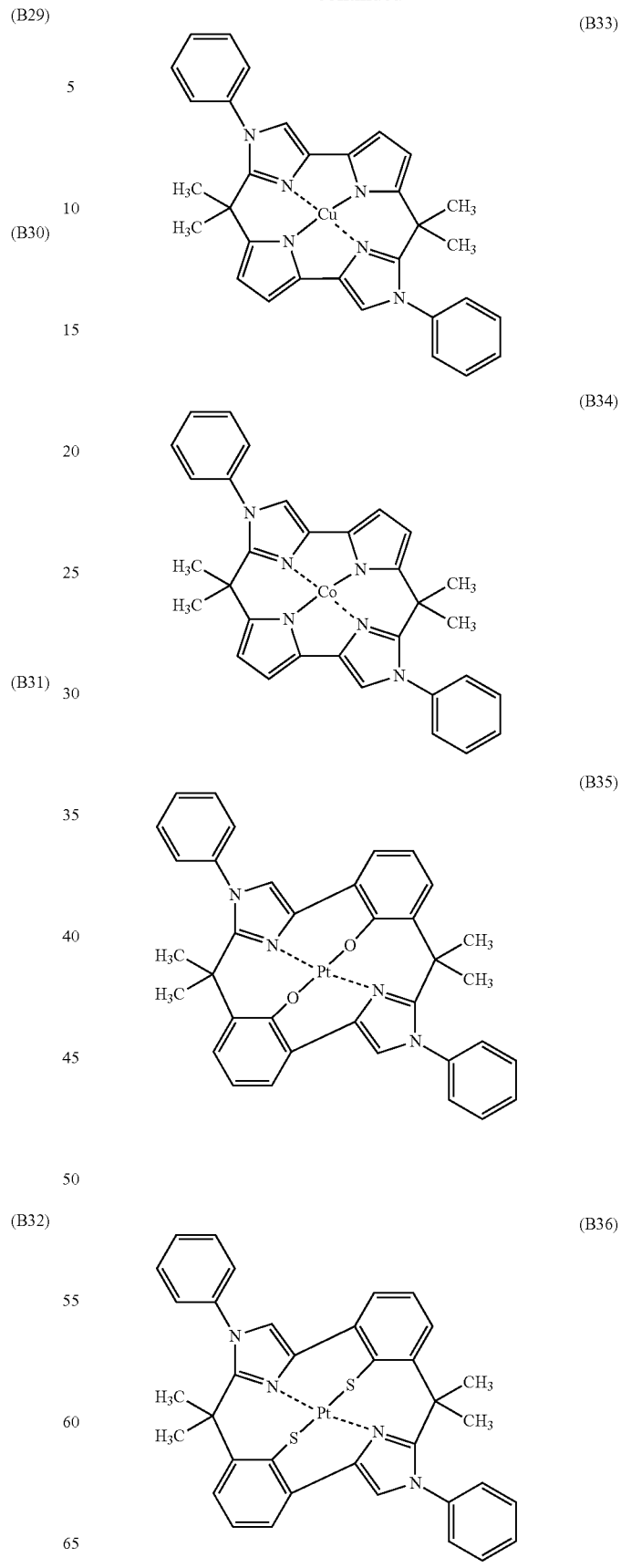

(B37) 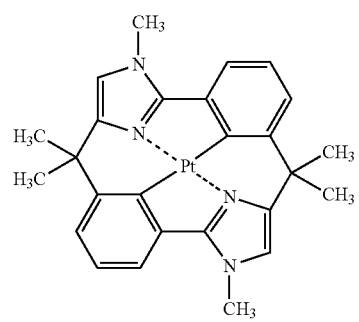
(B38) 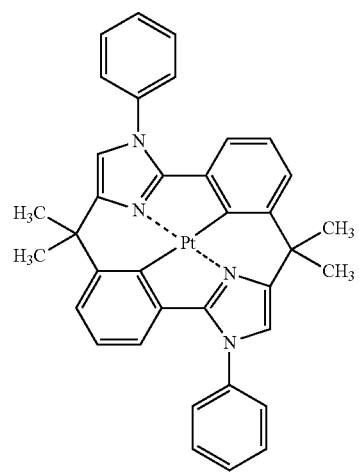
(B39) 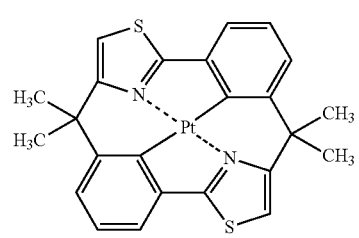
(B40) 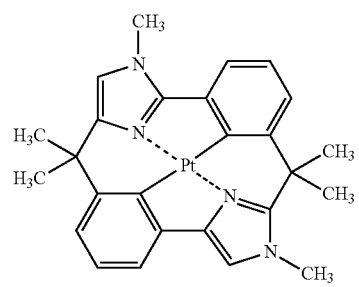
(B41) 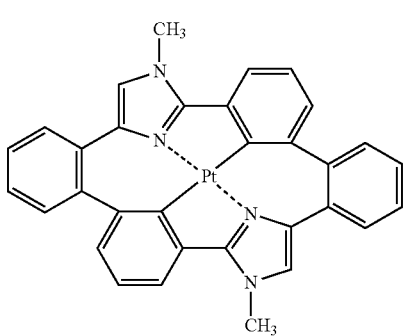
(B42) 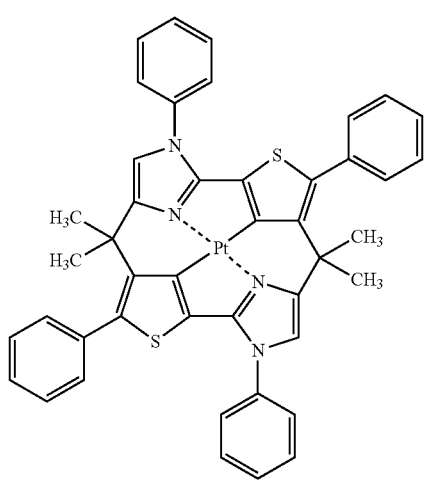
(B43) 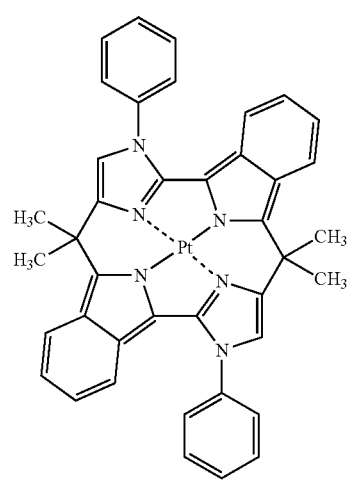
(B44) 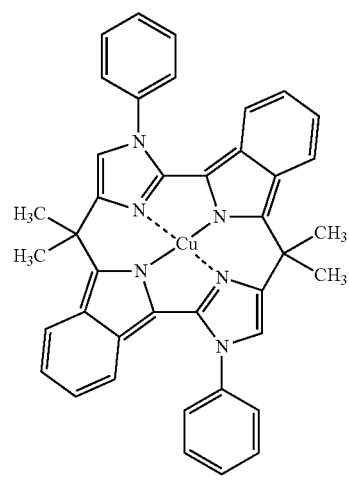

(B45)
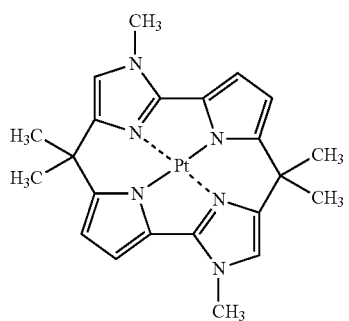
(B46)
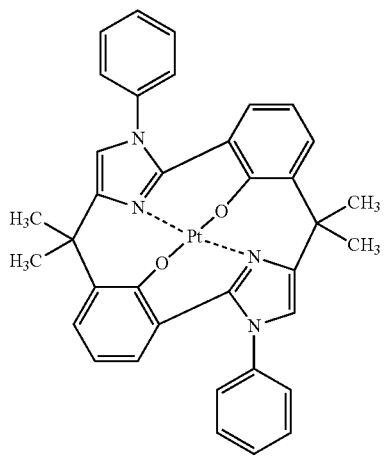
(B47)
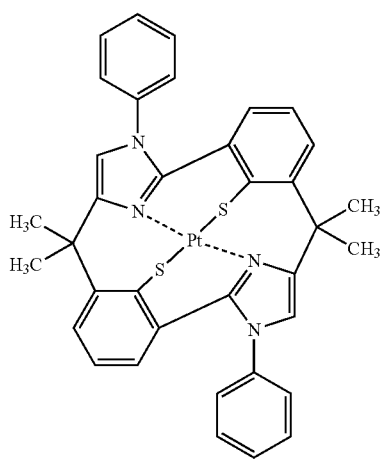
(B48)
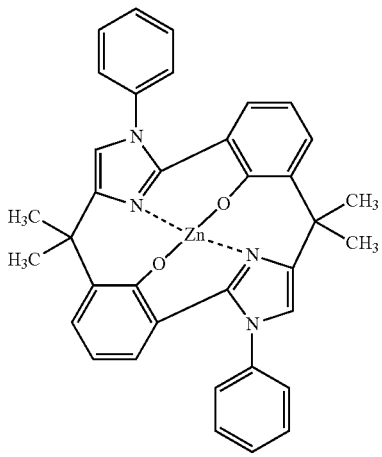
(B49)
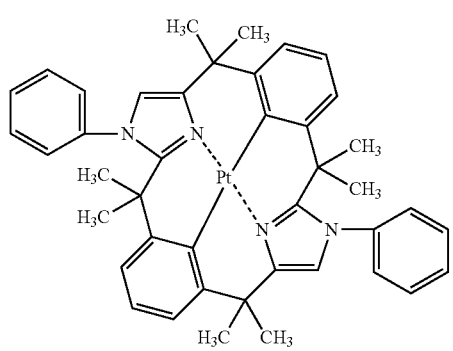
(B50)
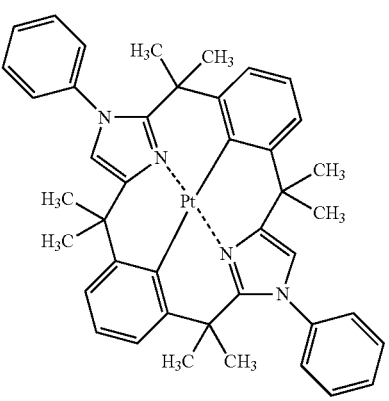
(B51)
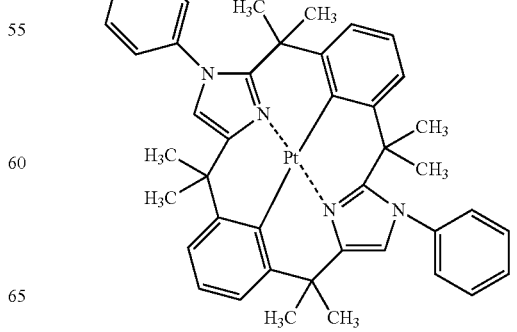

-continued (B52)
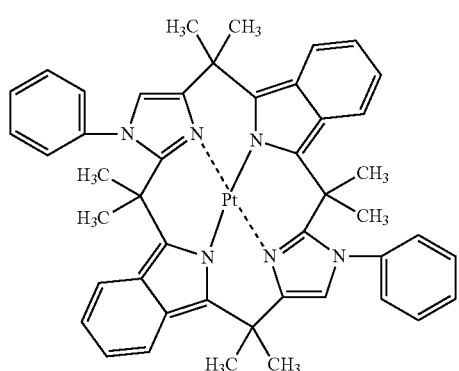

(B53)
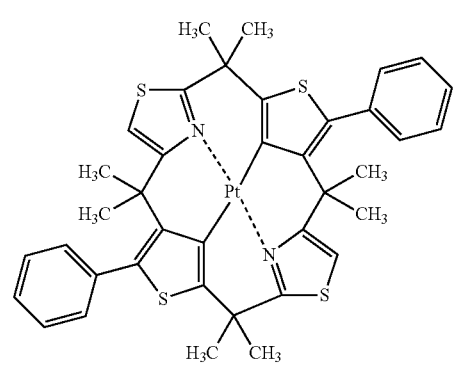

(B54)
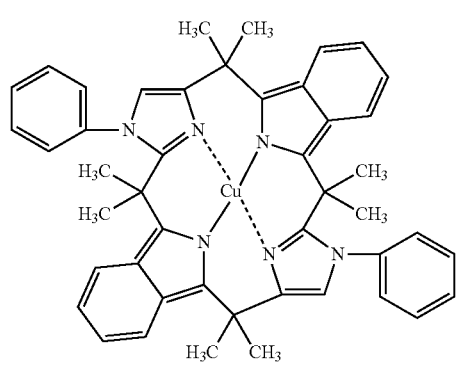

(B55)
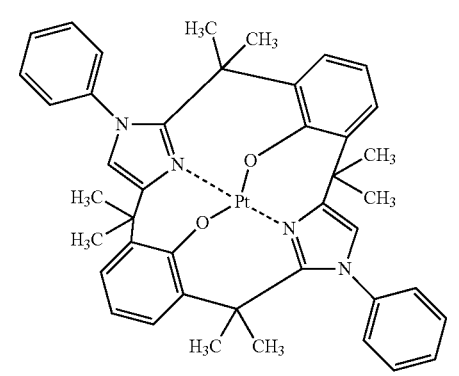

An example of preferable metal complexes usable in the invention is a compound represented by the following formula (C-1):

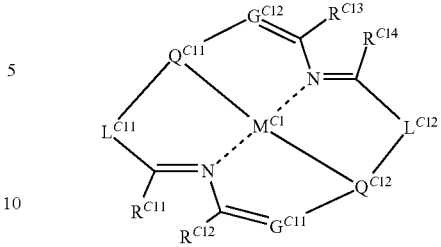

Formula (C-1)

In formula (C-1), $M^{C1}$ represents a metal ion. $R^{C11}$ and $R^{C12}$ each independently represent a hydrogen atom or a substituent. When $R^{C11}$ and $R^{C12}$ represent substituents, the substituents may be bonded to each other to form a 5-membered ring. $R^{C13}$ and $R^{C14}$ each independently represent a hydrogen atom or a substituent. When $R^{C13}$ and $R^{C14}$ represent substituents, the substituents may be bonded to each other to form a 5-membered ring. $G^{C11}$ and $G^{C12}$ each independently represent a nitrogen atom or a substituted or unsubstituted carbon atom. $L^{C11}$ and $L^{C12}$ each independently represent a connecting group. $Q^{C11}$ and $Q^{C12}$ each independently represent a partial structure containing an atom bonded to $M^{C1}$. The bond between the atom in the partial structure and $M^{C1}$ may be, for example, a covalent bond.

The formula (C-1) will be described in detail.

In formula (C-1), $M^{C1}$, $L^{C11}$, $L^{C12}$, $Q^{C11}$ and $Q^{C12}$ have the same definitions as corresponding $M^{A1}$, $L^{A11}$, $L^{A12}$, $Q^{A11}$ and $Q^{A12}$ in formula (A-1) respectively, and their preferable examples are also the same.

$G^{C11}$ and $G^{C12}$ each independently represent a nitrogen atom or a substituted or unsubstituted carbon atom, preferably a nitrogen atom or an unsubstituted carbon atom, and more preferably a nitrogen atom.

$R^{C11}$ and $R^{C12}$ each independently represent a hydrogen atom or a substituent. $R^{C11}$ and $R^{C12}$ may be bonded to each other to form a 5-membered ring. $R^{C13}$ and $R^{C14}$ each independently represent a hydrogen atom or a substituent. $R^{C13}$ and $R^{C14}$ may be bonded to each other to form a 5-membered ring.

The substituent represented by $R^{C11}$, $R^{C12}$, $R^{C13}$ or $R^{C14}$ may be, for example, an alkyl group (preferably a C1 to C30, more preferably C1 to C20, particularly preferably C1 to C10 group, for example methyl, ethyl, iso-propyl, tert-butyl, n-octyl, n-decyl, n-hexadecyl, cyclopropyl, cyclopentyl, cyclohexyl, etc.), an alkenyl group (preferably a C2 to C30, more preferably C2 to C20, particularly preferably C2 to C10 group, for example vinyl, allyl, 2-butenyl, 3-pentenyl, etc.), an alkynyl group (preferably a C2 to C30, more preferably C2 to C20, particularly preferably C2 to C10 group, for example propargyl, 3-pentynyl, etc.), an aryl group (preferably a C6 to C30, more preferably C6 to C20, particularly preferably C6 to C12 group, for example phenyl, p-methylphenyl, naphthyl, anthranyl, etc.), an amino group (preferably a C0 to C30, more preferably C0 to C20, particularly preferably C0 to C10 group, for example amino, methylamino, dimethylamino, diethylamino, dibenzylamino, diphenylamino, ditolylamino, etc.), an alkoxy group (preferably a C1 to C30, more preferably C1 to C20, particularly preferably C1 to C10 group, for example methoxy, ethoxy, butoxy, 2-ethylhexyloxy, etc.), an aryloxy group (preferably a C6 to C30, more preferably C6 to C20, particularly preferably C6 to C12 group, for example phenyloxy, 1-naphthyloxy, 2-naphthyloxy, etc.), a heterocyclic oxy group (preferably a C1 to C30, more preferably C1 to C20, particularly preferably C1 to C12 group, for example pyridyloxy, pyrazyloxy, pyrimidyloxy, quinolyloxy, etc.), an acyl group (preferably a C1 to C30, more preferably C1 to C20, particularly preferably C1 to C12 group, for example acetyl, benzoyl, formyl, pivaloyl, etc.), an alkoxycarbonyl group (preferably a C2 to C30, more preferably C2 to C20, particularly preferably C2 to C12 group, for example methoxycarbonyl, ethoxycarbonyl, etc.), an aryloxycarbonyl group (preferably a C7 to C30, more preferably C7 to C20, particularly preferably C7 to C12 group, for example phenyloxycarbonyl, etc.), an acyloxy group (preferably a C2 to C30, more preferably C2 to C20, particularly preferably C2 to C10 group, for example acetoxy, benzoyloxy, etc.), an acylamino group (preferably a C2 to C30, more preferably C2 to C20, particularly preferably C2 to C10 group, for example acetylamino, benzoylamino, etc.), an alkoxycarbonylamino group (preferably a C2 to C30, more preferably C2 to C20, particularly preferably C2 to C12 group, for example methoxycarbonylamino, etc.), an aryloxycarbonylamino group (preferably a C7 to C30, more preferably C7 to C20, particularly preferably C7 to C12 group, for example phenyloxycarbonylamino, etc.), an alkylthio group (preferably a C1 to C30, more preferably C1 to C20, particularly preferably C1 to C12 group, for example methylthio, ethylthio, etc.), an arylthio group (preferably a C6 to C30, more preferably C6 to C20, particularly preferably C6 to C12 group, for example phenylthio, etc.), a heterocyclic thio group (preferably a C1 to C30, more preferably C1 to C20, particularly preferably C1 to C12 group, for example pyridylthio, 2-benzimidazolylthio, 2-benzoxazolylthio, 2-benzthiazolylthio, etc.), a halogen atom (for example a fluorine atom, chlorine atom, bromine atom, iodine atom), a cyano group, a heterocyclic group (preferably a C1 to C30, more preferably C1 to C20, still more preferably C1 to C12 group containing a heteroatom such as a nitrogen atom, oxygen atom and sulfur atom, specifically imidazolyl, pyridyl, quinolyl, furyl, thienyl, piperidyl, morpholino, benzoxazolyl, benzimidazolyl, benzthiazolyl, carbazolyl group, azepinyl group, etc.), a silyl group (preferably a C3 to C40, more preferably C3 to C30, particularly preferably C3 to C24 group, for example trimethylsilyl, triphenylsilyl, etc.) or a silyloxy group (preferably a C3 to C40, more preferably C3 to C30, particularly preferably C3 to C24 group, for example trimethylsilyloxy, triphenylsilyloxy, etc.).

The substituent represented by $R^{C11}$, $R^{C12}$, $R^{C13}$ or $R^{C14}$ is preferably an alkyl group, an aryl group, or such a group that $R^{C11}$ and $R^{C12}$, or $R^{C13}$ and $R^{C14}$, are bonded to each other to form a 5-membered ring. In a particularly preferable embodiment, $R^{C11}$ and $R^{C12}$, or $R^{C13}$ and $R^{C14}$, are bonded to each other to form a 5-membered ring.

The compound represented by the formula (C-1) is more preferably a compound represented by formula (C-2):

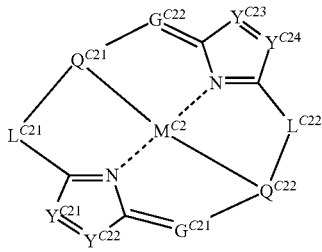

Formula (C-2)

In formula (C-2), $M^{C2}$ represents a metal ion.

$Y^{C21}$, $Y^{C22}$, $Y^{C23}$ and $Y^{C24}$ each independently represent a nitrogen atom or a substituted or unsubstituted carbon atom. $G^{C21}$ and $G^{C22}$ each independently represent a nitrogen atom or a substituted or unsubstituted carbon atom. $L^{C21}$ and $L^{C22}$ each independently represent a connecting group. $Q^{C21}$ and $Q^{C22}$ each independently represent a partial structure containing an atom bonded to $M^{C2}$. The bond between the atom in the partial structure and $M^{C2}$ may be, for example, a covalent bond.

The formula (C-2) will be described in detail.

In formula (C-2), $M^{C2}$, $L^{C21}$, $L^{C22}$, $Q^{C21}$, $Q^{C22}$, $G^{C21}$ and $G^{C22}$ have the same definitions as corresponding $M^{C1}$, $L^{C11}$, $L^{C12}$, $Q^{C11}$, $Q^{C12}$, $G^{C11}$ and $G^{C12}$ in formula (C-1) respectively, and their preferable examples are also the same.

$Y^{C21}$, $Y^{C22}$, $Y^{C23}$ and $Y^{C24}$ each independently represent a nitrogen atom or a substituted or unsubstituted carbon atom, preferably a substituted or unsubstituted carbon atom, and more preferably an unsubstituted carbon atom.

The compound represented by formula (C-2) is more preferably a compound represented by the following formula (C-3), (C-4) or (C-5).

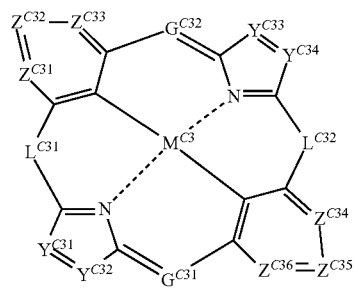

Formula (C-3)

In formula (C-3), $M^{C3}$ represents a metal ion.

$Y^{C31}$, $Y^{C32}$, $Y^{C33}$ and $Y^{C34}$ each independently represent a nitrogen atom or a substituted or unsubstituted carbon atom. $G^{C31}$ and $G^{C32}$ each independently represent a nitrogen atom or a substituted or unsubstituted carbon atom. $L^{C31}$ and $L^{C32}$ each independently represent a connecting group. $Z^{C31}$, $Z^{C32}$, $Z^{C33}$, $Z^{C34}$, $Z^{C35}$ and $Z^{C36}$ each independently represent a nitrogen atom or a substituted or unsubstituted carbon atom.

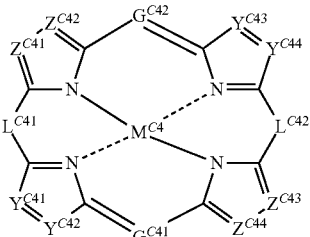

Formula (C-4)

In formula (C-4), $M^{C4}$ represents a metal ion.

$Y^{C41}$, $Y^{C42}$, $Y^{C43}$ and $Y^{C44}$ each independently represent a nitrogen atom or a substituted or unsubstituted carbon atom. $G^{C41}$ and $G^{C42}$ each independently represent a nitrogen atom or a substituted or unsubstituted carbon atom. $L^{C41}$ and $L^{C42}$ each independently represent a connecting group.

$Z^{C41}$, $Z^{C42}$, $Z^{C43}$ and $Z^{C44}$ each independently represent a nitrogen atom or a substituted or unsubstituted carbon atom.

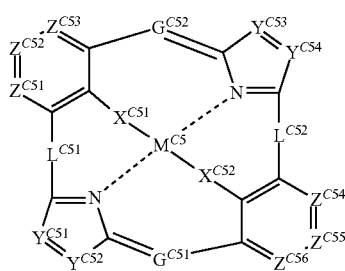

Formula (C-5)

In formula (C-5), $M^{C5}$ represents a metal ion.
$Y^{C51}$, $Y^{C52}$, $Y^{C53}$ and $Y^{C54}$ each independently represent a nitrogen atom or a substituted or unsubstituted carbon atom. $G^{C51}$ and $G^{C52}$ each independently represent a nitrogen atom or a substituted or unsubstituted carbon atom. $L^{C51}$ and $L^{C52}$ each independently represent a connecting group. $Z^{C51}$, $Z^{C52}$, $Z^{C53}$, $Z^{C54}$, $Z^{C55}$ and $Z^{C56}$ each independently represent a nitrogen atom or a substituted or unsubstituted carbon atom. $X^{C51}$ and $X^{C52}$ each independently represent an oxygen atom, a sulfur atom or a substituted or unsubstituted nitrogen atom.

The compound represented by the formula (C-3) will be described in detail.

In formula (C-3), $M^{C3}$, $L^{C31}$, $L^{C32}$, $G^{C31}$ and $G^{C32}$ have the same definitions as corresponding $M^{C1}$, $L^{C11}$, $L^{C12}$, $G^{C11}$ and $G^{C12}$ in formula (C-1) respectively, and their preferable examples are also the same.

$Z^{C31}$, $Z^{C32}$, $Z^{C33}$, $Z^{C34}$, $Z^{C35}$ and $Z^{C36}$ each independently represent a nitrogen atom or a substituted or unsubstituted carbon atom. Each of $Z^{C31}$, $Z^{C32}$, $Z^{C33}$, $Z^{C34}$, $Z^{C35}$ and $Z^{C36}$ is preferably a substituted or unsubstituted carbon atom, and more preferably an unsubstituted carbon atom.

The compound represented by the formula (C-4) is described in more detail.

In formula (C-4), have the same definitions as $M^{C4}$, $L^{C41}$, $L^{C42}$, $G^{C41}$ and $G^{C41}$ corresponding $M^{C1}$, $L^{C11}$, $L^{C12}$, $G^{C11}$ and $G^{C12}$ in formula (C-1) respectively, and their preferable examples are also the same.

$Z^{C41}$, $Z^{C42}$, $Z^{C43}$, and $Z^{C44}$ each independently represent a nitrogen atom or a substituted or unsubstituted carbon atom. Each of $Z^{C41}$, $Z^{C42}$, $Z^{C43}$ and $Z^{C44}$ is preferably a substituted or unsubstituted carbon atom, and more preferably an unsubstituted carbon atom.

The compound represented by the formula (C-5) is described in more detail.

$M^{C5}$, $L^{C51}$, $L^{C52}$, $G^{C51}$ and $G^{C52}$ have the same definitions as corresponding $M^{C1}$, $L^{C11}$, $L^{C12}$, $G^{C11}$ and $G^{C12}$ in formula (C-1) respectively, and their preferable examples are also the same.

$Z^{C51}$, $Z^{C52}$, $Z^{C53}$, $Z^{C54}$, $Z^{C55}$ and $Z^{C56}$ each independently represent a nitrogen atom or a substituted or unsubstituted carbon atom. Each of $Z^{C51}$, $Z^{C52}$, $Z^{C53}$, $Z^{C54}$, $Z^{C55}$ and $Z^{C56}$ is preferably a substituted or unsubstituted carbon atom, and more preferably an unsubstituted carbon atom.

$X^{C51}$ and $X^{C52}$ each independently represent an oxygen atom, a sulfur atom or a substituted or unsubstituted nitrogen atom. Each of $X^{C51}$ and $X^{C52}$ is preferably an oxygen atom or a sulfur atom, and more preferably an oxygen atom.

Specific examples of the compounds represented by the formula (C-1) are illustrated below, but the invention is not limited thereto.

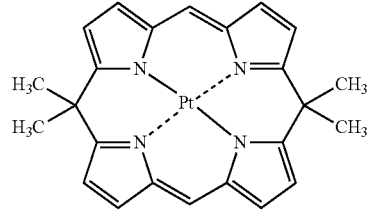
(C1)

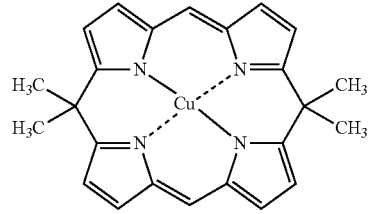
(C2)

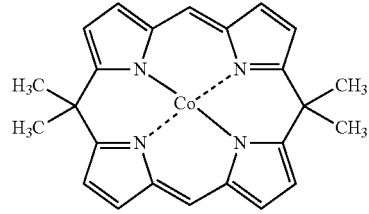
(C3)

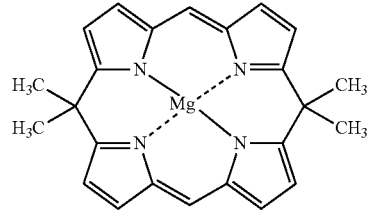
(C4)

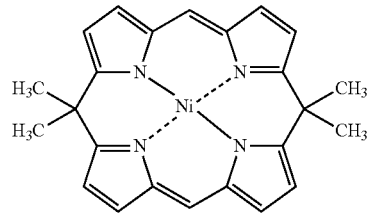
(C5)

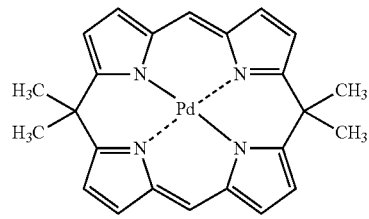
(C6)

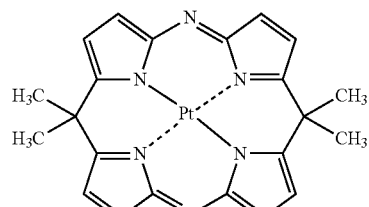
(C7)

(C8)
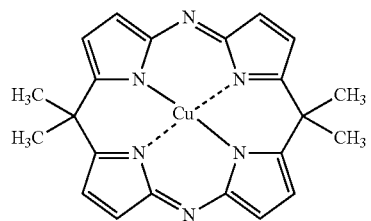
(C9)
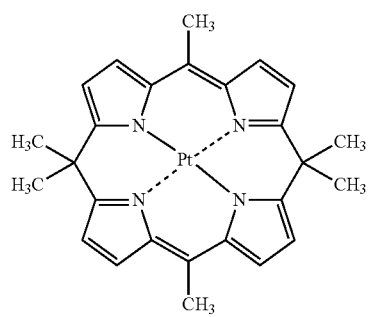
(C10)
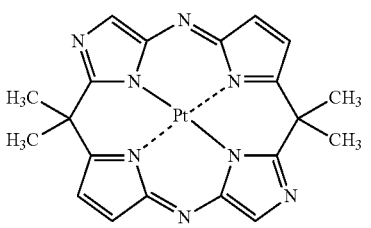
(C11)
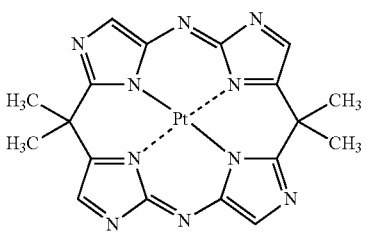
(C12)
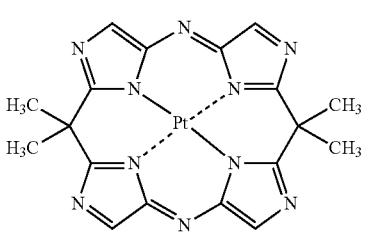
(C13)
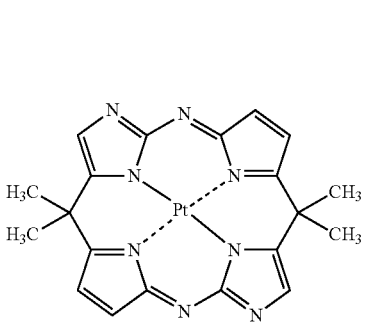
(C14)
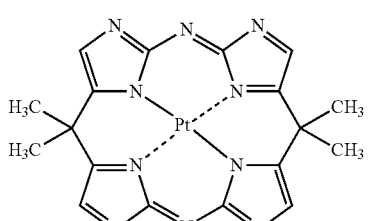
(C15)
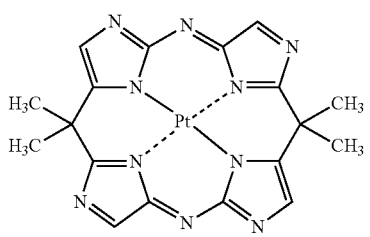
(C16)
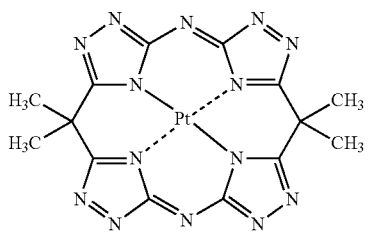
(C17)
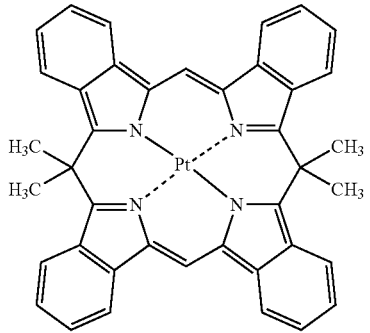
(C18)
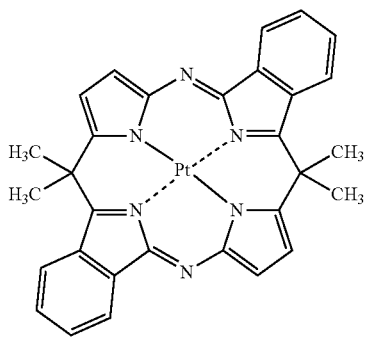

(C19) 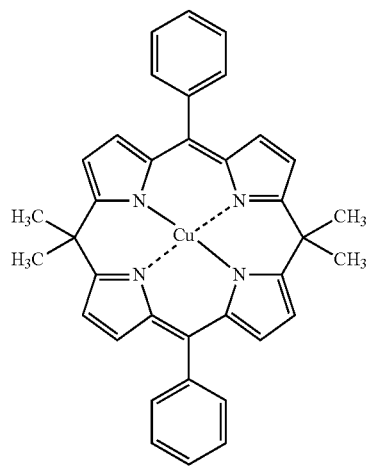
(C20) 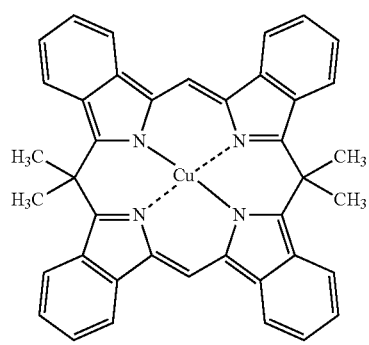
(C21) 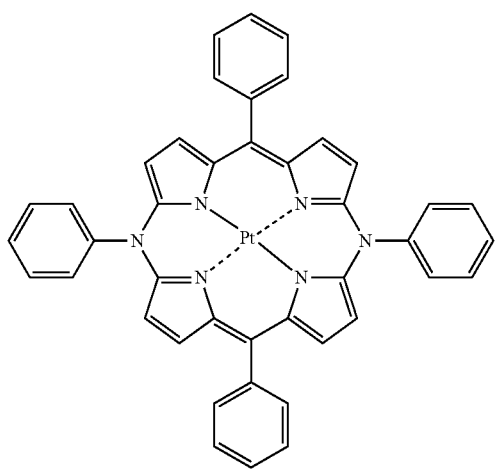
(C22) 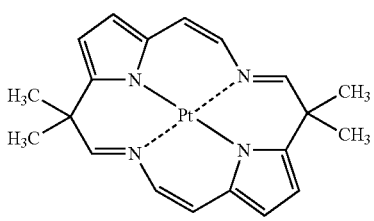
(C23) 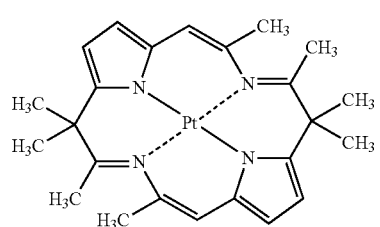
(C24) 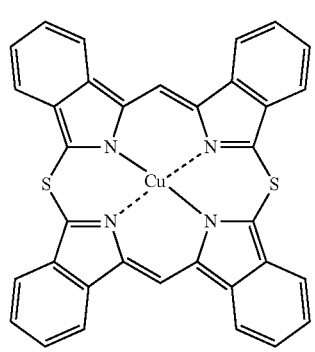
(C25) 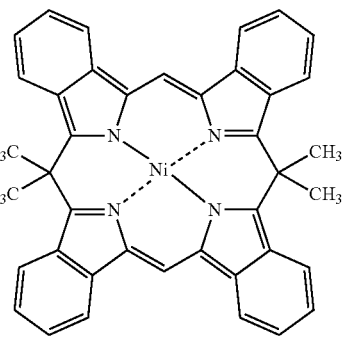
(C26) 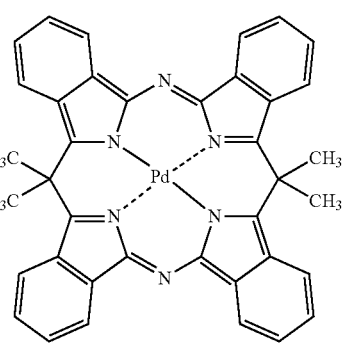

(C27) 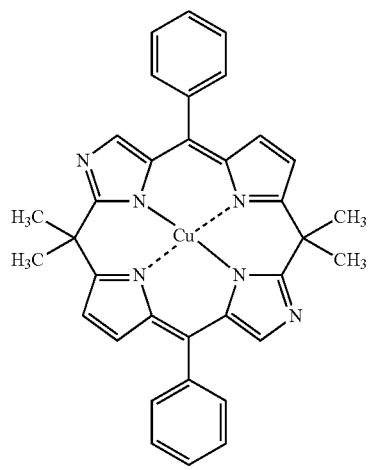
(C28) 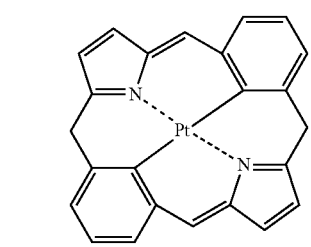
(C29) 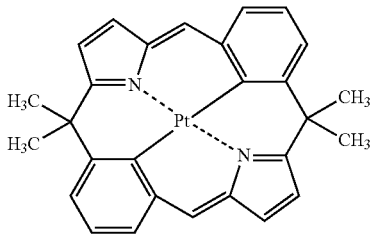
(C30) 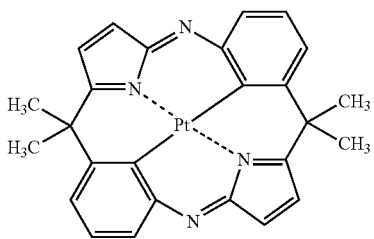
(C31) 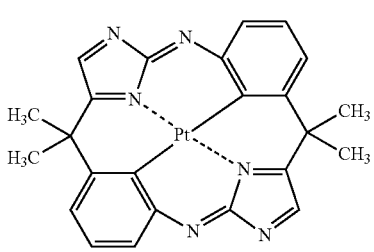
(C32) 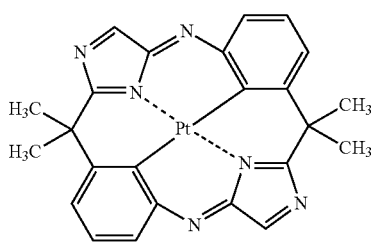
(C33) 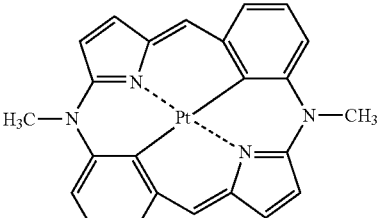
(C34) 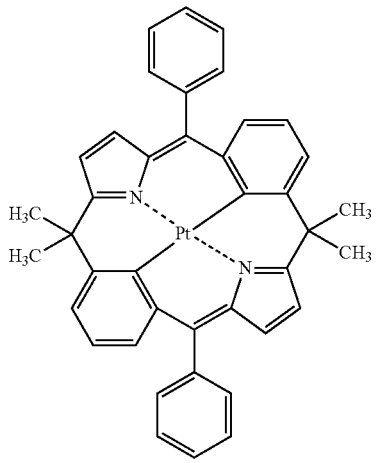
(C35) 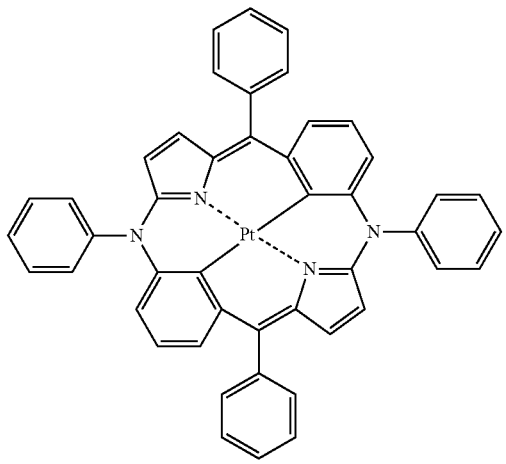

-continued
(C36)
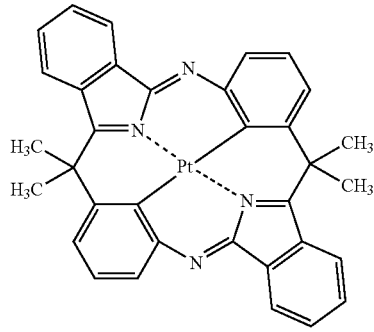
(C37)
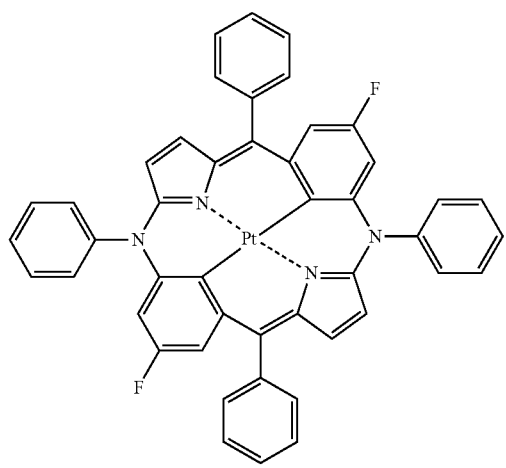
(C38)
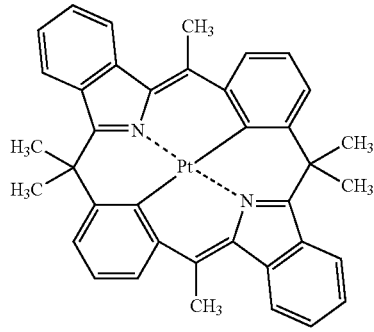
(C39)
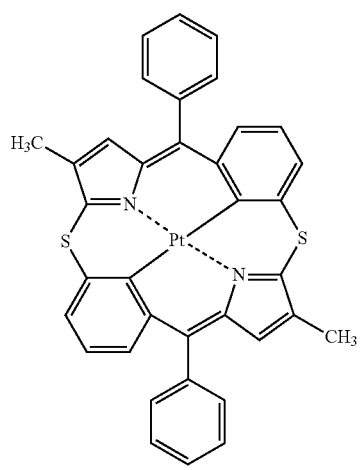
-continued
(C40)
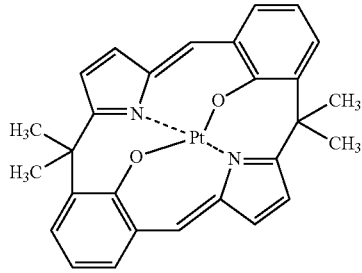
(C41)
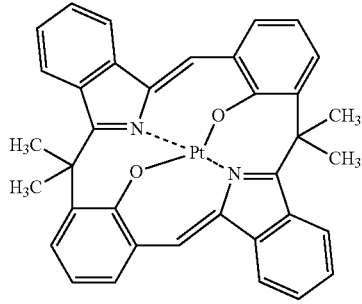
lp;2p
(C42)
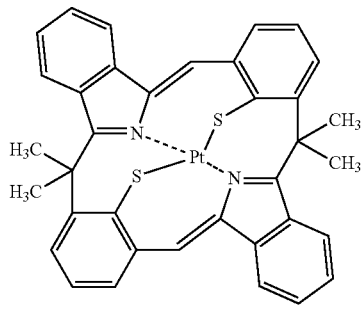
(C43)
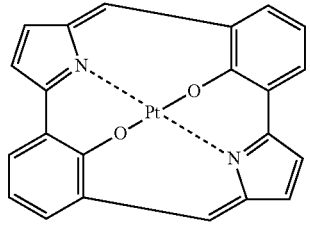
(C44)
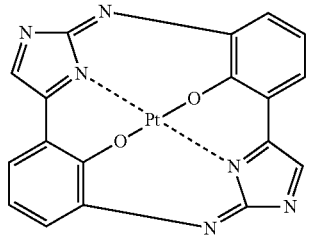

-continued
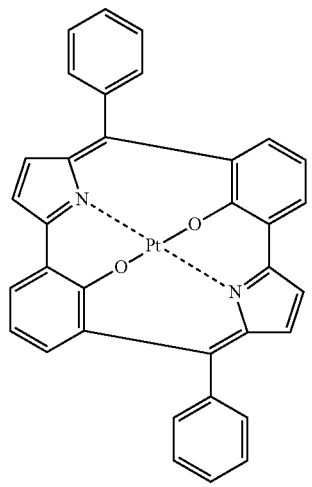
(C45)
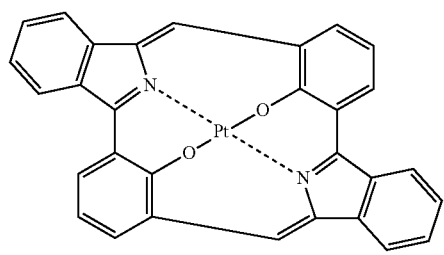
(C46)
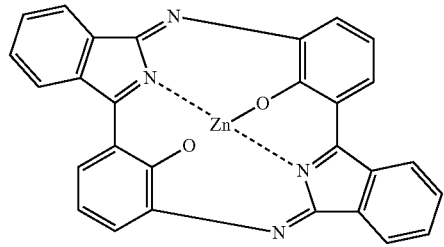
(C47)
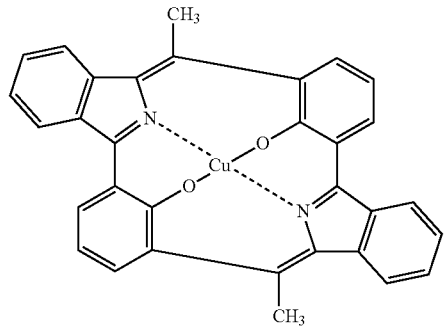
(C48)
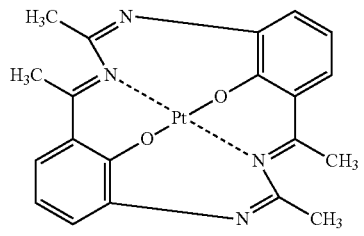
(C49)
-continued
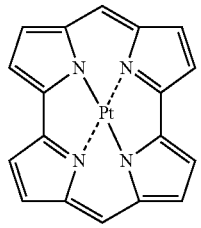
(C50)
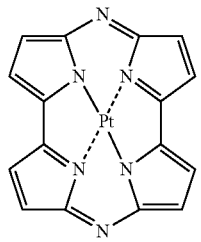
(C51)
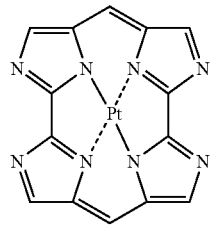
(C52)
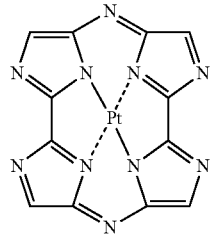
(C53)
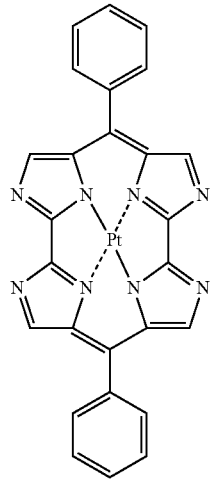
(C54)

(C55) 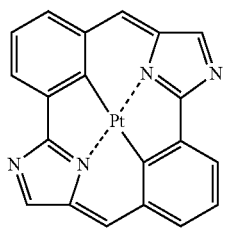
(C56) 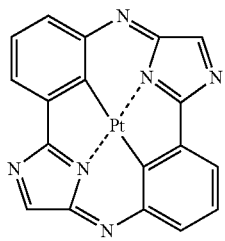
(C57) 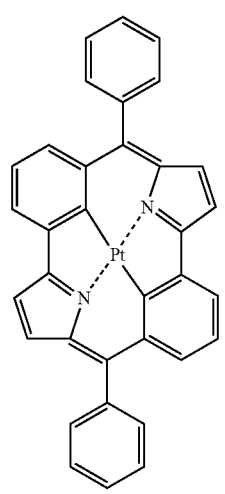
(C58) 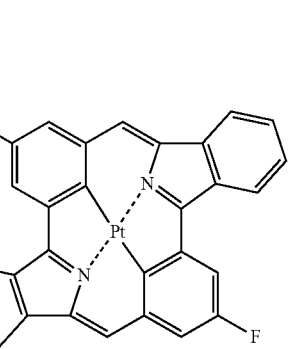
(C59) 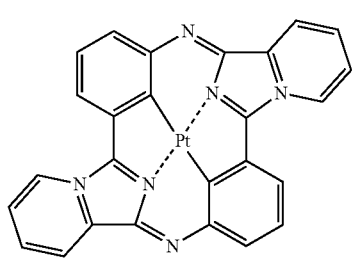
(C60) 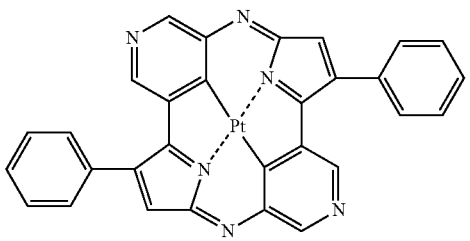
(C61) 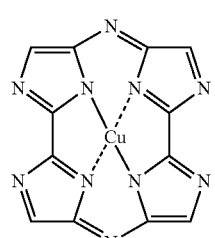
(C62) 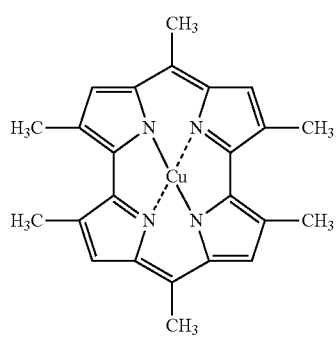
(C63) 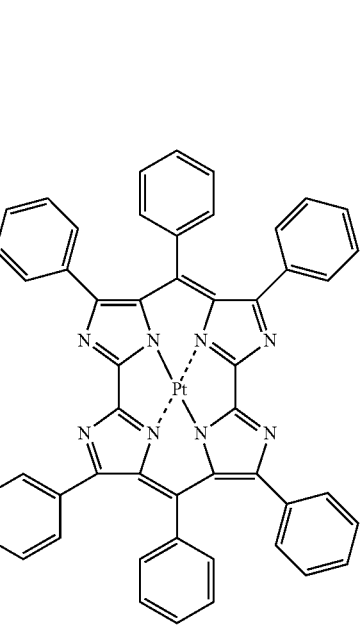
An example of preferable metal complexes usable in the invention is a compound represented by the following formula (D-1):

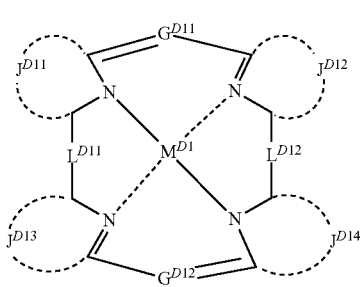

Formula (D-1)

In formula (D-1), $M^{D1}$ represents a metal ion.

$G^{D11}$ and $G^{D12}$ each independently represent a nitrogen atom or a substituted or unsubstituted carbon atom. $J^{D11}$, $J^{D12}$, $J^{D13}$ and $J^{D14}$ each independently represent an atomic group necessary for forming a 5-membered ring. $L^{D11}$ and $L^{D12}$ each independently represent a connecting group.

The formula (D-1) will be described in detail.

In formula (D-1), $M^{D1}$, $L^{D11}$ and $L^{D12}$ have the same definitions as corresponding $M^{A1}$, $L^{A11}$ and $L^{A12}$ in formula (A-1) respectively, and their preferable examples are also the same.

$G^{D11}$ and $G^{D12}$ have the same definitions as corresponding $G^{C11}$ and $G^{C12}$ in formula (C-1) respectively, and their preferable examples are also the same.

$J^{D11}$, $J^{D12}$, $J^{D13}$ and $J^{D14}$ each independently represent such an atomic group that a nitrogen-containing 5-membered heterocyclic ring containing the atomic group is formed.

The compound represented by the formula (D-1) is more preferably a compound represented by the following formula (D-2), (D-3) or (D-4).

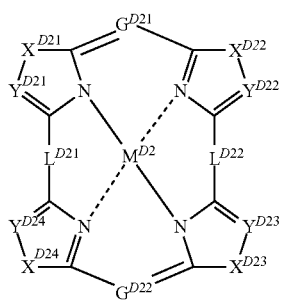

Formula (D-2)

In formula (D-2), $M^{D2}$ represents a metal ion.

$G^{D21}$ and $G^{D22}$ each independently represent a nitrogen atom or a substituted or unsubstituted carbon atom.

$Y^{D21}$, $Y^{D22}$, $Y^{D23}$ and $Y^{D24}$ each independently represent a nitrogen atom or a substituted or unsubstituted carbon atom.

$X^{D21}$, $X^{D22}$, $X^{D23}$ and $X^{D24}$ each independently represent an oxygen atom, a sulfur atom, $-NR^{D21}-$ or $-C(R^{D22})R^{D23}-$.

$R^{D21}$, $R^{D22}$ and $R^{D23}$ each independently represent a hydrogen atom or a substituent. $L^{D21}$ and $L^{D22}$ each independently represent a connecting group.

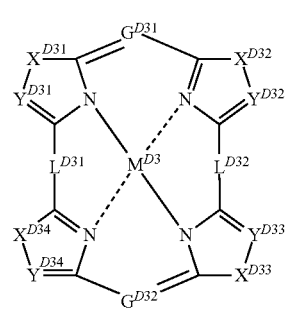

Formula (D-3)

In formula (D-3), $M^{D3}$ represents a metal ion.

$G^{D31}$ and $G^{D32}$ each independently represent a nitrogen atom or a substituted or unsubstituted carbon atom.

$Y^{D31}$, $Y^{D32}$, $Y^{D33}$ and $Y^{D34}$ each independently represent a nitrogen atom or a substituted or unsubstituted carbon atom.

$X^{D31}$, $X^{D32}$, $X^{D33}$ and $X^{D34}$ each independently represent an oxygen atom, a sulfur atom, $-NR^{D31}-$ or $-C(R^{D32})R^{D33}-$.

$R^{D31}$, $R^{D32}$ and $R^{D33}$ each independently represent a hydrogen atom or a substituent. $L^{D31}$ and $L^{D32}$ each independently represent a connecting group.

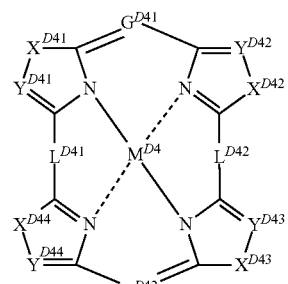

Formula (D-4)

In formula (D-4), $M^{D4}$ represents a metal ion.

$G^{D41}$ and $G^{D42}$ each independently represent a nitrogen atom or a substituted or unsubstituted carbon atom.

$Y^{D41}$, $Y^{D42}$, $Y^{D43}$ and $Y^{D44}$ each independently represent a nitrogen atom or a substituted or unsubstituted carbon atom.

$X^{D41}$, $X^{D42}$, $X^{D43}$ and $X^{D44}$ each independently represent an oxygen atom, a sulfur atom, $-NR^{D41}-$ or $-C(R^{D42})R^{D43}-$. $R^{D41}$, $R^{D42}$ and $R^{D43}$ each independently represent a hydrogen atom or a substituent. $L^{D41}$ and $L^{D42}$ each independently represent a connecting group.

The formula (D-2) will be described in detail.

In formula (D-2), $M^{D2}$, $L^{D21}$, $L^{D22}$, $G^{D21}$ and $G^{D22}$ have the same definitions as corresponding $M^{D1}$, $L^{D11}$, $L^{D12}$, $G^{D11}$ and $G^{D12}$ formula (D-1) respectively, and their preferable examples are also the same.

$Y^{D21}$, $Y^{D22}$, $Y^{D23}$ and $Y^{D24}$ each independently represent a nitrogen atom or a substituted or unsubstituted carbon atom, preferably a substituted or unsubstituted carbon atom, and more preferably an unsubstituted carbon atom.

$X^{D21}$, $X^{D22}$, $X^{D23}$ and $X^{D24}$ each independently represent an oxygen atom, a sulfur atom, $-NR^{D21}-$ or $-C(R^{D22})R^{D23}-$, preferably a sulfur atom, $-NR^{D21}-$ or $-C(R^{D22})R^{D23}-$, more preferably $-NR^{D21}-$ or $-C(R^{D22})R^{D23}-$, and further more preferably $-NR^{D21}-$.

$R^{D21}$, $R^{D22}$ and $R^{D23}$ each independently represent a hydrogen atom or a substituent. The substituent represented by $R^{D21}$, $R^{D22}$, $R^{D23}$ may be, for example, an alkyl group (preferably a C1 to C20, more preferably C1 to C12, particularly preferably C1 to C8 group, for example methyl, ethyl, iso-propyl, tert-butyl, n-octyl, n-decyl, n-hexadecyl, cyclopropyl, cyclopentyl, cyclohexyl, etc.), an alkenyl group (preferably a C2 to C20, more preferably C2 to C12, particularly preferably C2 to C8 group, for example vinyl, allyl, 2-butenyl, 3-pentenyl, etc.), an alkynyl group (preferably a C2 to C20, more preferably C2 to C12, particularly preferably C2 to C8 group, for example propargyl, 3-pentynyl, etc.), an aryl group (preferably a C6 to C30, more preferably C6 to C20, particularly preferably C6 to C12 group, for example phenyl, p-methylphenyl, naphthyl, etc.), a substituted carbonyl group (preferably a C1 to C20, more preferably C1 to C16, particularly preferably C1 to C12 group, for example acetyl, benzoyl, methoxycarbonyl, phenyloxycarbonyl, dimethylaminocarbonyl, phenylaminocarbonyl, etc.), a substituted sulfonyl group (preferably a C1 to C20, more preferably C1 to C16, particularly preferably C1 to C12 group, for example mesyl, tosyl, etc.), or a heterocyclic group (including an aliphatic heterocyclic group and aromatic heterocyclic group, preferably a C1 to C50, more preferably C1 to C30, more preferably C2 to C12 group, preferably containing an oxygen atom, a sulfur atom or a nitrogen atom, for example imidazolyl, pyridyl, furyl, piperidyl, morpholino, benzoxazolyl, triazolyl groups, etc.). Each of $R^{D21}$, $R^{D22}$ and $R^{D23}$ is preferably an alkyl group, aryl group or aromatic heterocyclic group, more preferably an alkyl or aryl group, and still more preferably an aryl group.

The formula (D-3) will be described in detail.

In formula (D-3), $M^{D3}$, $L^{D31}$, $L^{D32}$, $G^{D31}$ and $G^{D32}$ have the same definitions as corresponding $M^{D1}$, $L^{D11}$, $L^{D12}$, $G^{D11}$ and $G^{D12}$ in formula (D-1) respectively, and their preferable examples are also the same.

$X^{D31}$, $X^{D32}$, $X^{D33}$ and $X^{D34}$ have the same definitions as corresponding $X^{D21}$, $X^{D22}$, $X^{D23}$ and $X^{D24}$ in formula (D-2) respectively, and their preferable examples are also the same.

$Y^{D31}$, $Y^{D32}$, $Y^{D33}$ and $Y^{D34}$ have the same definitions as corresponding $Y^{D21}$, $Y^{D22}$, $Y^{D23}$ and $Y^{D24}$ in formula (D-2) respectively, and their preferable examples are also the same.

The formula (D-4) will be described in detail.

In formula (D-4), $M^{D4}$, $L^{D41}$, $L^{D42}$, $G^{D41}$ and $G^{D42}$ have the same definitions as corresponding $M^{D1}$, $L^{D11}$, $L^{D12}$, $G^{D11}$ and $G^{D12}$ in formula (D-1) respectively, and their preferable examples are also the same.

$X^{D41}$, $X^{D42}$, $X^{D43}$ and $X^{D44}$ have the same definitions as corresponding $X^{D21}$, $X^{D22}$, $X^{D23}$ and $X^{D24}$ in formula (D-2) respectively, and their preferable examples are also the same. $Y^{D41}$, $Y^{D42}$, $Y^{D43}$ and $Y^{D44}$ have the same definitions as corresponding $Y^{D21}$, $Y^{D22}$, $Y^{D23}$ and $Y^{D24}$ in formula (D-2) respectively, and their preferable examples are also the same.

Specific examples of the compounds represented by the formula (D-1) are illustrated below, but the invention is not limited thereto.

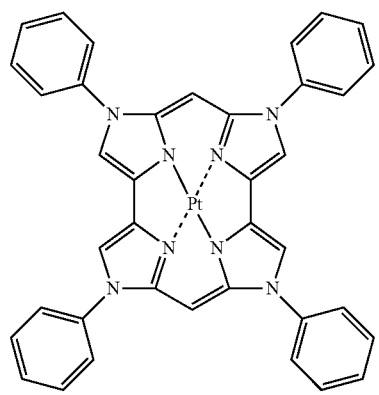

(D1)

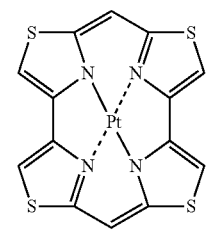

(D2)

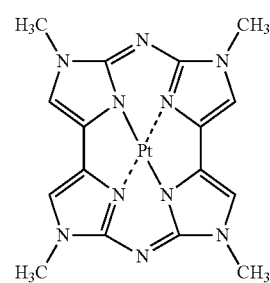

(D3)

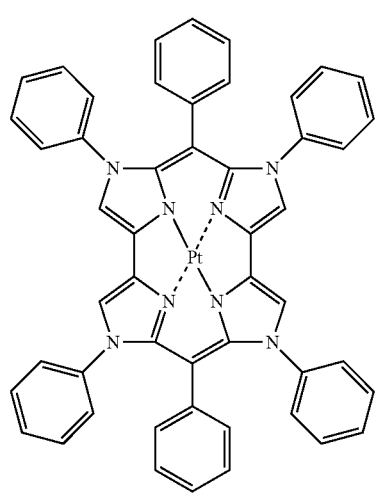

(D4)

(D5)
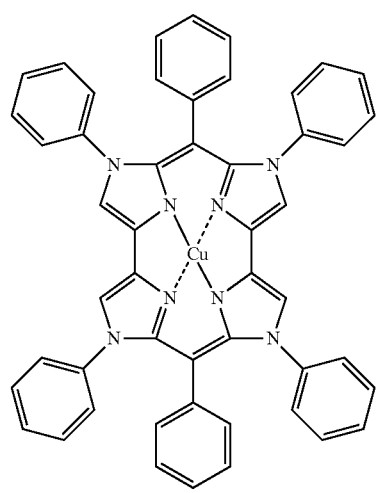
(D6)
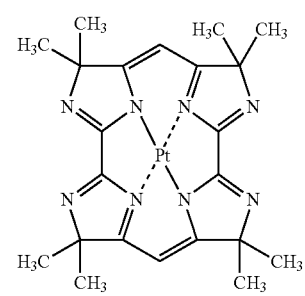
(D7)
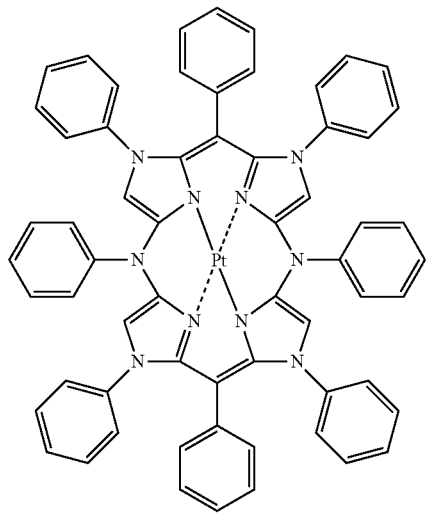
(D8)
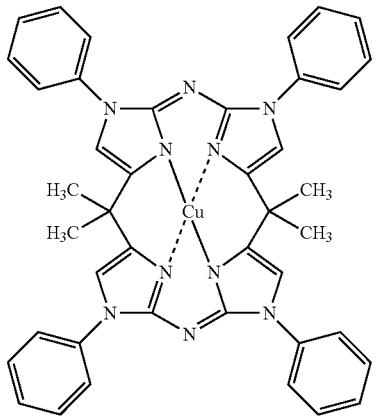
(D9)
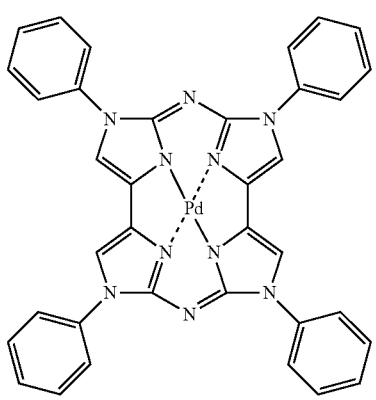
(D10)
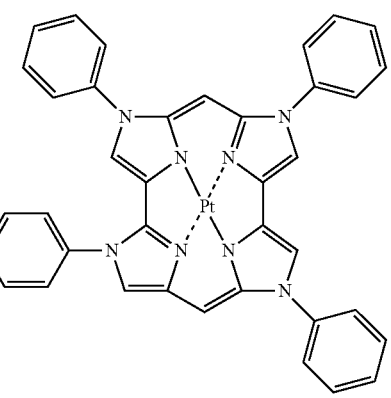
(D11)
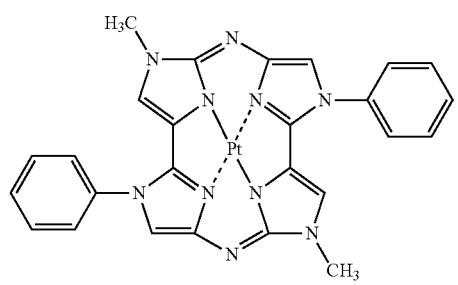

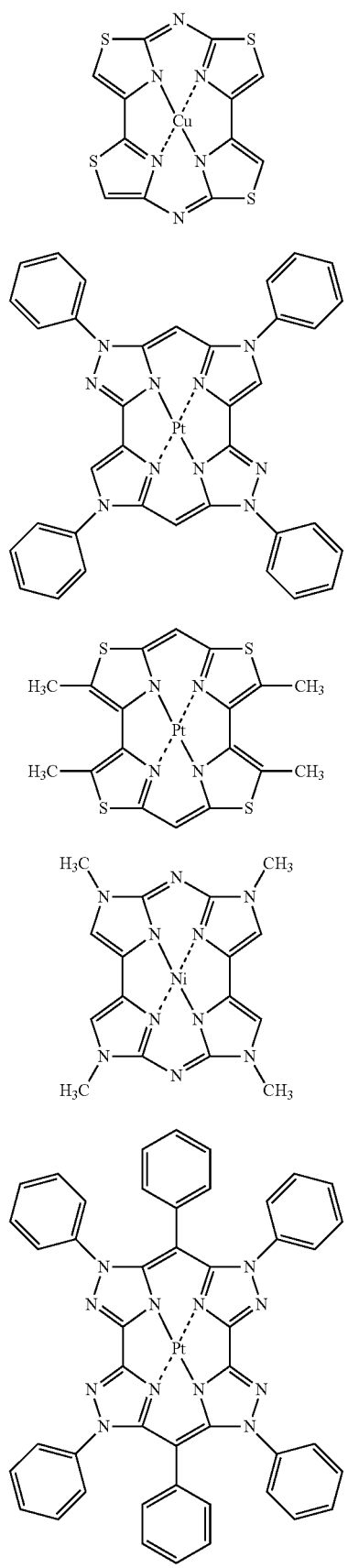
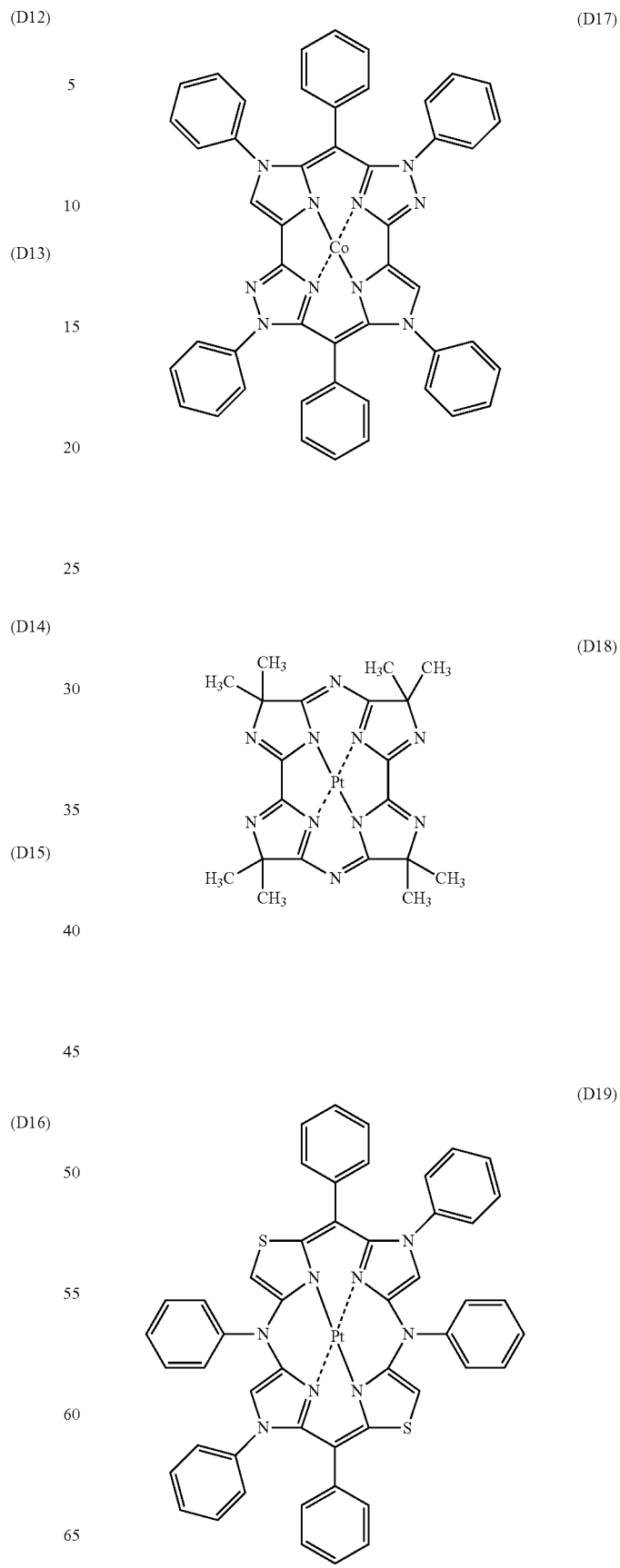

-continued (D20)
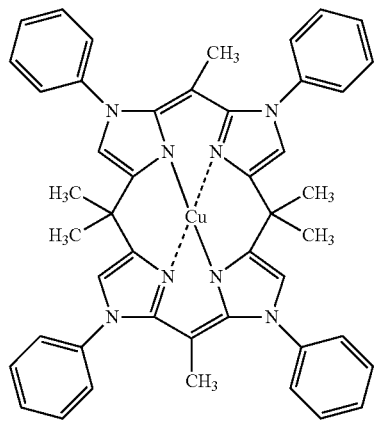

(D21)
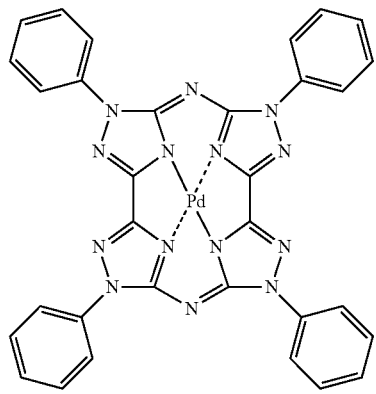

(D22)
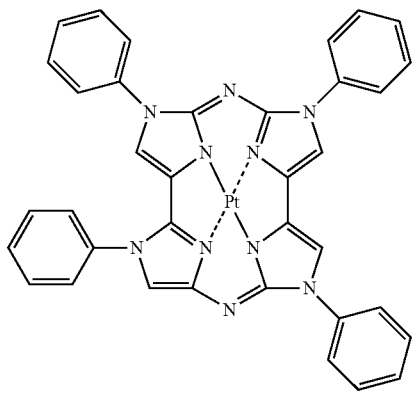

(D23)
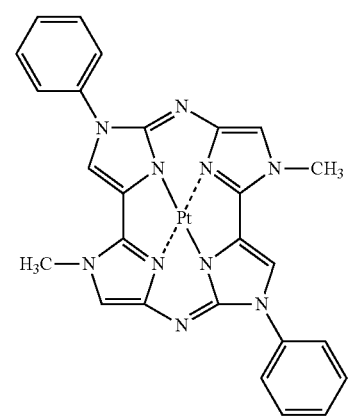

-continued (D24)
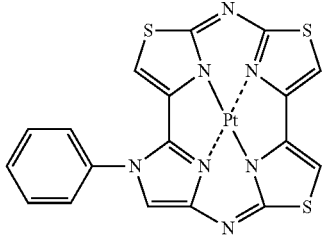

An example of preferable metal complexes usable in the invention is a compound represented by the following formula (E-1):

Formula (E-1)
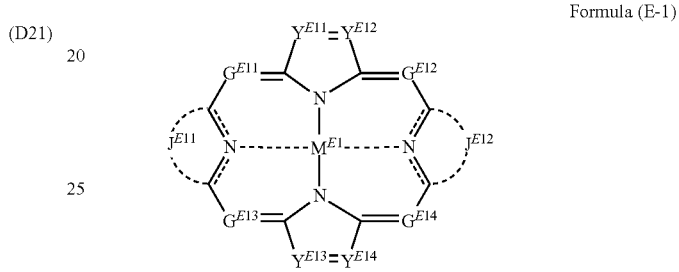

In formula (E-1), $M^{E1}$ represents a metal ion. $J^{E11}$ and $J^{E12}$ each independently represent an atomic group necessary for forming a 5-membered ring. $G^{E11}$, $G^{E12}$, $G^{E13}$ and $G^{E14}$ each independently represent a nitrogen atom or a substituted or unsubstituted carbon atom. $Y^{E11}$, $Y^{E12}$, $Y^{E13}$ and $Y^{E14}$ each independently represent a nitrogen atom or a substituted or unsubstituted carbon atom.

The formula (E-1) will be described in detail.

$M^{E1}$ has the same definition as $M^{A1}$ in formula (A-1), and its preferable examples are also the same. $G^{E11}$, $G^{E12}$, $G^{E13}$ and $G^{E14}$ have the same definition as $G^{C11}$ and $G^{C12}$ in formula (C-1), and their preferable examples are also the same.

$J^{E11}$ and $J^{E12}$ have the same definition as $J^{D11}$ to $J^{D14}$ in formula (D-1), and their preferable examples are also the same. $Y^{E11}$, $Y^{E12}$, $Y^{E13}$ and $Y^{E14}$ have the same definitions as corresponding $Y^{C21}$ to $Y^{C24}$ in formula (C-2) respectively, and their preferable examples are also the same.

The compound represented by the formula (E-1) is more preferably a compound represented by the following formula (E-2) or (E-3).

Formula (E-2)
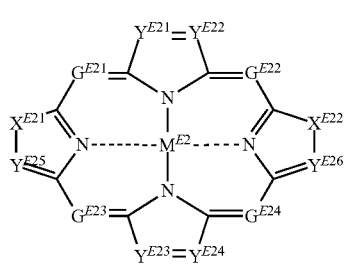

In formula (E-2), $M^{E2}$ represents a metal ion. $G^{E21}$, $G^{E22}$, $G^{E23}$ and $G^{E24}$ each independently represent a nitrogen atom or a substituted or unsubstituted carbon atom. $Y^{E21}$, $Y^{E22}$, $Y^{E23}$, $Y^{E24}$, $Y^{E25}$ and $Y^{E26}$ each independently represent a nitrogen atom or a substituted or unsubstituted carbon atom.

$X^{E21}$ and $X^{E22}$ each independently represent an oxygen atom, a sulfur atom, —$NR^{E21}$— or —$C(R^{E22})R^{E23}$—. $R^{E21}$, $R^{E22}$ and $R^{E23}$ each independently represent a hydrogen atom or a substituent.

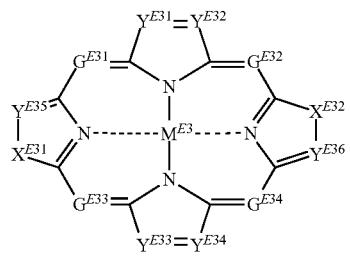

Formula (E-3)

In formula (E-3), $M^{E3}$ represents a metal ion. $G^{E31}$, $G^{E32}$, $G^{E33}$ and $G^{E34}$ each independently represent a nitrogen atom or a substituted or unsubstituted carbon atom. $Y^{E31}$, $Y^{E32}$, $Y^{E33}$, $Y^{E34}$, $Y^{E35}$ and $Y^{E36}$ each independently represent a nitrogen atom or a substituted or unsubstituted carbon atom. $X^{E31}$ and $X^{E32}$ each independently represent an oxygen atom, a sulfur atom, —$NR^{E31}$— or —$C(R^{E32})R^{E33}$—. $R^{E31}$, $R^{E32}$ and $R^{E33}$ each independently represent a hydrogen atom or a substituent.

The formula (E-2) will be described in detail.

In formula (E-2), $M^{E2}$, $G^{E21}$, $G^{E22}$, $G^{E23}$, $G^{E24}$, $Y^{E21}$, $Y^{E22}$, $Y^{E23}$ and $Y^{E24}$ have the same definitions as corresponding $M^{E1}$, $G^{E11}$, $G^{E12}$, $G^{E13}$, $G^{E14}$, $Y^{E11}$, $Y^{E12}$, $Y^{E13}$ and $Y^{E14}$ in formula (E-1) respectively, and their preferable examples are also the same. $X^{E21}$ and $X^{E22}$ have the same definitions corresponding $X^{D21}$ and $X^{D22}$ in formula (D-2) respectively, and their preferable examples are also the same.

The formula (E-3) will be described in detail.

In formula (E-3), $M^{E3}$, $G^{E31}$, $G^{E32}$, $G^{E33}$, $G^{E34}$, $Y^{E31}$, $Y^{E32}$, $Y^{E33}$ and $Y^{E34}$ have the same definitions as corresponding $M^{E1}$, $G^{E11}$, $G^{E12}$, $G^{E13}$, $G^{E14}$, $Y^{E11}$, $Y^{E12}$, $Y^{E13}$ and $Y^{E14}$ in formula (E-1) respectively, and their preferable examples are also the same. $X^{E31}$ and $X^{E32}$ have the same definitions as corresponding $X^{E21}$ and $X^{E22}$ in formula (E-2) respectively, and their preferable examples are also the same.

Specific examples of the compounds represented by the formula (E-1) are illustrated below, but the invention is not limited thereto.

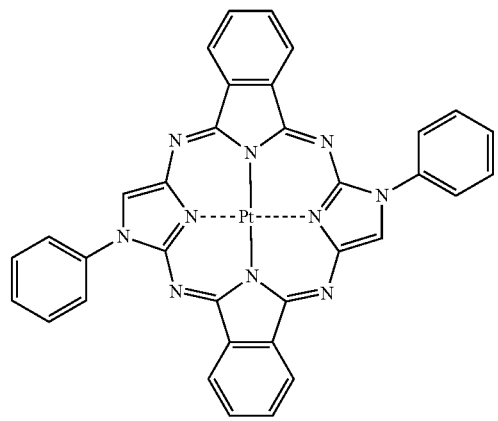

(E1)

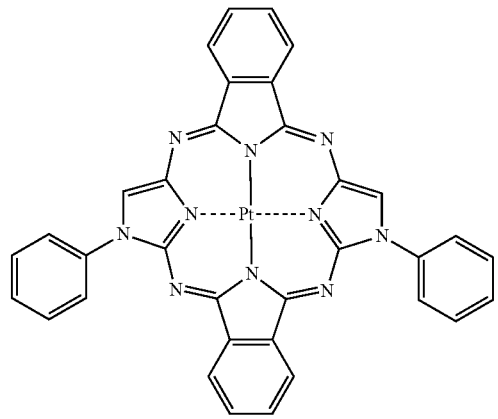

(E2)

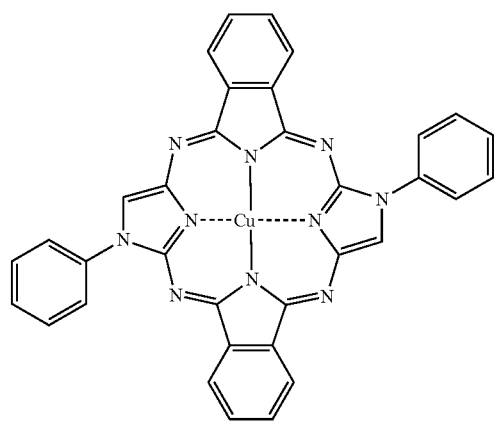

(E3)

-continued
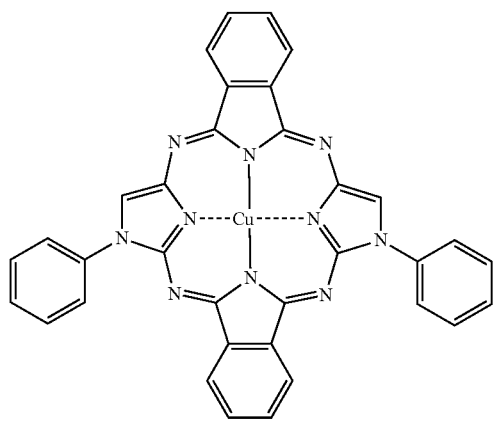
(E4)
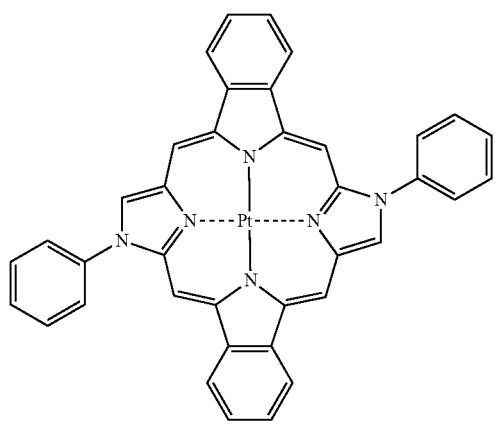
(E5)
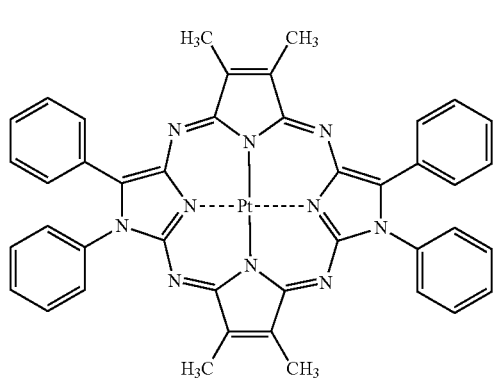
(E6)
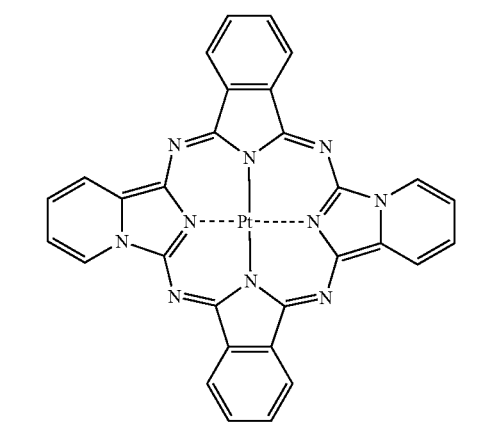
(E7)
-continued
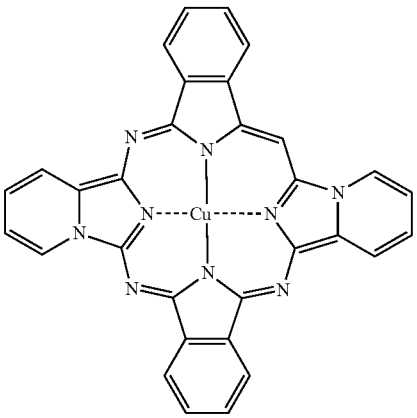
(E8)
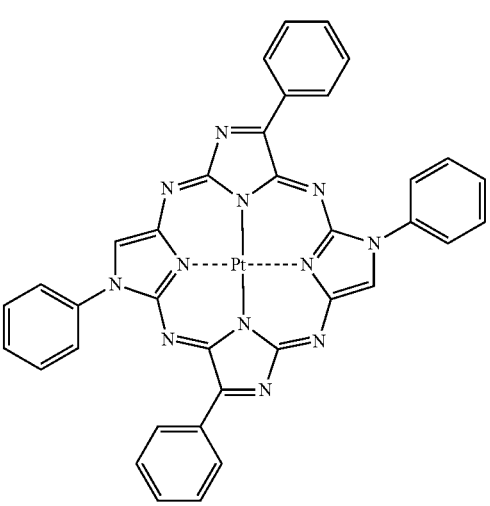
(E9)
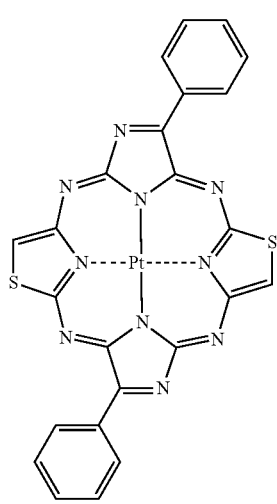
(E10)

-continued

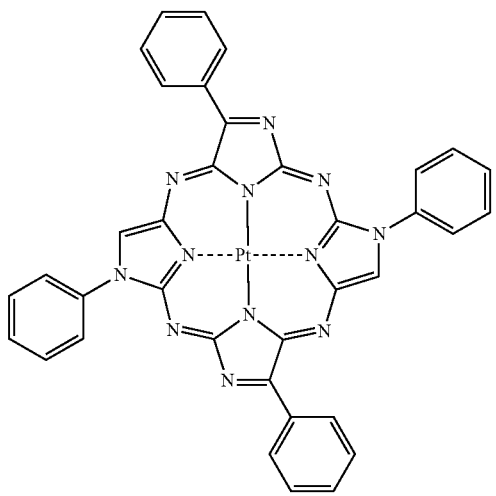
(E11)

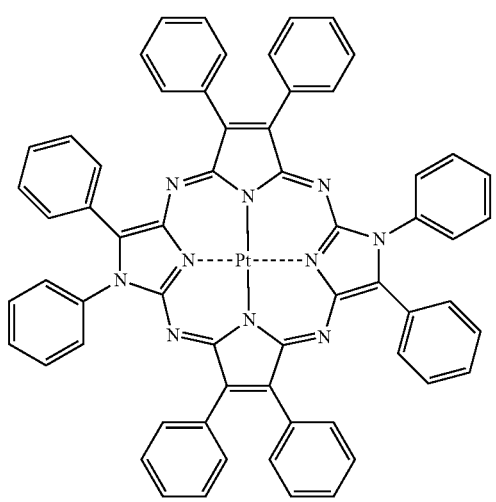
(E12)

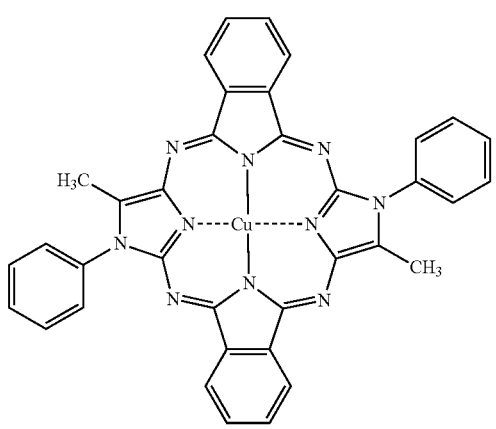
(E13)

-continued

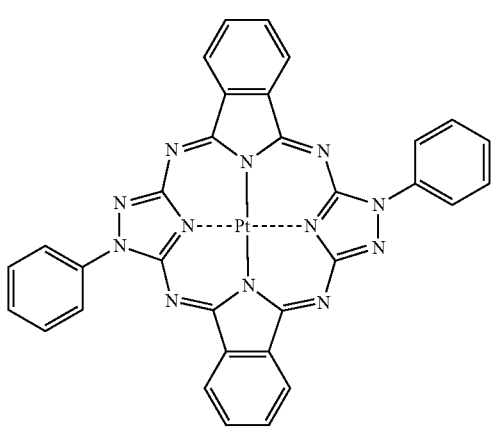
(E14)

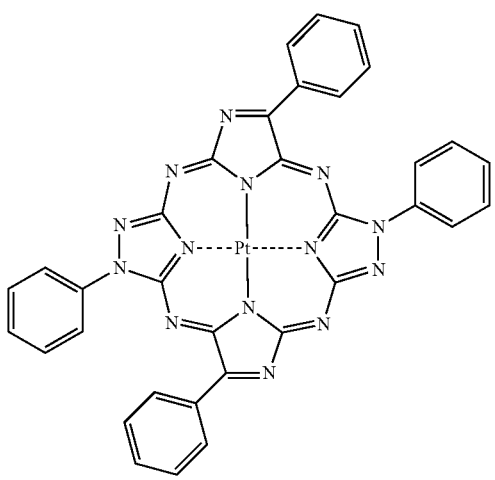
(E15)

An example of metal complexes usable in the invention is a compound represented by the following formula (F-1):

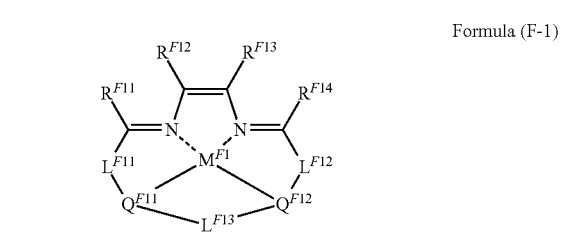
Formula (F-1)

In formula (F-1), $M^{F1}$ represents a metal ion. $L^{F11}$, $L^{F12}$ and $L^{F13}$ each independently represent a connecting group. $R^{F11}$, $R^{F12}$, $R^{F13}$ and $R^{F14}$ each independently represent a hydrogen atom or a substituent. $R^{F11}$ and $R^{F12}$ may, if possible, be bonded to each other to form a 5-membered ring. $R^{F12}$ and $R^{F13}$ may, if possible, be bonded to each other to form a ring. $R^{F13}$ and $R^{F14}$ may, if possible, be bonded to each other to form a 5-membered ring. $Q^{F11}$ and $Q^{F12}$ each independently represent a partial structure containing an atom bonded to $M^{F1}$. The bond between the atom in the partial structure and $M^{F1}$ may be, for example, a covalent bond.

The compound represented by the formula (F-1) will be described in detail.

In formula (F-1), $M^{F1}$, $L^{F11}$, $L^{F12}$, $L^{F13}$, $Q^{F11}$, and $Q^{F12}$ have the same definitions as corresponding $M^{41}$, $L^{S11}$, $L^{412}$, $L^{A13}$, $Q^{A11}$ and $Q^{A12}$ in formula (A-1) respectively, and their preferable examples are also the same. $R^{F11}$, $R^{F12}$, $R^{F13}$ and $R^{F14}$ each independently represent a hydrogen atom or a substituent. $R^{F11}$ and $R^{F12}$ may, if possible, be bonded to each other to form a 5-membered ring. $R^{F12}$ and $R^{F13}$ may, if possible, be bonded to each other to form a ring. $R^{F13}$ and $R^{F14}$ may, if possible, be bonded to each other to form a 5-membered ring. The substituent represented by $R^{F11}$, $R^{F12}$, $R^{F13}$ or $R^{F14}$ may be selected from the above-mentioned examples of the substituent represented by $R^{C11}$ to $R^{C14}$ in formula (C-1). In a preferable embodiment, $R^{F11}$ and $R^{F12}$ are bonded to each other to form a 5-membered ring, and $R^{F13}$ and $R^{F14}$ are bonded to each other to form a 5-membered ring. In another preferable embodiment, $R^{F12}$ and $R^{F13}$ are bonded to each other to form an aromatic ring.

The compound represented by the formula (F-1) is more preferably a compound represented by formula (F-2), (F-3) or (F-4).

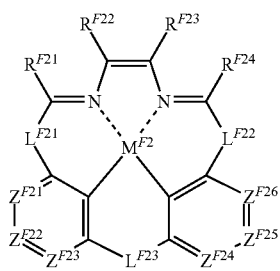

Formula (F-2)

In formula (F-2), $M^{F2}$ represents a metal ion. $L^{F21}$, $L^{F22}$ and $L^{F23}$ each independently represent a connecting group. $R^{F21}$, $R^{F22}$, $R^{F23}$ and $R^{F24}$ each independently represent a substituent. $R^{F21}$ and $R^{F22}$ may, if possible, be bonded to each other to form a 5-membered ring. $R^{F22}$ and $R^{F23}$ may, if possible, be bonded to each other to form a ring. $R^{F23}$ and $R^{F24}$ may, if possible, be bonded to each other to form a 5-membered ring. $Z^{F21}$, $Z^{F22}$, $Z^{F23}$, $Z^{F24}$, $Z^{F25}$ and $Z^{F26}$ each independently represent a nitrogen atom or a substituted or unsubstituted carbon atom.

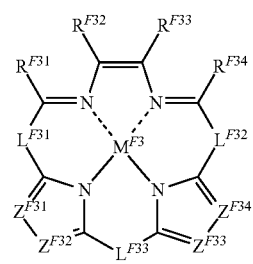

Formula (F-3)

In formula (F-3), $M^{F3}$ represents a metal ion. $L^{F31}$, $L^{F32}$ and $L^{F33}$ each independently represent a connecting group. $R^{F31}$, $R^{F32}$, $R^{F33}$ and $R^{F34}$ each independently represent a substituent. $R^{F31}$ and $R^{F32}$ may, if possible, be bonded to each other to form a 5-membered ring. $R^{F32}$ and $R^{F33}$ may, if possible, be bonded to each other to form a ring. $R^{F33}$ and $R^{F34}$ may, if possible, be bonded to each other to form a 5-membered ring. $Z^{F31}$, $Z^{F32}$, $Z^{F33}$ and $Z^{F34}$ each independently represent a nitrogen atom or a substituted or unsubstituted carbon atom.

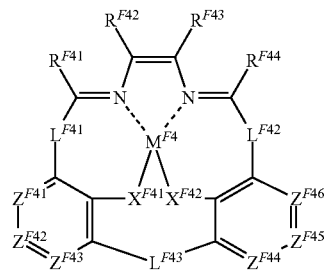

Formula (F-4)

In formula (F-4), $M^{F4}$ represents a metal ion. $L^{F41}$, $L^{F42}$ and $L^{F43}$ each independently represent a connecting group. $R^{F41}$, $R^{F42}$, $R^{F43}$ and $R^{F44}$ each independently represent a substituent. $R^{F41}$ and $R^{F42}$ may, if possible, be bonded to each other to form a 5-membered ring. $R^{F42}$ and $R^{F43}$ may, if possible, be bonded to each other to form a ring. $R^{F43}$ and $R^{F44}$ may, if possible, be bonded to each other to form a 5-membered ring. $Z^{F41}$, $Z^{F42}$, $Z^{F43}$, $Z^{F44}$, $Z^{F45}$ and $Z^{F46}$ each independently represent a nitrogen atom or a substituted or unsubstituted carbon atom. $X^{F41}$ and $X^{F42}$ each independently represent an oxygen atom, a sulfur atom or a substituted or unsubstituted nitrogen atom.

The compound represented by the formula (F-2) will be described in detail.

$M^{F2}$, $L^{F21}$, $L^{F22}$, $L^{F23}$, $R^{F21}$, $R^{F22}$, $R^{F23}$ and $R^{F24}$ have the same definitions as corresponding $M^{F1}$, $L^{F11}$, $L^{F12}$, $L^{F13}$, $R^{F11}$, $R^{F12}$, $R^{F13}$ and $R^{F14}$ in formula (F-1) respectively, and their preferable examples are also the same.

$Z^{F21}$, $Z^{F22}$, $Z^{F23}$, $Z^{F24}$, $Z^{F25}$ and $Z^{F26}$ each independently represent a nitrogen atom or a substituted or unsubstituted carbon atom. Each of $Z^{F21}$, $Z^{F22}$, $Z^{F23}$, $Z^{F24}$, $Z^{F25}$ and $Z^{F26}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

The compound represented by the formula (F-3) will be described in detail.

In formula (F-3), $M^{F3}$, $L^{F31}$, $L^{F32}$, $L^{F33}$, $R^{F31}$, $R^{F32}$, $R^{F33}$ and $R^{F34}$ have the same definitions as corresponding $M^{F1}$, $L^{F11}$, $L^{F12}$, $L^{F13}$, $R^{F11}$, $R^{F12}$, $R^{F13}$ and $R^{F14}$ in formula (F-1) respectively, and their preferable examples are also the same. $Z^{F31}$, $Z^{F32}$, $Z^{F33}$ and $Z^{F34}$ each independently represent a nitrogen atom or a substituted or unsubstituted carbon atom. Each of $Z^{F31}$, $Z^{F32}$, $Z^{F33}$ and $Z^{F34}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

The compound represented by the formula (F-4) will be described in detail.

In formula (F-4), $M^{F4}$, $L^{F41}$, $L^{F42}$, $L^{F43}$, $R^{F41}$, $R^{F42}$, $R^{F43}$ and $R^{F44}$ have the same definitions as corresponding $M^{F1}$, $L^{F11}$, $L^{F12}$, $L^{F13}$, $R^{F11}$, $R^{F12}$, $R^{F13}$ and $R^{F14}$ in formula (F-1) respectively, and their preferable examples are also the same.

$Z^{F41}$, $Z^{F42}$, $Z^{F43}$, $Z^{F44}$, $Z^{F45}$ and $Z^{F6}$ each independently represent a nitrogen atom or a substituted or unsubstituted carbon atom. Each of $Z^{F41}$, $Z^{F42}$, $Z^{F43}$, $Z^{F44}$, $Z^{F45}$ and $Z^{F46}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in formula (A-1).

$X^{F41}$ and $X^{F42}$ each independently represent an oxygen atom, a sulfur atom or a substituted or unsubstituted nitrogen atom. Each of $X^{F41}$ and $X^{F42}$ is preferably an oxygen atom or a sulfur atom, and more preferably an oxygen atom.

Specific examples of the compounds represented by the formula (F-1) are illustrated below, but the invention is not limited thereto.

(F1)
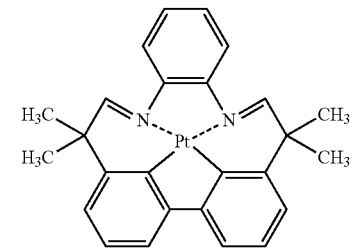

(F2)
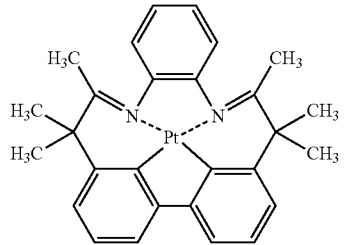

(F3)
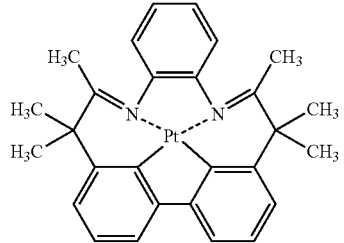

(F4)
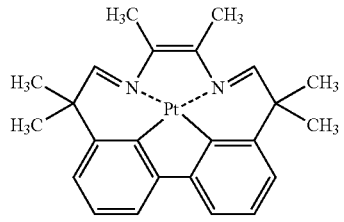

(F5)
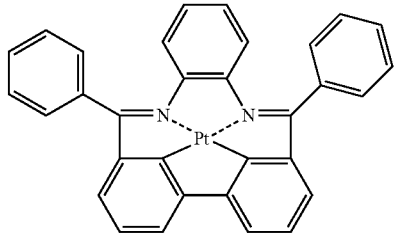

(F6)
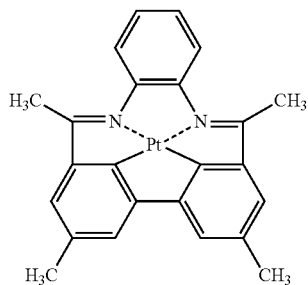

(F7)
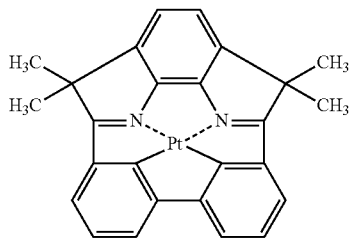

(F8)
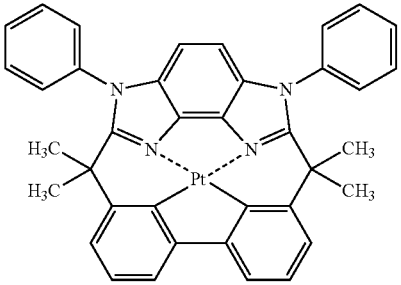

(F9)
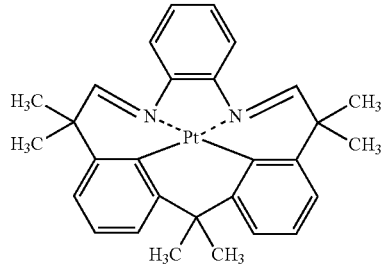

(F10)
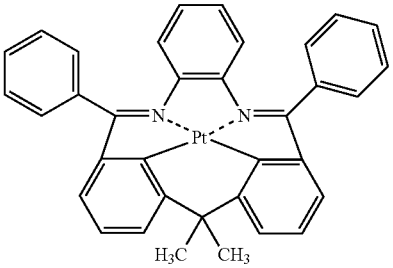

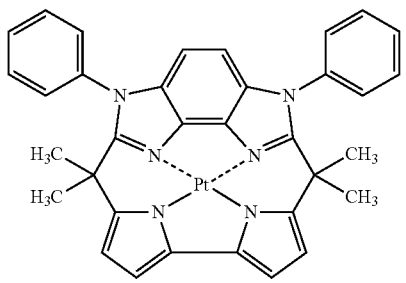
(F11)
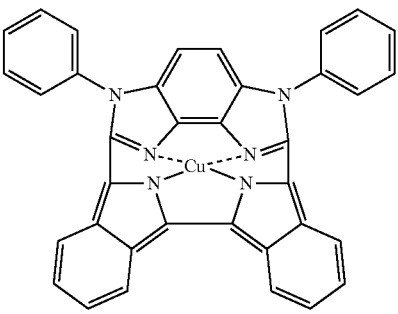
(F16)
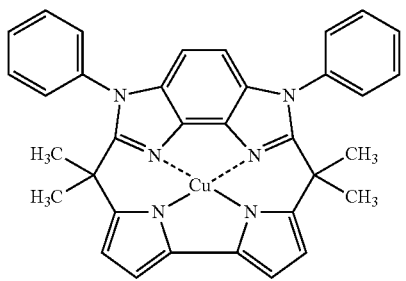
(F12)
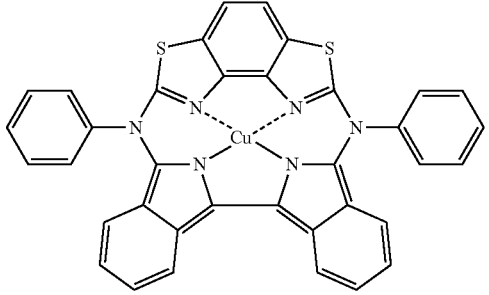
(F17)
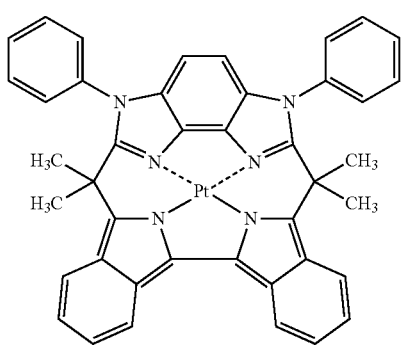
(F13)
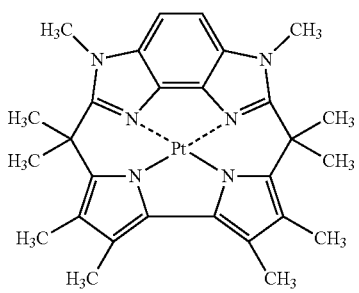
(F18)
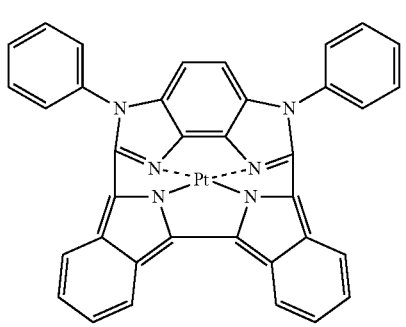
(F14)
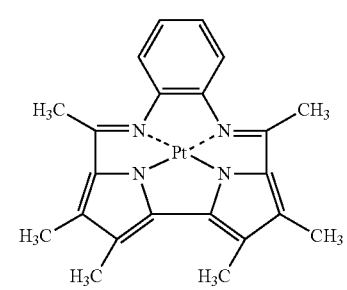
(F19)
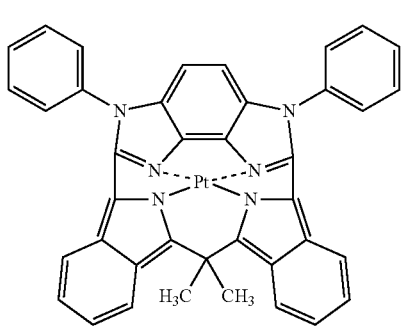
(F15)
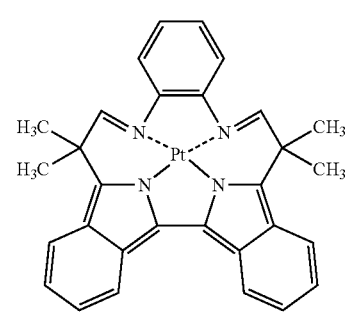
(F20)

(F21)
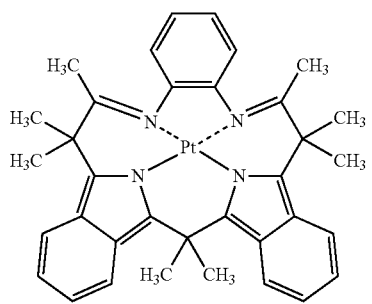
(F22)
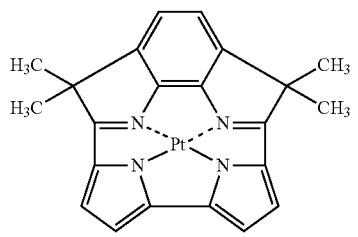
(F23)
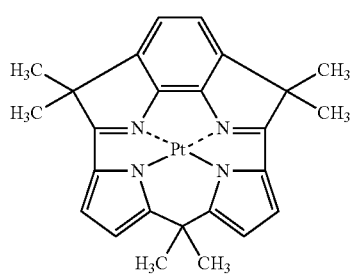
(F24)
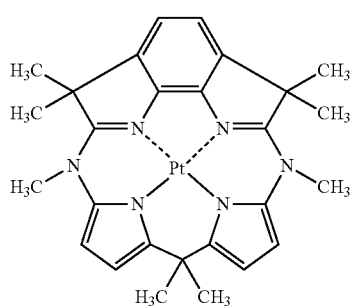
(F25)
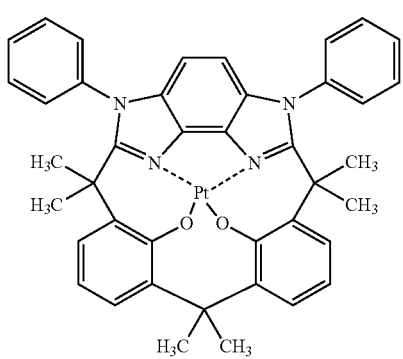
(F26)
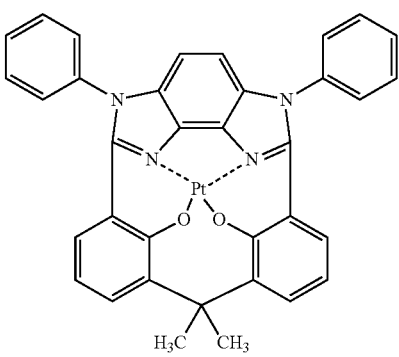
(F27)
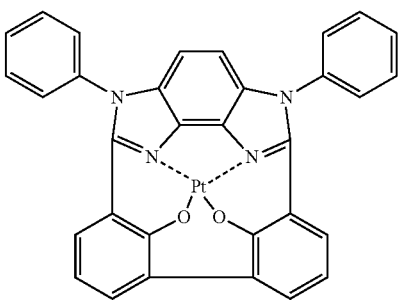
(F28)
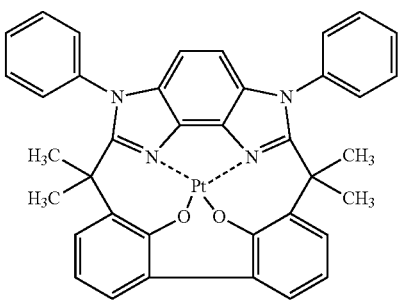
(F29)
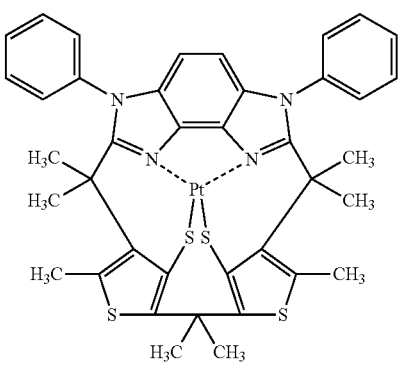
(F30)
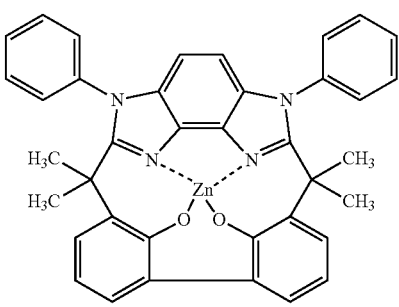

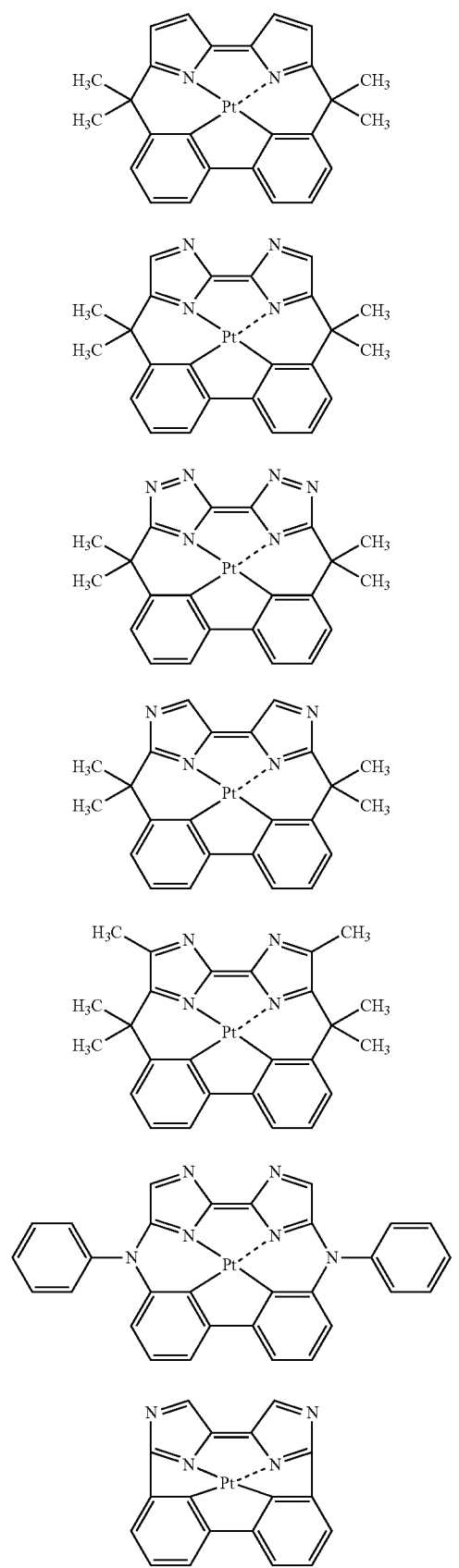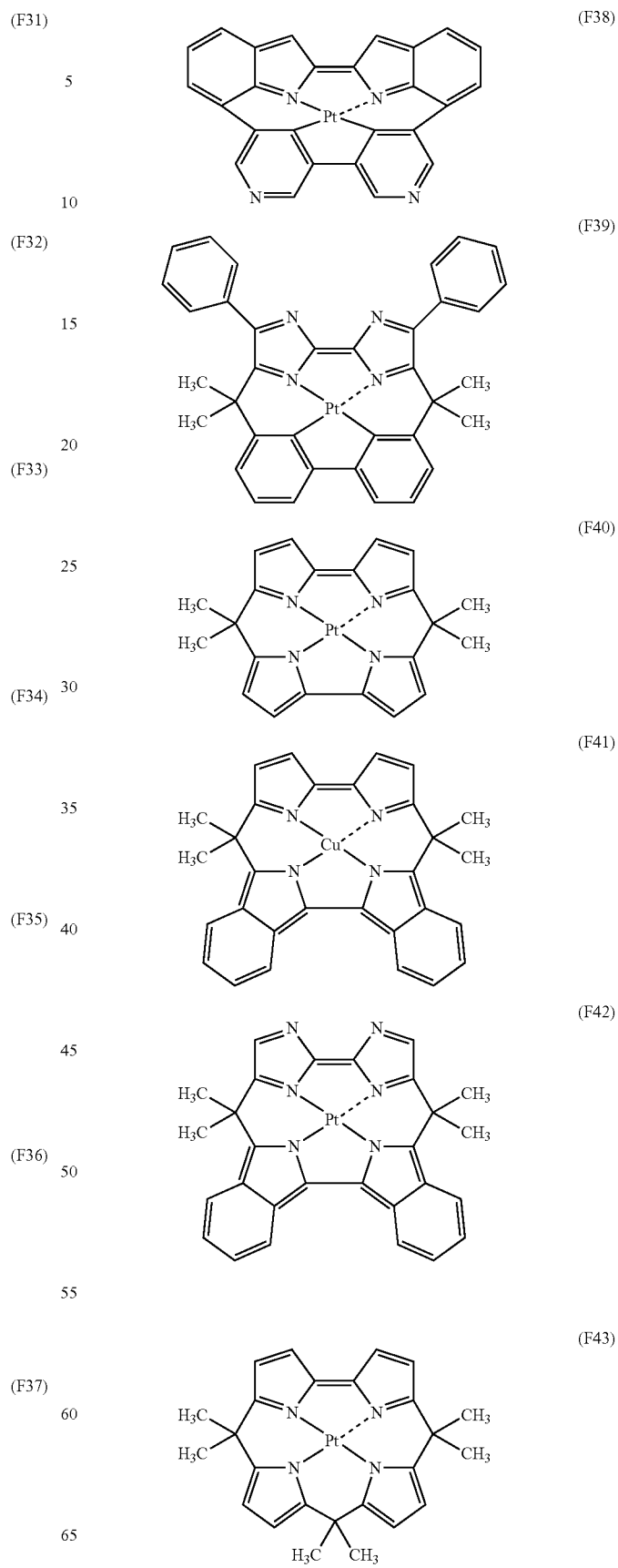

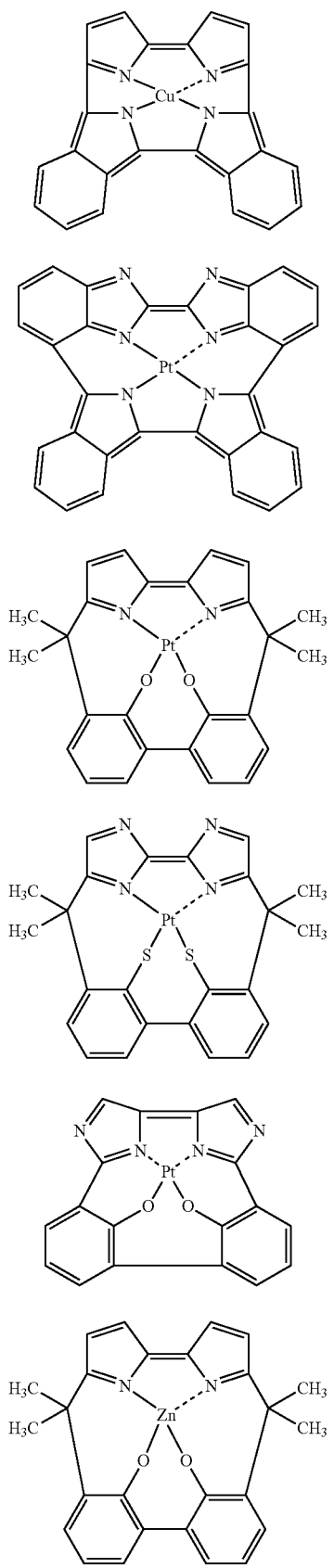

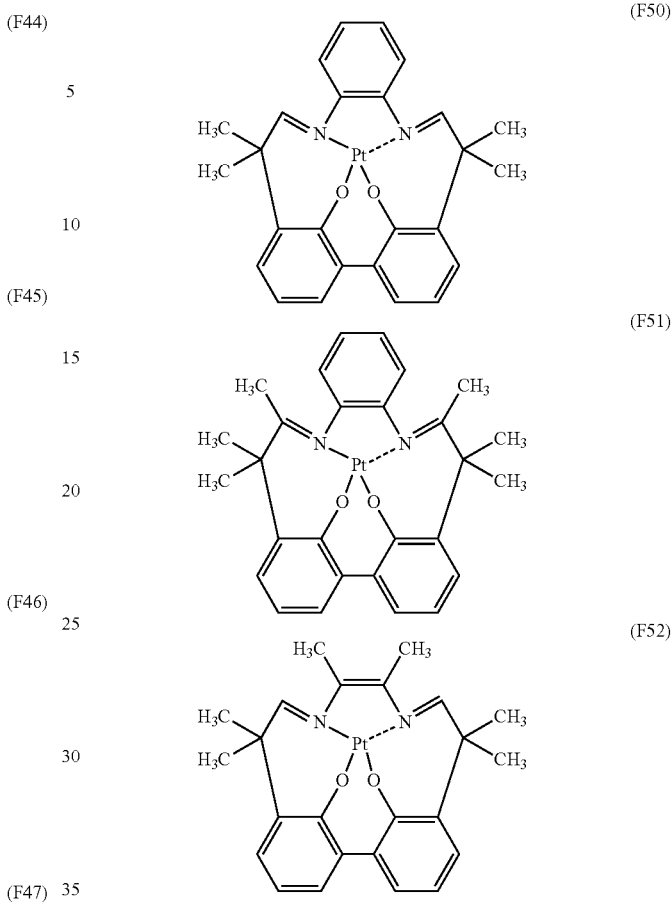

Compounds represented by the formulae (A-1) to (F-1) can be synthesized by known methods.

—Structure of Organic EL Device—

In the following, the structure of the organic EL device is described. The organic EL device of the invention has, between a pair of electrodes (cathode and anode), at least one organic layer including a luminescent layer.

The organic EL device of the invention comprises, in at least one of the organic layer(s), the metal complex having the tri- or higher-dentate ligand described above (the metal complex of the invention). The organic EL device further comprises the compound represented by formula (I) in the organic layer containing the metal complex and/or in other organic layer(s). Because of this structure, the organic EL device of the invention exhibits superior emission characteristics and driving durability.

<Anode>

The anode supplies the hole injection layer, hole transport layer, luminescent layer, etc. with holes. The material of the anode may be, for example, a metal, an alloy, a metal oxide, an electroconductive compound or a mixture thereof, and preferably a material having a work function of 4 eV or more.

Specific examples thereof include electroconductive metal oxides such as tin oxide, zinc oxide, indium oxide, indium tin oxide (ITO), etc., metals such as gold, silver, chrome, nickel, etc., mixtures or laminates of such metals and electroconductive metal oxides, inorganic electroconductive substances such as copper iodide, copper sulfide, etc., organic electroconductive materials such as polyaniline, polythiophene, polypyrrole, etc., and laminates thereof with ITO, preferably electroconductive metal oxides, and particularly ITO is preferable from the viewpoint of productivity, high electric conductivity, transparency, etc.

The thickness of the anode can be suitably selected depending on its material, but is usually preferably in the range of 10 nm to 5 μm, more preferably 50 nm to 1 μm, and still more preferably 100 nm to 500 nm.

The anode is usually formed on soda lime glass, non-alkali glass, a transparent resin substrate or the like. When glass is used, the glass is preferably non-alkali glass in order to reduce ions eluted from the glass. When soda lime glass is used, the glass is preferably coated with a barrier coat such as silica. Examples of the transparent resin substrate include: polyesters such as polyethylene terephthalate, polybutylene terephthalate, polyethylene naphthalate, etc, and polymer materials such as polyethylene, polycarbonate, polyether sulfone, polyarylate, allyl diglycol carbonate, polyimide, polycycloolefin, norbornene resin, poly(chlorotrifluoroethylene), TEFRON, and a polytetrafluoroethylene-polyethylene copolymer.

The thickness of the substrate is not particularly limited insofar as it is sufficient for maintaining mechanical strength; for example, when glass is used, the thickness of the substrate is usually 0.2 mm or more, preferably 0.7 mm or more.

Various methods are used to prepare the anode, and for example an ITO film is formed by an electron beam method, a sputtering method, a resistance heating deposition method, or a chemical reaction method (sol/gel method, etc.), or by application of a dispersion of iridium tin oxide.

By subjecting the anode to washing or any other treatment, the driving voltage of the device can be lowered, and luminous efficiency can be increased. For example, UV-ozone treatment, plasma treatment, etc. are effective for ITO.

<Cathode>

The cathode supplies the electron injection layer, electron transport layer, luminescent layer, etc. with electrons, and is selected in consideration of the adhesion of the cathode to adjacent layers such as the electron injection layer, electron transport layer, and luminescent layer, ionization potential, stability, etc. The material of the cathode may be a metal, an alloy, a metal halide, a metal oxide, an electroconductive compound or a mixture thereof, and specific examples thereof include: alkali metals (for example, Li, Na, and K) and fluorides thereof; alkaline earth metals (for example, Mg and Ca), oxides thereof and fluorides thereof; gold, silver, lead, aluminum, sodium-potassium alloy and mixed metals thereof; lithium-aluminum alloy and mixed metal thereof; magnesium-silver alloy and mixed metals thereof; and rare earth metals such as indium and ytterbium. The cathode material preferably has a work function of 4 eV or less. The cathode material is more preferably selected from aluminum, lithium-aluminum alloy, mixed metals thereof, magnesium-silver alloy, and mixed metals thereof.

The cathode may have a monolayer structure containing the cathode material or a laminate structure containing the cathode material. Preferable examples of the laminate structure are aluminum-lithium fluoride laminate and aluminum-lithium oxide laminate.

The thickness of the cathode can be selected suitably depending on its material, but is usually preferably in the range of 10 nm to 5 μm, more preferably 50 nm to 1 μm, still more preferably 100 nm to 1 μm.

The cathode can be prepared by methods such as an electron beam method, a sputtering method, a resistance heating deposition method, a coating method and a transfer method, and a single metal may be vapor-deposited, or two or more components may be simultaneously vapor-deposited. Further, a plurality of metals can be simultaneously vapor-deposited to form an alloy electrode, or a previously prepared alloy may be vapor-deposited. The sheet resistances of the anode and cathode are preferably lower. The sheet resistances are more preferably several hundreds Ω/sq or less.

<Organic Layer>

In the invention, the organic EL device has at least one organic layer including the luminescent layer. Each organic layer may contain organic compound(s) only, or may contain organic compound(s) and inorganic compound(s).

Examples of organic layers other than the luminescent layer include a hole transport layer, a hole injection layer, an electron injection layer, an electron transport layer, an exciton blocking layer, and a hole blocking layer. In a preferable embodiment, the organic layers include a hole transport layer, a luminescent layer and at least one layer selected from an exciton blocking layer, a hole injection layer, a hole blocking layer, and an electron transport layer.

The structure of the organic layers may be, for example: the structure of anode/hole transport layer/luminescent layer/cathode; or the structure of anode/hole transport layer/luminescent layer/electron transport layer/cathode.

Each organic layer may have an additional function which is different from its original function. There may be only one layer which performs a certain function, or there may be two or more layers which perform the same function. The material for each organic layer may be selected from various materials.

In the invention, it is preferable to provide a layer containing a compound having an ionization potential of 5.9 eV or higher (more preferably 6.0 eV or higher) between the cathode and the luminescent layer. The layer containing a compound having an ionization potential of 5.9 eV or higher is preferably an electron transport layer having an ionization potential of 5.9 eV or higher.

The method of forming the organic layer in the invention is not particularly limited. Examples thereof include a resistance heating deposition method, an electron beam method, a sputtering method, a molecule lamination method, a coating method (spray coating method, dip coating method, dipping method, roll coating method, gravure coating method, reverse coating method, roll brush method, air knife coating method, curtain coating method, spin coating method, flow coating method, bar coating method, microgravure coating method, air doctor coating, blade coating method, squeeze coating method, transfer roll coating method, kiss coating method, cast coating method, extrusion coating method, wire bar coating method, screen coating method, etc.), an inkjet method, a printing method, an LB method, and a transfer method, among which the resistance heating deposition method, coating method and transfer method are preferable in consideration of the characteristics of the device and productivity.

(Luminescent Layer)

The material contained in the luminescent layer is not particularly limited as long as the material is, upon application of electric field, capable of accepting holes from the anode, or from the hole injection layer, or from the hole transport layer, capable of accepting electrons from the cathode, or from the electron injection layer, or from the electron transport layer, capable of transporting the injected charges, and capable of providing a site for recombination of holes and electrons to emit light.

Examples of the substances contained in the luminescent layer include not only the metal complexes of the invention and the compound represented by formula (I), but also various metal complexes (such as metal complexes and rare earth complexes of benzoxazole, benzimidazole, benzothiazole, styryl benzene, polyphenyl, diphenyl butadiene, tetraphenyl butadiene, naphthalimide, coumarin, perylene, perinone, oxadiazole, aldazine, pyralizine, cyclopentadiene, bis-styryl anthracene, quinacridone, pyrrolopyridine, thiadiazolopyridine, cyclopentadiene, styryl amine, aromatic dimethylidene compounds and 8-quinolinol), polymer compounds (such as polythiophene, polyphenylene, and polyphenylene vinylene), organic silane, iridium trisphenyl pyridine complex, and transition metal complexes such as platinum porphyrin complex, and derivatives thereof.

Examples of the host material usable in the luminescent layer include the compound represented by formula (I), amine compounds (such as triarylamine compounds), metal chelete oxinoid compounds (which have a metal-oxygen bond; the metal may be selected from aluminium, zinc, and transition metals, and the ligand may be selected from 8-hydroxyquinoline derivatives and 2-(2-pyridino)phenol derivatives), polyarylene compounds (such as hexaphenylbenzene derivatives), condensed aromatic carbon cycle compound, and non-complex aromatic nitrogen-containing heterocyclic compounds (such as carbazole derivatives).

In an embodiment, the host material contained in the luminescent layer is a mixture of two or more compounds.

The thickness of the luminescent layer is not particularly limited, and usually the thickness is preferably in the range of 1 nm to 5 μm, more preferably 5 nm to 1 μm, still more preferably 10 nm to 500 nm.

The method of forming the luminescent layer is not particularly limited, and methods such as resistance heating deposition, electron beam, sputtering, a molecular deposition method, a coating method, an ink-jet method, a printing method, an LB method, a transfer method, and the like may be used, among which resistance heating deposition and a coating method are preferable.

The luminescent layer may be formed from a single substance or a plurality of substances. There may be only one luminescent layer or may be a plurality of luminescent layers, and such luminescent layers may emit lights with respectively different colors (for example, white light may be emitted based on the combination of the respective lights). In an embodiment, white light is emitted from a single luminescent layer. When there are a plurality of luminescent layers, the luminescent layers each may be formed from a single substance or a plurality of substances.

(Hole Injection Layer and Hole Transport Layer)

The materials contained in the hole injection layer and the hole transport layer are not limited insofar as: the hole injection layer has a function of being injected with holes; and the hole transport layer has a function of transporting holes. The hole injection layer and hole transport layer each may optionally have a function of blocking electrons migrating from the cathode.

Specific examples of the materials include: electroconductive high-molecular oligomers of carbazole, triazole, oxazole, oxadiazole, imidazole, polyaryl alkane, pyrazoline, pyrazolone, phenylene diamine, aryl amine, amino-substituted chalcone, styryl anthracene, fluorenone, hydrazone, stilbene, silazane, aromatic tertiary amine compounds, styryl amine compounds, aromatic dimethylidene compounds, porphyrin compounds, polysilane compounds, poly(N-vinyl carbazole), aniline copolymers, thiophene oligomers, polythiophene, and the like; organic silane; carbon films; the compounds of the invention; and derivatives thereof.

Preferable examples of the material contained in the hole injection layer are copper phthalocyanine and starburst-type amine compounds.

The thickness of the hole injection layer or hole transport layer is not particularly limited, and usually the thickness is preferably in the range of 1 nm to 5 μm, more preferably 5 nm to 1 μm, still more preferably 10 nm to 500 nm.

There may be a single hole injection layer comprising one of the above substances or two or more of the above substances, or there may be provided two or more hole injection layers each having same or different composition. Similarly, there may be a single hole transport layer comprising one of the above substances or two or more of the above substances, or there may be provided two or more hole transport layers each having the same or different composition.

The method of forming the hole injection layer or the hole transport layer may be a vacuum deposition method, an LB method, a method of applying a solution or dispersion of the hole injection transfer substance in a solvent, an inkjet method, a printing method, or a transfer method. In the coating method, the substances can be dissolved or dispersed together with a resin component, and examples of the resin component include polyvinyl chloride, polycarbonate, polystyrene, polymethyl methacrylate, polybutyl methacrylate, polyester, polysulfone, polyphenylene oxide, polybutadiene, poly(N-vinyl carbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin, and silicon resin.

(Electron Injection Layer and Electron Transport Layer)

The materials contained in the electron injection layer and electron transport layer are not limited insofar as: the electron injection layer has a function of being injected with electrons; and the electron transport layer has a function of transporting electrons. The electron injection layer and electron transport layer each may have a function of blocking holes migrating from the anode.

Preferable examples of the material contained in the electron transport layer include: the compound represented by formula (I), metal chelate oxinoid compounds, polyarylene compounds, condensed aromatic carbon cycle compounds, and non-complex aromatic heterocyclic compounds. Specific examples thereof include: various metal complexes such as metal complexes of triazole, oxazole, oxadiazole, imidazole, fluorenone, anthraquinodimethane, anthrone, diphenyl quinone, thiopyran dioxide, carbodiimide, fluorenylidene methane, distyryl pyrazine, aromatic tetracarboxylic acid anhydrides (such as naphthalene tetracarboxylic acid anhydride and perylene tetracarboxylic acid anhydride), phthalocyanine and 8-quinolinol, metal phthalocyanine, and metal complexes whose typical examples are metal complexes comprising ligands selected from benzoxazole and benzothiazole; organic silane; and derivatives thereof.

The thickness of the electron injection layer or electron transport layer is not particularly limited, but usually the thickness is preferably in the range of 1 nm to 5 μM, more preferably 5 nm to 1 μm, still more preferably 10 nm to 500 nm.

There may be a single electron injection layer comprising one of the above substances or two or more of the above substances, or there may be provided two or more electron injection layers each having the same or different composition. Similarly, there may be a single electron transport layer comprising one of the above substances or two or more of the above substances, or there may be provided two or more electron transport layers each having the same or different composition.

The method of forming the electron injection layer or the electron transport layer may be a vacuum deposition method, an LB method, a method of applying a solution or dispersion of the electron injection transfer materials in a solvent, an ink-jet method, a printing method, and a transfer method. In the coating method, the materials can be dissolved or dispersed together with a resin component, and the resin component may be selected from the resin components listed as examples in the explanation of hole injection layer and hole transfer layer.

(Hole Blocking Layer)

The hole blocking layer is a layer having a function of blocking the injected holes migrating from the anode.

(Exciton Blocking Layer)

The exciton blocking layer is a layer having functions of blocking the excitons generated in the luminescent layer so as to suppress the light emission from the region between the luminescent layer and the cathode or anode (Protective Layer)

The organic EL device of the invention may further comprise a protective layer so as to prevent the incorporation of moisture or oxygen. The material of the protective layer is not limited insofar as it has a function of preventing substances (such as water and oxygen) which cause deterioration of the device from entering the device.

Specific examples of the protective layer material include metals such as In, Sn, Pb, Au, Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal fluorides such as $MgF_2$, LiF, $AlF_3$, and $CaF_2$, nitrides such as $SiN_x$ and $SiO_xN_y$, polyethylene, polypropylene, polymethyl methacrylate, polyimide, polyurea, polytetrafluoroethylene, polychlorotrifluoroethylene, polydichlorodifluoroethylene, a chlorotrifluoroethylene-dichlorodifluoroethylene copolymer, a copolymer obtained by copolymerizing a monomer mixture containing tetrafluoroethylene and at least one kind of comonomer, a fluorine-containing copolymer having a cyclic structure on a main chain of thereof, a water-absorbing substance having a water absorption of 1% or higher, and a dampproof substance having a water absorption of 0.1% or lower.

The method of forming the protective layer is not particularly limited, either. Examples of usable methods include a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a coating method, a printing method, and a transfer method.

Systems, driving methods, and applications to which the organic EL device of the invention is applied are not particularly limited. The organic EL device of the invention can be used preferably in the fields of display devices, displays, backlight, electrophotography, lighting, recording light sources, exposure light sources, reading light sources, labels, signboards, interiors, optical communication, and the like.

EXAMPLES

Hereinafter, the organic EL device according to the invention will be described in detail with reference to Examples, but the invention is not restricted by these Example.

Example 1

A washed ITO substrate was placed in a vapor-deposition apparatus; TPD (N,N-diphenyl-N,N-di(m-tolyl)-benzidine) was vapor-deposited thereon to a thickness of 50 nm; the following compounds A and B and the exemplary compound (2-2) in a mass ratio of 1:17:17 were co-vapor-deposited thereon to a thickness of 36 nm; and the following compound C was vapor-deposited thereon to a thickness of 36 nm. After a patterned mask (such a mask to give a luminescent area of 4 mm×5 mm) was placed on the organic thin film thus obtained, in the vapor-deposition apparatus lithium fluoride was vapor-deposited to a thickness of 3 nm and aluminum was vapor-deposited thereon to a thickness of 400 nm, to give an organic EL device of Example 1.

Compound A

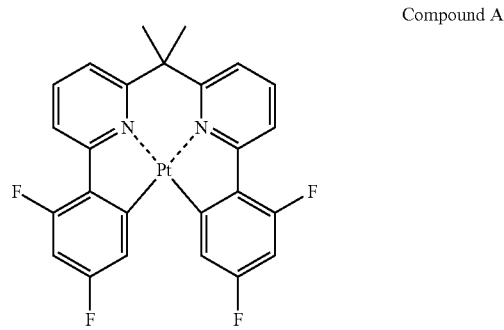

Compound B

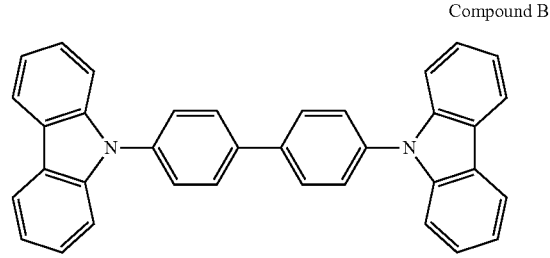

Compound C

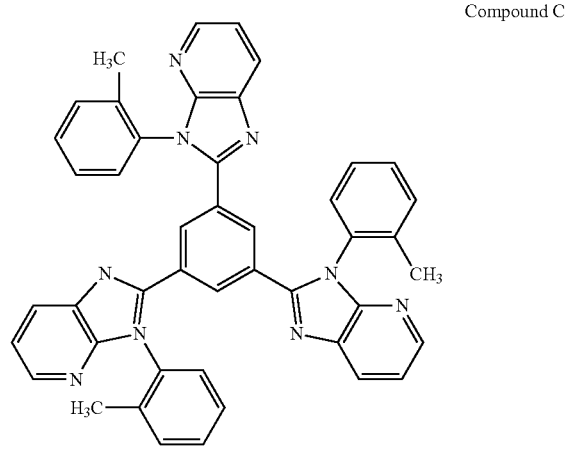

—Evaluation—

The emission characteristics and the driving durability of the organic EL device thus obtained were evaluated according to the following methods.

1. Emission Characteristics

The emission characteristics were evaluated as follows. Using a source measure unit 2400 (trade name) manufactured by Toyo Corporation, constant direct-current voltage was applied to the organic EL element obtained to allow it to emit light, The luminance was measured by using a luminance meter BM-8 (trade name) manufactured by Topcon Corporation.

As a result, an emission with the luminance maximum of 5,400 cd/m$^2$ was observed.

2. Driving Durability

The driving durability was evaluated as follows. Using a source measure unit 2400 manufactured by KEITHKEY, DC voltage was applied to the organic EL device such that the initial luminance was 300 cd/m$^2$. A continuous driving test was conducted by continuously applying the DC voltage to the organic EL device. The driving durability was evaluated by measuring the length of time the luminance takes to decrease to 150 cd/m$^2$ (luminance half-life).

As a result, the driving durability of the organic EL device obtained in Example 1 at an initial luminance of 300 cd/m$^2$ was approximately nine times that of the device obtained in Comparative Example 1 described later.

Example 2

A washed ITO substrate was placed in a vapor-deposition apparatus; TPD (N,N-diphenyl-N,N-di(m-tolyl)-benzidine) was vapor-deposited thereon to a thickness of 50 nm; the following compounds E and B in a mass ration of 1:17 were co-vapor-deposited to a thickness of 36 nm; the exemplary compound (1-3) was vapor-deposited thereon to a thickness of 10 nm and additionally, Alq was vapor-deposited to a thickness of 40 nm. After a patterned mask (such a mask to give a luminescent area of 4 mm×5 mm) was placed on the organic thin film thus obtained, in the vapor-deposition apparatus lithium fluoride was vapor-deposited to a thickness of 3 nm and aluminum was vapor-deposited thereon to a thickness of 400 nm, to give an organic EL device of Example 2.

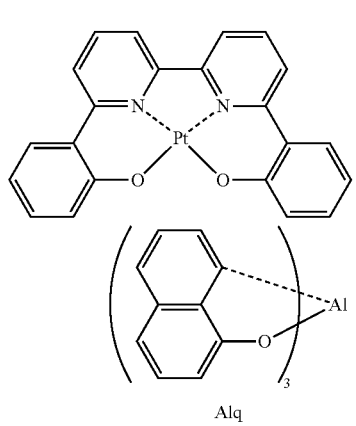

Compound E

Alq

The emission characteristics and the driving durability of the organic EL device thus obtained were evaluated in the same manner as in Example 1.

As a result, as for the emission characteristics, a red emission with the luminance maximum of 1,300 cd/m$^2$ was observed.

In addition, the driving durability of the organic EL device of Example 2 at an initial luminance of 300 cd/m$^2$ was eight times that of the device obtained in Comparative Example 1 described later.

Comparative Example 1

A washed ITO substrate was placed in a vapor-deposition apparatus; TPD (N,N-diphenyl-N,N-di(m-tolyl)-benzidine) was vapor-deposited thereon to a thickness of 50 nm; the compound E described in Japanese Patent Application No. 2004-162849 and the compound B in a mass ratio of 1:17 were co-vapor-deposited thereon to a thickness of 36 nm and the compound C was vapor-deposited thereon to a thickness of 36 nm. After a patterned mask (such a mask to give a luminescent area of 4 mm×5 mm) was placed on the organic thin film thus obtained, in the vapor-deposition apparatus lithium fluoride was vapor-deposited to a thickness of 3 nm and aluminum was vapor-deposited thereon to a thickness of 400 nm.

The emission characteristics of the organic EL device of Comparative Example 1 thus obtained were evaluated in the same manner as in Example 1, and a red emission with the luminance maximum of 1,000 cd/m$^2$ was observed.

As described above, the organic EL devices of Examples were found to be superior in emission characteristics as well as driving durability.

Thus, the invention provides organic electroluminescent devices superior in emission characteristics and driving durability.

What is claimed is:

1. An organic electroluminescent device comprising at least one organic layer between a pair of electrodes, wherein the at least one organic layer includes a luminescent layer, at least one layer of the at least one organic layer includes at least one metal complex represented by formula (1), and a compound represented by formula (I-A) or (I-B) is contained in an organic layer containing the metal complex and/or in other organic layer(s):

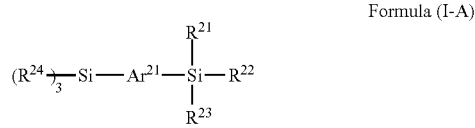

Formula (I-A)

wherein in formula (I-A), $R^{21}$ to $R^{24}$ each independently represent a hydrogen atom or a substituent group; and $Ar^{21}$ represents an arylene or heteroarylene group,

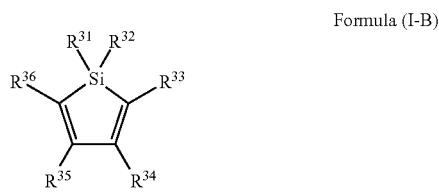

Formula (I-B)

wherein in formula (I-B), $R^{31}$ to $R^{36}$ each independently represent a hydrogen atom or a substituent group, and wherein at least one of $R^{31}$ or $R^{32}$ is an aryl or heteroaryl group;

Formula (I)

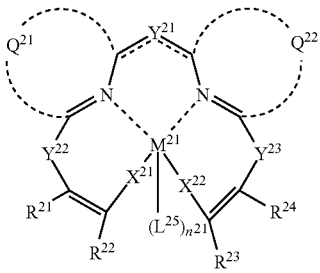

wherein in formula (1), $M^{21}$ represents a metal ion;
$Y^{21}$ represents a connecting group or a single or double bond;
$Y^{22}$ and $Y^{23}$ each represent a single bond or a connecting group;
$Q^{21}$ and $Q^{22}$ each represent an atomic group forming a nitrogen-containing heterocyclic ring, and the bond between $Y^{21}$ and the ring containing $Q^{21}$ and the bond between $Y^{21}$ and the ring containing $Q^{22}$ are each a single or double bond;
$X^{21}$ and $X^{22}$ each independently represent an oxygen atom, a sulfur atom, or a substituted or unsubstituted nitrogen atom;
$R^{21}$, $R^{22}$, $R^{23}$, and $R^{24}$ each independently represent a hydrogen atom or a substituent;
$R^{21}$ and $R^{22}$ may bind to each other to form a ring, and $R^{23}$ and $R^{24}$ may bind to each other to form a ring;
$L^{25}$ represents a ligand coordinating to $M^{21}$; and
$n^{21}$ represents an integer of 0 to 4.

2. The organic electroluminescent device of claim 1, wherein the compound represented by formula (I-A) or (I-B) is a compound represented by formula (I-A).

3. The organic electroluminescent device of claim 1, wherein $R^{21}$ to $R^{24}$ each independently represent a phenyl, benzimidazolyl, imidazopyridyl, siloxy, or vinyl group.

4. The organic electroluminescent device of claim 1, wherein $Ar^{21}$ represents a phenylene, biphenylene, or pyridylene group.

5. The organic electroluminescent device of claim 1, wherein the compound represented by formula (I-A) or (I-B) is a compound represented by formula (I-B).

6. The organic electroluminescent device of claim 1, wherein $R^{31}$ to $R^{36}$ each independently represent a phenyl, benzimidazolyl, imidazopyridyl, siloxy, or vinyl group, and wherein at least one of $R^{31}$ and $R^{32}$ is a phenyl, benzimidazolyl, or imidazopyridyl group.

7. The organic electroluminescent device of claim 1, wherein the metal ion in the metal complex is an ion of a metal selected from the group consisting of platinum, iridium, rhenium, palladium, rhodium, ruthenium, and copper.

8. The organic electroluminescent device of claim 1, wherein) the compound represented by formula (I-A) or (I-B) is contained in the luminescent layer.

9. The organic electroluminescent device of claim 1, wherein the metal complex is contained in the luminescent layer.

* * * * *